(12) United States Patent
Takizawa et al.

(10) Patent No.: US 9,423,690 B2
(45) Date of Patent: Aug. 23, 2016

(54) PATTERN FORMING METHOD, ELECTRON BEAM-SENSITIVE OR EXTREME ULTRAVIOLET RAY-SENSITIVE RESIN COMPOSITION, RESIST FILM, AND METHOD FOR MANUFACTURING ELECTRONIC DEVICE, AND ELECTRONIC DEVICE USING THE SAME

(71) Applicant: FUJIFILM Corporation, Tokyo (JP)

(72) Inventors: Hiroo Takizawa, Shizuoka (JP); Shuji Hirano, Shizuoka (JP); Natsumi Yokokawa, Shizuoka (JP); Wataru Nihashi, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/625,897

(22) Filed: Feb. 19, 2015

(65) Prior Publication Data

US 2015/0168834 A1 Jun. 18, 2015

Related U.S. Application Data

(63) Continuation of application No. PCT/JP2013/072485, filed on Aug. 16, 2013.

(30) Foreign Application Priority Data

Aug. 20, 2012 (JP) ................................. 2012-181892
Mar. 15, 2013 (JP) ................................. 2013-054401

(51) Int. Cl.
G03F 7/004 (2006.01)
G03F 7/038 (2006.01)
C08F 220/18 (2006.01)
(Continued)

(52) U.S. Cl.
CPC .......... *G03F 7/0388* (2013.01); *C08F 14/185* (2013.01); *C08F 16/10* (2013.01); *C08F 24/00* (2013.01); *C08F 220/18* (2013.01); *C08F 220/20* (2013.01); *C08F 220/26* (2013.01); *G03F 7/0045* (2013.01); *G03F 7/0046* (2013.01); *G03F 7/0392* (2013.01); *G03F 7/0397* (2013.01); *G03F 7/2002* (2013.01); *G03F 7/2037* (2013.01); *G03F 7/325* (2013.01);
(Continued)

(58) Field of Classification Search
CPC .... G03F 7/038; G03F 7/0388; G03F 7/0392; G03F 7/32; G03F 7/40; C08F 220/18; C08F 220/12; C08F 220/20; C08F 220/26; H01L 21/0271; H01L 21/0273; H01L 21/0274
USPC ........... 430/270.1, 322, 325, 329, 434, 435, 430/913, 914; 526/320, 326
See application file for complete search history.

(56) References Cited

U.S. PATENT DOCUMENTS 8,252,504 B2 * 8/2012 Harada et al. ............. 430/270.1
8,426,115 B2 * 4/2013 Hatakeyama et al. ........ 430/312
(Continued)

FOREIGN PATENT DOCUMENTS

JP 2001-201854 A 7/2001
JP 2005-091712 A 4/2005
(Continued)

OTHER PUBLICATIONS

Search Report dated Nov. 12, 2013, issued by the International Searching Authority in counterpart International Application No. PCT/JP2013/072485.
(Continued)

*Primary Examiner* — Amanda C Walke
(74) *Attorney, Agent, or Firm* — Sughrue Mion, PLLC

(57) ABSTRACT

There is provided a pattern forming method, including: (a) forming a film by using an electron beam-sensitive or extreme ultraviolet ray-sensitive resin composition containing a resin (A) having a repeating unit represented by Formula (1-0) and a repeating unit represented by Formula (1-2); (b) exposing the film by using an electron beam or extreme ultraviolet ray; and (c) developing the exposed film by using a developer containing an organic solvent to form a negative pattern, wherein a content of the repeating unit represented by Formula (1-0) is 45 mol % or more based on a whole repeating units in the resin (A).

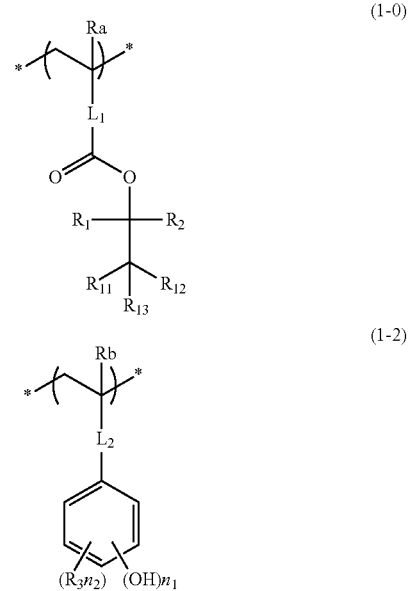

14 Claims, No Drawings

(51) Int. Cl.

| | | |
|---|---|---|
| C08F 220/26 | (2006.01) | |
| C08F 220/20 | (2006.01) | |
| H01L 21/027 | (2006.01) | |
| C08F 14/18 | (2006.01) | |
| C08F 16/10 | (2006.01) | |
| C08F 24/00 | (2006.01) | |
| G03F 7/20 | (2006.01) | |
| G03F 7/039 | (2006.01) | |
| G03F 7/32 | (2006.01) | |

(52) U.S. Cl.
CPC ....... *H01L 21/0273* (2013.01); *H01L 21/0274* (2013.01)

(56) References Cited

U.S. PATENT DOCUMENTS

| | | | |
|---|---|---|---|
| 8,795,948 B2* | 8/2014 | Dazai et al. | 430/270.1 |
| 8,802,352 B2* | 8/2014 | Ichikawa et al. | 430/270.1 |
| 8,841,060 B2* | 9/2014 | Kataoka et al. | 430/270.1 |
| 8,883,396 B2* | 11/2014 | Yahagi et al. | 430/270.1 |
| 9,017,924 B2* | 4/2015 | Takaki et al. | 430/270.1 |
| 2005/0064327 A1 | 3/2005 | Yasunami et al. | |
| 2010/0055608 A1* | 3/2010 | Ohashi et al. | 430/270.1 |
| 2010/0136485 A1* | 6/2010 | Hasegawa et al. | 430/296 |
| 2011/0236826 A1* | 9/2011 | Hatakeyama et al. | 430/270.1 |
| 2011/0236831 A1* | 9/2011 | Hasegawa et al. | 430/285.1 |
| 2011/0300485 A1 | 12/2011 | Tsubaki et al. | |
| 2012/0208124 A1* | 8/2012 | Iwashita et al. | 430/270.1 |
| 2012/0328987 A1* | 12/2012 | Hatakeyama et al. | 430/285.1 |
| 2013/0022911 A1* | 1/2013 | Utsumi et al. | 430/270.1 |
| 2013/0084523 A1* | 4/2013 | Nakamura et al. | 430/270.1 |
| 2013/0189619 A1* | 7/2013 | Komuro et al. | 430/270.1 |
| 2013/0209936 A1* | 8/2013 | Hatakeyama et al. | 430/285.1 |
| 2013/0260312 A1* | 10/2013 | Suzuki et al. | 430/270.1 |
| 2014/0186769 A1* | 7/2014 | Kaiho et al. | 430/285.1 |

FOREIGN PATENT DOCUMENTS

| | | |
|---|---|---|
| JP | 2005-275282 A | 10/2005 |
| JP | 2010-217884 A | 9/2010 |
| JP | 2012-073398 A | 4/2012 |
| JP | 2013-174715 A | 9/2013 |
| WO | 2013/047092 A1 | 4/2013 |

OTHER PUBLICATIONS

Written Opinion dated Nov. 12, 2013, issued by the International Searching Authority in counterpart International Application No. PCT/JP2013/072485.

Notification of Reasons for Refusal from the Japanese Patent Office dated May 12, 2015 in a counterpart Japanese application No. 2013-054401.

Notice of Submission of Opinion dated Jun. 10, 2016, issued by the Korean Intellectual Property Office in corresponding KR Application No. 10-2015-7004408.

* cited by examiner

PATTERN FORMING METHOD, ELECTRON BEAM-SENSITIVE OR EXTREME ULTRAVIOLET RAY-SENSITIVE RESIN COMPOSITION, RESIST FILM, AND METHOD FOR MANUFACTURING ELECTRONIC DEVICE, AND ELECTRONIC DEVICE USING THE SAME

CROSS-REFERENCE TO RELATED APPLICATION

This is a continuation of International Application No. PCT/JP2013/072485 filed on Aug. 16, 2013, and claims priority from Japanese Patent Application Nos. 2012-181892 filed on Aug. 20, 2012, and 2013-054401 filed on Mar. 15, 2013, the entire disclosures of which are incorporated herein by reference.

TECHNICAL FIELD

The present invention relates to a pattern forming method using a developer containing an organic solvent, which is suitably used in a super micro lithography process such as a manufacturing process of a super LSI or high capacity microchip or other photofabrication processes, an electron beam-sensitive or an extreme ultraviolet ray-sensitive resin composition, and a resist film, and a method for manufacturing an electronic device, and an electronic device using the same. More specifically, the present invention relates to a pattern forming method using a developer containing an organic solvent, which is suitably used in a micromachining process of semiconductor device using an electron beam or EUV ray (wavelength: near 13 nm), an electron beam-sensitive or an extreme ultraviolet ray-sensitive resin composition, and a resist film, and a method for manufacturing an electronic device, and an electronic device using the same.

BACKGROUND ART

A micromachining by a lithography using a photoresist composition has been conducted in a conventional manufacturing process of a semiconductor device such as an IC or LSI. Recently, an ultrafine pattern formation of a submicron region or a quarter micron region has been required, because an integration level of an integrated circuit becomes higher. Accordingly, an exposure wavelength has a tendency to become shorter from g line to i line, and further to a KrF excimer laser ray. Furthermore, development of a lithography using an electron beam or X-ray or EUV ray other than the excimer laser ray is now progressing.

These electron beam or X-ray or EUV ray lithography takes a position as a pattern forming technique of the next generation or the next of the next generation, and a resist composition of a high sensitivity and high resolution is desired. Particularly, a high sensitization is a very important problem to be solved for shortening of a processing time of wafer. However, when intending to the high sensitization, a resolution which is represented by a pattern shape or limiting resolution line width is prone to be reduced. Thus, the development of a resist composition which is capable to satisfy these characteristics at the same time is highly demanded.

A high sensitivity, a high resolution and a good pattern shape are in a relationship of a tradeoff therebetween, and thus it is very important how to satisfy them at the same time.

In order to solve the problems, for example, Japanese Patent Application Laid-Open No. 2005-91712 discloses a positive type resist composition using a resin having a certain repeating unit of an acid-decomposable group having an alicyclic group and a certain polystyrene repeating unit. According to the document, the resolution and the sensitivity are said to be improved.

However, in a positive type image forming method, an isolated line or dot pattern may be formed well, but the shapes of patterns are easy to deteriorate when an isolated space or fine hole patterns are formed.

In addition, a pattern forming method using a developer containing an organic solvent has been developed recently (for example, see Japanese Patent Application Laid-Open No. 2010-217884). According to this method, it is said that the stable formation of a micro pattern in high precision is possible. Further, in recent years, the needs of the formation of fine isolated space patterns and the refinement of hole patterns are rapidly increasing. Because of this, a further performance improvement on sensitivity, resolution, and space width roughness performance is required in the formation of fine isolated space patterns having a space width of 100 nm or less. Similarly, in the case of forming a hole pattern having fine pore diameter (for example, 50 nm or less), a further performance improvement on high resolution, good exposure latitude (EL), and the uniformity of local pattern dimension (Local-CDU) is required.

An object of the present invention is to provide a pattern forming method, an electron beam-sensitive or an extreme ultraviolet ray-sensitive resin composition, and a resist film, and a method for manufacturing an electronic device, and an electronic device using the same, in which the pattern forming method provides an excellent sensitivity, resolution, and space width roughness performance in the formation of fine isolated space patterns having a space width of 100 nm or less, and also provides a high resolution, a good exposure latitude (EL), and an excellent uniformity of local pattern dimension (Local-CDU) in the case of forming a hole pattern having fine pore diameter (for example, 50 nm or less).

SUMMARY OF INVENTION

The present invention is as follows.

[1] A pattern forming method, including:

(a) forming a film by using an electron beam-sensitive or extreme ultraviolet ray-sensitive resin composition containing a resin (A) having a repeating unit represented by Formula (1-0) and a repeating unit represented by Formula (1-2);

(b) exposing the film by using an electron beam or extreme ultraviolet ray; and (c) developing the exposed film by using a developer containing an organic solvent to form a negative pattern, wherein a content of the repeating unit represented by Formula (1-0) is 45 mol % or more based on a whole repeating units in the resin (A):

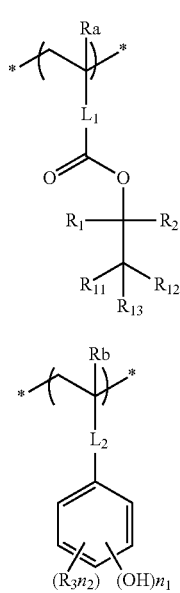

wherein in Formula (1-0), $R_1$ and $R_2$ each independently represent an alkyl group, $R_{11}$ and $R_{12}$ each independently represent an alkyl group, $R_{13}$ represents a hydrogen atom or an alkyl group, $R_{11}$ and $R_{12}$ may be bound with each other to form a ring, and $R_{11}$ and $R_{13}$ may be bound with each other to form a ring, Ra represents a hydrogen atom, an alkyl group, a cyano group or a halogen atom, and $L_1$ represents a single bond or a divalent linking group, in Formula (1-2), Rb represents a hydrogen atom, an alkyl group, a cyano group or a halogen atom, $R_3$ represents a substituent, $n_1$ represents an integer of 1 or 2, $n_2$ represents an integer of 0 to 4, when $n_2$ represents an integer of 2 to 4, $R_3$'s may be bound with each other to form a ring, and $L_2$ represents a single bond, —COO— or —CONR$_4$—, and $R_4$ represents a hydrogen atom or an alkyl group.

[2] The pattern forming method according to [1], wherein the repeating unit represented by Formula (1-0) is a repeating unit represented by Formula (1-1):

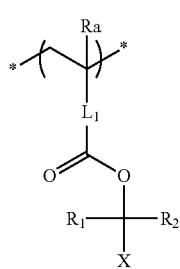

wherein in Formula (1-1),

X represents an alicyclic group, $R_1$ and $R_2$ each independently represent an alkyl group, Ra represents a hydrogen atom, an alkyl group, a cyano group or a halogen atom, and $L_1$ represents a single bond or a divalent linking group.

[3] The pattern forming method according to [2], wherein X in Formula (1-1) is a cyclohexyl group or a cyclopentyl group.

[4] The pattern forming method according to any one of [1] to [3], wherein the content of the repeating unit represented by Formula (1-0) or (1-1) is 55 mol % or more based on the whole repeating units in the resin (A).

[5] The pattern forming method according to any one of [1] to [4], wherein a content of the repeating unit represented by Formula (1-2) is 15 mol % or more based on the whole repeating units in the resin (A).

[6] The pattern forming method according to any one of [1] to [5], wherein both of $R_1$ and $R_2$ in Formula (1-0) or (1-1) are an alkyl group having 2 to 10 carbon atoms.

[7] The pattern forming method according to [6], wherein both of $R_1$ and $R_2$ in Formula (1-0) or (1-1) are an ethyl group.

[8] The pattern forming method according to any one of [1] to [7], wherein the resin (A) further contains a repeating unit represented by Formula (2), the content of the repeating unit represented by Formula (1-0) or (1-1) is 45 to 85 mol % based on the whole repeating units in the resin (A), a content of the repeating unit represented by Formula (1-2) is 15 to 45 mol % based on the whole repeating units in the resin (A), and a content of the repeating unit represented by Formula (2) is 1 to 40 mol % based on the whole repeating units in the resin (A):

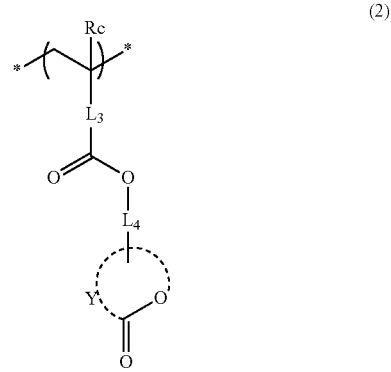

wherein in Formula (2), $L_3$ and $L_4$ each independently represent a single bond or a divalent linking group, Y represents an atomic group capable of forming a lactone structure, and Rc represents a hydrogen atom, an alkyl group, a cyano group or a halogen atom.

[9] The pattern forming method according to any one of [1] to [8], wherein the electron beam-sensitive or extreme ultraviolet ray-sensitive resin composition further contains a compound (B) capable of generating an acid upon the irradiation with an electron beam or extreme ultraviolet, and the compound (B) is a compound represented by Formula (3-1) or (3-2):

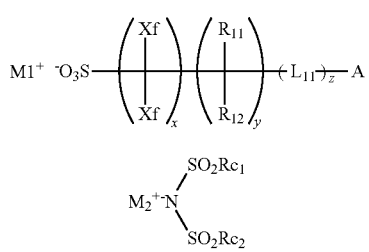

wherein in Formula (3-1),

Xf's each independently represents a fluorine atom or an alkyl group substituted with at least one fluorine atom, $R_{11}$ and $R_{12}$ each independently represent a hydrogen atom, a fluorine atom or an alkyl group, and when a plurality of $R_{11}$ and $R_{12}$ is present, $R_{11}$'s may be the same or different and $R_{12}$'s may be the same or different, $L_{11}$ represents a divalent linking group, and when a plurality of $L_{11}$ is present, $L_{11}$'s may be the same or different, A represents an organic group, $M1^+$ represents a cation, x represents an integer of 1 to 20, y represents an integer of 0 to 10, z represents an integer of 0 to 10, in Formula (3-2), $Rc_1$ and $Rc_2$ each independently represent an organic group, and $Rc_1$ and $Rc_2$ may be bound with each other to form a ring, and $M2^+$ represents a cation.

[10] The pattern forming method according to any one of [1] to [9], for use in fabricating semiconductor microcircuits.

[11] An electron beam-sensitive or extreme ultraviolet ray-sensitive resin composition used for the pattern forming method according to any one of [1] to [10].

[12] A resist film formed by using the electron beam-sensitive or extreme ultraviolet ray-sensitive resin composition according to [11].

[13] A method for manufacturing an electronic device comprising the pattern forming method according to any one of [1] to [10].

[14] An electronic device manufactured by the method according to [13].

It is also preferred that the present invention has the following constitution.

[15] The pattern forming method according to any one of [1] to [10], in which Rb in Formula (1-2) is a hydrogen atom.

[16] The pattern forming method according to any one of [1] to [10] and [15], in which the electron beam-sensitive or an extreme ultraviolet ray-sensitive resin composition further contains a basic compound.

[17] The pattern forming method according to any one of [1] to [10], [15] and [16], in which the electron beam-sensitive or an extreme ultraviolet ray-sensitive resin composition further contains a solvent (C).

[18] The pattern forming method according to any one of [1] to [10] and [15] to [17], in which the electron beam-sensitive or an extreme ultraviolet ray-sensitive resin composition further contains a surfactant.

DESCRIPTION OF EMBODIMENTS

Hereinafter, exemplary embodiments of the present invention will be described in detail.

In representing a group (atomic group) in the present specification, the representation which does not specify substitution or unsubstitution also includes having substituents along with having no substituent. For example, "an alkyl group" which does not specify substitution or unsubstitution includes not only an alkyl group having no substituent (an unsubstituted alkyl group) but also an alkyl group having a substituent (a substituted alkyl group).

The term "light" in the present specification refers to an electron beam (EB) as well as an extreme ultraviolet ray (EUV).

In addition, unless otherwise specifically indicated, the term "exposure" in the present specification includes not only the exposure performed by an extreme ultraviolet ray, but also the drawing performed by an electron beam.

[Pattern Forming Method]

The pattern forming method of the present invention at least includes (a) forming a film by using an electron beam-sensitive or an extreme ultraviolet ray-sensitive resin composition containing a resin (A) having a repeating unit represented by the following Formula (1-0) and a repeating unit represented by the following Formula (1-2), (b) exposing the film by using an electron beam or an extreme ultraviolet ray, and (c) developing the exposed film by using a developer containing an organic solvent to form a negative pattern, in which the content of the repeating unit represented by Formula (1-0) is 45 mol % or more based on the whole repeating units in the resin (A).

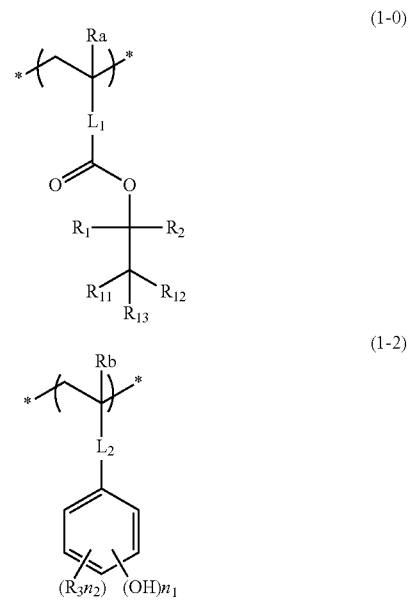

In Formula (1-0), $R_1$ and $R_2$ each independently represent an alkyl group, $R_{11}$ and $R_{12}$ each independently represent an alkyl group, and $R_{13}$ represents a hydrogen atom or an alkyl group. $R_{11}$ and $R_{12}$ may be bound with each other to form a ring, and $R_{11}$ and $R_{13}$ may be bound with each other to form a ring.

Ra represents a hydrogen atom, an alkyl group, a cyano group or a halogen atom, and $L_1$ represents a single bond or a divalent linking group.

In Formula (1-2),

Rb represents a hydrogen atom, an alkyl group, a cyano group or a halogen atom.

$R_3$ represents a substituent.

$n_1$ represents an integer of 1 or 2.

$n_2$ represents an integer of 0 to 4.

When $n_2$ represents an integer of 2 to 4, $R_3$'s may be bound with each other to form a ring.

$L_2$ represents a single bond, —COO— or —CONR$_4$—, and $R_4$ represents a hydrogen atom or an alkyl group.

According to the pattern forming method of the present invention, it provides an excellent sensitivity, resolution, and space width roughness are excellent in the formation of fine isolated space patterns having a space width of 100 nm or less, and also provides a high resolution, a good exposure latitude (EL), and an excellent uniformity of local pattern dimension (Local-CDU) in the case of forming a hole pattern having fine pore diameter (for example, 50 nm or less). The reason is not clear, but it is estimated as follows.

The resin (A) of the present invention may have a repeating unit represented by Formula (1-2), the activation energy (Ea) of the acid decomposition reaction of the repeating unit represented by Formula (1-0) is small, and the molar ratio is 45 mol % or more, and thus it has high sensitivity and increased solution contrast. As a result, high resolution and excellent space width roughness may be considered to be achieved in forming a fine isolated space pattern having a space width of 100 nm or less. In the case of forming a hole pattern having a fine pore diameter (for example, 50 nm or less), similarly, the present invention may have a repeating unit represented by Formula (1-2), the activation energy (Ea) of the acid decomposition reaction of the repeating unit represented by Formula (1-0) is small, and the molar ratio is 45 mol % or more, and thus it has shorten effective diffusion length of the generated acid and increased solution contrast. As a result, high resolution, good EL, and the uniformity (Local-CDU) of the local pattern dimension may be considered to be achieved.

The effect is regarded as particularly outstanding in the case of forming a fine pattern by an electron beam or extreme ultraviolet exposure.

In addition, a pattern forming method carrying out the exposure by an electron beam or extreme ultraviolet is expected to form a fine pattern (for example, a pattern having a line width or space width of 50 nm or less space width) in good condition.

However, for example, in the case of forming a line and space pattern in which the line width or space width is 50 nm or less and the ratio of line width to space width is 1:1, because the stronger capillary force is easy to occur in the fine space formed in the development process, when the developer is discharged from the space, the capillary force is applied to the sidewalls of the pattern having a fine line width. And, in the case where the positive pattern is formed by the alkali developer, because the affinity of the pattern of the resin as a main component and the alkali developer tends to be lower, the capillary force applied to the sidewalls of the pattern becomes bigger, and thus the collapse of the pattern is easy to occur.

Meanwhile, in the case of forming a negative pattern by the organic developer as in the present invention, because the affinity of the pattern of the resin as a main component and the organic developer tends to be higher, the capillary force applied to the sidewalls of the pattern becomes smaller, and thus the collapse of the pattern is difficult to occur. Thus, according to the present invention, it is thought that high resolution may be achieved. In addition, it is thought that the small capillary force contributes to the improvement of the space width roughness.

(1) Film Formation

The resist film of the present invention is a film formed by an electron beam-sensitive or extreme ultraviolet ray-sensitive resin composition.

More specifically, the formation of the resist film may be performed by dissolving each following component of the electron beam-sensitive or extreme ultraviolet ray-sensitive resin composition in a solvent, if necessary, filtering the solution through a filter, and then applying the filtered solution on the support (substrate). The filter used for filtration is preferably a polytetrafluoroethylene-, polyethylene- or nylon-made filter having a pore size of 0.5 μm or less, more preferably 0.2 μm or less, and still more preferably 0.1 μm or less.

The composition may be applied on a substrate used in the manufacture of the integrated circuit devices (for example, silicon or silicon dioxide coated) by the appropriate coating method such as spin coater. After that, drying is performed to form a photosensitive film. It is preferred that the heating (prebake) is performed in the drying step.

The film thickness is not particularly limited, but is preferably in a range of 10 to 500 nm, more preferably a range of 10 to 200 nm, and still more preferably a range of 10 to 100 nm. When applying an electron beam-sensitive or extreme ultraviolet ray-sensitive resin composition on a spinner, the rotational speed is usually 500 to 3000 rpm, preferably 800 to 2000 rpm, and more preferably 1000 to 1500 rpm.

The temperature of heating (prebake) is preferably 60 to 200° C., more preferably 80 to 150° C., and still more preferably 90 to 140° C.

The time of heating (prebake) is not particularly limited, but it is preferably 30 to 300 seconds, more preferably 30 to 180 seconds, and still more preferably 30 to 90 seconds.

The heating process may be performed by the means equipped with the common exposure development device, or by using a hot plate and the like.

If necessary, commercially available inorganic or organic anti-reflective film may be used. The anti-reflective film may be coated on the lower layer of an electron beam-sensitive or extreme ultraviolet ray-sensitive resin composition and used. As an anti-reflective film, all of an inorganic film type such as titanium, titanium dioxide, titanium nitride, chromium oxide, carbon and amorphous silicon, and an organic film type composed of a light absorber and a polymer material may be used. In addition, as an organic anti-reflective film, commercially available organic anti-reflective films such as DUV30 series or DUV-40 series manufactured by Brewer Science Corporation, and AR-2, AR-3 and AR-5 manufactured by Shipley Corporation may be used.

(2) Exposure

The exposure may be performed by an extreme ultraviolet (EUV light) or an electron beam (EB). In the case where the extreme ultraviolet (EUV light) is used as an exposure source, it is preferably irradiated on the formed film throughout the predetermined mask EUV light (near 13 nm). When the electron beam (EB) is irradiated, the drawing (a direct drawing) without passing through the mask is common. The exposure step may be preferably performed by using an extreme ultraviolet.

(3) Bake

After the exposure, it is preferred that the bake (heat) is performed before the development process.

The temperature of heating is preferably 60 to 150° C., more preferably 80 to 150° C., and still more preferably 90 to 140° C.

The time of heating is not particularly limited, but it is preferably 30 to 300 seconds, more preferably 30 to 180 seconds, and still more preferably 30 to 90 seconds.

The heating process may be performed by the means equipped with the common exposure development device, or by using a hot plate and the like.

By baking, the reaction of the exposure portion may be promoted, and the sensitivity or the pattern profile may be improved. In addition, after rinsing process, it is preferred that the heating process (Post Bake) may be included. The heating temperature and the heating time is the same as mentioned above. By baking, the developer and the rinse liquid residual between patterns and inside of the pattern may be removed.

(4) Development

In the present invention, the development is performed by the developer containing an organic solvent.

Developer

The vapor pressure of the developer (in the case of a solvent mixture, the whole vapor pressure) is preferably 5 kPa or less, more preferably 3 kPa or less, and particularly preferably 2 kPa or less, at 20° C. It is thought that, by adjusting the vapor pressure of the organic solvent 5 kPa or less, the evaporation of the developer on a substrate or in the development cup may be suppressed, the temperature uniformity in the wafer surface may be improved, and as a result, the dimension uniformity within the wafer surface may be better. As an organic solvent used in a developer, various an organic solvent may be widely used, but, for example, a solvent such as an ester-based solvent, a ketone-based solvent, an alcohol-based solvent, an amide-based solvent, an ether-based solvent, a hydrocarbon-based solvent and the like may be used.

In the present invention, an ester-based solvent is referred to as a solvent having an ester group in the molecule, a ketone-based solvent is referred to as a solvent having a ketone group in the molecule, an alcohol-based solvent is referred to as a solvent having an alcoholic hydroxyl group in the molecule, an amide-based solvent is referred to as a solvent having an amide group in the molecule, and an ether-based solvent is referred to as a solvent having an ether bond in the molecule. Among them, there are solvents having several kinds of the functional groups in one molecule, but, in that case, the solvent corresponds to all kinds of solvents which contain functional groups possessed by the solvent.

For example, the diethylene glycol monomethyl ether corresponds to both of the alcohol-based solvent and the ether-based solvent in the above classification. In addition, the hydrocarbon-based solvent refers to a hydrocarbon solvent not having a substituent. In particular, the developer may preferably be a developer containing at least one kind of solvent selected from the group of a ketone-based solvent, an ester-based solvent, an alcohol-based solvent and an ether-based solvent.

Examples of the ester-based solvent may include methyl actate, ethyl acetate, butyl acetate, pentyl acetate, isopropyl acetate, amyl acetate, isoamyl acetate, methoxy ethyl acetate, ethoxy ethyl acetate, propylene glycol monomethyl ether acetate (PGMEA; 1-methoxy-2-acethoxypropane), ethylene glycol monoethyl ether acetate, ethylene glycol monopropyl ether acetate, ethylene glycol monobutyl ether acetate, ethylene glycol monophenylether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, diethylene glycol monoethyl ether acetate, 2-methoxybutylacetate, 3-methoxybutylacetate, 4-methoxybutylacetate, 3-methyl-3-methoxybutylacetate, 3-ethyl-3-methoxybutylacetate, propylene glycol monoethylether acetate, propylene glycol monopropylether acetate, 2-ethoxy butylacetate, 4-ethoxy butylacetate, 4-propoxy butylacetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoactate, ethyl acetoactate, methyl propionate, ethyl propionate, propyl propionate, isopropyl propionate, methyl 2-hydroxy propionate, ethyl 2-hydroxy propionate, methyl-3-methoxy propionate, ethyl-3-methoxy propionate, ethyl-3-ethoxy propionate, propyl-3-methoxy propionate and the like.

Examples of the ketone-based solvent may include 1-octanone, 2-octanone, 1-nonanone, 2-nonanone, acetone, 2-heptanone, 4-heptanone, 1-hexanone, 2-hexanone, diisobutyl ketone, cyclohexanone, methylcyclohexanone, phenylacetone, methyl ethyl ketone, methyl isobutyl ketone, acetyl acetone, acetonyl acetone, ionone, diacetonyl alcohol, acetyl carbinol, acetophenone, methyl naphthyl ketone, isophorone, propylene carbonate and the like.

Examples of the alcohol-based solvent may include an alcohol such as methyl alcohol, ethyl alcohol, n-propyl alcohol, isopropyl alcohol, n-butyl alcohol, sec-butyl alcohol, t-butyl alcohol, isobutyl alcohol, n-hexyl alcohol, n-heptyl alcohol, n-octyl alcohol, n-decanol and 3-methoxy-1-butanol, a glycol-based solvent such as ethylene glycol, diethylene glycol and triethylene glycol, and a glycol ether-based solvent containing a hydroxy group such as ethylene glycol monomethyl ether, propylene glycol monomethyl ether (PGME; 1-methoxy-2-propaneol), diethylene glycol monomethyl ether, triethylene glycol monoethyl ether, methoxymethyl butanol, ethylene glycol monoethyl ether, ethylene glycol monopropyl ether, ethylene glycol monobutyl ether, propylene glycol monoethyl ether, propylene glycol monopropyl ether, propylene glycol monobutyl ether and propylene glycol monophenyl ether. Among these solvents, it is preferred to use a glycol ether-based solvent.

Examples of the ether-based solvent may include a solvent other than the glycol ether-based solvents containing a hydroxyl group, a glycol ether-based solvents containing no hydroxyl group such as propylene glycol dimethyl ether, propylene glycol diethyl ether, diethylene glycol dimethyl ether and dietylene glycol diethyl ether, and an aromatic ether solvent such as anisole, phenetol, dioxane, tetrahyrofuran, tetrahydropyran, perfluoroalkyl-2-butyl tetrahydrofuran, perfluoro tetrahyro furan and 1,4-dioxane. Preferably, the glycol ether-based solvents or the aromatic ether solvents such as anisole may be used.

Examples of the amide-based solvent may include N-methyl-2-pyrrolidone, N,N-dimethylacetamide, N,N-dimethylformamide, hexamethylphosphoric triamide, 1,3-dimethyl-2-imidazolidinone and the like.

Examples of the hydrocarbon-based solvent may include an aliphatic hydrocarbon-based solvent such as pentane, hexane, octane, decane, 2,2,4-trimethylpentane, 2,2,3-trimethylhexane, perfluorohexane and perfluoroheptane, and an aromatic hydrocarbon-based solvent such as toluene, xylene, ethylbenzene, propylbenzene, 1-methylpropylbenzene, 2-methylpropylbenzene, dimethylbenzene, diethylbenzene, ethylmethylbenzene, trimethylbenzene, ethyldimethylbenzene and dipropylbenzene. Among these, an aromatic hydrocarbon-based solvent is preferred.

A plurality of the solvents may be mixed, or the solvents may be used in a mixture with a solvent other than those described above or with water. However, in order to sufficiently exhibit the effects of the present invention, the water content ratio of the entire developer is preferably less than 10% by mass, and it is more preferred that the developer contains substantially no moisture.

That is, the concentration (the sum in the case of a multiple mixture) of the organic solvent used in the developer is preferably 50% by mass or more, more preferably 70% by mass or more, and still more preferably 90% by mass or more. In particular, the developer is preferably a developer substantially consisting of only an organic solvent. In addition, the case of being substantially consisted of only an organic solvent is the case where the solvent includes a small amount of surfactants, antioxidants, stabilizers, anti-foaming agent, and the like.

Among the solvents, those containing one or more kinds selected from the group consisting of butyl acetate, pentyl acetate, isopentyl acetate, propylene glycol monomethyl ether acetate, 2-heptanone and anisole are more preferred.

The organic solvent used as a developer may be preferably an ester based solvent. As the ester based solvent, the solvents represented by the following Formula (S1) or the following Formula (S2) may be preferably used, the solvents represented by the following Formula (S1) may be more preferably used, and alkyl acetate may be particularly preferably used, and butyl acetate, pentyl acetate or isopentyl acetate may be most preferably used.

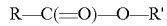  Formula (S1)

In Formula (S1),

R and R' each independently represent a hydrogen atom, an alkyl group, a cycloalkyl group, an alkoxyl group, an alkoxy carbonyl group, a carboxyl group, a hydroxyl group, a cyano group or a halogen atom. R and R' may be bond with each other to form a ring.

The alkyl group, the alkoxyl group and the alkoxycarbonyl group for R and R' have preferably 1 to 15 carbon atoms, and the cycloalkyl group has preferably 3 to 15 carbon atoms.

R and R' are preferably a hydrogen atom or an alkyl group. The alkyl group, the cycloalkyl group, the alkoxyl group and the alkoxycarbonyl group for R and R', and the ring formed by R and R' being bound with each other may be substituted with a hydroxyl group, a group containing a carbonyl group (for example, an acyl group, an aldehyde group, an alkoxycarbonyl, and the like), a cyano group, and the like.

Examples of the solvent represented by Formula (S1) may include methyl acetate, butyl acetate, ethyl acetate, isopropyl acetate, amyl acetate, isoamyl acetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, 2-hydroxy methyl propionate, 2-hydroxy ethyl propionate, and the like.

Among these, each R and R' is preferably an unsubstitued alkyl group.

The solvent represented by Formula (S1) is preferably alkyl acetate, and more preferably butyl acetate, pentyl acetate or isopentyl acetate.

The solvent represented by Formula (S1) may be used in combination with one or more kinds of other organic solvents. The combined solvent in this case is not particularly limited as long as the combined solvent is able to be mixed without separation from the solvent represented by Formula (S1). The solvents represented by Formula (S1) may be used in combination with each other, and the solvent represented by Formula (S1) may be used in a mixture with a solvent selected from other ester-based solvents, ketone-based solvents, alcohol-based solvents, amide-based solvents, ether-based solvents and hydrocarbon-based solvents. One or more kinds of the combined solvents may be used, but one kind of the combined solvent is preferred to obtain a stable performance. In the case of using a mixture of one or more kinds of the combined solvents, the mixing ratio of the solvent represented by Formula (S1) and the combined solvent is usually 20:80 to 99:1, preferably 50:50 to 97:3, more preferably 60:40 to 95:5, and most preferably 60:40 to 90:10 by mass.

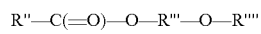  Formula (S2)

In Formula (S2),

R" and R"" each independently represent a hydrogen atom, an alkyl group, a cycloalkyl group, an alkoxyl group, an alkoxy carbonyl group, a carboxyl group, a hydroxyl group, a cyano group or a halogen atom. R" and R"" may be bond with each other to form a ring.

R" and R"" are preferably a hydrogen atom or an alkyl group. The alkyl group, the alkoxyl group and the alkoxycarbonyl group for R" and R"" have preferably 1 to 15 carbon atoms, and the cycloalkyl group has preferably 3 to 15 carbon atoms.

R''' represents an alkylene group or a cycloalkylene group. R''' is preferably alkylene group. The alkylene group for R''' has preferably 1 to 10 carbon atoms, and the cycloalkylene group has preferably 3 to 15 carbon atoms.

The alkyl group, the cycloalkyl group, the alkoxyl group and the alkoxycarbonyl group for R" and R"", the alkylene group and cycloalkylene group for R''', and the ring formed by R" and R"" being bound with each other may be substituted with a hydroxyl group, a group containing a carbonyl group (for example, an acyl group, an aldehyde group, an alkoxycarbonyl, and the like), a cyano group, and the like.

The alkylene group of R''' in Formula (S2) may have an ether bond in the alkylene chain.

Examples of the solvent represented by Formula (S2) may include propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monophenyl ether acetate, diethylene glycol monobutyl ether acetate, diethylene glycol monoethyl ether acetate, propylene glycol monoethyl ether acetate, propylene glycol monopropyl ether acetate, methyl-3-methoxypropionate, ethyl-3-methoxypropionate, ethyl-3-ethoxypropionate, propyl-3-methoxypropionate, methoxy methyl acetate, ethoxy ethyl acetate, 2-methoxybutylacetate, 3-methoxybutylacetate, 4-methoxybutylacetate, 3-methyl-3-methoxybutylacetate, 3-ethyl-3-methoxybutylacetate, 2-ethoxybutylacetate, 4-ethoxybutylacetate, 4-propoxy butylacetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, and the like, and preferably propylene glycol monomethyl ether acetate.

Among them, each R″ and R″″ is an unsubstituted alkyl group, R‴ is preferably an unsubstituted alkylene group, each R″ and R″″ may be more preferably any one of a methyl group and an ethyl group, and each R″ and R″″ is more preferably a methyl group.

The solvent represented by Formula (S2) may be used in combination with one or more kinds of other organic solvents. The combined solvent in this case is not particularly limited as long as the combined solvent is able to be mixed without separation from the solvent represented by Formula (S2). The solvents represented by Formula (S2) may be used in combination with each other, and the solvent represented by Formula (S2) may be used in a mixture with a solvent selected from other ester-based solvent, ketone-based solvent, alcohol-based solvent, amide-based solvent, ether-based solvent and hydrocarbon-based solvent. One or more kinds of the combined solvents may be used, but one kind of the combined solvent is preferred to obtain a stable performance. In the case of using a mixture of one or more kinds of the combined solvents, the mixing ratio of the solvent represented by Formula (S2) and the combined solvent is usually 20:80 to 99:1, preferably 50:50 to 97:3, more preferably 60:40 to 95:5, and most preferably 60:40 to 90:10 by mass.

Further, the organic solvent used as a developer is preferably an ether-based solvent.

The available ether-based solvent may be the ether-based solvent, preferably an ether-based solvent containing one or more of aromatic rings among them, more preferably the solvent represented by the following Formula (S3), and most preferably anisole.

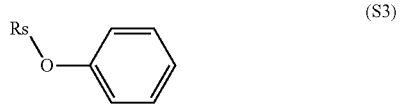

(S3)

In Formula (S3), $R_S$ represents an alkyl group. The alkyl group may preferably have 1 to 4 carbon atoms, more preferably be a methyl group or an ethyl group, and most preferably a methyl group.

In the present invention, the water content ratio of the developer is usually less than 10% by mass, preferably less than 5% by mass, and more preferably less than 1% by mass, and it is most preferred that the developer contains substantially no moisture.

Surfactants

The developer containing an organic solvent may contain a surfactant in an appropriate amount, if necessary.

As a surfactant, the same surfactant may be used as in the electron beam-sensitive or extreme ultraviolet ray-sensitive resin composition.

The amount of the surfactant used is usually 0.001% by mass to 5% by mass, preferably 0.005% by mass to 2% by mass, and more preferably 0.01% by mass to 0.5% by mass, based on the total amount of the developer.

Basic Compound

The developer containing an organic solvent may contain a basic compound.

Specific examples and preferable examples of the basic compound which may be contained in the developer of the present invention may be the same as those of the basic compound which may be contained in the following actinic ray-sensitive or radiation-sensitive resin composition.

Developing Method

As for the developing method, it is possible to apply, for example, a method of dipping a substrate in a bath filled with a developer for a certain period of time (dipping method), a method of raising a developer on a substrate surface sufficiently by the effect of a surface tension and keeping the substrate for a certain period of time, thereby performing development (puddle method), a method of spraying a developer on a substrate surface (spraying method), a method of continuously ejecting a developer on a substrate spinning at a constant speed while scanning a developer ejecting nozzle at a constant rate (dynamic dispense method) and the like.

In addition, after performing the process of development, the process of development may be carried out to stop it, while replacing with other solvents.

The time of developing is not particularly limited to as long as the resin of the unexposed portion melts sufficiently, and it is usually 10 to 300 seconds, and preferably 20 to 120 seconds.

The temperature of the developer is preferably 0° C. to 50° C., and more preferably 15° C. to 35° C.

(5) Rinse

The pattern forming method of the present invention may include the cleaning process (5) using a rinse liquid containing an organic solvent, after the development process (4), but it is preferred not to include the rinsing process from the viewpoint of the using amount of the rinsing solution.

Rinse Liquid

The vapor pressure (the whole vapor pressure in the case of a solvent mixture) of the rinse liquid used after the step of developing is preferably 0.05 kPa to 5 kPa, still more preferably 0.1 kPa to 5 kPa, and most preferably 0.12 kPa to 3 kPa, at 20° C. By setting the vapor pressure of the rinse liquid to 0.05 kPa to 5 kPa, the temperature uniformity in the wafer plane is improved, and furthermore, swelling caused by permeation of the rinse liquid is suppressed, and as a result, the dimensional uniformity in the wafer plane is improved.

As the rinse liquid, various an organic solvent may be used, but it is preferred that a rinse liquid containing at least one kind of an organic solvent selected from a hydrocarbon-based solvent, a ketone-based solvent, an ester-based solvent, an alcohol-based solvent, an amide-based solvent and an ether-based solvent, or water.

More preferably, after the process of development, a step of performing washing using a rinse liquid containing at least one of an organic solvent selected from the group consisting of a ketone-based solvent, an ester-based solvent, an alcohol-based solvent and an amide-based solvent is preformed. Still more preferably, after the process of development, a step of performing washing using a rinse liquid containing an alcohol-based solvent or a hydrocarbon-based solvent is performed.

Particularly preferably, rinse liquid containing at least one selected from a monohydric alcohol and hydrocarbon-based solvent is used.

Here, examples of the monohydric alcohol used in the rinsing step after the development may includes a straight, branched or cyclic monohydric alcohol, and specifically, it is possible to use 1-butanol, 2-butanol, 3-methyl-1-butanol, tert-butylalcohol, 1-pentanol, 2-pentanol, 1-hexanol, 1-heptanol, 1-octanol, 2-hexanol, 2-heptanol, 2-octanol, 3-hexanol, 3-heptanol, 3-octanol, 4-octanol, 3-methyl-3-pentanol, cyclopentanol, 2,3-dimethyl-2-butanol, 3,3-dimethyl-2-butanol, 2-methyl-2-pentanol, 2-methyl-3-pentanol, 3-methyl-2-pentanol, 3-methyl-3-pentanol, 4-methyl-2-pentanol, 4-methyl-3-pentanol, cyclohexanol, 5-methyl-2-hexanol, 4-methyl-2-hexanol, 4,5-dityl-2-hexanol, 6-methyl-2-heptanol, 7-methyl-2-octanol, 8-methyl-2-nonanol, 9-methyl-2-decanol, and the like, preferably 1-hexanol, 2-hexanol, 1-pentanol, 3-methyl-1-butanol, 3-methyl-2-pentanol, 3-methyl-3-pentanol, 4-methyl-2-pentanol, 4-methyl-3-pentanol, and most preferably 1-hexanol or 4-methyl-2-pentanol.

Examples of hydrocarbon-based solvent may include an aromatic hydrocarbon-based solvent such as toluene and xylene, and an aliphatic hydrocarbon-based solvent such as octane and decane.

The rinse liquid contains more preferably at least one kind selected from the group consisting of 1-hexanol, 4-methyl-2-pentanol and decane.

A plurality of the components may be mixed, or they may be used in a mixture with an organic solvent other than those described above. The solvent may be mixed with water, but the water content ratio of the rinse liquid is usually 60% by mass or less, preferably 30% by mass or less, more preferably 10% by mass or less, most preferably 5% by mass or less. By setting the water content 60% by mass or less, good rinse effect may be obtained.

The rinse liquid may also be used by adding an appropriate amount of a surfactant thereto. As a surfactant, the same surfactant may be used as in the electron beam-sensitive or extreme ultraviolet ray-sensitive resin composition. The amount of the surfactant used is usually 0.001% by mass to 5% by mass, preferably 0.005% by mass to 2% by mass, and more preferably 0.01% by mass to 0.5% by mass, based on the total amount of the rinse liquid.

Rinsing Method

In the rinsing process, the wafer subjected to development is washed by using the rinse liquid including an organic solvent.

The method of washing treatment is not particularly limited, but it is possible to apply, for example, a method of continuously ejecting a rinse liquid on a substrate spinning at a constant speed (spin coating method), a method of dipping a substrate in a bath filled with a rinse liquid for a fixed time (dipping method), a method of spraying a rinse liquid on a substrate surface (spraying method), and the like, and among them, it is preferred that the rinsing treatment is performed by the spin coating method and after the rinsing, the substrate is spun at a rotational speed from 2,000 rpm to 4,000 rpm to remove the rinse liquid from the substrate.

The time of rinsing is not particularly limited, but it is usually 10 to 300 seconds, preferably 10 to 180 seconds, and most preferably 20 to 120 seconds.

The temperature of the rinse liquid is preferably 0° C. to 50° C., and more preferably 15° C. to 35° C.

In addition, after the development treatment or rinsing treatment, the process of removing the developer or the rinse liquid attached on the pattern may be performed by supercritical fluid.

Further, after the development treatment or rinsing treatment or the treatment by supercritical fluid, the heating treatment may be performed to remove a residual solvent in the pattern. The heating temperature is not particularly limited as long as it may obtain a good resist pattern, and it usually 40° C. to 160° C., preferably 50° C. to 150° C., and most preferably 50° C. to 110° C. The heating time is not particularly limited as long as it may obtain a good resist pattern, and it is usually 15 to 300 seconds, and preferably 15 to 180 seconds.

Alkali Development

The pattern forming method of the present invention includes further a resist pattern forming process (alkali development process) by using an alkali aqueous solution. Accordingly, the finer pattern may be formed.

In the present invention, the portion having weak exposure strength is removed by the organic solvent development process (4), but by performing more the alkali development process, the portion having strong exposure strength may be removed. Because, by the multiple development process performing the development multiple times, the pattern forming method may be carried out without dissolving only the area having an intermediate exposure strength, the finer pattern than as usual may be formed (the same mechanism as in [0077] of Japanese Patent Application Laid-Open No. 2008-292975).

The alkaline development may be performed by using the developer containing an organic solvent before or after the development process (4), but developing before the organic solvent development process (4) is more preferred.

Examples of an alkali aqueous solution which may be used in the alkali development include inorganic alkalis such as sodium hydroxide, potassium hydroxide, sodium carbonate, sodium silicate, sodium methasilicate and ammonia water, primary amines such as ethylamine and n-propylamine, secondary amines such as diethylamine and di-n-butylamine, tertiary amines such as triethylamine and methyldiethylamine, alcohol amines such as dimethylethanol amine and triethanol amine, quaternary ammonium salts such as tetramethyl ammonium hydroxide and tetraethyl ammonium hydroxide, and an alkaline aqueous solution of cyclic amine such as pyrrole and piperidine.

Further, in the alkaline aqueous solution, an appropriate amount of alcohol and surfactants may be added.

The alkaline concentration of the alkali development is usually 0.1 to 20% by mass.

The pH of the alkaline development is usually 10.0 to 15.0.

In particular, a 2.38% by mass aqueous solution of tetramethyl ammonium hydroxide is preferred.

The alkaline development time is not particularly limited, and it is usually 10 to 300 seconds, and preferably 20 to 120 seconds.

The temperature of the alkaline development is preferably 0° C. to 50° C., and more preferably 15° C. to 35° C.

After the development treatment by an alkali aqueous solution, the rinsing treatment may be carried out. As a rinse liquid in the rinsing treatment, the pure water is preferred, and an appropriate amount of surfactants may be added thereto and used.

In addition, after the development process or rinsing process, the heating treatment may be performed to remove the moisture remaining in the pattern.

Further, the process of removing the residual developer or the rinse liquid may be carried out by heating. The heating temperature is not particularly limited as long as it may obtain a good resist pattern, and it usually 40° C. to 160° C. The heating temperature is preferably 50° C. to 150° C., and most preferably 50° C. to 110° C. The heating time is not particularly limited as long as a good resist pattern may be obtained, and it is usually 15 to 300 seconds, and preferably 15 to 180 seconds.

About the film formed with the resist composition according to the present invention, when an electron beam or extreme ultraviolet is irradiated, it is preferred that the liquid (liquid immersion medium) having higher refractive index than the air may be filled between the film and the lens and the exposure (liquid immersion exposure) may be performed. Accordingly, the resolution may be improved. Any available liquid immersion medium may be used as long as it is liquid having higher refractive index than that of the air, but pure water is preferred.

The immersion liquid used for the liquid immersion exposure will be explained below.

The immersion liquid is preferably a liquid which is transparent to light at the exposure wavelength and has a temperature coefficient of refractive index as small as possible in order to minimize the distortion of an optical image projected on the resist film, but water is preferably used, from the viewpoint of easy availability and easy handleability in addition to the above-described viewpoint.

Further, from the point of improving the refractive index further, the medium having the refractive index of 1.5 or more may be used. This medium may be an aqueous solution or an organic solvent.

When water is used as the immersion liquid, it is preferred that an additive (liquid) capable of being negligible the effect on the optical coat at the undersurface of the lens element may be added in a small ratio without dissolving the resist film on the wafer to decrease the surface tension of water and increase the interfacial activity. Such an additive is preferably an aliphatic alcohol having a refractive index almost equal to that of water, and specific examples thereof may include a methyl alcohol, an ethyl alcohol, an isopropyl alcohol and the like. By adding an alcohol having a refractive index almost equal to that of water, even when the alcohol component in water is evaporated and the content concentration thereof is changed, it is possible to obtain an advantage in that the change in the refractive index of the liquid as a whole may be made very small. Meanwhile, when an impurity greatly differing from water in the refractive index is incorporated, the distortion of the optical image projected on the resist may be occurred, and thus, the water used is preferably distilled water. Further, pure water filtered through an ion-exchange filter or the like may also be used.

The electrical resistance of water used is preferably 18.3 MΩcm or more, and TOC (organic concentration) is preferably 20 ppb or less and the water is preferably subjected to deaeration treatment.

Further, the lithography performance may be enhanced by raising the refractive index of the immersion liquid. From this viewpoint, an additive for raising the refractive index may be added to water, or heavy water ($D_2O$) may be used in place of water.

Between the film according to the composition of the present invention and the immersion liquid, in order not to cause the film to directly contact the immersion liquid, a film (hereinafter, also referred to as a "topcoat") that is sparingly soluble in a liquid for liquid immersion may be formed. Examples of a function required for the topcoat may include coating suitability to the upper layer portion of the composition film, and poor solubility in the immersion liquid. It is preferred that the topcoat may be uniformly coated onto the upper layer of the composition film without being mixed with the composition film.

Specific examples of the topcoat may include specifically a hydrocarbon polymer, an acrylateester polymer, polymethacrylate, polyacrylate, polyvinyl ether, a silicone-containing polymer, a fluorine-containing polymer and the like. From the viewpoint that, if impurities are eluted from the topcoat to the immersion liquid, the optical lens is contaminated, it is preferred that the amounts of residual monomer components of the polymer included in the topcoat are less.

When the topcoat is peeled off, a developer may be used, or a separate peeling agent may be used. As the peeling agent, a solvent that rarely penetrates the film is preferred. From the viewpoint that the peeling process may be performed simultaneously with the developing treatment process of the film, it is preferred that the topcoat may be peeled off by the developer containing an organic solvent.

In the case where there is no difference in the refractive index between the topcoat and the immersion liquid, the resolution may be improved. When water is used as the immersion liquid, it is preferred that the topcoat has a refractive index close to the refractive index of the immersion liquid. From the viewpoint of setting the refractive index close to that of the immersion liquid, it is preferred that it has a fluorine atom in the topcoat. Further, from the viewpoint of transparency and refractive index, the topcoat is preferably a thin film.

It is preferred that the topcoat is not mixed with the film and the immersion liquid. From this viewpoint, when the immersion liquid is water, it is preferred that the solvent used for the topcoat is sparingly soluble in the solvent used for the composition of the present invention and is a water-insoluble medium. Further, when the immersion liquid is an organic solvent, the topcoat may be water-soluble or water-insoluble.

When EUV exposure or EB exposure are performed, for the purpose of surpressing the outgas, surpressing the blob defects, preventing the collapse deterioration due to the improvement of the reverse shape, and preventing LWR deterioration due to the surface roughness, the topcoat layer may be formed on the upper layer of the resist film formed by the actinic ray-sensitive or radiation-sensitive resin composition of the present invention. Hereinafter, the topcoat composition being used in forming the topcoat layer will be described.

In the topcoat composition of the present invention, the solvent is preferably water or an organic solvent, and more preferably water or an alcohol-based solvent.

If the solvent is an organic solvent, the solvent not to dissolve the resist film is preferred. The available solvent may preferably use an alcohol-based solvent, a fluorine-based solvent, or a hydrocarbon-based solvent, more preferably a non-fluorine alcohol-based solvent. The alcohol-based solvent may be preferably a primary alcohol, more preferably a primary alcohol having 4 to 8 carbon atoms from the viewpoint of the applying property. The primary alcohol having 4 to 8 carbon atoms may be a straight, branched or cyclic alcohol, but a straight or branced alcohol is preferred. Specific examples thereof may include 1-butanol, 1-hexanol, 1-pentanol and 3-methyl-1-butanol and the like.

If the solvent of the topcoat composition in the present invention is water, an alcohol-based solvent and the like, it may preferably have water-soluble resina water-soluble resin. By containing water-soluble resina water-soluble resin, it is thought that the dissolution uniformity to the developer may be improved. The preferred water-soluble resin includes polyacrylate, polymethacrylate, polyhydroxystyrene, polyvinyl pyrrolidone, polyvinyl alcohol, polyvinyl ether, polyvinyl acetal, polyacrylimide, polyethyleneglycol, polyethyleneoxide, polyethyleneimine, polyesterpolyol and polyetherpolyol, polysaccharides and the like. The water-soluble resin is particularly preferably polyacrylate, polymethacrylate, polyhydroxystyrene, polyvinyl pyrrolidone and polyvinyl alcohol. Further, the water-soluble resin is not limited to only a homopolymer, and it may be a copolymer. For example, it may be a copolymer having a monomer corresponding to the repeating unit of the above exemplified homopolymer and a monomer unit other than that. Specifically, an acrylate-methacrylate copolymer, an acrylate-hydroxystyrene copolymer and the like may be used in the present invention.

In addition, as the resin for the topcoat composition, the resin having an acidic group disclosed in Japanese Patent Application Laid-Open No. 2009-134177, and Japanese Patent Application Laid-Open No. 2009-91798 may be preferably used.

The weight average molecular weight of the water-soluble resin is not particularly limited, but it is preferably 2,000 to 1,000,000, more preferably 5,000 to 500,000, and particularly preferably 10,000 to 100,000. Here, the weight average molecular weight of the resin refers to a polystyrene equivalent molecular weight measured by the GPC (carrier: THF or N-methyl-2-pyrrolidone (NMP)).

The pH of the topcoat composition is not particularly limited, but is preferably 0 to 10, more preferably 0 to 8, and particularly preferably 1 to 7.

If the solvent of the topcoat composition is an organic solvent, the topcoat composition may contain a hydrophobic resin such as the forgoing hydrophobic resin (HR) as in an actinic ray-sensitive or radiation-sensitive resin composition. As the hydrophobic resin, the hydrophobic resin disclosed in Japanese Patent Application Laid-Open No. 2008-209889 may be preferably used.

The concentration of the resin in the topcoat composition is preferably 0.1 to 10% by mass, more preferably 0.2 to 5% by mass, and particularly preferably 0.3 to 3% by mass.

The topcoat material may have the components other than the resin, but the ratio of the resin occupied in the solids of the topcoat composition is preferably 80 to 100% by mass, more preferably 90 to 100% by mass, and particularly preferably 95 to 100% by mass.

The concentration of the solids of the topcoat composition of the present invention is preferably 0.1 to 10, more preferably 0.2 to 6% by mass, and still more preferably 0.3 to 5% by mass. By setting the concentration of the solids in the above-mentioned range, the topcoat composition may be uniformly coated on a resist film.

Other components other than the resin capable of being added to the topcoat material include surfactants, a photo-acid generator, a basic compound and the like. Specific examples of the photo-acid generator and basic compound include the same compound as the compound capable of generating an acid upon the irradiation with the active light or radiation and as the basic compound.

If surfactants are used, the amount of the surfactants used is preferably 0.0001 to 2% by mass, and more preferably 0.001 to 1% by mass based on the full amount of the topcoat composition.

By adding the surfactants to the topcoat composition, the coating propery in the case of applying the topcoat composition may be improved. The surfactants may be nonionic, anionic, cationic and amphoteric surfactants.

As nonionic surfactants, Plufarac series manufactured by BASF corporation, ELEBASE series, Finesurf series, Brownone series manufactured by Aokiyuji Industrial Co. Ltd., Adecapulonic P-103 manufactured by Asahi Telephone Industrial Co. Ltd., Emalgen series, Amito series, Aminoe PK-02S, Emanon CH-25, Reodol series manufactured by Kao Chemical Corporation, Safron S-141 manufactured by AGC Seimi Chemical Corporation, Noigen series manufactured by Daiichi Pharmaceutical Industrial Co. Ltd., Newkalgen series manufactured by Takemotoyuji company, DYNOL604, Enbirogem AD01, Olpin EXP series, Safinol series manufactured by Nissan Chemical Industrial Co. Ltd., Ptajent 300 manufactured by Ryoko Chemical Corporation and the like may be used.

As anionic surfactants, Emal 20T, Poise 532A manufactured by Kao Chemical Corporation, Phospanol ML-200 manufactured by TOHO corporation, EMULSOGEN series manufactured by Client Japan Corporation, Saffron 5-111N, Saffron S-211 manufactured by AGC Seimi Chemical Corporation, Flysuff series manufactured by Daiichi Pharmaceutical Industrial Co. Ltd., Pionine series manufactured by Takemotoyuji company, Olpin PD-201, Olpin PD-202 manufactured by Nissan Chemical Industrial Co. Ltd., AKYPO RLM45, ECT-3 manufactured by Japan Surfactant Industrial Co. Ltd., Liphone manufactured by Lion Corporation, and the like may be used.

As cationic surfactants, Acetamine 24, Acetamine 86 manufactured by Kao Chemical Corporation and the like may be used.

As amphoteric surfactants, Saffron S-131 (manufactured by AGC Seimi Chemical Corporation), Enajikol C-40H, Lipomine LA (manufacture by Kao Chemical Corporation) may be used.

Further, thesed surfactants may be used in a mixture thereof.

In the pattern forming method of the present invention, a resist film may be formed on a substrate by using an actinic ray-sensitive or radiation-sensitive resin composition, and a topcoat layer may be formed on the resist film by using the topcoat composition. The film thickness of the resist film is preferably 10 to 100 nm, and the film thickness of the topcoat layer is preferably 10 to 200 nm, more preferably 20 to 100 nm, and particularly preferably 40 to 80 nm.

A coating method for applying an actinic ray-sensitive or radiation-sensitive resin on a substrate is preferably a spin coating, and the rotational speed is preferably 1000 to 3000 rpm.

For example, the composition is coated on a substrate used for manufacturing a precise integrated circuit device (for example, silicon/silicon dioxide coating) by an appropriate coating method such as a spiner, a coater and the like and then dried to form a resist film. A known antireflection film may be previously applied. Further, the resist film may be preferably dried before forming a topcoat layer.

Then, the topcoat layer may be formed by applying the topcoat composition on the obtained resist film and drying by the same means as in the forming method of the foreging resist film.

The resist film having a topcoat layer on the top is irradiated with an electron beam (EB), X ray or EUV light usually through a mask, and the development is carried out preferably by baking (heating) the film. Accordingly, a good pattern may be obtained.

[Electron Beam-Sensitive or Extreme Ultraviolet Ray-Sensitive Resin Composition]

The electron beam-sensitive or extreme ultraviolet ray-sensitive resin composition according to the present invention is used in a negative type development (development in which when a resist film is exposed, the solubility thereof in the developer is decreased, and thus the exposed portion remains as a pattern and the unexposed portion is removed).

That is, the electron beam-sensitive or extreme ultraviolet ray-sensitive resin composition relating to the present invention may be used as an electron beam-sensitive or extreme ultraviolet ray-sensitive resin composition for an organic solvent development, which is used for development using a developer containing an organic solvent. Here, the term, for an organic solvent development refers to a use that is used in a step of developing using a developer including at least an organic solvent.

As such, the present invention relates to an electron beam-sensitive or extreme ultraviolet ray-sensitive resin composition provided in the pattern forming method of the present invention.

It is preferred that the electron beam-sensitive or extreme ultraviolet ray-sensitive resin composition of the present invention is typically a resist composition and a negative type resist composition (that is, a resist composition for an organic solvent development), because a particularly good effect may be obtained. In addition, the composition relating to the present invention is typically a chemical amplification resist composition.

[1] Resin (A)

The resin (A) has the repeating unit represented by the following Formula (1-0), and the content of the repeating unit represented by the following Formula (1-0) is 45 mol % or more based on the whole repeating units of the resin (A). Because the above content is 45 mol % or more, high contrast (γ value is high) may be achieved. In the case of forming a fine isolated space pattern, resolution and space width roughness may be improved, and in the case of forming a fine hole pattern, high resolution, good EL, uniformity of local pattern dimension may be achieved.

The repeating unit represented by the following Formula (1-0) is the repeating unit having the structure protected by the leaving group in which the carboxyl group as a polar group is decomposed by the action of an acid and left, and thus, the resin (A) is a resin in which the solubility to the develop contacting an organic solvent may be reduced by the action of an acid.

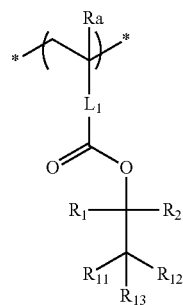

(1-0)

In Formula (1-0), $R_1$ and $R_2$ each independently represent an alkyl group, $R_{11}$ and $R_{12}$ each independently represent an alkyl group, and $R_{13}$ represents a hydrogen atom or an alkyl group. $R_{11}$ and $R_{12}$ may be bound with each other to form a ring, and $R_{11}$ and $R_{13}$ may be bound with each other to form a ring.

Ra represents a hydrogen atom, an alkyl group, a cyano group or a halogen atom, and $L_1$ represents a single bond or a divalent linking group.

In Formula (1-0),

The alkyl group as $R_1$, $R_2$, $R_{11}$ to $R_{13}$ is preferably an alkyl group having 1 to 10 carbon atoms, examples thereof include a methyl group, an ethyl group, a propyl group, an isopropyl group, a n-butyl group, a sec-butyl group, a t-butyl group, a neopentyl group, a hexyl group, a 2-ethylhexyl group, an octyl group, a dodecyl group and the like.

The alkyl group of $R_1$ and $R_2$ is preferably an alkyl group having 2 to 10 carbon atoms, more preferably, $R_1$ and $R_2$ both are an ethyl group, from the viewpoint of achieving the effect of the present invention surely.

The alkyl group of $R_{11}$ and $R_{12}$ is preferably alkyl group having 1 to 6 carbon atoms, more preferably, a methyl group or and ethyl group, and particularly preferably a methyl group.

$R_{13}$ is preferably a hydrogen atom or a methyl group.

$R_{11}$ and $R_{12}$ may be particularly preferably bound with form an alkylene group and to from a ring, and $R_{11}$ and $R_{13}$ may be bound with from an alkylene group and then to form a ring.

The ring which $R_{11}$ and $R_{12}$ are bound with form is preferably a 3- to 8-membered ring, and more preferably a 5- to 6-membered ring.

The ring which $R_{11}$ and $R_{13}$ are bound with form is preferably a 3- to 8-membered ring, and more preferably a 5- to 6-membered ring.

When $R_{11}$ and $R_{13}$ are bound with each other to form a ring is preferably the when $R_{11}$ and $R_{12}$ are bound with each other to form a ring.

The ring formed by $R_{11}$ and $R_{12}$ (or $R_{11}$ and $R_{13}$) being bound with each other is more preferably an alicyclic group described as X of Formula (1-1).

The alkyl group of $R_1$, $R_2$, $R_{11}$ to $R_{13}$, and the ring formed by $R_{11}$ and $R_{12}$ (or $R_{11}$ and $R_{13}$) being bound with each other, may further have a substituent.

Examples of the further substituent possessed by the alkyl group of $R_1$, $R_2$, $R_{11}$ to $R_{13}$, and the ring formed by $R_{11}$ and $R_{12}$ (or $R_{11}$ and $R_{13}$) being bound with each other may include a cycloalkyl group, an aryl group, an amino group, a hydroxyl group, a carboxyl group, a halogen atom, an alkoxy group, an arakyloxy group, a thioether group, an acyl group, an acyloxy group, an alkoxycarbonyl group, a cyano group and a nitro group and the like. The substituents may be bound with each other to form a ring. When the substituents are bound with each other to form a ring, the ring includes a cycloalkyl group or phenyl group having 3 to 10 carbon atoms.

The alkyl group of Ra may have a substituent, and is preferably an alkyl group having 1 to 4 carbon atoms.

Preferred examples of the substituent which may be possessed by the alkyl group of Ra may include a hydroxyl group, and a halogen atom.

The halogen atom of Ra includes a fluorine atom, a chlorine atom, a bromine atom, and an oxo atom.

Ra is preferably a hydrogen atom, a methyl group, a hydroxymethyl group, a perfluoroalkyl group (for example, trifluoromethyl group) having 1 to 4 carbon atoms, and particularly preferably methyl group, from the viewpoint of improving the glass transition temperature (Tg), the resolution, and the space width roughness of resin (A).

But, if $L_1$ is a phenylene group, Ra is preferably a hydrogen atom.

The divalent linking group represented by $L_1$ includes an alkylene group, a divalent aromatic ring group, —COO-$L_{11}$-, —O-$L_{11}$-, a group in combination of two or more thereof, and the like. Here, $L_{11}$ represents an alkylene group, a cycloalkylene group, a divalent aromatic ring group, and a group in combination of an alkylene group and a divalent aromatic ring group.

The alkylene group of $L_1$ and $L_{11}$ includes an alkylene group having 1 to 8 carbon atoms such as a methylene group, an ethylene group, a propylene group, a butylenes group, a hexylene group, and octylene group. An alkylene group having 1 to 4 carbon atoms is preferred, and an alkylene group having 1 or 2 carbon atoms is particularly preferred.

The cycloalkylene group of $L_{11}$ is preferably a cycloalkylene group having 3 to 20 carbon atoms, and examples thereof may include a cyclopropylene group, a cyclobutylene group, a cyclopentylene group, a cyclohexylene group, a cycloheptylene group, a cyclooctylene group, a norbonylene group or an adamantylene group.

In the cycloalkylene group of $L_{11}$, the carbon constituting the ring (the carbon contributing to ring formation) may be carbonyl carbon, a heteroatom such as an oxygen atom, and a group having an ester bond to form a lactone ring.

The divalent aromatic ring group of $L_1$ and $L_{11}$ is preferably a phenylene group such as 1,4-phenylene group, 1,3-phenylene group, and 1,2-phenylene group, preferably 1,4-naphtylene group, and more preferably 1,4-phenylene group.

$L_1$ is preferably a single bond, a divalent aromatic ring group, a divalent group having a norbornylene group or a divalent group having an adamatylene group, and particularly preferably a single bond.

Specific examples of the divalent linking group of $L_1$ are shown below, but the present invention is not limited thereto.

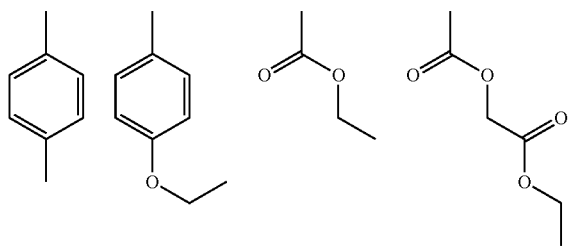

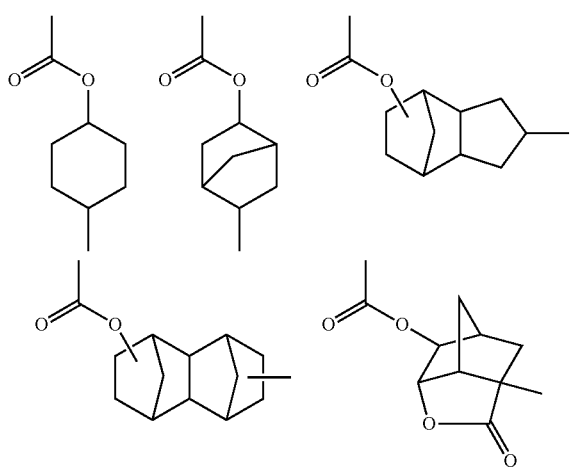

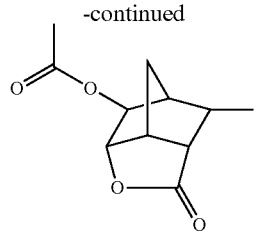

From the viewpoint that, in the case of forming a fine isolated space pattern by achieving the higher contrast (γ value is high), the resolution and the space width roughness may be further improved, and in the case of forming a fine hole pattern, high resolution, good EL, and uniformity of local pattern dimension may be achieved for sure, the repeating unit represented by Formula (1-0) may be preferably the repeating unit represented by the following Formula (1-1).

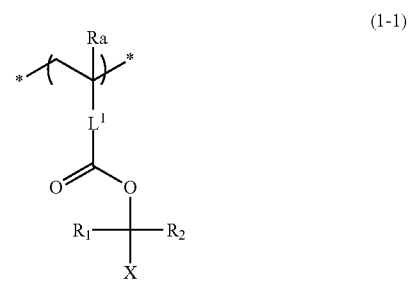

In Formula (1-1),

X represents an alicyclic group.

$R_1$, $R_2$, Ra and $L_1$ each have the same meaning as $R_1$, $R_2$, Ra and $L_1$ in Formula (1-0), and the specific examples and preferred examples thereof are the same as $R_1$, $R_2$, Ra and $L_1$ in Formula (1-0).

An alicyclic group as X may represent a monocyclic, a polycyclic and a bridged group, and preferably the alicyclic group having 3 to 25 carbon atoms.

In addition, an alicyclic group may have a substituent, examples of the substituent may include the same substituent which may be possessed by the alkyl group of $R_1$, $R_2$, $R_{11}$ to $R_{13}$, and the ring formed by $R_{11}$ and $R_{12}$ (or $R_{11}$ and $R_{13}$) being bound with each other, and the alkyl group (a methyl group, an ethyl group, a propyl group, a butyl group, a perfluoroalkyl group (for example, a trifluoromethyl group) and the like) and the like.

X represents preferably an alicyclic group having 3 to 25 carbon atoms, more preferably an alicyclic group having 5 to 20 carbon atoms, and particularly preferably a cycloalkyl group having 5 to 15 carbon atoms.

In addition, X is preferably an alicyclic group as a 3- to 8-membered ring or the condensed ring group, more preferably, 5- or 6-membered ring or the condensed ring group.

Hereinafter, the structure examples of an alicyclic group as X are shown.

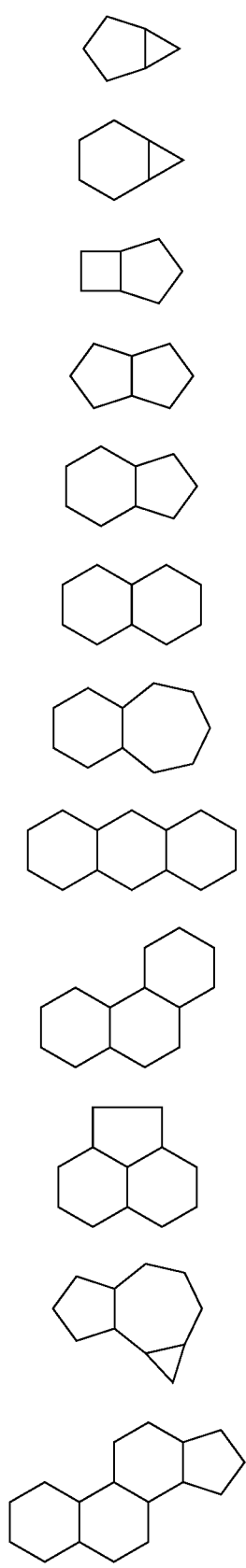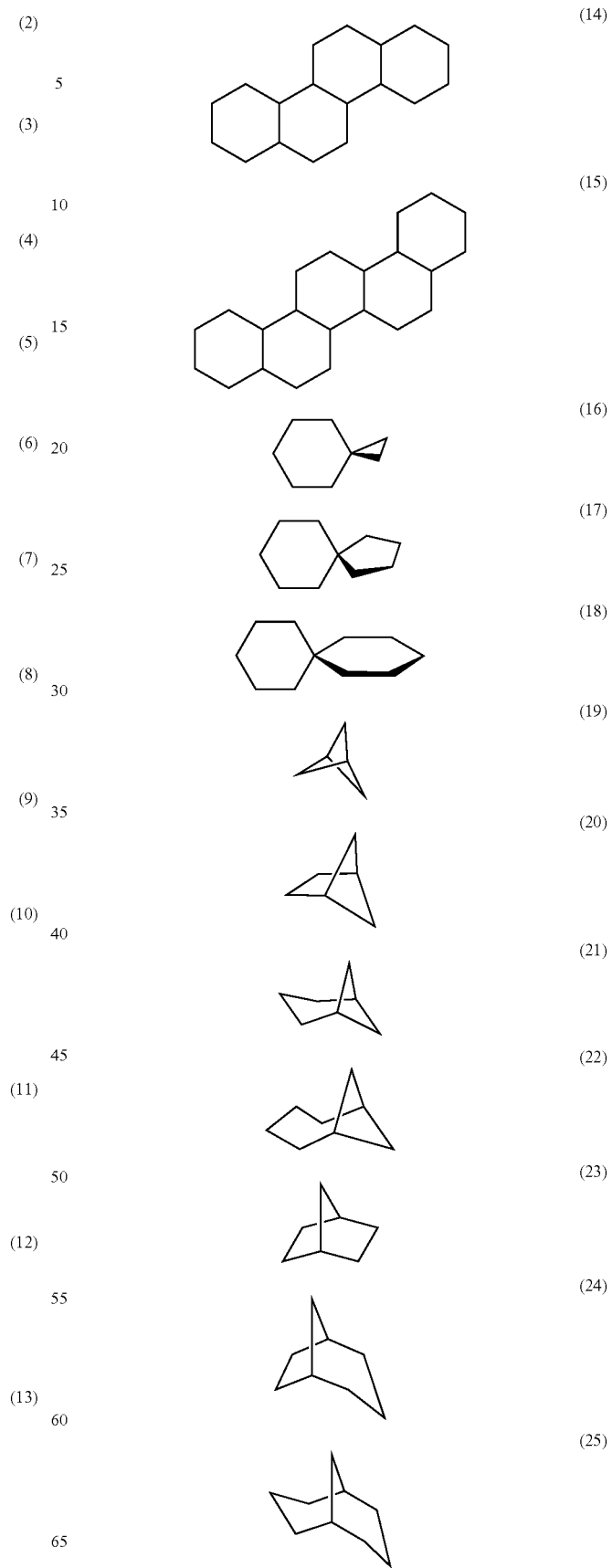

-continued
(26)
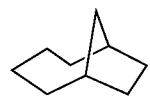
(27)
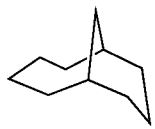
(28)
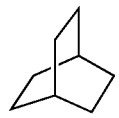
(29)
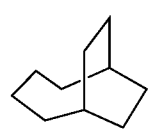
(30)
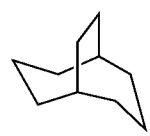
(31)
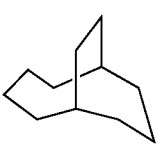
(32)
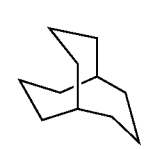
(33)
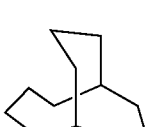
(34)
(35)
(36)
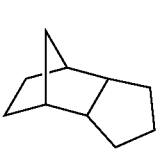
(37)
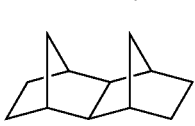
-continued
(38)
(39)
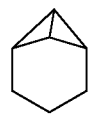
(40)
(41)
(42)
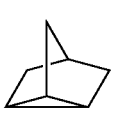
(43)
(44)
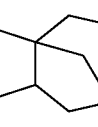
(45)
(46)
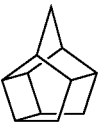
(47)
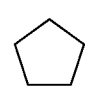
(48)
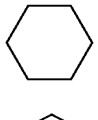
(49)
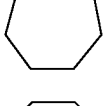
(50)
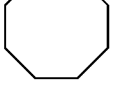

Preferred examples of the alicyclic group include an adamantyl group, a noradamatyl group, a decalin residue, a tricyclodecanyl group, a tetracyclododecanyl group, a norbornyl group, a cedro group, a cyclopentyl group, a cyclohexyl group, a cycloheptyl group, a cyclooctyl group, a cyclodecanyl group, and a cyclododecanyl group. A cyclohexyl group, a cyclopentyl group, an adamantly group, and a norbornyl group are more preferred, a cyclohexyl group, and a cyclopentyl group are still more preferred, and a cyclohexyl group is particularly preferred.

Specific examples of the repeating unit represented by Formula (1-0) or (1-1) are shown below, but the present invention is not limited thereto.

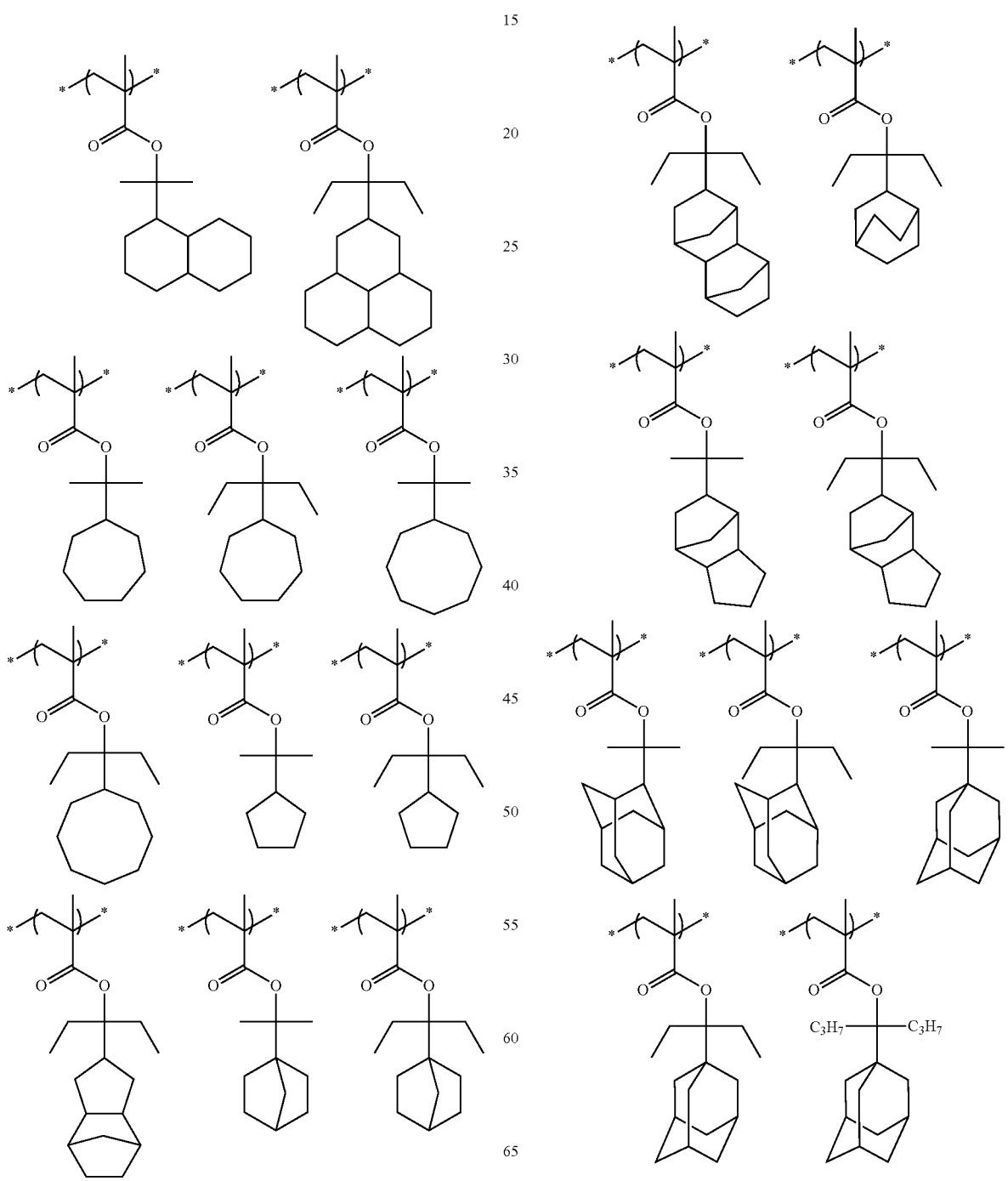

31
-continued
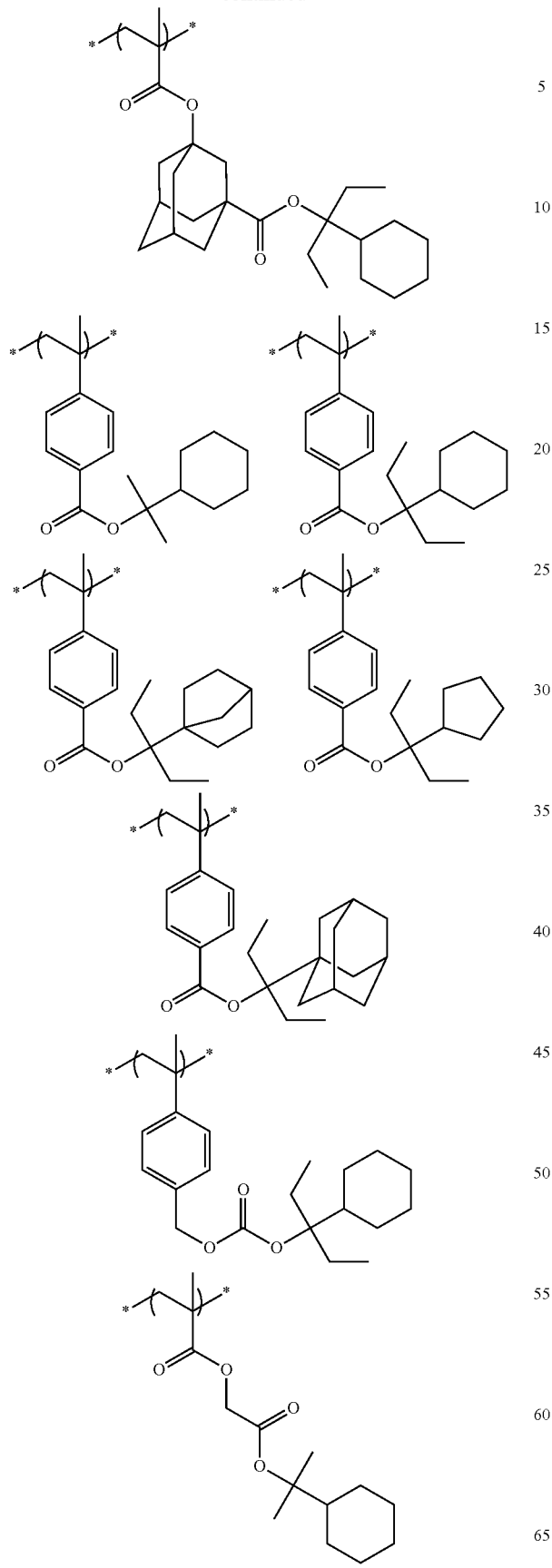
32
-continued
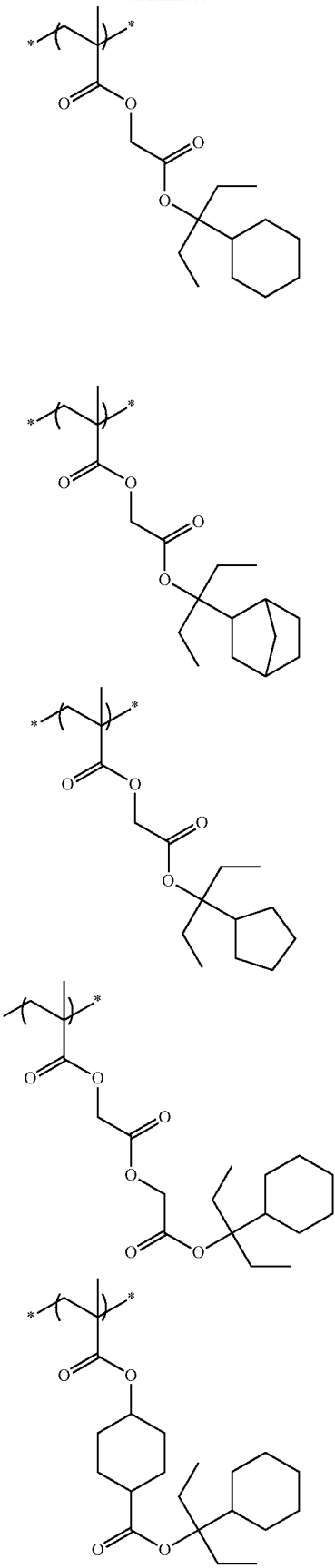

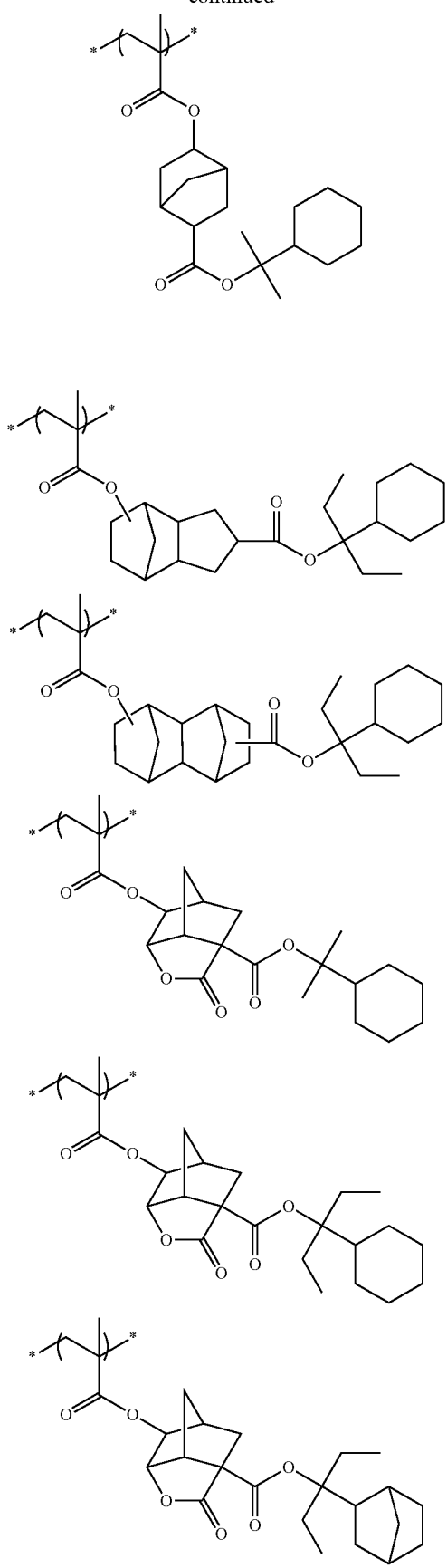
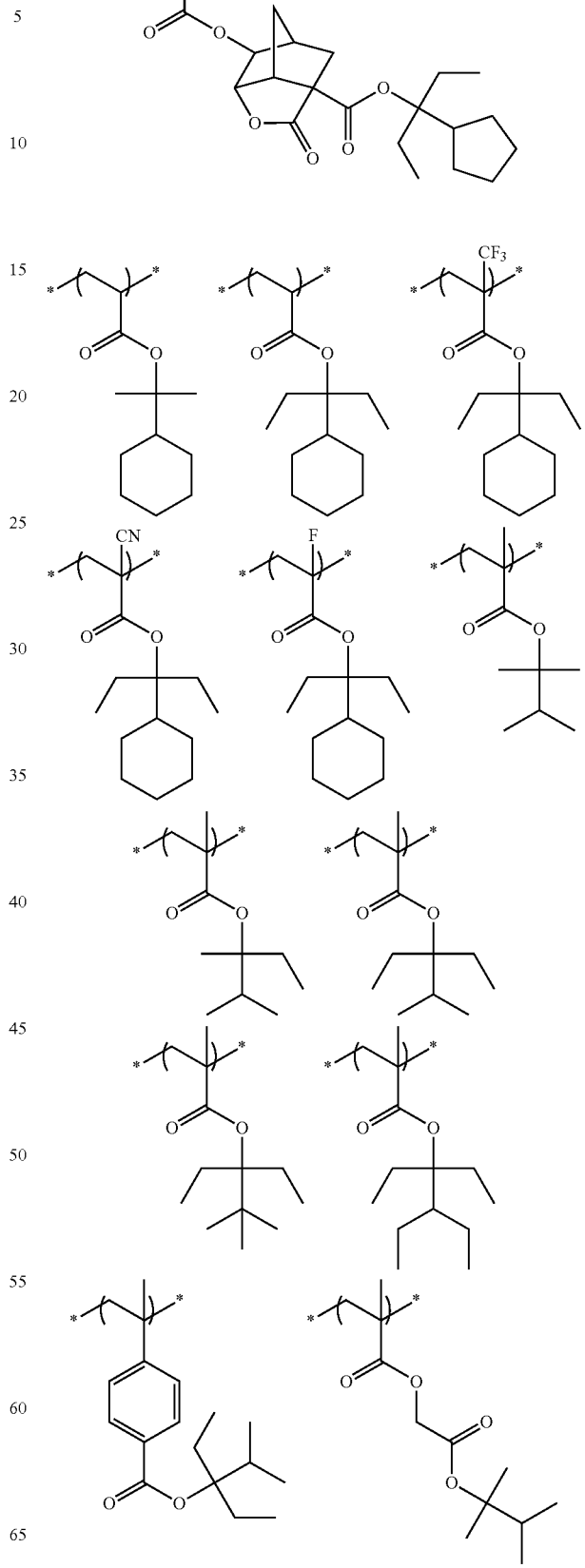

-continued

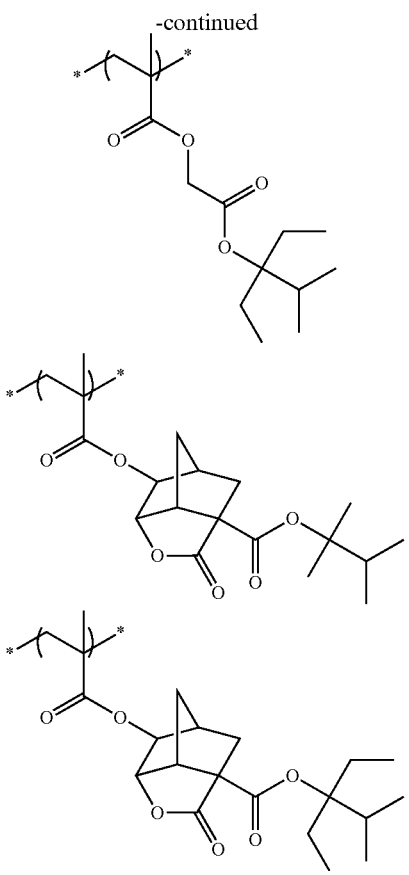

The content of the repeating unit (the sum, in the case of containing plural kinds) represented by Formulas (1-0) or (1-1) in the resin (A) is 45 mol % or more, preferably 55 mol % or more, and more preferably 60 mol % or more base on the whole repeating unit in the resin (A), from the viewpoint that, in the case of forming a fine isolated space pattern by setting the high contrast (γ value is high) for sure, the resolution and the space width roughness may be improved, and in the case of forming a fine hole pattern, sure high resolution, good EL, and uniformity of local pattern dimension may be achieved for sure.

The content of the repeating unit represented by the following Formula (1-2) is not particularly limited as the upper limit value, but it is preferably 85 mol % or less, more preferably 80 mol % or less, and still more preferably 75 mol % or less, from the viewpoint of achieving the effect of the present invention clearly.

The resin (A) has the repeating unit represented by the following Formula (1-2).

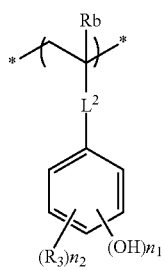

(1-2)

In Formula (1-2),

Rb represents a hydrogen atom, an alkyl group, a cyano group or a halogen atom.

$R_3$ represents a substituent. $n_1$ represents an integer of 1 or 2, $n_2$ represents an integer of 0 to 4. When $n_2$ is an integer of 2 to 4, $R_3$'s may be bound with each other to form a ring.

$L_2$ represents a single bond, —COO— or —CONR$_4$—, and $R_4$ represents a hydrogen atom or an alkyl group.

The alkyl group of Rb may have a substituent, and it is preferably an alkyl group having 1 to 4 carbon atoms.

Preferred examples of the substituent which may be possessed by the alkyl group of Rb may include a hydroxyl group and a halogen atom.

Examples of the halogen atom of Rb may include a fluorine atom, a chlorine atom, a bromine atom, and an oxo atom. Rb is preferably a hydrogen atom, a methyl group, a hydroxymethyl group, perfluoroalkyl group having 1 to 4 carbon atoms (for example, a trifluoromethyl group), and particularly preferably a hydrogen atom, from the view point of suppressing the depolymerization of the resin (A).

Examples of the substituent of $R_3$ may include a halogen atom, an alkyl group, an aryl group, an alkoxy group, and the like.

The alkyl group of $R_3$ is preferably an alkyl group having 20 or less carbon atoms such as a methyl group, an ethyl group, a propyl group, an isopropyl group, a n-butyl group, a sec-butyl group, a hexyl group, a 2-ethylhexyl group, an octyl group and a dodecyl group, which may have a substituent, more preferably an alkyl group having 8 or less carbon atoms, and particularly preferably an alkyl group having 3 or less carbon atoms.

The alkoxy group of $R_3$ is preferably a methoxy group, an ethoxy group, a hydroxyethoxy group, a propoxy group, a hydroxypropoxy group, a butoxy group, and the like. The aryl group of $R_4$ is preferably a phenyl group.

The ring formed by $R_3$'s being bound with each other may preferably be a 5- to 7-membered ring, and a 5- or 6-membered ring, and preferably an aromatic ring.

$n_1$ is preferably an integer of 1. $n_2$ is preferably an integer of 0.

The alkyl group $R_4$ in —CONR$_4$— ($R_4$ represents a hydrogen atom or an alkyl group) represented by $L_2$ includes the same alkyl group of $R_3$.

$L_2$ is preferably a single bond or —COO—, and more preferably a single bond.

Hereinafter, specific examples of the repeating unit represented by Formula (1-2) are shown, but the present invention is not limited thereto. In the formula, a represents 1 or 2.

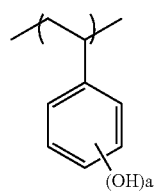
(B-1)

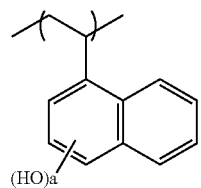
(B-2)

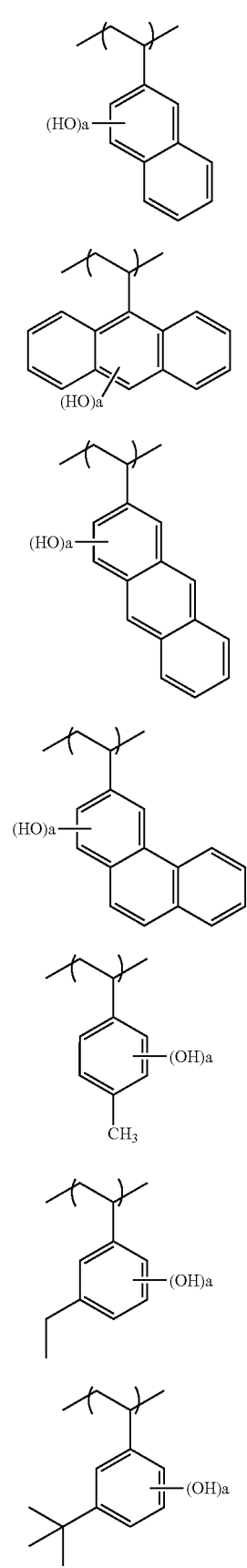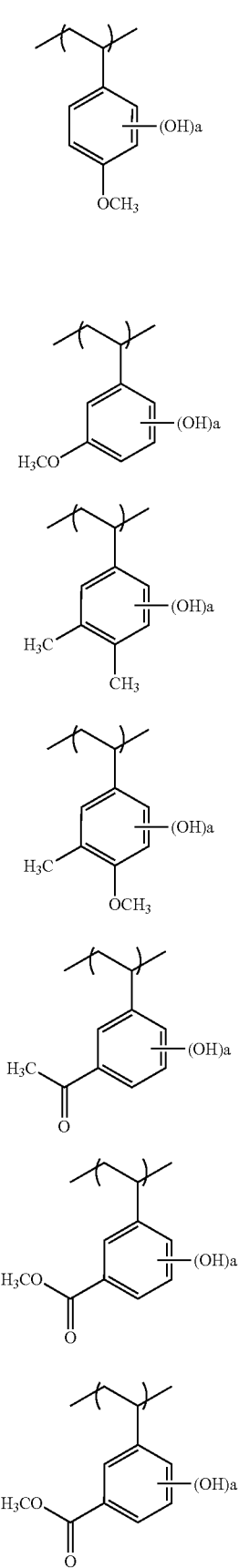

(B-16)
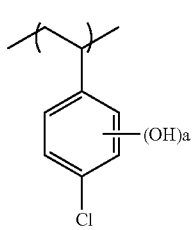
(B-17)
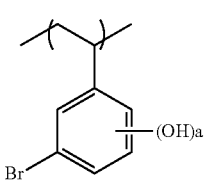
(B-18)
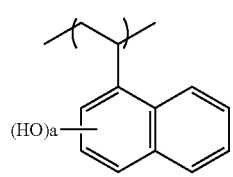
(B-19)
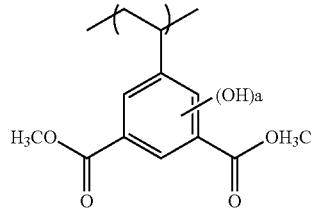
(B-20)
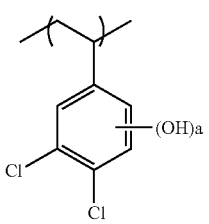
(B-21)
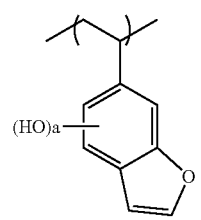
(B-19)
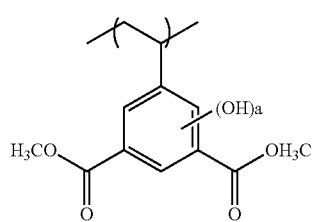
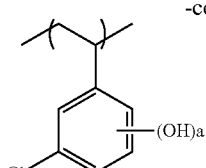
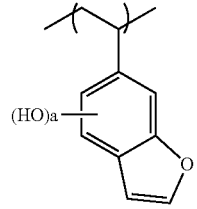
(B-22)
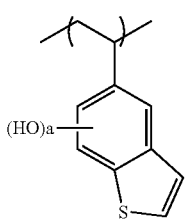
(B-23)
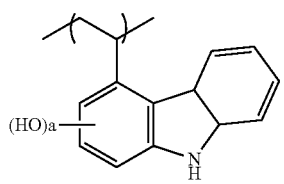
(B-24)
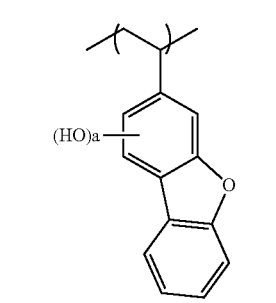
(B-25)
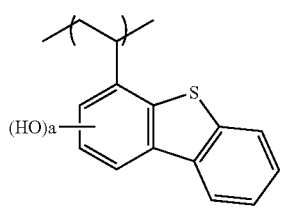
(B-26)
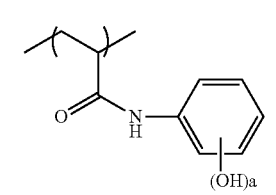
(B-27)
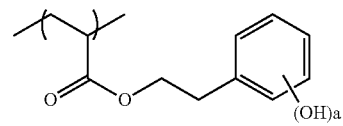

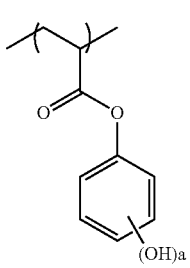
(B-28)

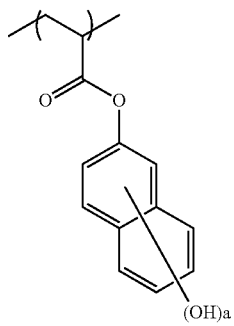
(B-29)

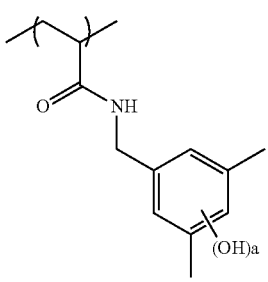
(B-30)

The resin (A) may contain two kinds or more of the repeating unit represented by Formula (1-2).

The content of the repeating unit (the sum in the case of containing several kinds thereof) represented by Formula (1-2) in the resin (A) is preferably 10 mol % or more, more preferably 15 mol % or more, still more preferably 15 mol % to 55 mol %, particularly preferably 20 mol % to 45 mol %, and most preferably 30 mol % to 45 mol % base on the whole repeating unit in the resin (A), from the viewpoint of achieving high resolution, sensitivity, and dry etching resistance, and good space width roughness for sure.

The resin (A) may have the repeating unit having a group capable of decomposing by the action of an acid (hereinafter, also referred to as an "acid-decomposable group") other than the repeating unit represented by Formula (1-0) or (1-1).

The preferred acid-decomposable group used in combination includes tertiary alkyl ester carboxylate, secondary benzyl ester carboxylate, an acetal protecting group of a phenolic hydroxyl group, a group protected by t-butoxycarbonyl group of the phenolic hydroxyl group or a tertiary ether protecting group, an acetal protecting group of an alcoholic hydroxyl group, a group protected by t-butoxycarbonyl group of the alcoholic hydroxyl group or a tertiay ether protecting group, and they may be used in combination thereof. In addition, specific examples of the preferred acid-decomposable group include those described in Japanese Patent Application Laid-Open No. 2010-217884.

The repeating unit having an acid-decomposable group other than the repeating unit represented by Formula (1-0) or (1-1) may be used either alone or in combination of two or more thereof.

If the resin has an acid-decomposable group other than the repeating unit represented by Formulas (1-0) or (1-1), the content of the repeating unit (the sum, in the case of containing several kinds thereof) is preferably 1 mol % to 30 mol %, more preferably 3 mol % to 25 mol %, and most preferably 5 mol % to 20 mol %, base on the whole repeating unit in the resin (A)

The resin (A) may have further the repeating unit represented by the following Formula (4).

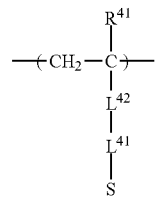

(4)

$R^{41}$ represents a hydrogen atom or a methyl group. $L^{41}$ represents a single bond or a divalent linking group. $L^{42}$ represents a divalent linking group. S represents the structure portion capable of decomposing and generating an acid in the side chain upon irradiation with an electron beam or extreme ultraviolet.

Hereinafter, specific examples of the repeating unit represented by Formula (4) are shown, but the present invention is not limited thereto.

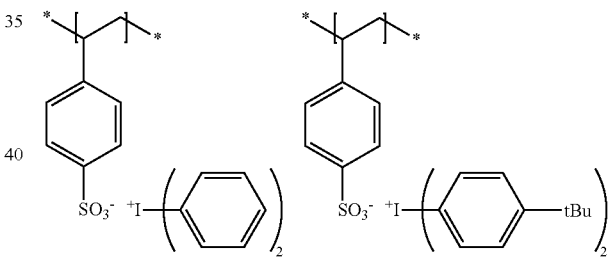

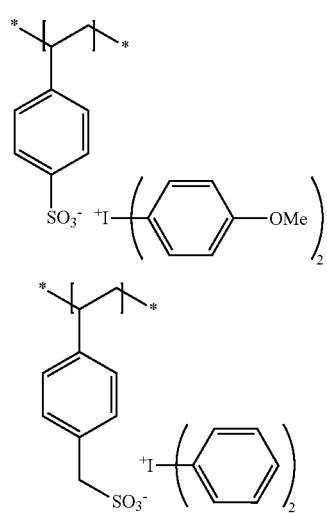

-continued
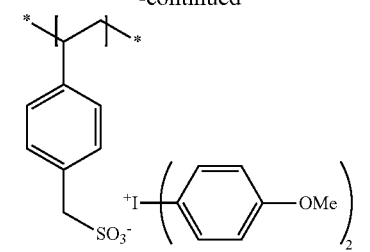
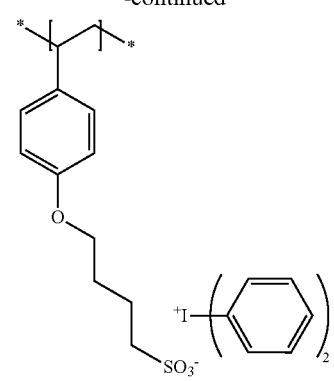
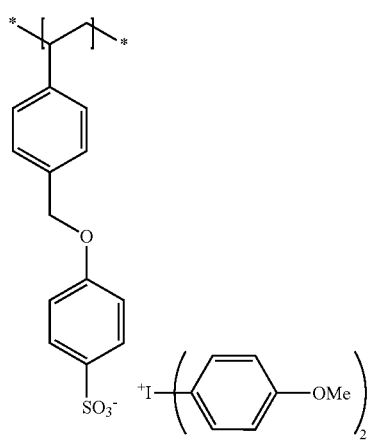
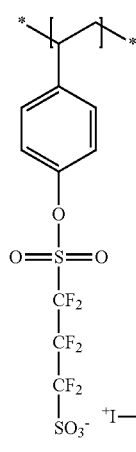
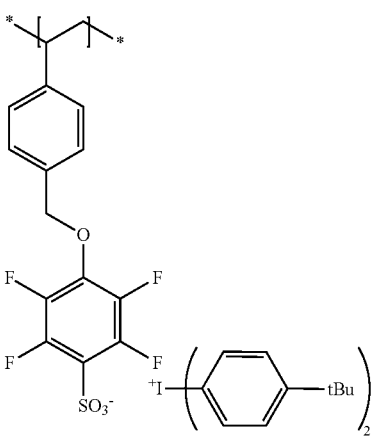
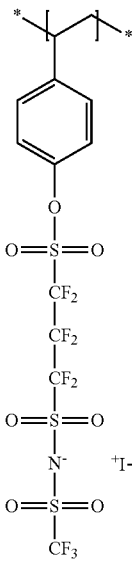
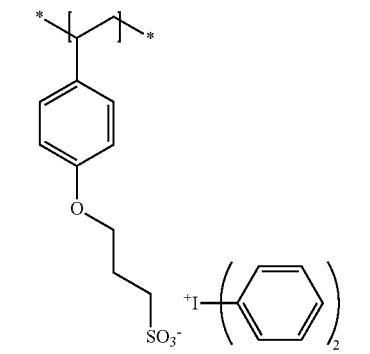
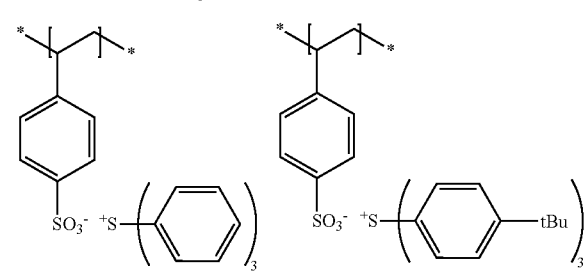

-continued
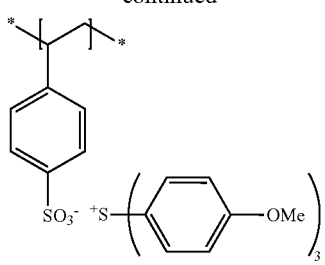
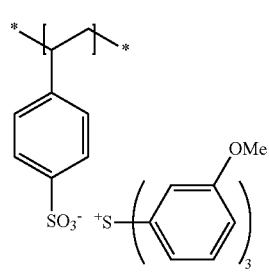
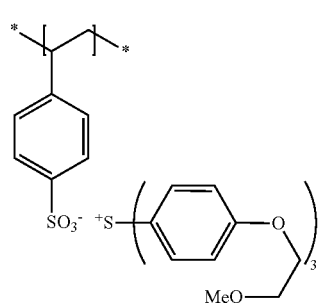
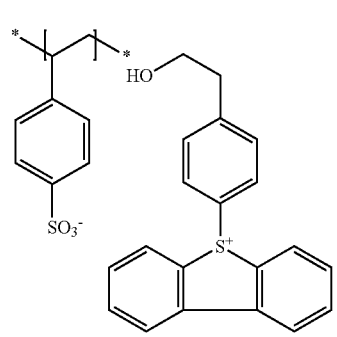
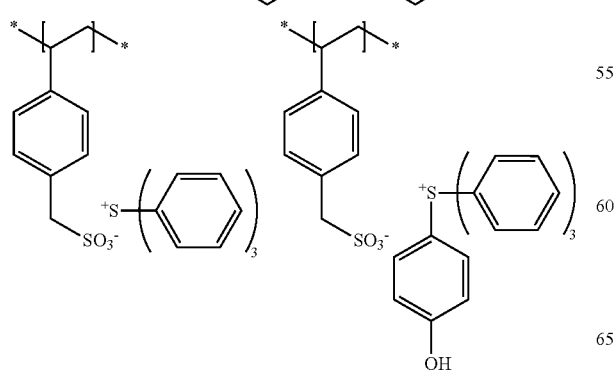
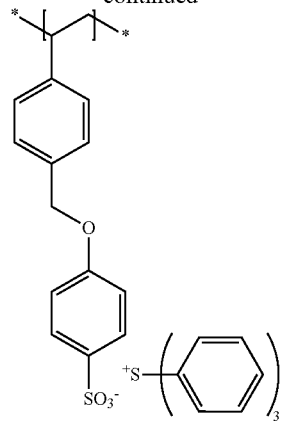
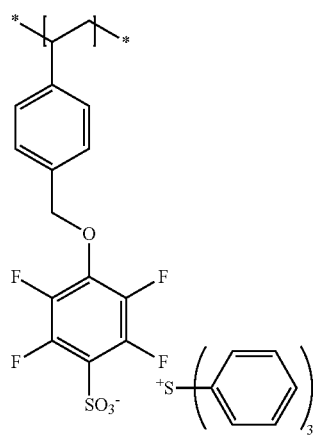
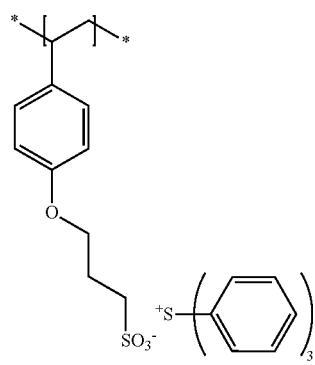
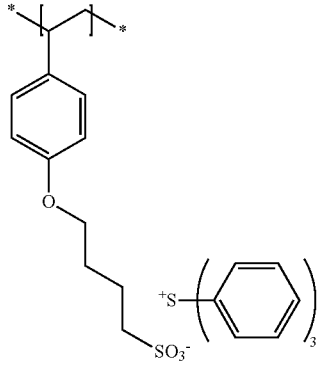

47
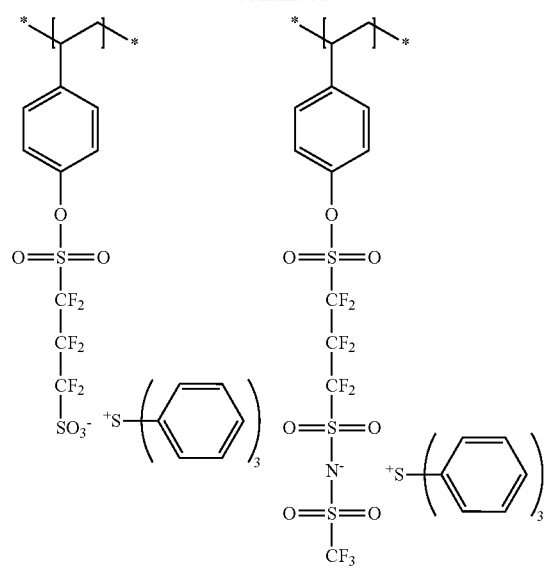
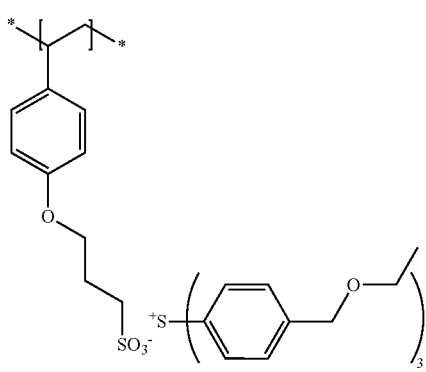
48
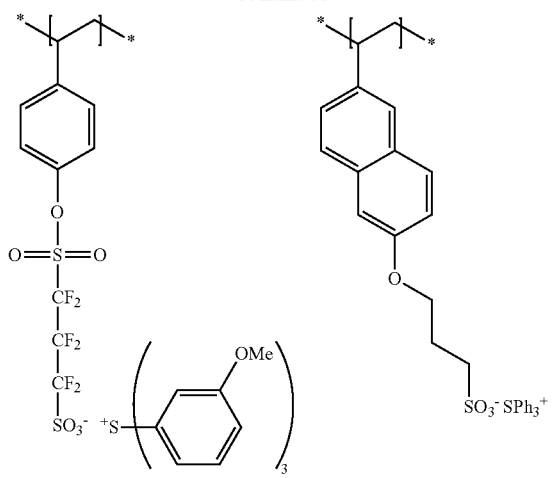
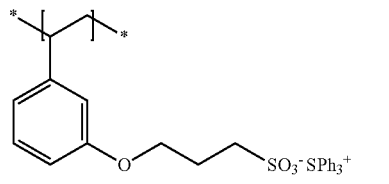

49
-continued
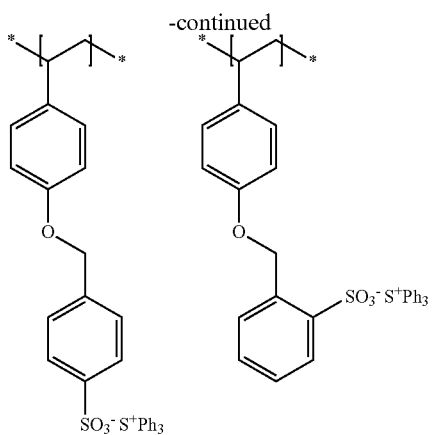
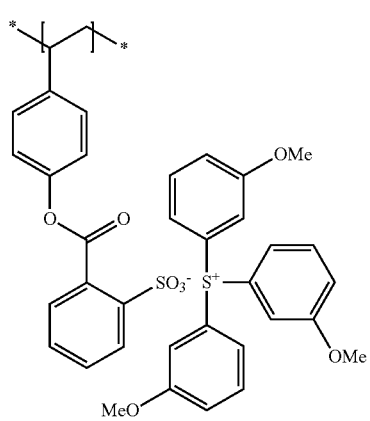
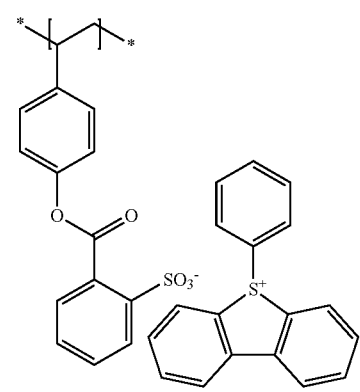
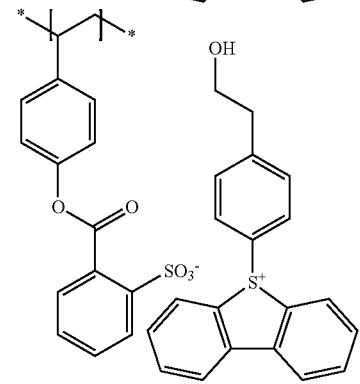
50
-continued
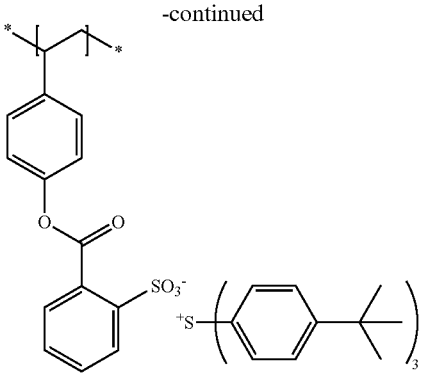
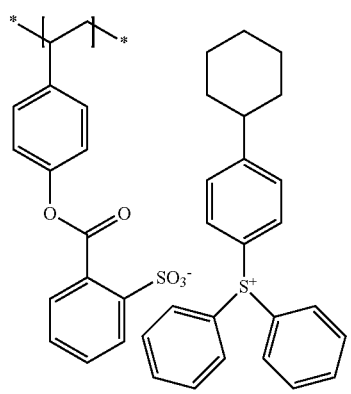
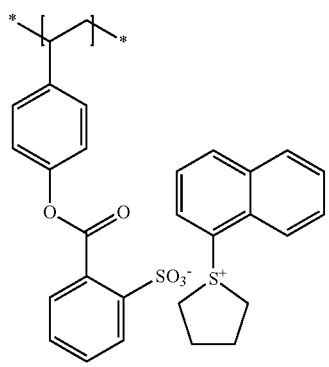
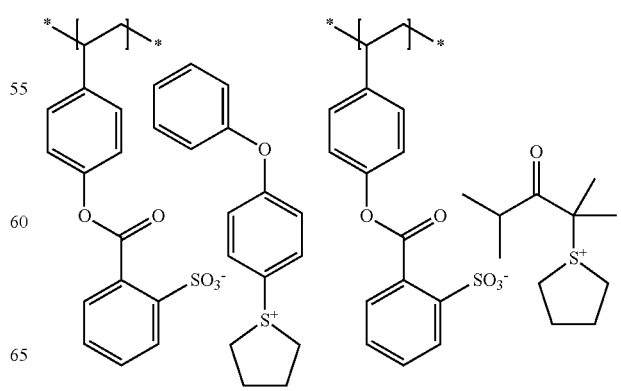

51
-continued
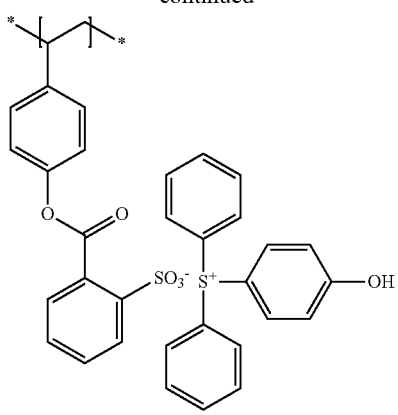
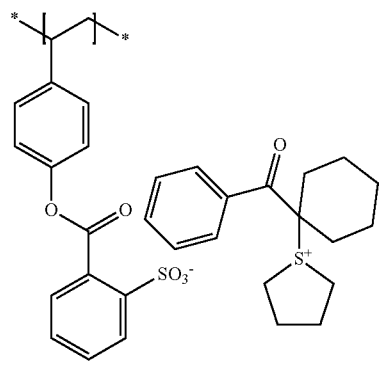
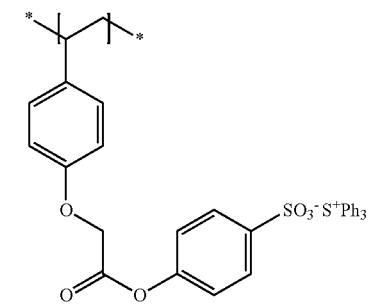
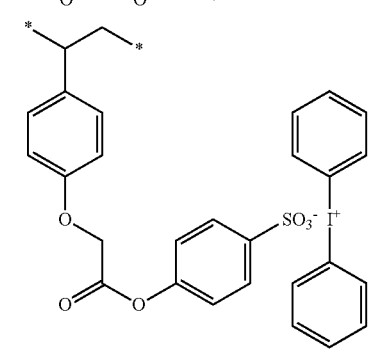
52
-continued
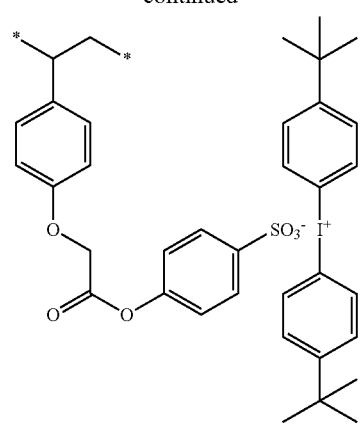
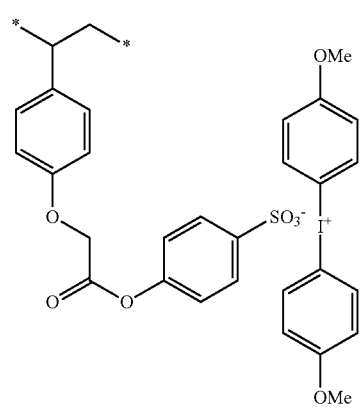
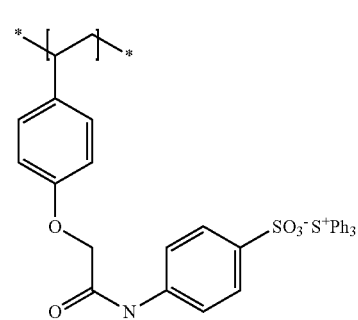
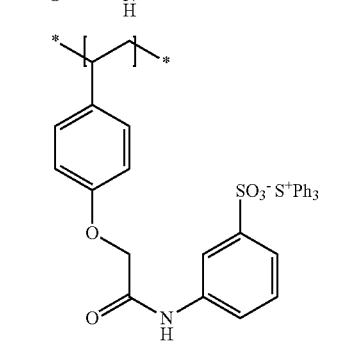

53
-continued
54
-continued
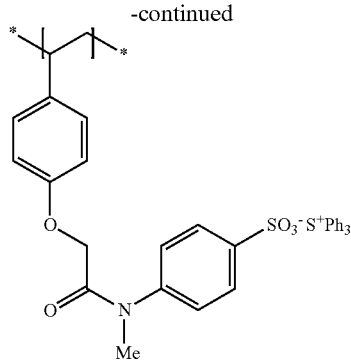
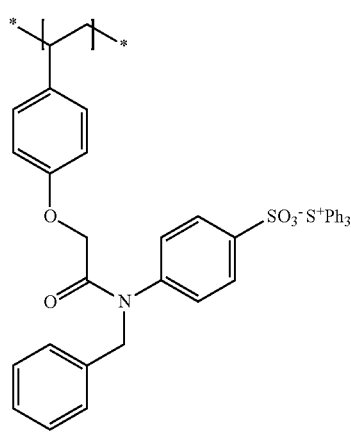
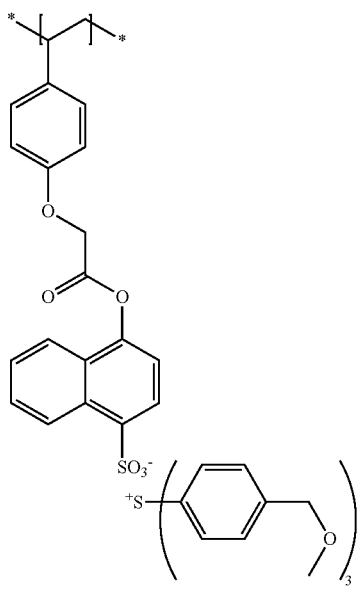
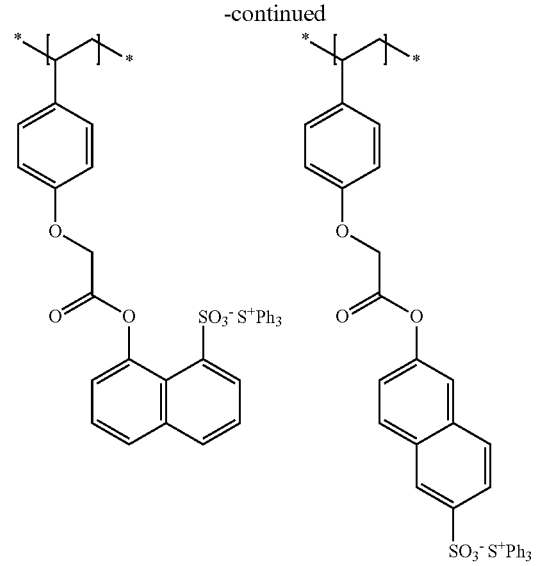
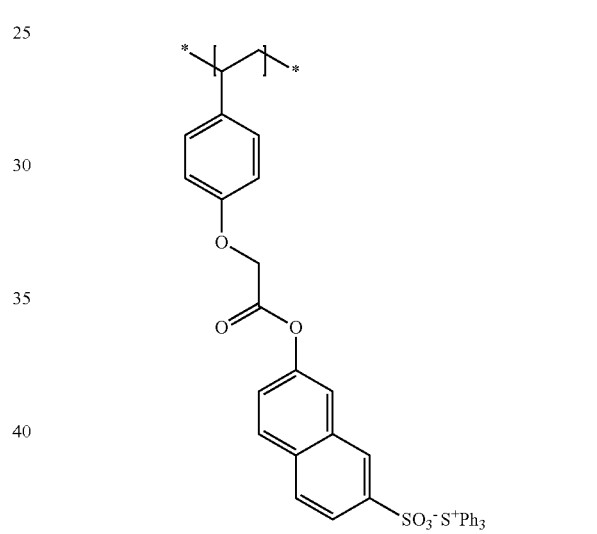
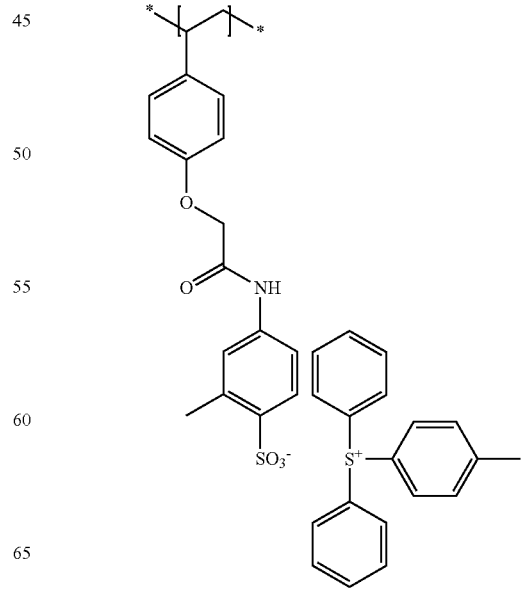

55
-continued
56
-continued
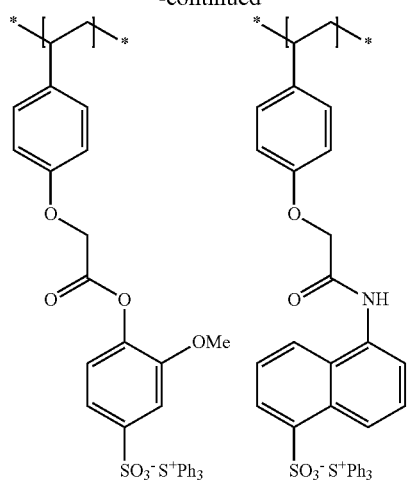
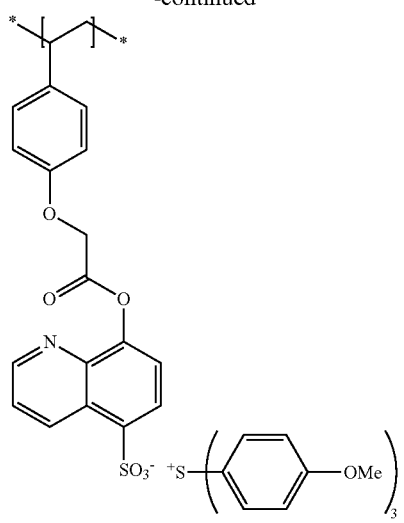
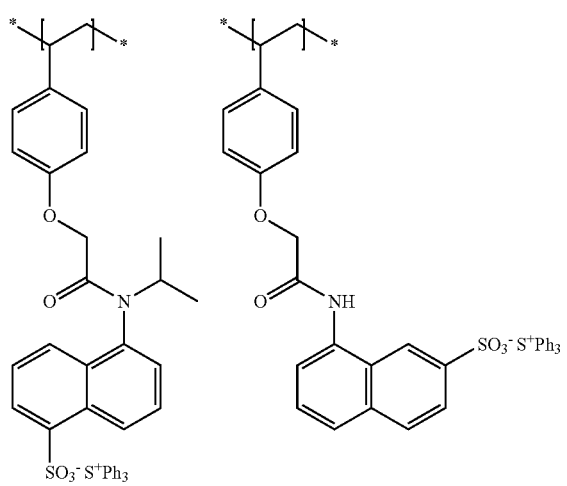
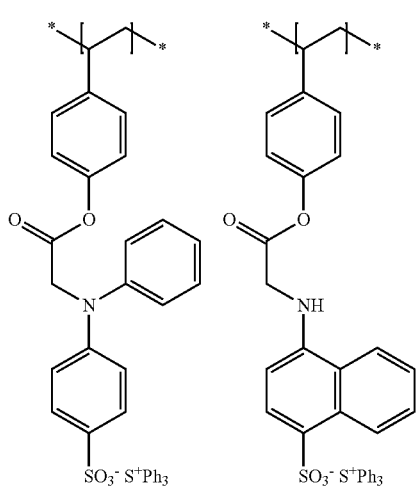
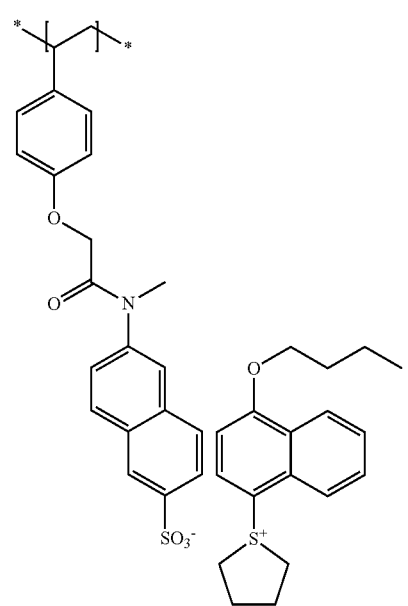

57
-continued
58
-continued
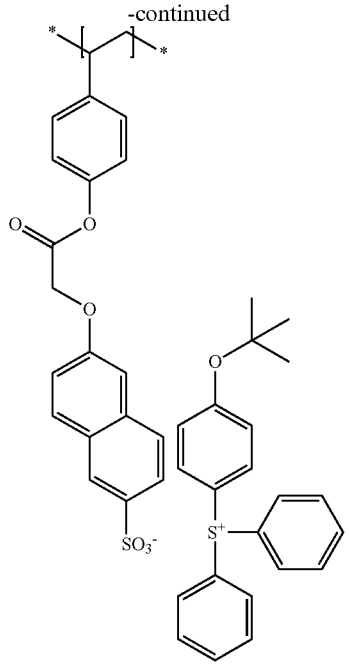
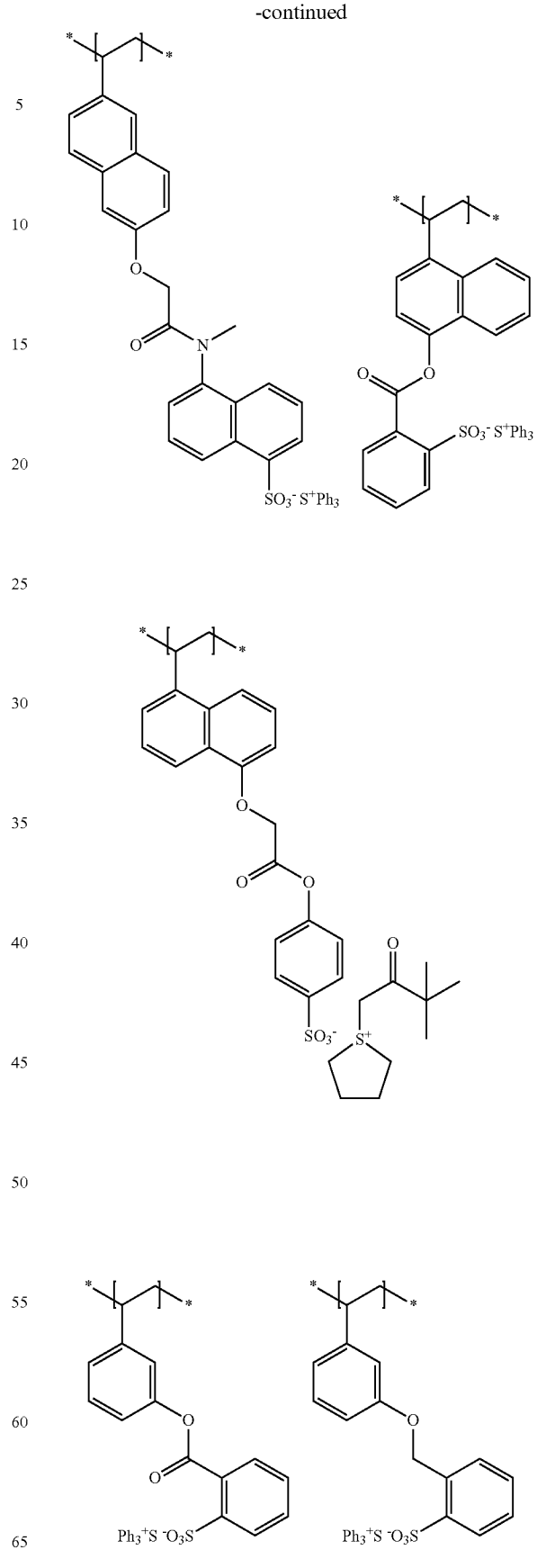

59
-continued
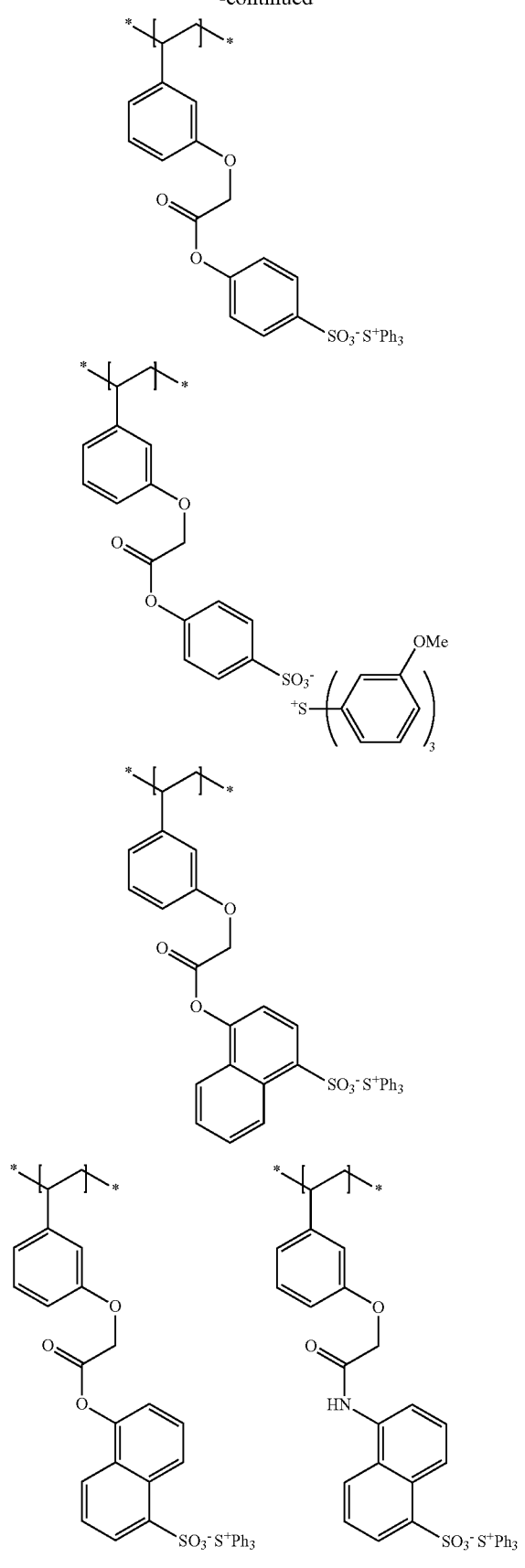
60
-continued
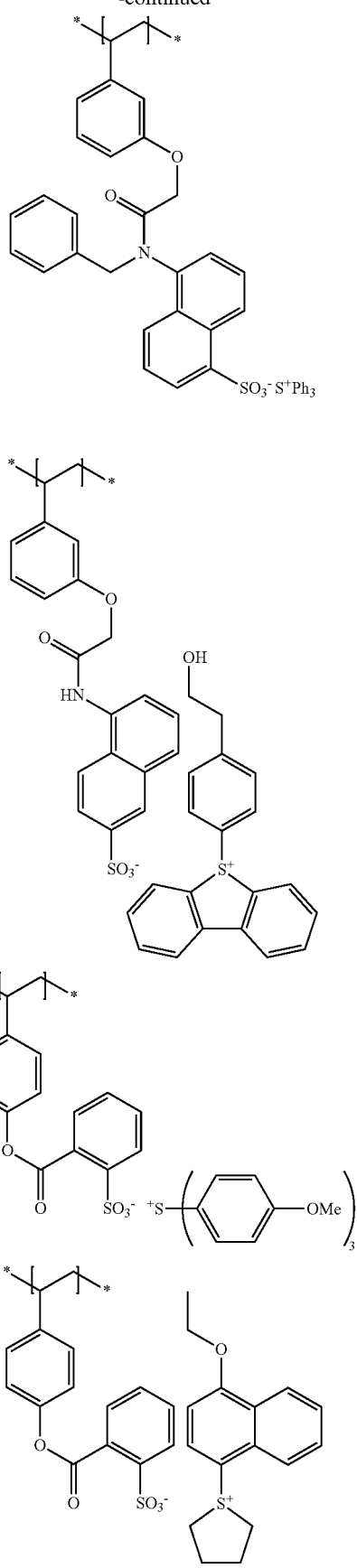

61
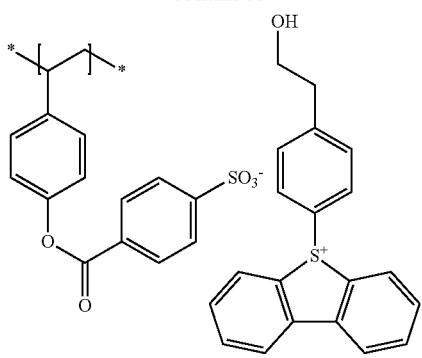
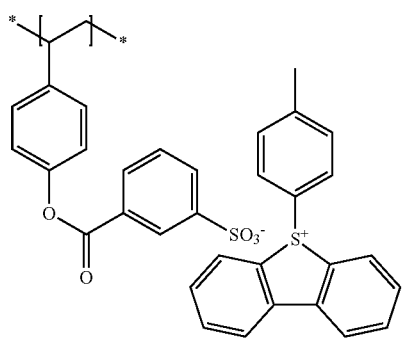
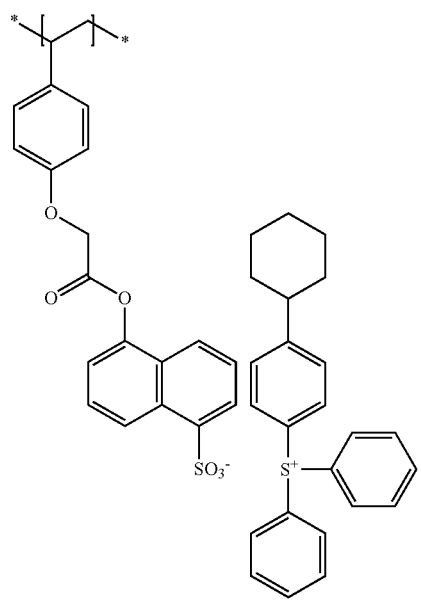
62
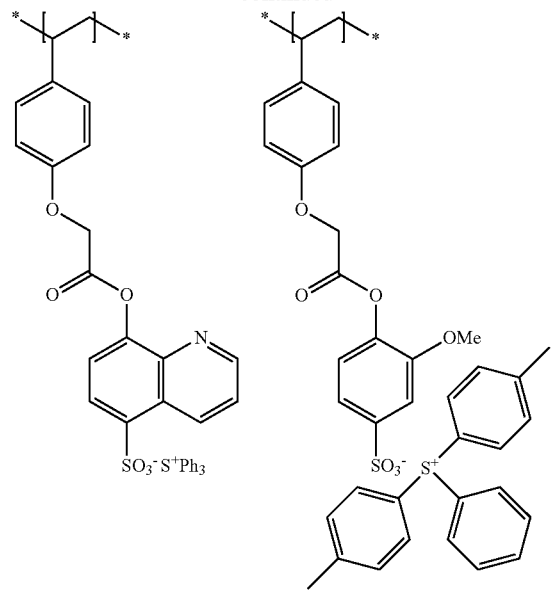
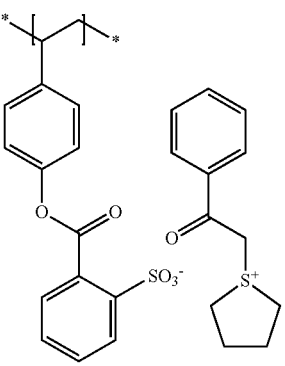

63
-continued
64
-continued
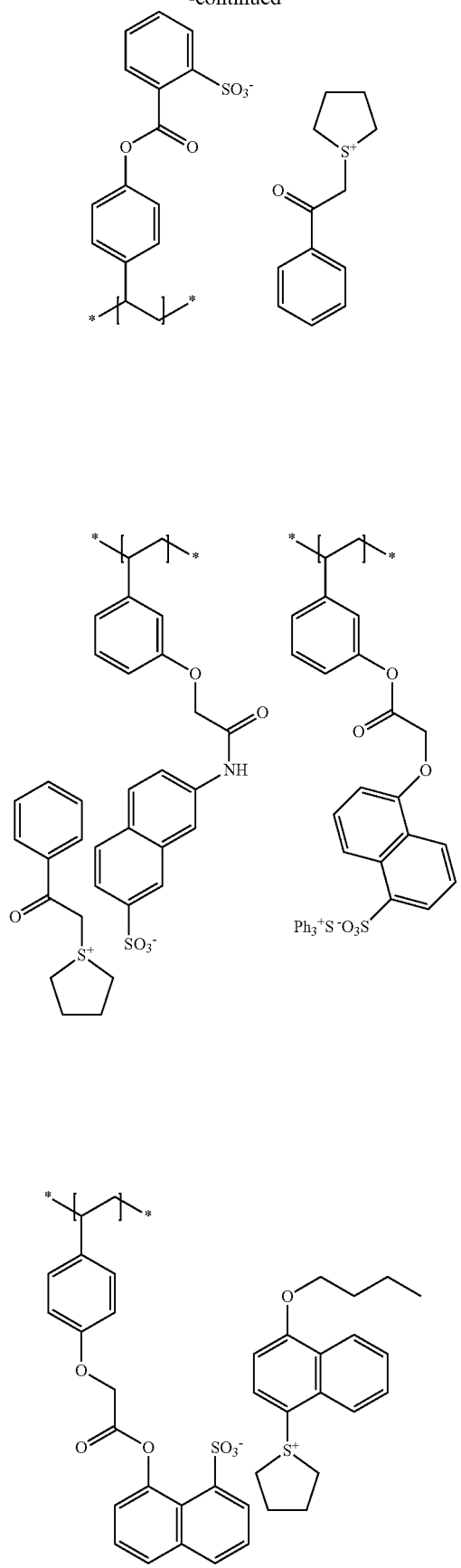
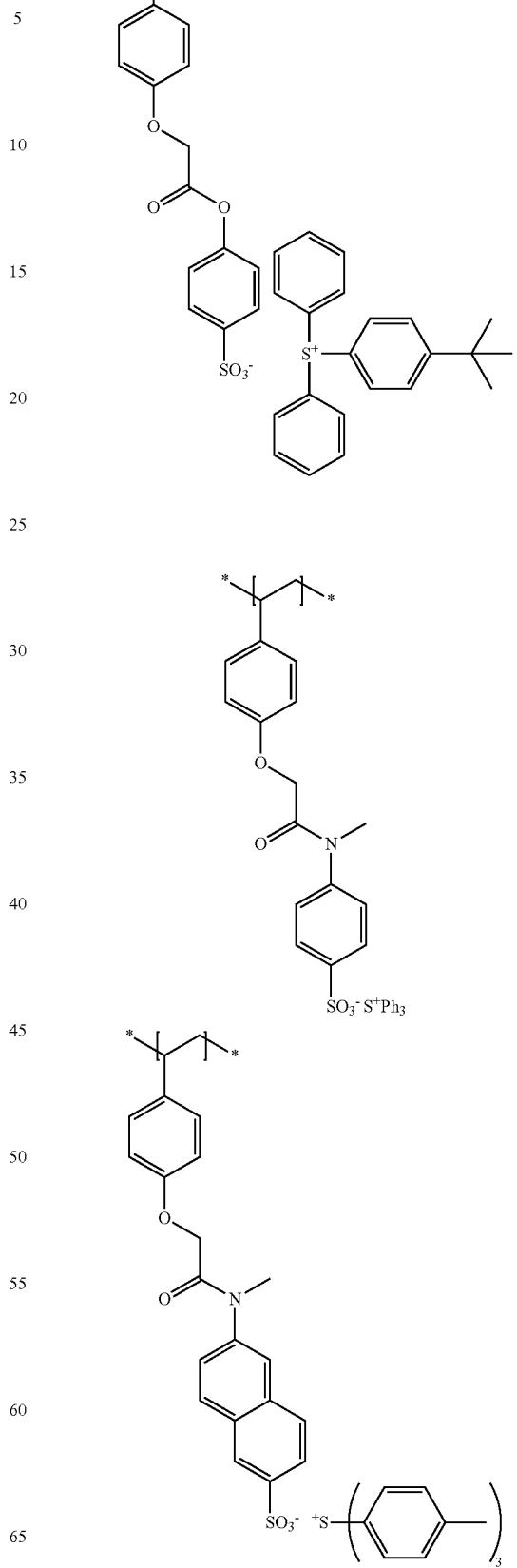

-continued
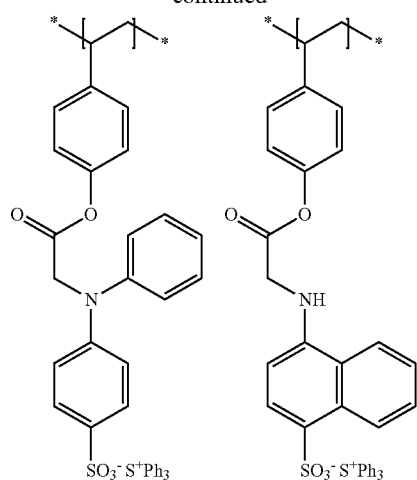
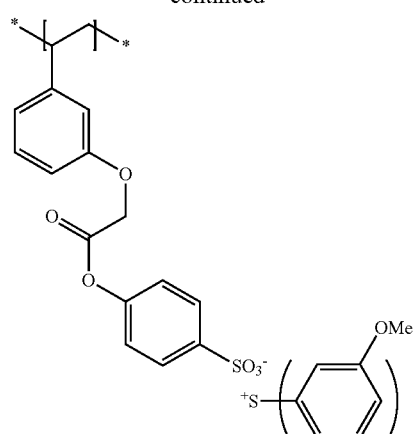
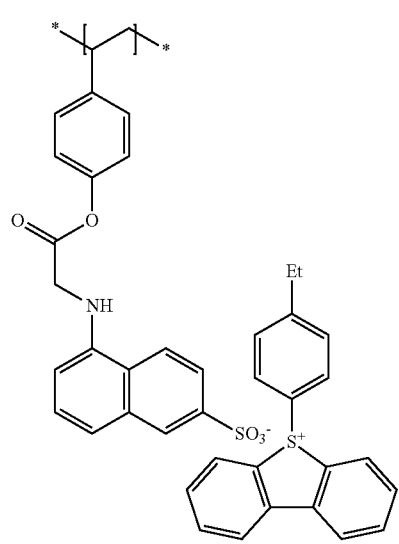
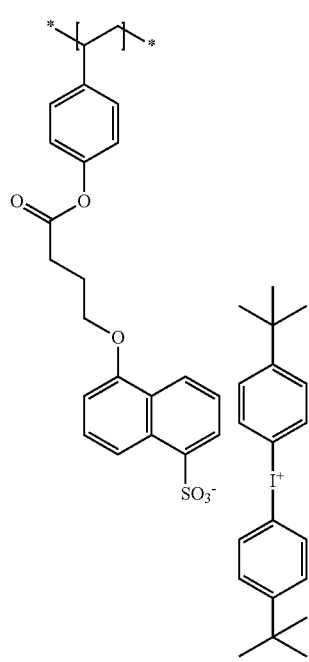
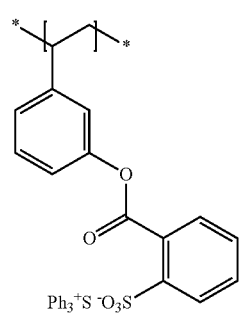
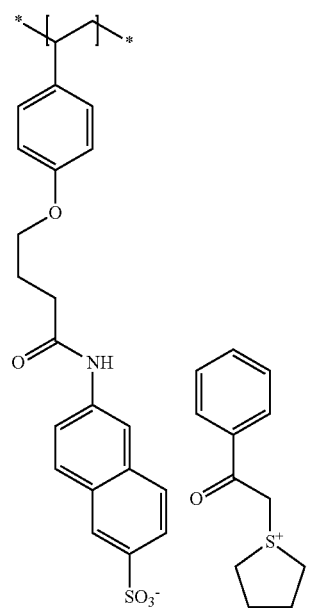

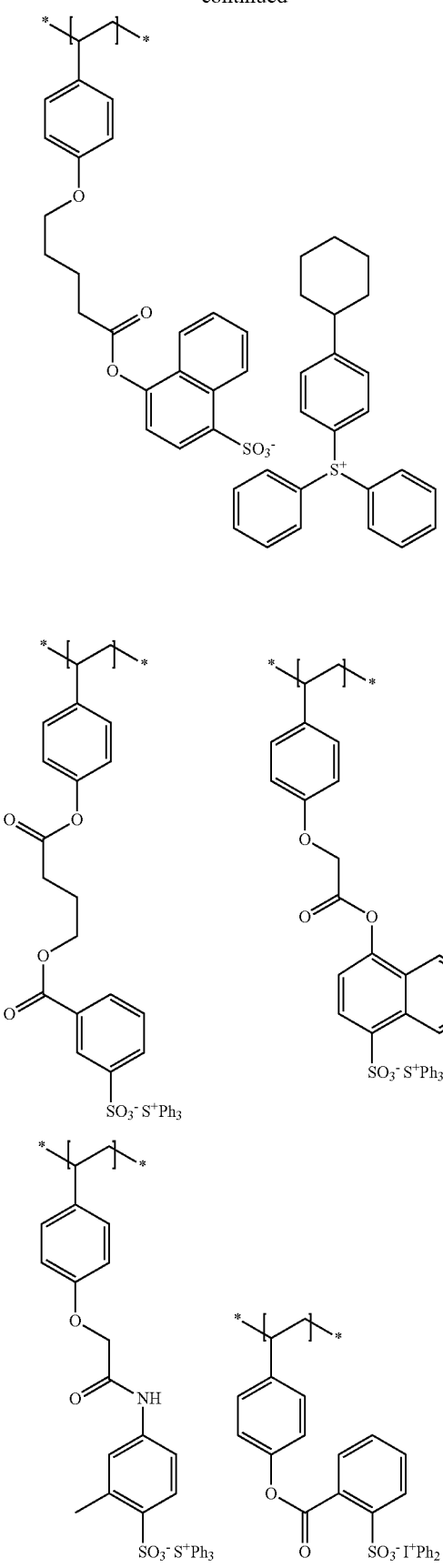
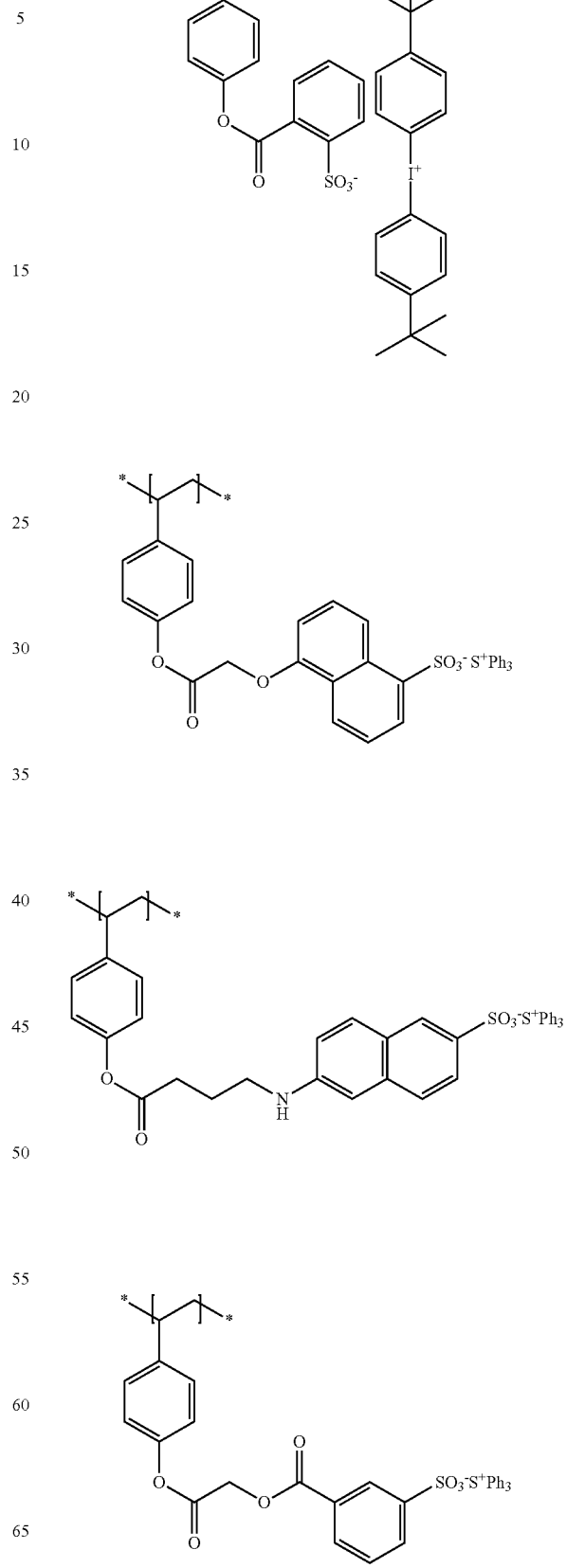

69
-continued
70
-continued
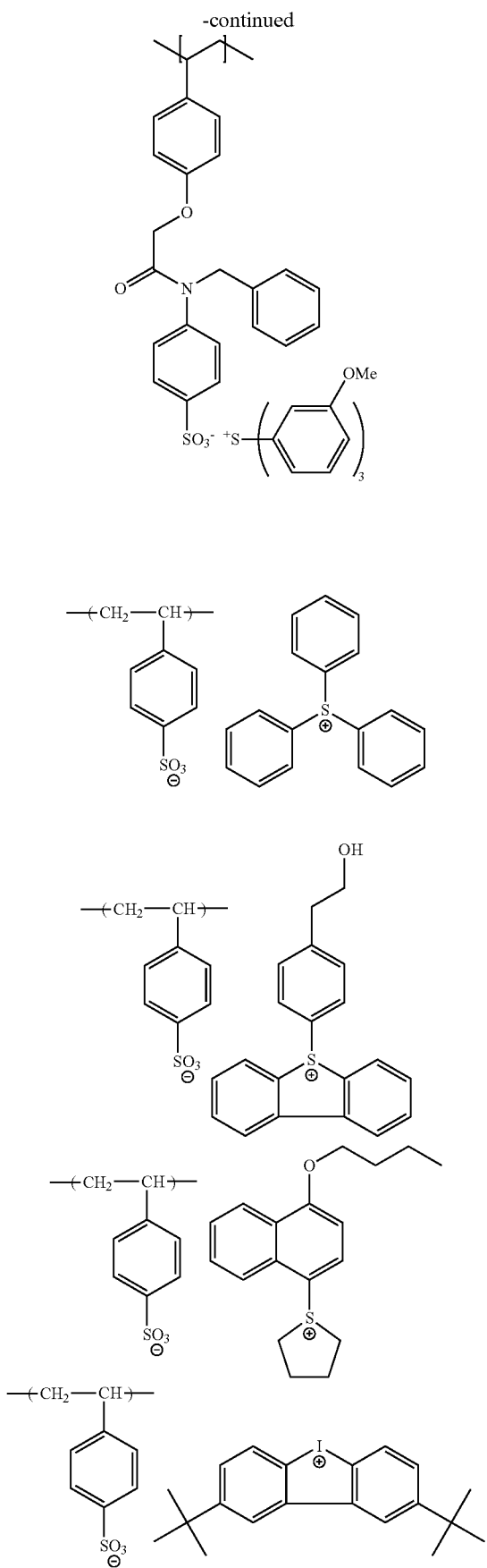
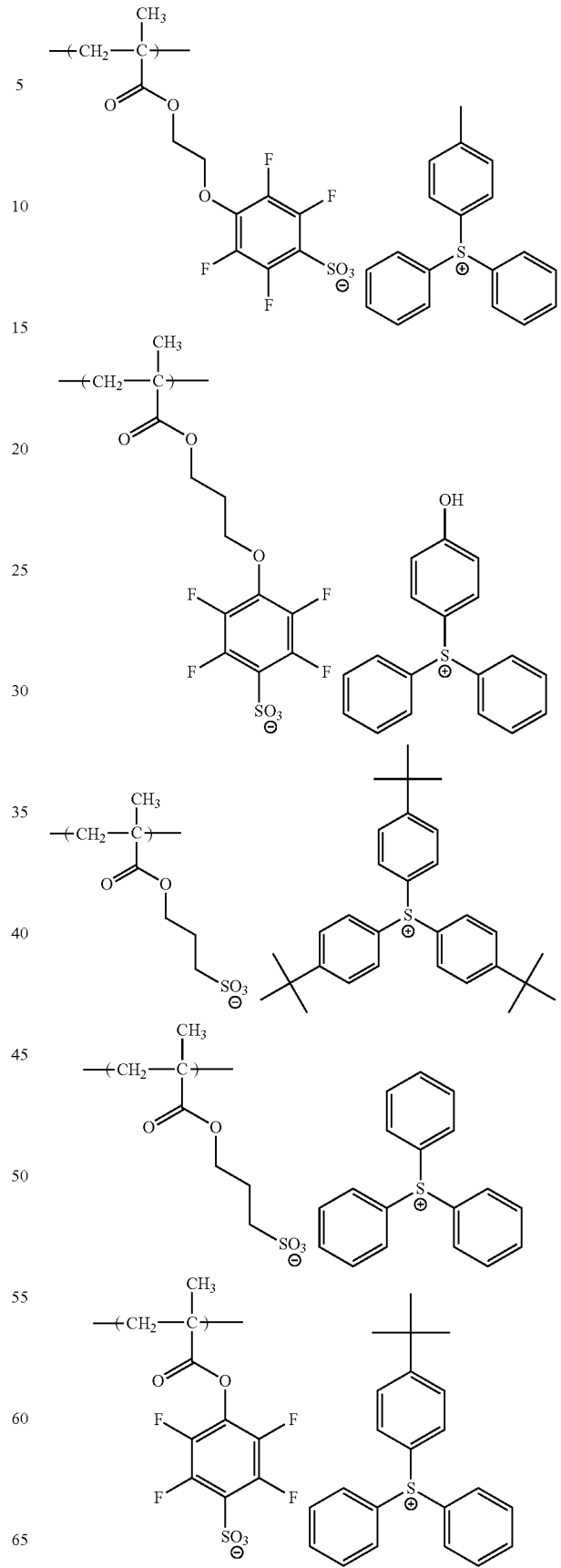

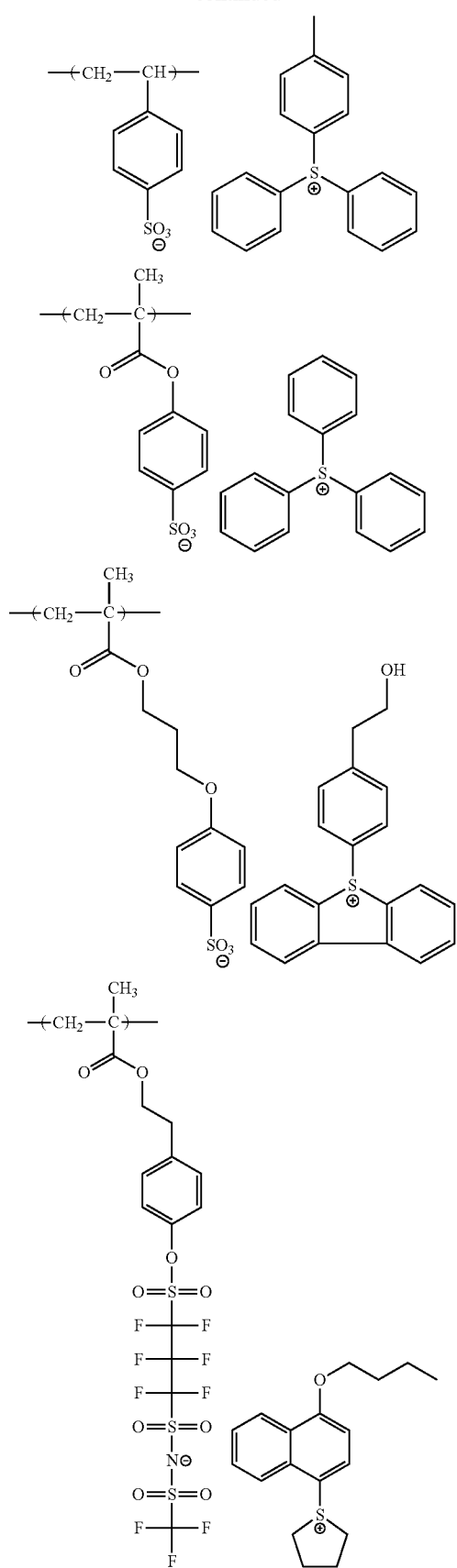
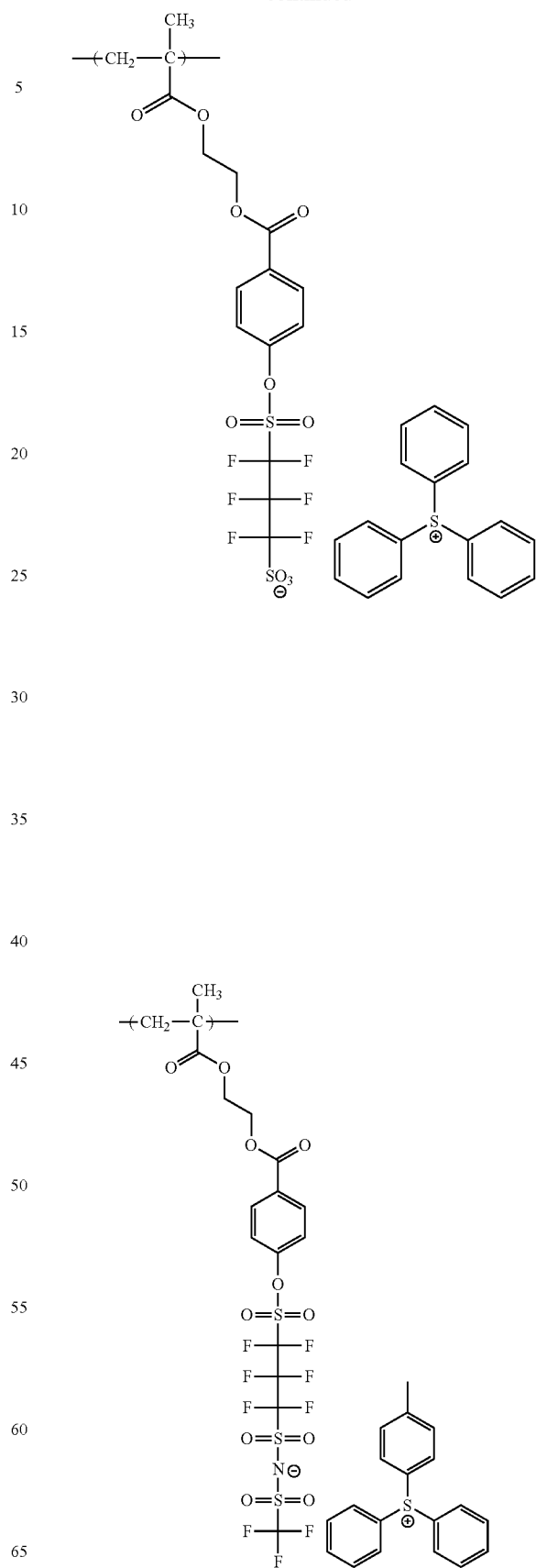

73
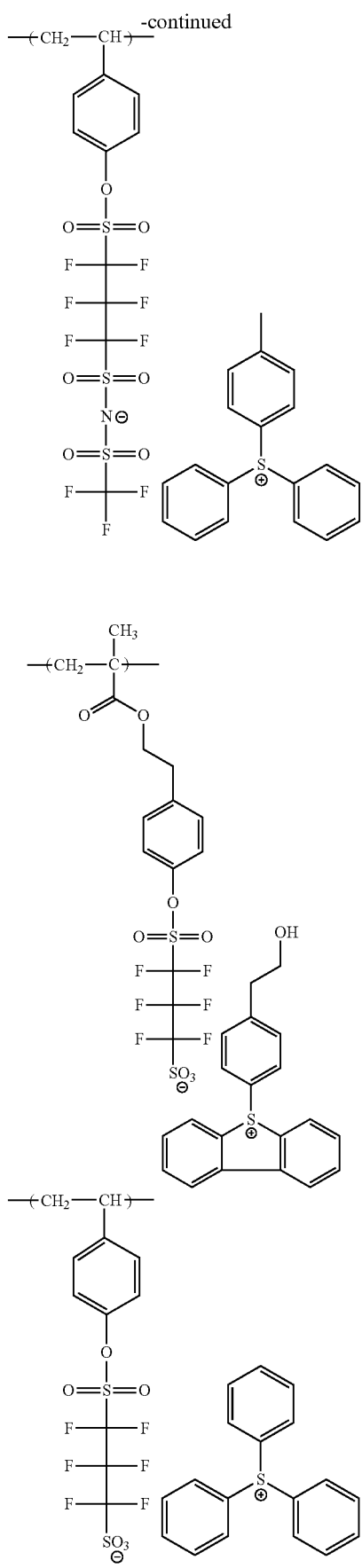
74
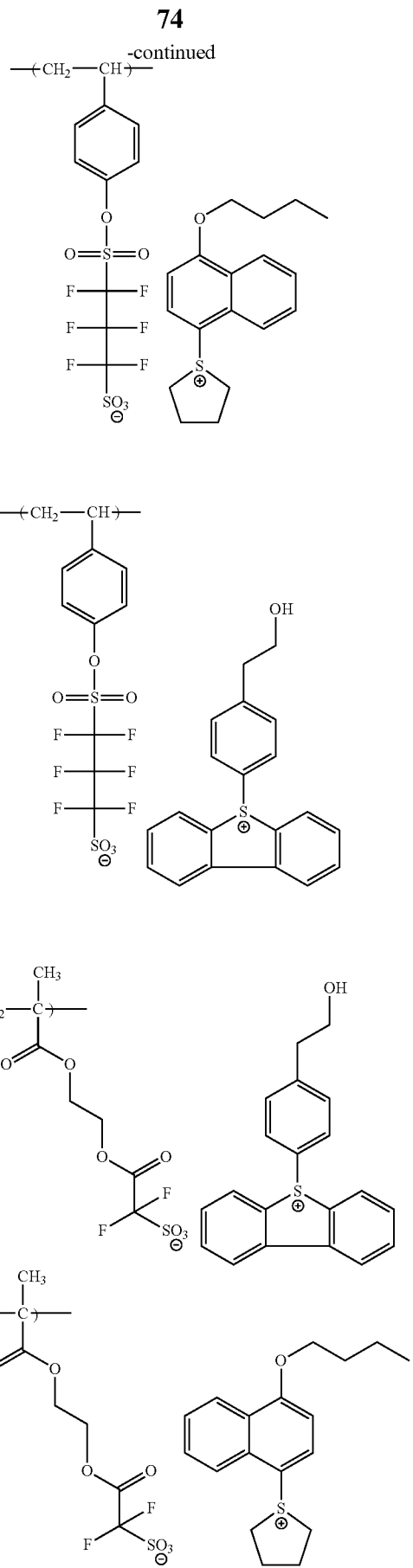

75
-continued
76
-continued
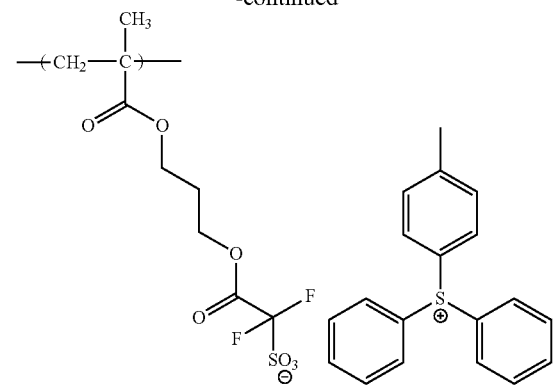
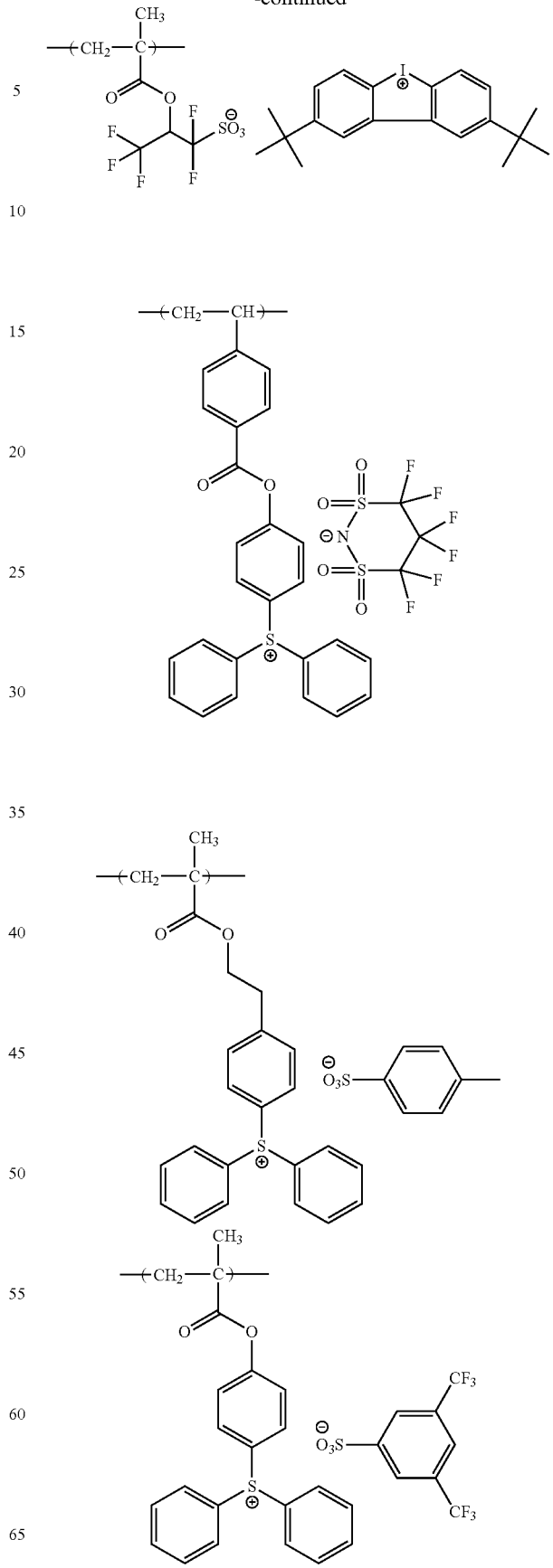

77
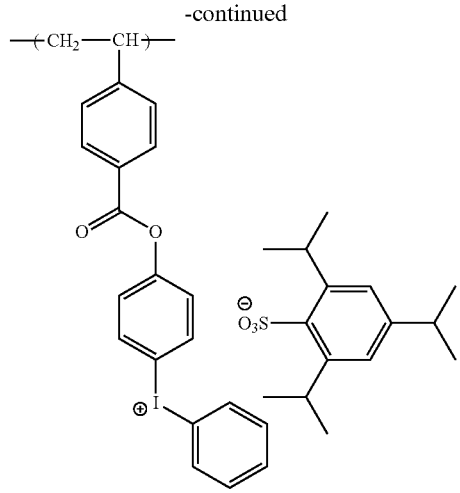
78
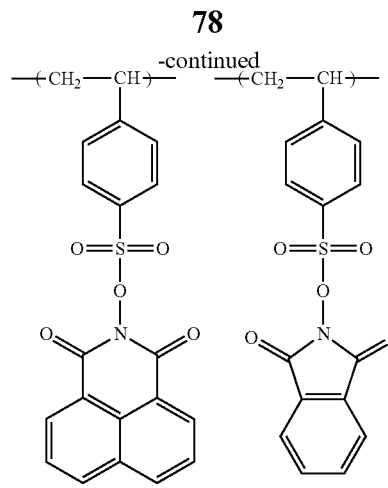
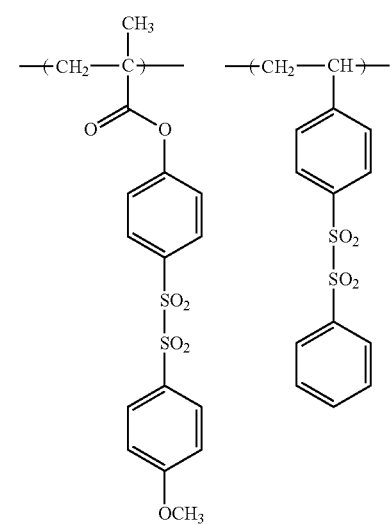
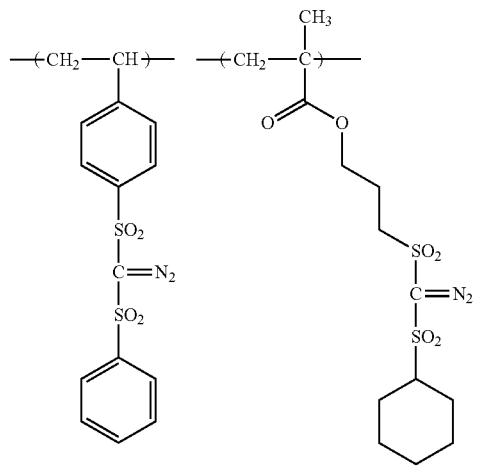
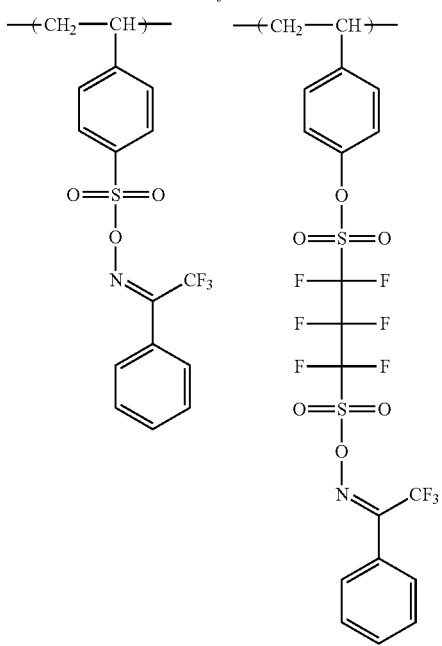
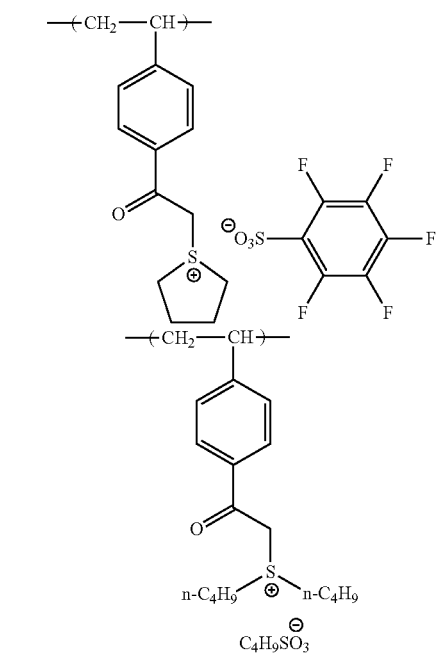

-continued
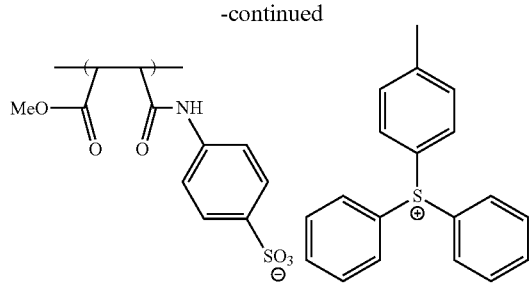
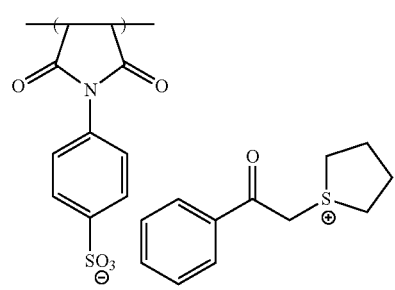
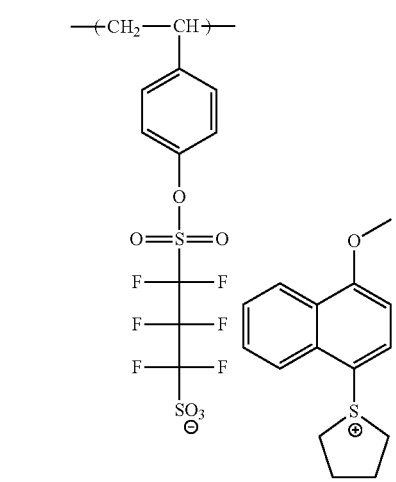
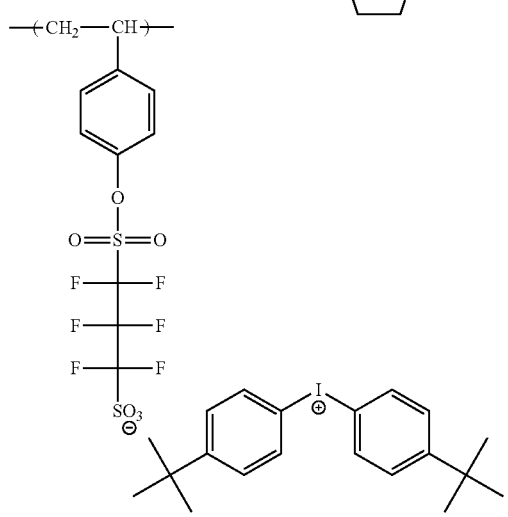
-continued
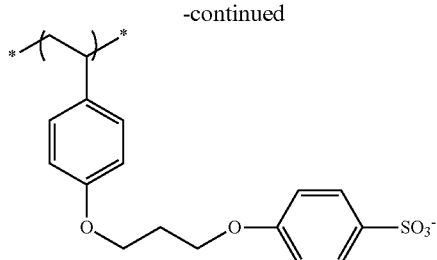
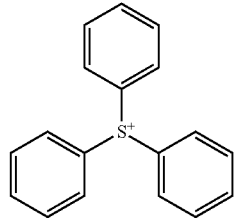
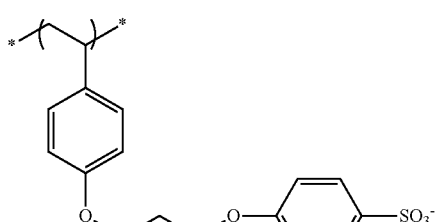
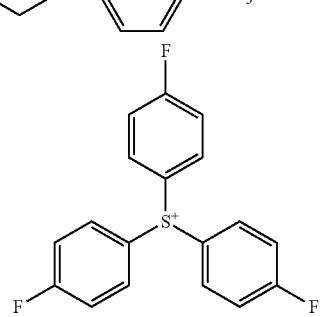
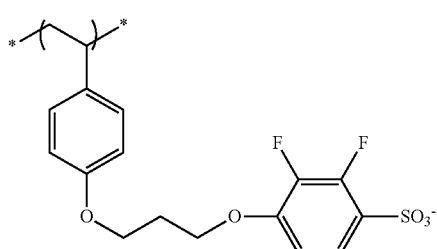
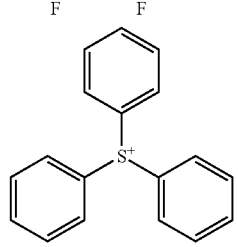

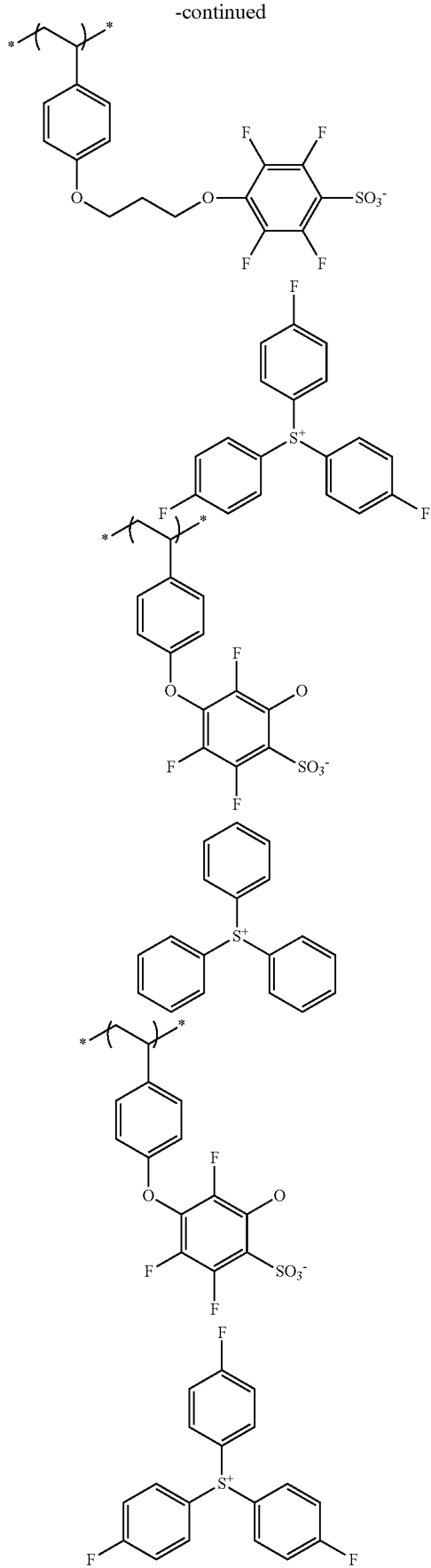
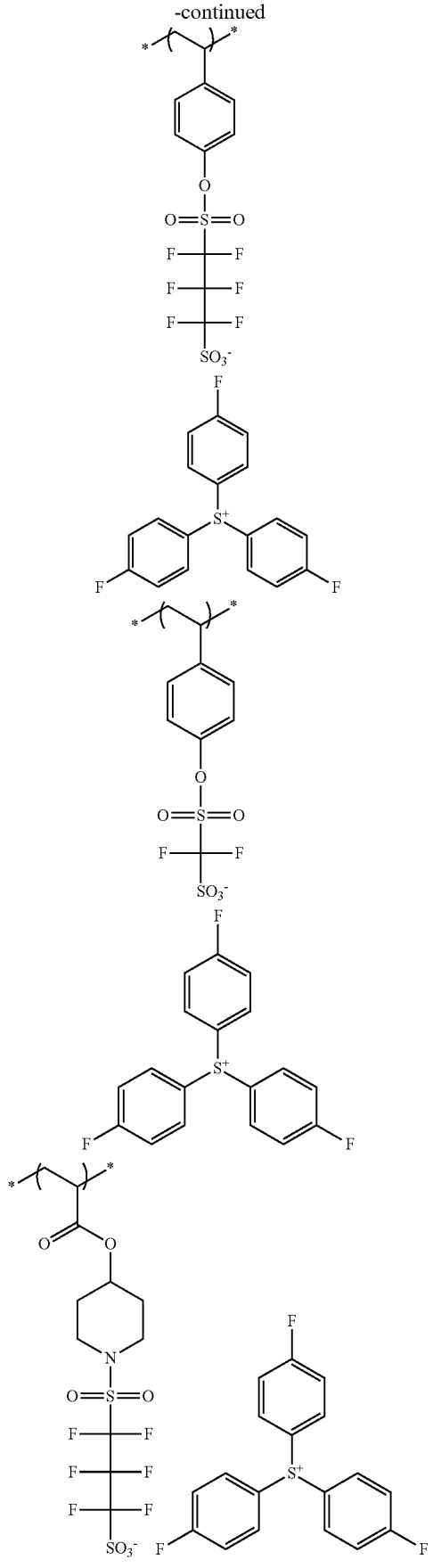

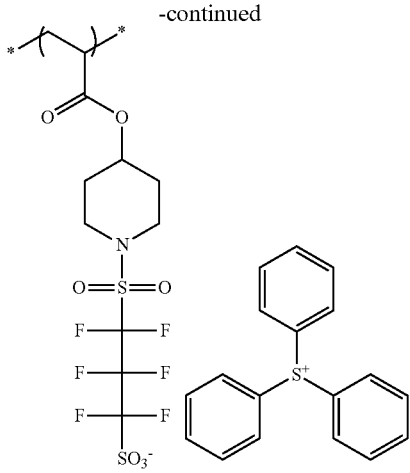

If the resin (A) contains the repeating unit represented by Formula (4), the content is preferably 1 mol % to 40 mol %, more preferably 2 mol % to 30 mol %, and particularly preferably 5 mol % to 25 mol %, base on the whole repeating unit in the resin (A).

The resin (A) may contain the repeating unit (b) having a polar group other than the repeating unit represented by Formula (1-2). Because of containing the repeating unit (b'), for example, the sensitivity of the composition having the resin may be improved. The repeating unit (b) is preferably a non acid-decomposable repeating unit (that is, the unit not having acid-decomposable group).

A "polar group" which may be contained in the repeating unit (b) includes, for example, the following (1) to (4). Further, hereinafter, "electronegativity" means the value by Pauling.

(1) A functional group containing a structure in which an oxygen atom and an atom having an electronegativity difference of 1.1 or more from an oxygen atom are bound by a single bond.

This polar group includes for example, a group containing the structure represented by O—H such as a hydroxyl group.

(2) A functional group containing a structure in which a nitrogen atom and an atom having an electronegativity difference of 0.6 or more from a nitrogen atom are bound by a single bond.

This polar group includes for example, a group containing the structure represented by N—H such as an amino group.

(3) A functional group containing a structure in which two atoms having an electronegativity difference of 0.5 or more from each other are bound by a double bond or triple bond.

This polar group includes, for example, a group containing the structure represented by C≡N, C═O, N═O, S═O or C═N.

(4) A functional group having an ionic moiety

This polar group includes, for example, a group having a moiety represented by N$^+$ or S$^+$.

The specific examples of the partial structure which may be contained in the "polar group" are shown below.

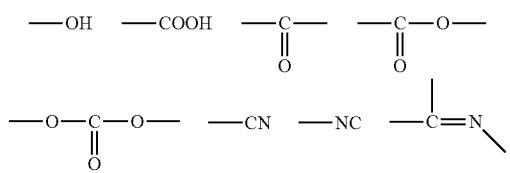

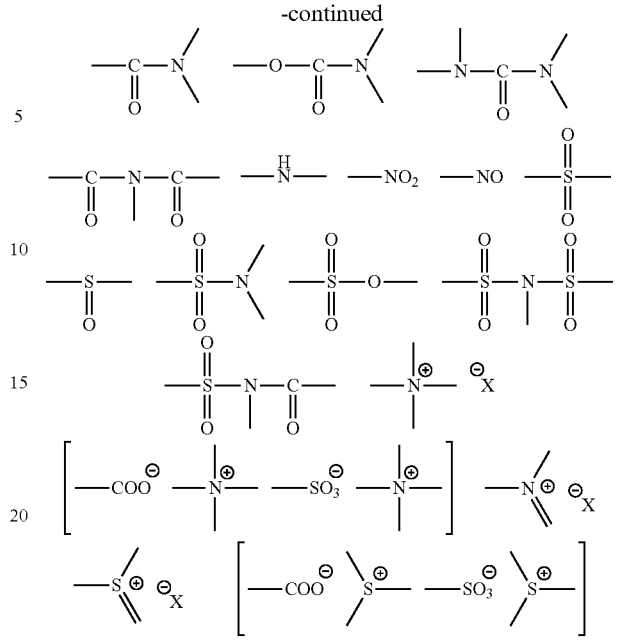

The polar group which may be contained in the repeating unit (b) is preferably selected from the group consisting of a hydroxyl group, a cyano group, a lactone group, a sultone group, a carboxylic acid group, a sulphonic acid group, an amide group, a sulpone amide group, an ammonium group, a sulphonium group, a carbonate group (—O—CO—O—) (for example, a cyclic carbonate ester structure, and the like) and a combination of two or more thereof, and particularly preferably a group containing an alcoholic hydroxy group, a cyano group, a lactone group, a sultone group, or a cyano-lactone structure.

If the resin further contains the repeating unit having an alcoholic hydroxy group, the exposure latitude (EL) of the composition containing the resin may be improved.

If the resin further contains a repeating unit having a cyano group, the sensitivity of the composition containing the resin may be improved.

If the resin further contains a repeating unit having a lactone group, a dissolution contrast against the developer containing an organic solvent may be further improved. In addition, in this way, the dry etching resistance, the coating property, and the adhesion property on the substrate of the composition containing the resin may be improved.

If the resin contains a repeating unit with a group containing a lactone structure having a cyano group, a dissolution contrast against the development containing an organic solvent may be improved. In addition, in this way, the dry etching resistance, the sensitivity, the coating property, and the adhesion property on the substrate of the composition containing the resin may be improved. Further, in this way, it is possible to charge the function caused by each of a cyano group and a lactone group to a single repeating unit, and to increase the degree of freedom of designing the resin.

The repeating unit having a polar group is preferably a repeating unit having a lactone structure as a polar group. The repeating unit having a lactone structure is more preferably a repeating unit represented by the following Formula (2).

(2)

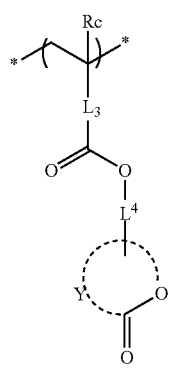

In Formula (2), $L_3$ and $L_4$ each independently represent a single bond or a divalent linking group, Y represents an atomic group capable of forming a lactone structure, and Rc represents a hydrogen atom, an alkyl group, a cyano group or a halogen atom.

Examples of the divalent linking group of $L_3$ and $L_4$ may include an alkylene group, a divalent linking group having a monocyclic or polycyclic cycloalkyl structure, an arylene group (for example, a phenylene group), an ether bond, an ester bond, a carbonyl group, or a divalent linking group obtained by combining thereof, which may have a substituent, and preferred examples thereof are the same as the preferred examples of the divalent linking group of $L_1$.

$L_3$ and $L_4$ are particularly preferably a single bond.

Examples of the lactone structure formed by the atomic group Y which may form a lactone structure may include the lactone structure represented by the following Formulas (LC1-1) to (LC1-17).

The alkyl group of Rc may have a substituent, and is preferably an alkyl group having 1 to 4 carbon atoms.

Preferred examples of the substituent which may be possessed by the alkyl group of Rc may include a hydroxyl group and a halogen atom.

Examples of the halogen atom of Rc may include a fluorine atom, a chlorine atom, a bromine atom and an oxo atom. Rc is preferably a hydrogen atom, a methyl group, a hydroxymethyl group, a perfluoroalkyl group having 1 to 4 carbon atoms (for example, a trifluoromethyl group), particularly preferably a hydrogen atom, and methyl group, and most preferably a methyl group.

The repeating unit having lactone structure is more preferably the repeating unit represented by the following Formula (AII).

(AII)

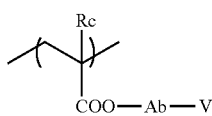

In Formula (AII),

Rc has the same meaning of Rc in Formula (2).

Ab represents a single bond, an alkylene group, a divalent linking group having a monocyclic or polycyclic cycloalkyl structure, an ether bond, an ester bond, a carbonyl group or a divalent linking group obtained by combining thereof. Ab is preferably a single bond and a divalent linking group represented by -$Ab_1$-$CO_2$—.

$Ab_1$ is a straight or branched alkylene group and a monocyclic or polycyclic cycloalkylene group, and preferably a methylene group, an ethylene group, a cyclohexylene group, an adamantylene group and a norbornylene group.

V represents a group having a lactone structure or a sultone structure.

As a group having a lactone structure, any group having a lactone structure may be used as long as it has a lactone structure, but a 5- to 7-membered ring lactone structure is preferred, and it is preferred that another ring structure is condensed as a form in which a bicyclo or spiro structure is formed in a 5- to 7-membered ring lactone structure. It is more preferred that the resin (A) has a repeating unit having a lactone structure represented by any one of the following Formulas (LC1-1) to (LC1-17). Further, the lactone structure may be bonded directly to the main chain. A preferred lactone structure is (LC1-1), (LC1-4), (LC1-5), (LC1-6), (LC1-8), (LC1-13), and (LC1-14),

LC1-1

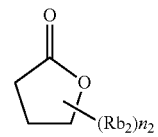

LC1-2

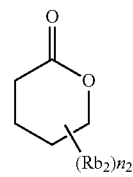

LC1-3

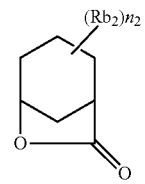

LC1-4

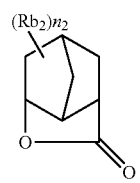

LC1-5

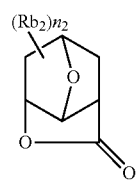

LC1-6

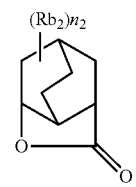

-continued

LC1-7 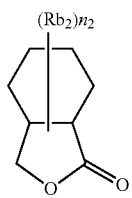

LC1-8 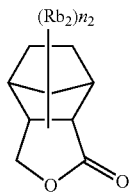

LC1-9 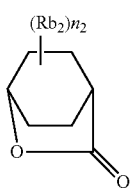

LC1-10 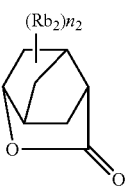

LC1-11 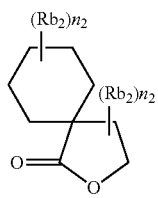

LC1-12 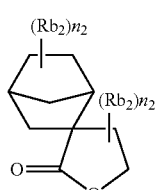

LC1-13 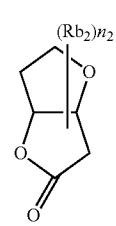

LC1-14 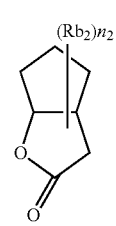

-continued

LC1-15 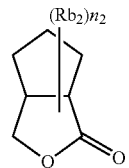

LC1-16 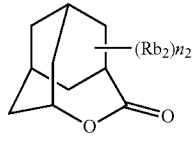

LC1-17 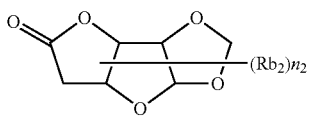

The lactone structure moiety may or may not have a substituent ($Rb_2$). Preferred examples of the substituent ($Rb_2$) may include an alkyl group having 1 to 8 carbon atoms, a cycloalkyl group having 4 to 7 carbon atoms, an alkoxy group having 1 to 8 carbon atoms, an alkoxycarbonyl group having 2 to 8 carbon atoms, a carboxyl group, a halogen atom, a hydroxyl group, a cyano group, an acid-decomposable group, and the like. An alkyl group having 1 to 4 carbon atoms, a cyano group, and an acid-decomposable group are more preferred. $n_2$ represents an integer of 0 to 4. When $n_2$ is 2 or more, the substituents ($Rb_2$'s) may be the same as or different. Further, the substituents ($Rb_2$'s) may be bound with each other to form a ring.

The repeating unit having a lactone group usually has optical isomers, but any optical isomers may be used. In addition, the optical isomer may be used either alone, or in a mixture of two or more thereof. When one kind of the optical isomers is mainly used, the optical purity (ee) is preferably 90% or more, and more preferably 95% or more.

The resin (A) may or may not have a repeating unit having a lactone structure, but if the repeating unit having a lactone structure is contained, the content of the repeating unit in the resin (A) is preferably in a range of 1 to 40 mol %, more preferably in a range of 5 to 30 mol %, and still more preferably in a range of 8 to 20 mol % based on the whole repeating units of the resin.

In the present invention, it is preferred that the resin (A) contains the repeating unit represented by Formula (1-0) or (1-1), the repeating unit represented by Formula (1-2), and the repeating unit represented by Formula (2), the content of the repeating unit represented by Formula (1-0) or (1-1) is 45 to 85 mol % based on the whole repeating units in the resin (A), the content of the repeating unit represented by Formula (1-2) is 10 to 45 mol % based on the whole repeating units in the resin (A), and the content of the repeating unit represented by Formula (2) is 1 to 40 mol % based on the whole repeating units in the resin (A).

It is more preferred that the content of the repeating unit represented by Formula (1-0) or (1-1) is 45 to 85 mol % based on the whole repeating units in the resin (A), the content of the repeating unit represented by Formula (1-2) is 15 to 45 mol % based on the whole repeating units in the resin (A), and the content of the repeating unit represented by Formula (2) is 1 to 40 mol % based on the whole repeating units in the resin (A).

It is still more preferred that the content of the repeating unit represented by Formula (1-0) or (1-1) is 55 to 80 mol % based on the whole repeating units in the resin (A), the content of the repeating unit represented by Formula (1-2) is 20 to 45 mol % based on the whole repeating units in the resin (A), and the content of the repeating unit represented by Formula (2) is 5 to 30 mol % based on the whole repeating units in the resin (A).

It is particularly preferred that the content of the repeating unit represented by Formulas (1-0) or (1-1) is 60 to 80 mol % based on the whole repeating units in the resin (A), the content of the repeating unit represented by Formula (1-2) is 30 to 45 mol % based on the whole repeating units in the resin (A), and the content of the repeating unit represented by Formula (2) is 8 to 20 mol % based on the whole repeating units in the resin (A).

Specific examples of the repeating unit having a lactone structure in the resin (A) are shown below, but the present invention is not limited thereto. In the formulas, Rx represents H, $CH_3$, $CH_2OH$ or $CF_3$.

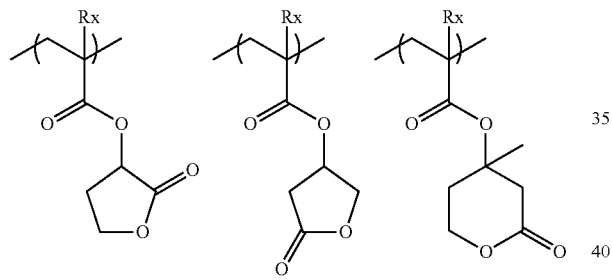

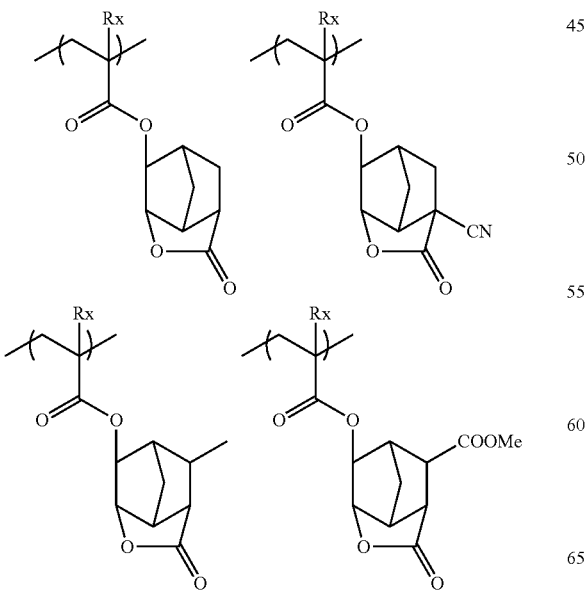

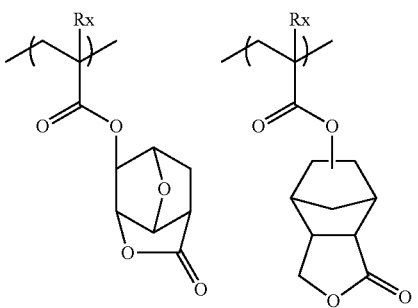

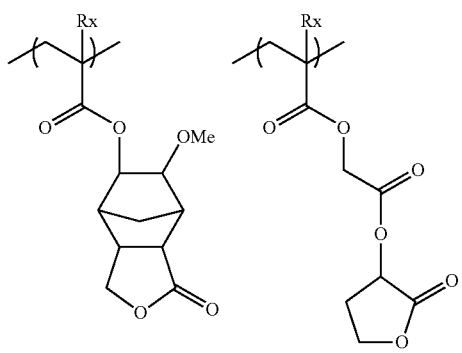

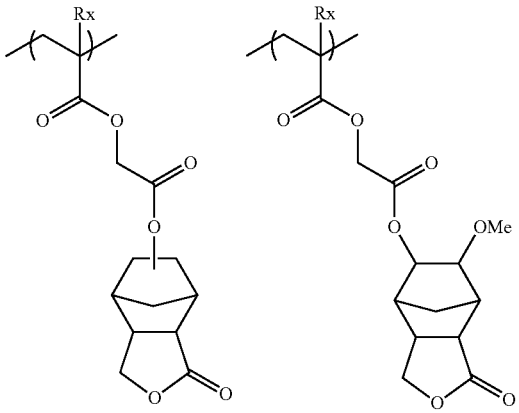

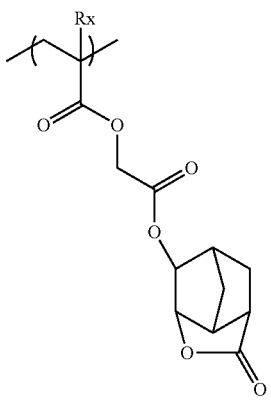

-continued

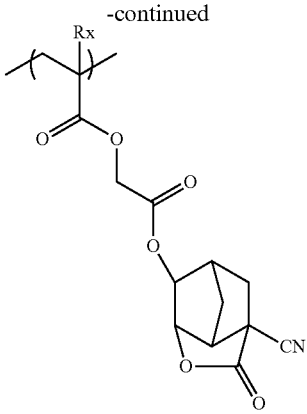

In addition, a sultone group possessed by the resin (A) is preferably represented by the following Formula (SL-1) or (SL-2). $Rb_2$ and $n_2$ in the formulas have the same meaning as those in Formulas (LC1-1) to (LC1-17).

SL1-1

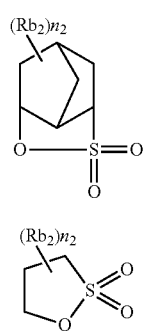

SL1-2

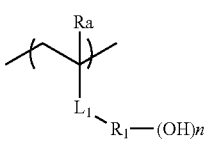

The repeating unit containing a sultone group which the resin (A) has is preferably a group in which the lactone group in the repeating unit having the lactone group is substituted with a sultone group.

If a polar group possessed by the repeating unit (b) is an alcoholic hydroxy group, it is preferred to be represented by at least one selected from the group consisting of the following Formulas (I-1H) to (I-10H). In particular, it is more preferred to be represented by at least one selected from the group consisting of the following Formulas (I-1H) to (I-3H), and it is still more preferred to be represented by the following Formula (I-1H).

(I-1H)

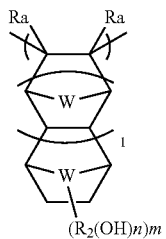

(I-2H)

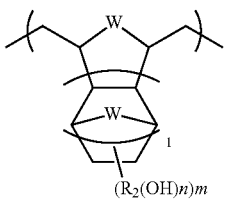

(I-3H)

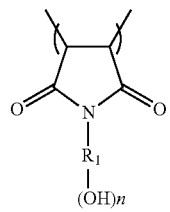

(I-4H)

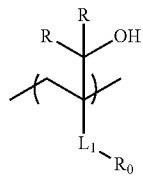

(I-5H)

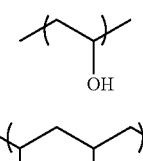

(I-6H)

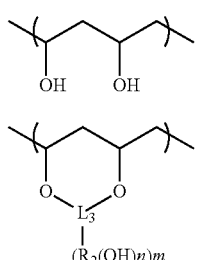

(I-7H)

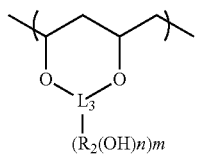

(I-8H)

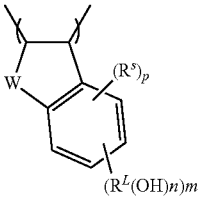

(I-9H)

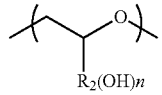

(I-10H)

In the formulas,

Ra's each independently represent a hydrogen atom, an alkyl group or a group represented by —$CH_2$—O—$Ra_2$. Here, $Ra_2$ represents a hydrogen atom, an alkyl group or an acyl group.

$R_1$ represents a (n+1)-valent organic group.

If m≥2, $R_2$'s each independently represent a single bond or (n+1) valent organic group.

W represents a methylene group, an oxygen atom or a sulfur atom.

n and m represent an integer of 1 or more. Further, in Formula (I-2), (I-3) or (I-8), if $R_2$ represents a single bond, n is an integer of 1.

l represents an integer of 0 or more.

L₁ represents a linking group represented by —COO—, —OCO—, —CONH—, —O—, —Ar—, —SO₃— or —SO₂NH—. Here, Ar represents a divalent aromatic ring group.

R's each independently represent a hydrogen atom or an alkyl group.

R₀ represents a hydrogen atom or an organic group.

L₃ represents a (m+2)-valent linking group.

If m≥2, $R^L$'s each independently represent a (n+1)-valent linking group.

If p≥2, $R^S$'s each independently represent a substituent. If p≥2, $R^S$'s may be bound with each other to from a ring.

p represents an integer of 0 to 3.

Ra represents a hydrogen atom, an alkyl group or a group represented by —CH₂—O—Ra₂. Ra is preferably a hydrogen atom or an alkyl group having 1 to 10 carbon atoms, more preferably, a hydrogen atom or a methyl group.

W represents a methylene group, an oxygen atom or a sulfur atom. W is preferably a methylene group or an oxygen atom.

R₁ represents a (n+1)-velent organic group. R₁ is preferably a non-aromatic hydrocarbon group. In this case, R₁ may be a chained hydrocarbon or an alicyclic hydrocarbon group. R₁ is more preferably an alicyclic hydrocarbon group.

R₂ represents a single bond or a (n+1)-valent an organic group. R₂ is preferably a single bond or a non-aromatic hydrocarbon group. In this case, R₂ may be a chained hydrocarbon group or an alicyclic hydrocarbon group.

If R₁ and/or R₂ is a chained hydrocarbon group, this chained hydrocarbon group may be straight or branched. In addition, this chained hydrocarbon group has preferably 1 to 8 carbon atoms. For example, if R₁ and/or R₂ is an alkylene group, R₁ and/or R₂ is preferably a methylene group, an ethylene group, a n-propylene group, an isopropylene group, a n-butylene group, an isobutylene group or a sec-butylene group.

If R₁ and/or R₂ is an alicyclic hydrocarbon group, this alicyclic hydrocarbon group may be monocyclic or polycyclic. This alicyclic hydrocarbon group has, for example, a monocyclo, a bicyclo, a tricyclo or a tetracyclo structure. This alicyclic hydrocarbon group has usually 5 or more carbon atoms, preferably 6 to 30 carbon atoms, and more preferably 7 to 25 carbon atoms.

This alicyclic hydrocarbon group is, for example, a group having a partial structure listed below. These partial structures each may have a substituent. In addition, in each of the partial structures, a methylene group (—CH₂—) may be substituted with an oxygen atom (—O—), a sulfur atom (—S—), a carbonyl group [—C(=O)—], a sulphonyl group [—S(=O)₂—], a sulphinyl group [—S(=O)—] or an imino group [—N(R)—] (R is a hydrogen atom or an alkyl group).

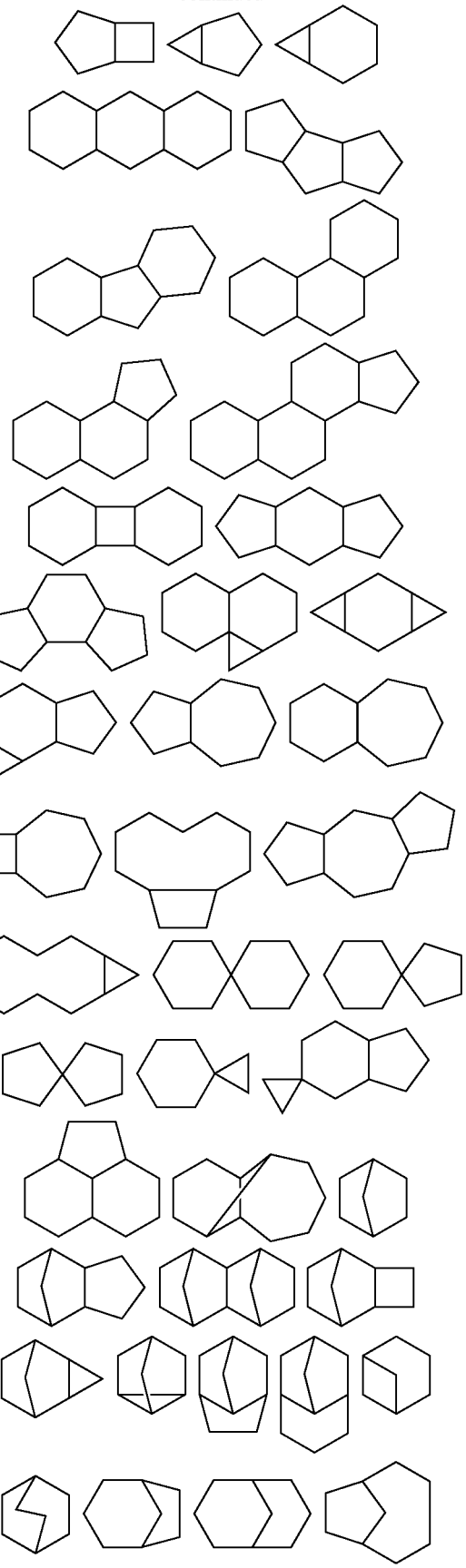

-continued

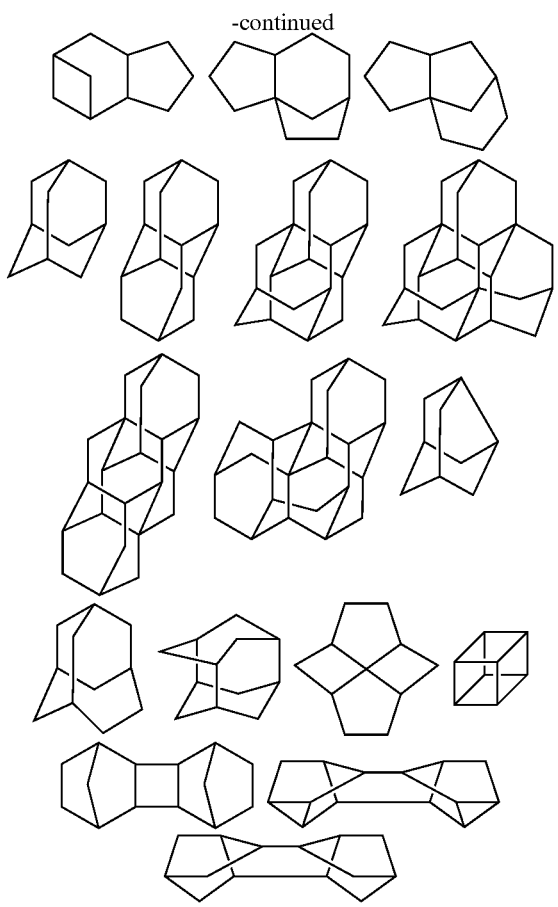

For example, $R_1$ and/or $R_2$ is a cycloalkylene group, $R_1$ and/or $R_2$ is preferably an adamantylene group, a noradamantylene group, a decahydronaphthylene group, a tricyclodecanylene group, a tetracyclododecanylene group, a norbornylene group, a cyclopentylene group, a cyclohexylene group, a cycloheptylene group, a cyclooctylene group, a cyclodecanylene group or a cyclododecanylene group, and more preferably, an adamantylene group, a noradamantylene group, a norbornylene group, a cyclohexylene group, a cyclopentylene group, a cyclodecanylene group or a cyclododecanylene group.

The non-aromatic hydrocarbon group of $R_1$ and/or $R_2$ may have a substituent. Examples of the substituent may include an alkyl group having 1 to 4 carbon atoms, a halogen atom, a hydroxyl group, an alkoxy group having 1 to 4 carbon atoms, a carboxyl group and an alkoxycarbonyl group having 2 to 6 carbon atoms. The alkyl group, the alkoxy group and the alkoxycarbonyl group may have a substituent. Examples of the substituent may include a hydroxyl group, a halogen atom and an alkoxy group.

$L_1$ represents a linking group represented by —COO—, —OCO—, —CONH—, —O—, —Ar—, —SO$_3$— or —SO$_2$NH—. Here, Ar represents a divalent aromatic ring group. $L_1$ is preferably a linking group represented by —COO—, —CONH— or —Ar—, and more preferably a linking group represented by —COO— or —CONH—.

R represents a hydrogen atom or an alkyl group. The alkyl group may be a straight or branched. The number of carbon atoms of the alkyl group is preferably 1 to 6, and more preferably 1 to 3. R is preferably a hydrogen atom or a methyl group, and more preferably a hydrogen atom.

$R_0$ represents a hydrogen atom or an organic group. An organic group includes, for example, an alkyl group, a cycloalkyl group, an aryl group, an alkynyl group and an alkenyl group. $R_0$ is preferably a hydrogen atom or an alkyl group, more preferably a hydrogen atom or a methyl group.

$L_3$ represents a (m+2)-valent linking group. That is, $L_3$ represents a tri- or higher valent linking group. Examples of the linking group may include corresponding groups as in the specific examples disclosed later.

$R^L$ represents a (n+1)-valent linking group. That is, $R^L$ represents a di- or higher valent linking group. Examples of the linking group include an alkylene group, a cycloalkylene group and corresponding groups as in the specific examples disclosed later. $R^L$'s may be bound with each other or bount with the following $R^S$ to form a ring structure.

$R^S$ represents a substituent. Examples of the substituent may include an alkyl group, an alkenyl group, an alkynyl group, an aryl group, an alkoxy group, an actkoxy group, an alkoxycarbonyl group and a halogen atom.

n is an integer greater than 1. n is preferably an integer of 1 to 3, and more preferably an integer of 1 or 2. Further, if n is an integer of 2 or more, the dissolution contrast against the development containing an organic solvent may be improved. As a result, in this way, the limit resolution and the roughness propery may be further improved.

m is an integer greater than 1. m is preferably an integer of 1 to 3, and more preferably 1 or 2.

l is an integer greater than 0. l is preferably 0 or 1.

p is an integer of 0 to 3.

If the repeating unit having a group capable of decomposing by the action of an acid to generate an alcoholic hydroxyl group is used in combination with the repeating unit represented by at least one selected from the group consisting of Formulas (I-1H) to (I-10H), for example, it is possible to improve the exposure latitude (EL) by the suppression of acid diffusion by an alcoholic hydroxy group and by the increase in sensitivity of the group capable of decomposing by the action of an acid to generate an alcoholic hydroxyl group without deteriorating other performance.

If the unit has an alcoholic hydroxy group, the content of the repeating unit is preferably 1 to 60 mol %, more preferably 3 to 50 mol %, and still more preferably 5 to 40 mol % based on the whole repeating units in the resin (A).

Hereinafter, specific examples of the repeating unit represented by Formulas (I-1H) to (I-10H) are shown below. Further, in the specific examples, Ra has the same meaning as those in Formulas (I-1H) to (I-10H).

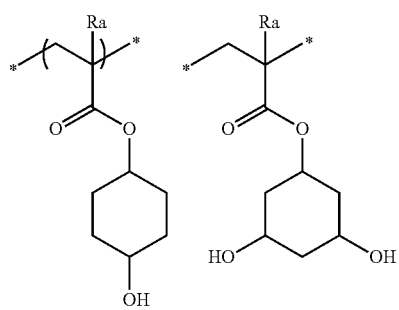

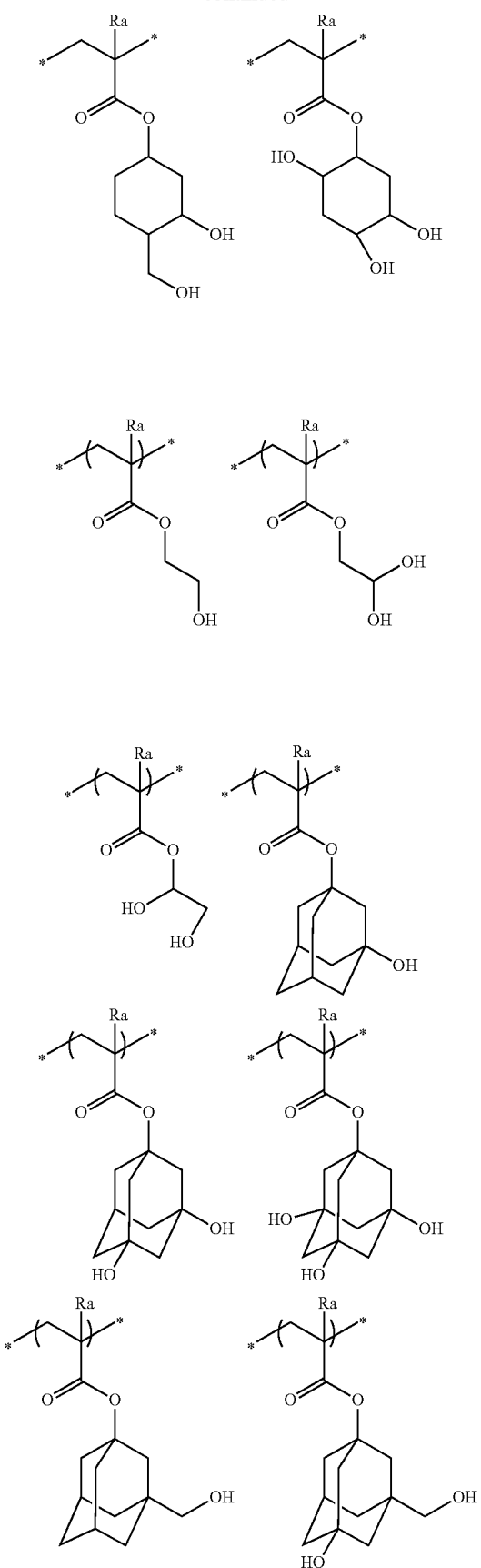
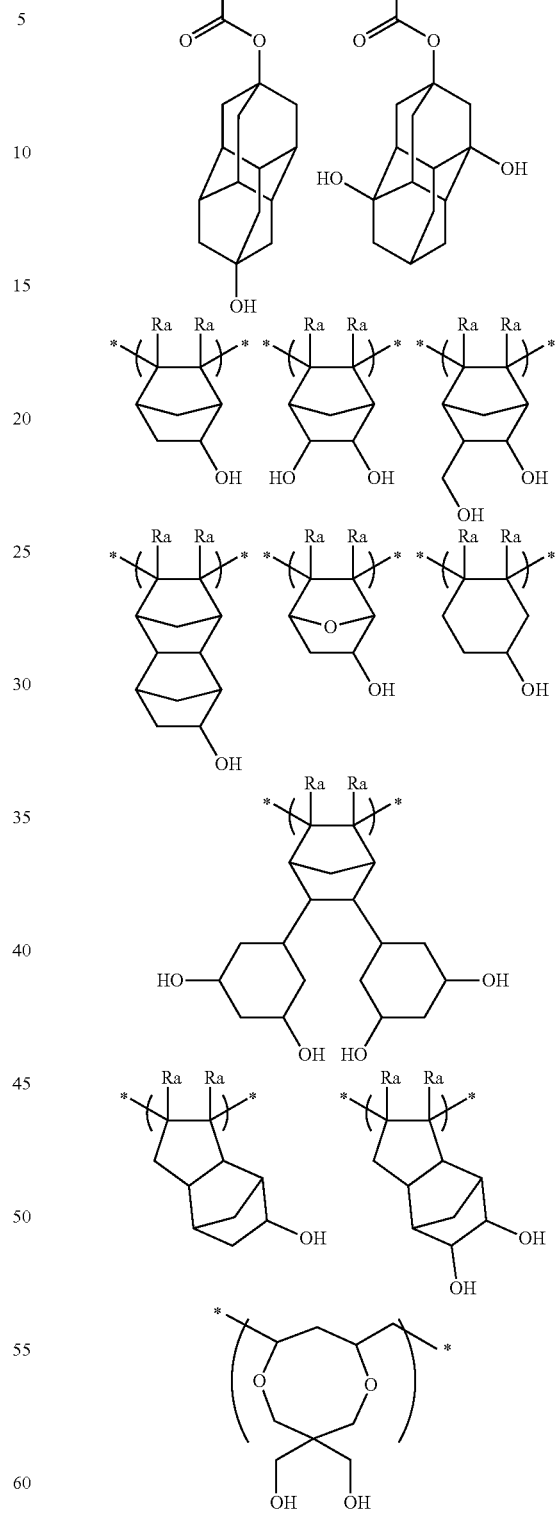
If a polar group possessed by the repeating unit (b) is an alcoholic hydroxy group or a cyano group, one preferred aspect of the repeating unit may be a repeating unit having an alicyclic hydrocarbon structure substituted with a hydroxyl group or a cyano group. At this time, it is preferred that the unit does not have an acid-decomposable group. In an alicyclic hydrocarbon structure substituted with a hydroxyl group or a cyano group, the alicyclic hydrocarbon structure is preferably an adamantyl group, diadamantyl group, or norbornanyl group. The preferred alicyclic hydrocarbon structure substituted with a hydroxyl group or a cyano group is preferably a partial structure represented by the following Formulas (VIIa) to (VIIc). Accordingly, the adhesion property on a substrate and the affinity to the developer may be improved.

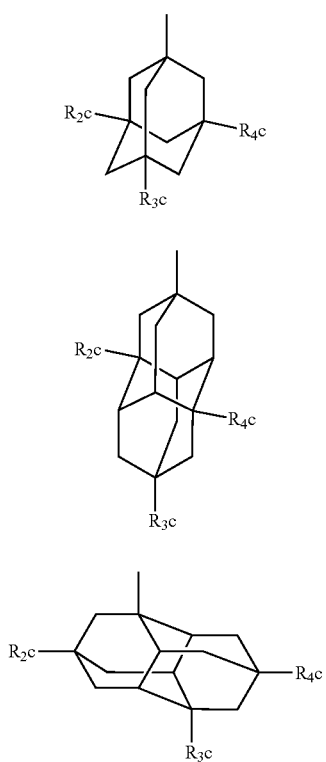

In Formulas (VIIa) to (VIIc), $R_2c$ to $R_4c$ each independently represent a hydrogen atom, a hydroxyl group or a cyano group. But, at least one of $R_2c$ to $R_4c$ represents a hydroxyl group. Preferably, one or two of $R_2c$ to $R_4c$ are a hydroxyl group, and the rest is a hydrogen atom. In Formula (VIIa), it is more preferred that two of $R_2c$ to $R_4c$ are a hydroxyl group, and the resat is a hydrogen atom.

The repeating unit having a partial structure represented by Formulas (VIIa) to (VIIc) includes the repeating unit represented by the following Formulas (AIIa) to (AIIc).

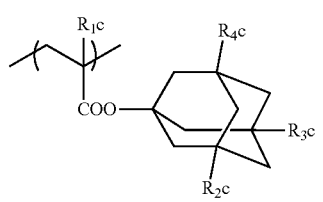

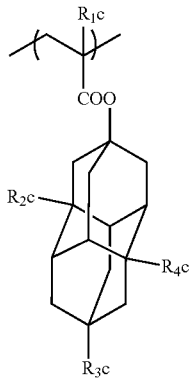

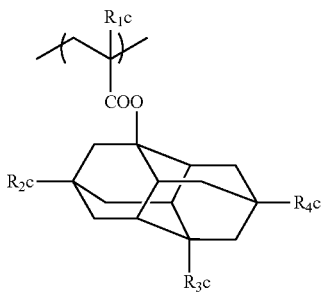

In Formulas (AIIa) to (AIIc), $R_1c$ represents a hydrogen atom, a methyl group, a trifluoro methyl group or a hydroxymethyl group.

$R_2c$ to $R_4c$ have the same meaning as $R_2c$ to $R_4c$ in Formulas (VIIa) to (VIIc).

The resin (A) may or may not have a repeating unit having a hydroxyl group or a cyano group, but if the repeating unit is contained, the content of the repeating unit having a hydroxyl group or a cyano group is preferably 1 to 60 mol %, more preferably 3 to 50 mol %, and still more preferably 5 to 40 mol % based on the whole repeating unit in the resin (A).

Specific examples of the repeating unit having a hydroxyl group or a cyano group are shown below, but the present invention is not limited thereto.

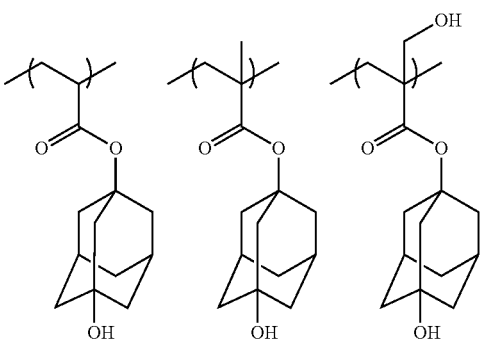

-continued

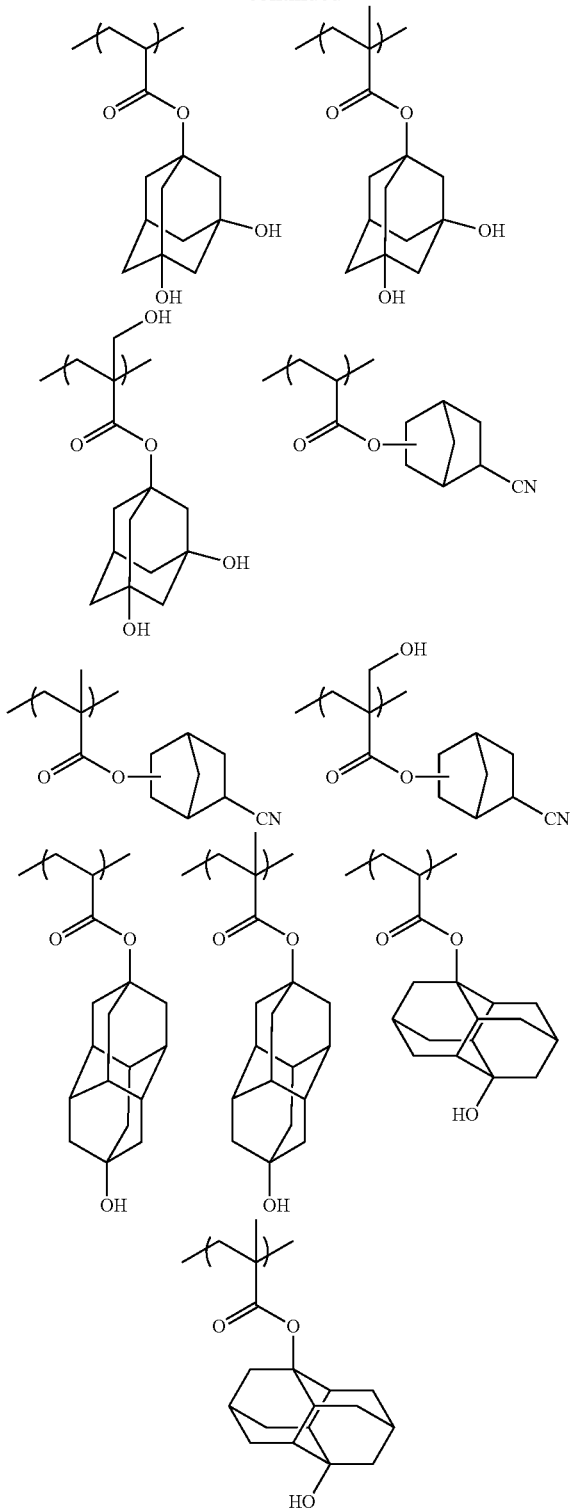

In addition, a polar group that the repeating unit (b) may have is an acidic group, and this is one of the particularly preferred aspects. Preferred examples of the acidic group may include a phenolic hydroxyl group, a carboxylic acid group, a sulphonic acid group, a fluorinated alcohol group (for example, hexafluoroisopropanol group), a sulfone amide group, a sulphonyl imide group, an (alkylsulphonyl)(alkylcarbonyl)methylene group, an (alkylsulphonyl)(alkylcarbonyl)imide group, a bis(alkylcarbonyl)methylene group, a bis(alkylcarbonyl)imide group, a bis(alkylsulphonyl)methylene group, a bis(alkylsulphonyl)imide group, a tris(alkylcarbonyl)methylene group, and a tris(alkylsulphonyl)methylene group. Among them, the repeating unit (b) is more preferably the repeating unit having a carboxyl group. By containing the repeating unit having an acidic group, the resolution may be increased in the use of a contact hole. The repeating unit having an acidic group may include a repeating unit, in which the acidic group is directly bonded to the main chain of the resin, such as the repeating unit by an acrylic acid or a methacrylic acid, or a repeating unit in which the acidic group is bonded to the main chain of the resin through a linking group. Further, the repeating unit may also be introduced into the end of the polymer chain by using a polymerization initiator having an acidic group or a chain transfer agent at the time of polymerization, and all of these cases are preferred. It is particularly preferably is a repeating unit by an acrylic acid or a methacrylic acid.

An acidic group which may be possessed by the repeating unit (b) may or may not have an aromatic ring. If the repeating unit (b) has an acidic group, the content of the repeating unit having an acidic group is preferably 30 mol % or less, and more preferably 20 mol % or less based on the whole repeating unit in the resin (A). If the resin (A) contains a repeating unit having an acidic group, the content of the repeating unit having an acidic group in the resin (A) is usually 1 mol % or more.

Specific examples of the repeating unit having an acidic group are shown below, but the present invention is not limited thereto.

Among the specific examples, Rx represents H, CH$_3$, CH$_2$OH or CF$_3$.

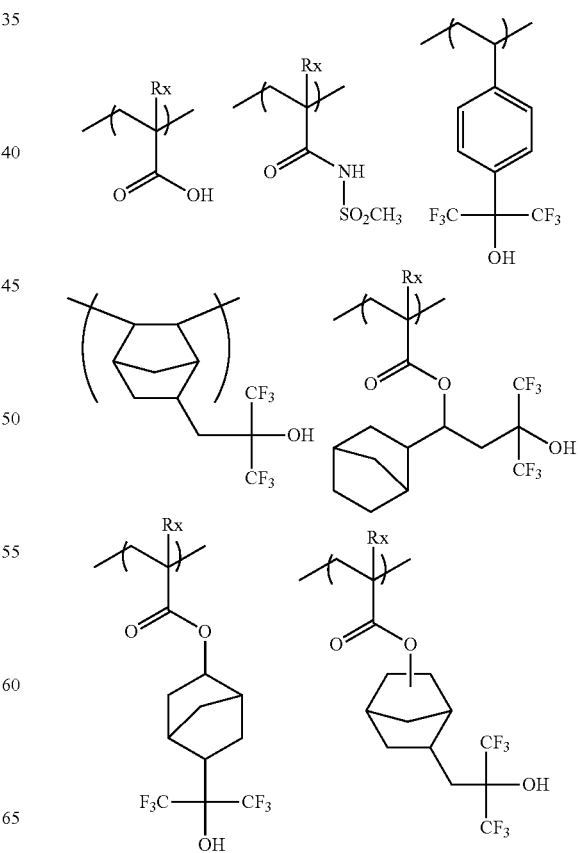

-continued

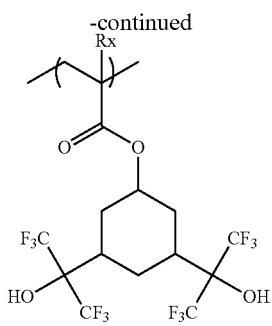

The polar group which may be possessed by the repeating unit having a polar group may be a carbonate group such as a cyclic carbonate ester structure, and the resin (A) preferably contain a repeating unit having a cyclic carbonate ester structure.

The repeating unit having a cyclic carbonate ester structure is preferably the repeating unit represented by Formula (A-1).

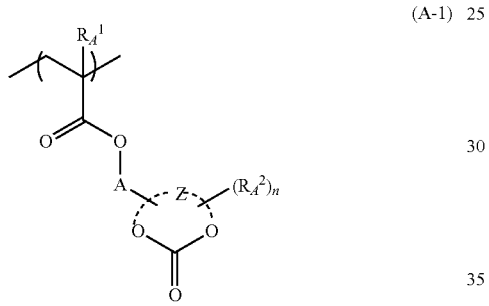

(A-1)

In Formula (A-1), $R_A^1$ represents a hydrogen atom or an alkyl group.

If n is 2 or more, $R_A^2$'s each independently represents a substituent.

A represents a single bond or a divalent linking group.

Z represents a atomic group forming a monocyclid or polycyclic structure together with a group represented by —O—C(=O)—O— in the formula.

n represents an integer of 0 or more.

Formula (A-1) will be described in detail.

The alkyl group represented by $R_A^1$ may have a substituent such as a fluorine atom. $R_A^1$ represents preferably a hydrogen atom, a methyl group or a trifluormethyl group, and more preferably a methyl group.

The substituent represented by $R_A^2$ is, for example, an alkyl group, a cycloalkyl group, a hydroxyl group, an alkoxy group, an amino group and an alkoxycarbonylamino group. The substituent is preferably an alkyl group having 1 to 5 carbon atoms, for example, a straight alkyl group having 1 to 5 carbon atoms such as a methyl group, an ethyl group, a propyl group and a butyl group; and a branched alkyl group having 3 to 5 carbon atoms such as an isopropyl group, an isobutyl group and a t-butyl group. An alkyl group may have a substituent such as a hydroxyl group.

n represents the number of substituents, and is an integer of 0 or more. For example, n is preferably 0 to 4, and more preferably 0.

Examples of the a divalent linking group represented by A may include an alkylene group, a cycloalkylene group, an ester bond, an amide bond, an ether bond, an urethane bond, an urea bond, or combination thereof. Examples of the alkylene group may include preferably an alkylene group having 1 to 10 carbon atoms, more preferably an alkylene group having 1 to 5 carbon atoms, and for example a methylene group, an ethylene group, an propylene group, and the like.

In one aspect of the present invention, A is preferably a single bond, or an alkylene group.

The moncyclic group containing —O—C(=O)—O—, represented by Z is, for example, a 5- to 7-membered ring in which $n_A$=2 to 4 in the cyclic carbonate ester represented by the following Formula (a), and preferably a 5-membered ring or a 6-membered ring ($n_A$=2 or 3), and more preferably a 5-membered ring ($n_A$=2).

The polycyclic group containing —O—C(=O)—O— represented by Z may, for example, be a structure in which a cyclic carbonate ester represented by the following Formula (a) are bound with 1 or 2 or more other ring structure to form a condensed ring or to form a spiro ring. "Other ring structures" capable of forming a condensed ring or spiro ring may be an alicyclid hydrocarbon group, an aromatic hydrocarbon group or a heterocyclic ring.

(a)

The monomer corresponding to the repeating unit represented by Formula (A-1) may be synthesized by a conventionally known method described in, for example, Tetrahedron Letters, Vol. 27, No. 32 p. 3741(1986), Organic Letters, Vol. 4, No. 15 p. 2561(2002), and the like.

In the resin (A), the repeating unit represented by Formula (A-1) may be contained either alone or in a combination of two or more thereof.

Hereinafter, specific examples of the repeating unit having a cyclic carbonate ester structure are shown below, but the present invention is not limited thereto.

In addition, $R_A^1$ in the following specific examples has the same meaning as $R_A^1$ in Formula (A-1).

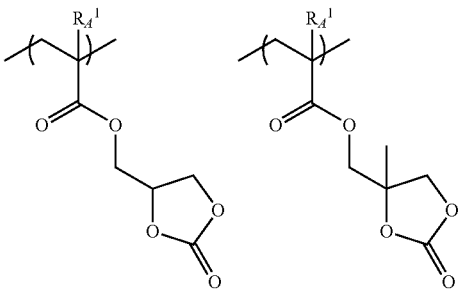

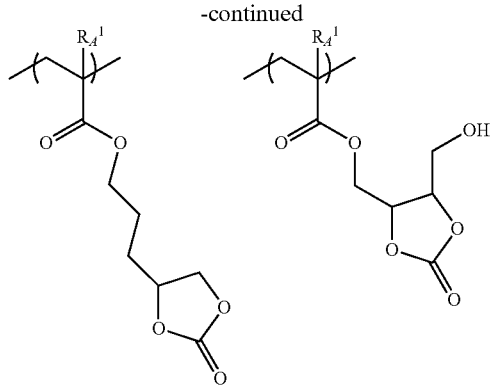
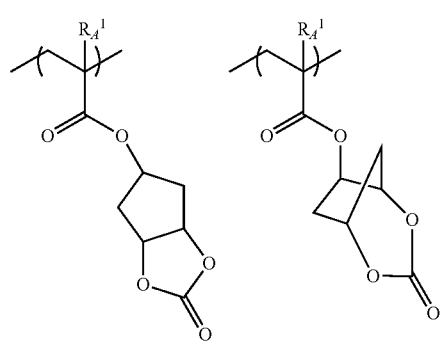
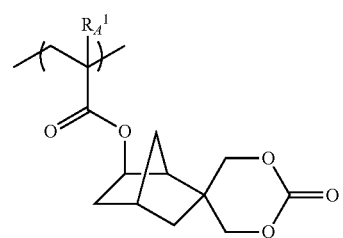
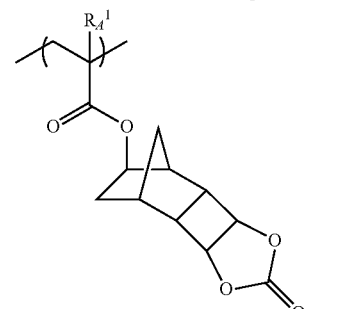
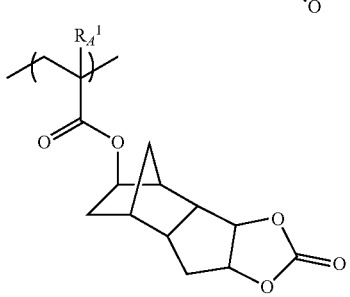
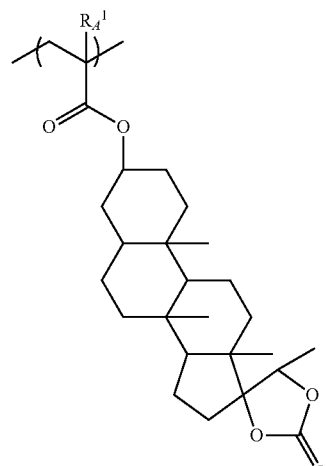
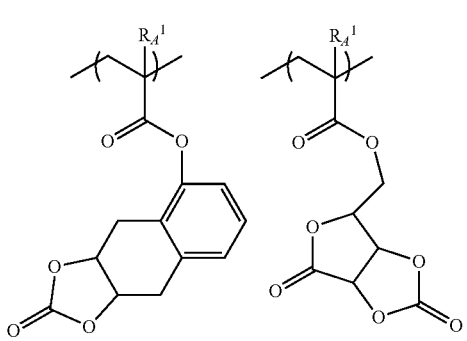
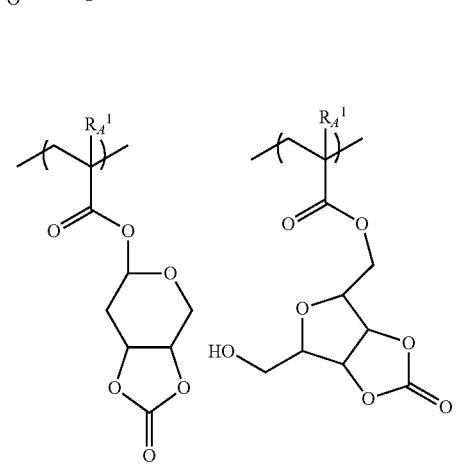
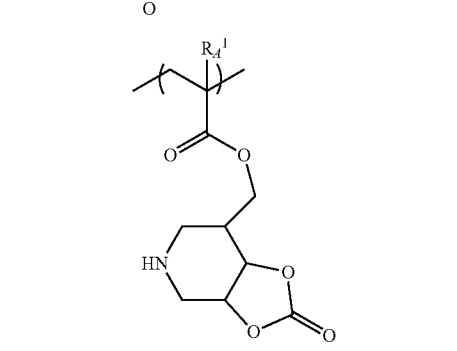

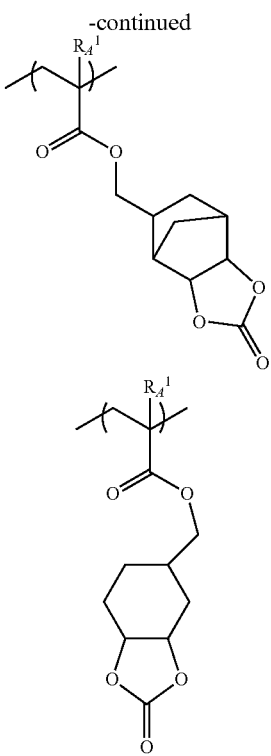

In the resin (A), the repeating unit having a cyclic carbonate ester structure may be contained either alone or in a combination of two or more thereof.

When the resin (A) contains a repeating unit having a cyclic carbonate ester structure, the content of the repeating unit having a cyclic carbonate ester structure is preferably 5 to 60 mol %, more preferably 5 to 55 mol %, still more preferably 10 to 50 mol % based on the whole repeating units in the resin (A).

The resin (A) may have the repeating unit (c) having a plurality of aromatic rings represented by the following Formula (c1).

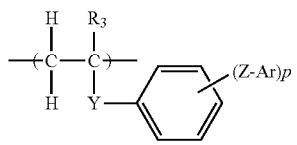

In Formula (c1), $R_3$ represents a hydrogen atom, an alkyl group, a halogen atom, a cyano group or a nitro group;

Y represents a single bond or divalent linking group;

Z represents a single bond or divalent linking group;

Ar represents an aromatic ring group;

p represents an integer greater than 1.

The alkyl group as $R_3$ may be straight or branched, and examples thereof may include a methyl group, an ethyl group, a n-propyl group, an i-propyl group, a n-butyl group, a sec-butyl group, a t-butyl group, a n-pentyl group, a n-hexyl group, a n-heptyl group, a n-octyl group, a n-nonyl group, a n-decanyl group, an i-butyl group and the like. The group may have a substituent, and preferred examples of the substituents may include an alkoxy group, a hydroxyl group, a halogen atom, a nitro group and the like. Among them, the alkyl group having a substituent is preferably a $CF_3$ group, an alkyloxycarbonylmethyl group, an alkylcarbonyloxymethyl group, a hydroxymethyl group, an alkoxymethyl group and the like.

A halogen atom as $R_3$ includes a fluorine atom, a chlorine atom, a bromine atom and iodine atom, particularly preferably fluorine atom.

Y represents a single bond or divalent linking group, a divalent linking group, examples thereof include an ether group (an oxygen atom), a thioether group (a sulfur atom), an alkylene group, an arylene group, a carbonyl group, a sulfide group, a sulfone group, —COO—, —CONH—, —SO$_2$NH—, —CF$_2$—, —CF$_2$CF$_2$—, —OCF$_2$O—, —CF$_2$OCF$_2$—, —SS—, —CH$_2$SO$_2$CH$_2$—, —CH$_2$COCH$_2$—, —COCF$_2$CO—, —COCO—, —OCOO—, —OSO$_2$O—, an amino group (a nitrogen atom), an acyl group, an alkylsuphonyl group, —CH=CH—, —C≡C—, an amino carbonyl amino group, an amino sulphonyl amino group, or a combination thereof. Y has preferably 15 carbon atoms or less, and more preferably 10 carbon atoms.

Y is preferably a single bond, —COO— group, —COS— group, —CONH— group, more preferably —COO— group, —CONH— group, particularly preferably —COO- group.

Z represents a single bond or divalent linking group, and examples of a divalent linking group include an ether group (an oxygen atom), a thioether group (a sulfur atom), an alkylene group, an arylene group, a carbonyl group, a sulfide group, a sulfone group, —COO—, —CONH—, —SO$_2$NH—, an amino group (a nitrogen atom), an acyl group, an alkylsulphonyl group, —CH=CH—, an amino carbonyl amino group, an amino sulphonyl amino group, or combination thereof.

Z represents preferably a single bond, an ether group, a carbonyl group, —COO—, more preferably a single bond, an ether group, and particularly preferably a single bond.

Ar represents an aromatic ring group, specifically, a phenyl group, a naphthyl group, an anthracenyl group, a phenanthrenyl group, a quinolinyl group, a furanyl group, a thiophenyl group, a fluorenyl-9-on-yl group, an anthraquinonyl group, a phenanthraquinonyl group, a pyryole group and the like, and preferably a phenyl group. The aromatic ring group may have a substituent, and preferred examples of the substituent may include an alkyl group, an alkoxy group, a hydroxyl group, a halogen atom, a nitro group, an acyl group, an acyloxy group, an acylamino group, a sulphonyl amino group, an aryl group such as a phenyl group, an aryloxy group, an arylcarbonyl group, a hetero cyclic residue and the like. Among them, a phenyl group is preferred, from the viewpoint of surpressing deterioration of exposure latitude or pattern shape due to outband light.

p is an integer of 1 or more, and preferably an integer of 1 to 3.

The repeating unit (c) is more preferably the repeating unit represented by the following Formula (c2).

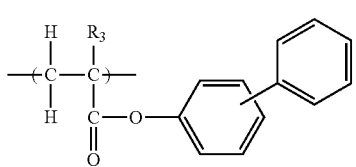

In Formula (c2), $R_3$ represents a hydrogen atom or an alkyl group. The alkyl group as $R_3$ is preferably the same as Formula (c1).

Here, with respect to the extreme ultraviolet (EUV light) exposure, the light leakage (out-of-band light) occurred in the ultraviolet region having a wavelength of 100 to 400 nm worsens the surface roughness, and as a result, the performance of the resolution and the space width roughness tends to be degraded due to the bridge between patterns or pattern disconnection.

However, the aromatic ring in the repeating unit (c) functions as an internal filter capable of absorbing the out-of-band light. Accordingly, it is preferred that the resin (A) contains the repeating unit (c) from the viewpoint of high resolution and low space width roughness.

Here, it is preferred that the repeating unit (c) does not have a phenolic hydroxyl group (a hydroxyl group directly bound on the aromatic ring) from the viewpoint of obtaining high resolution.

Specific examples of the repeating unit (c) are shown below, but are not limited thereto.

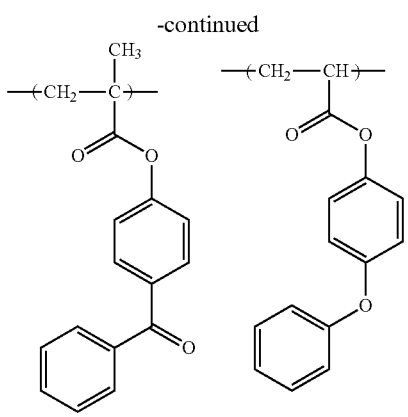

-continued

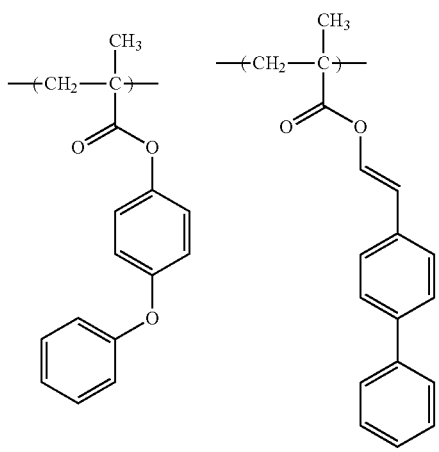

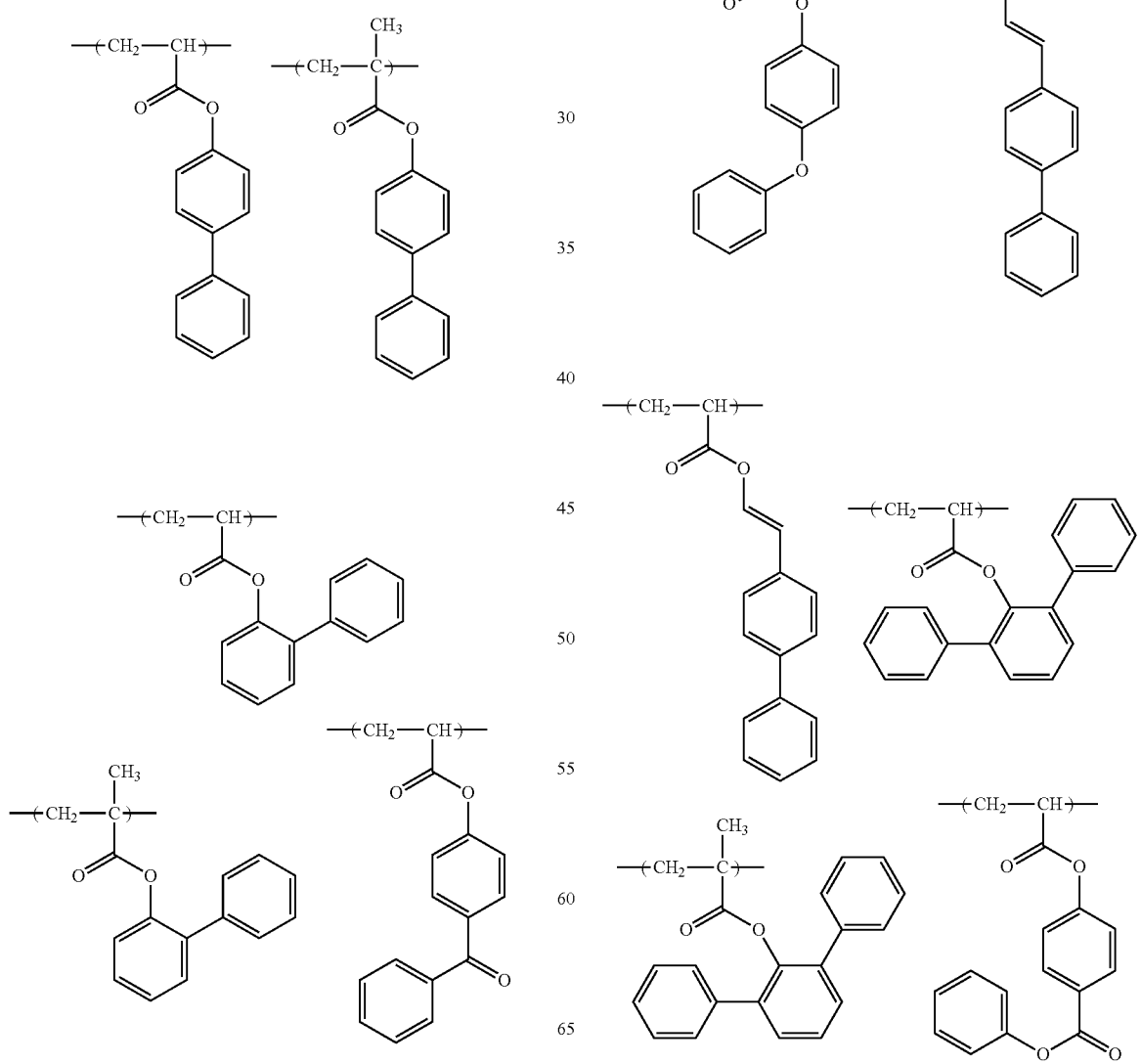

111
-continued
112
-continued
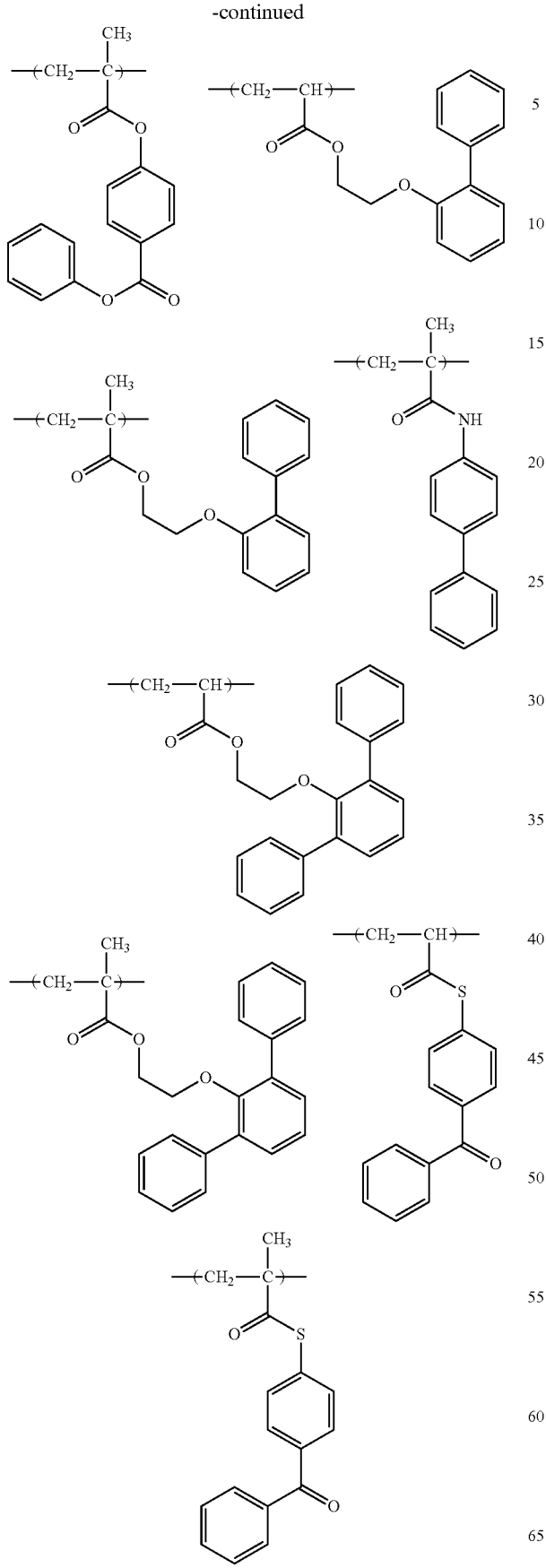
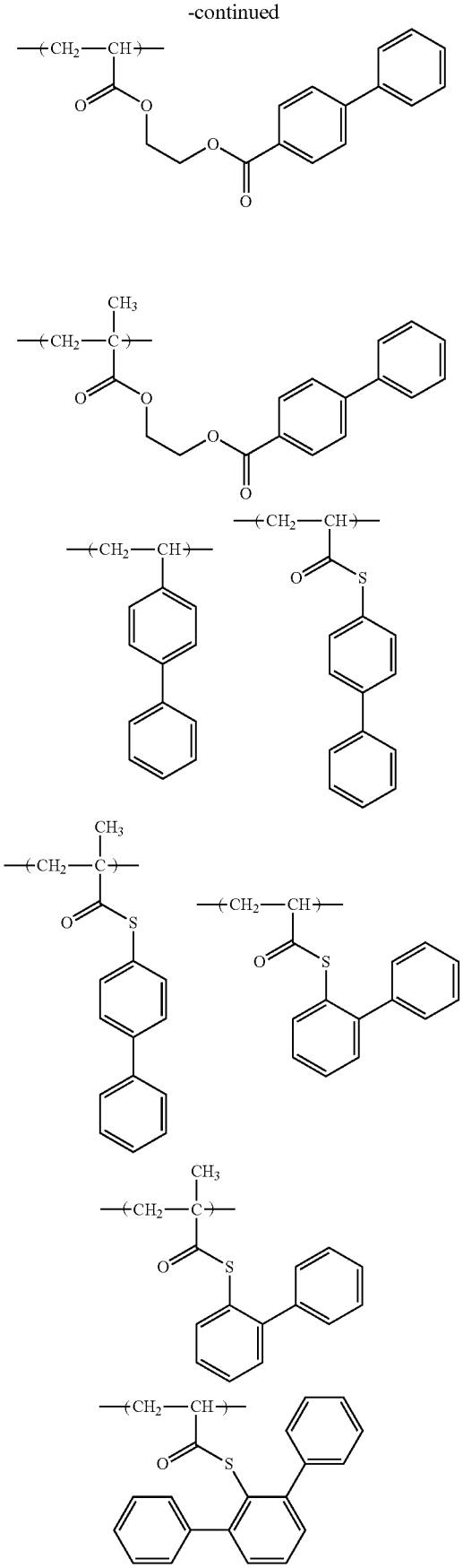

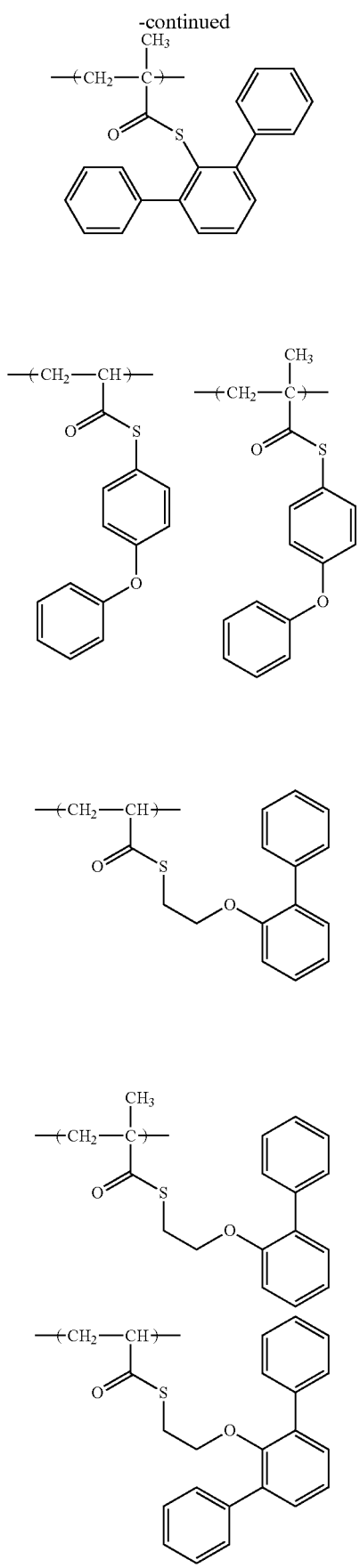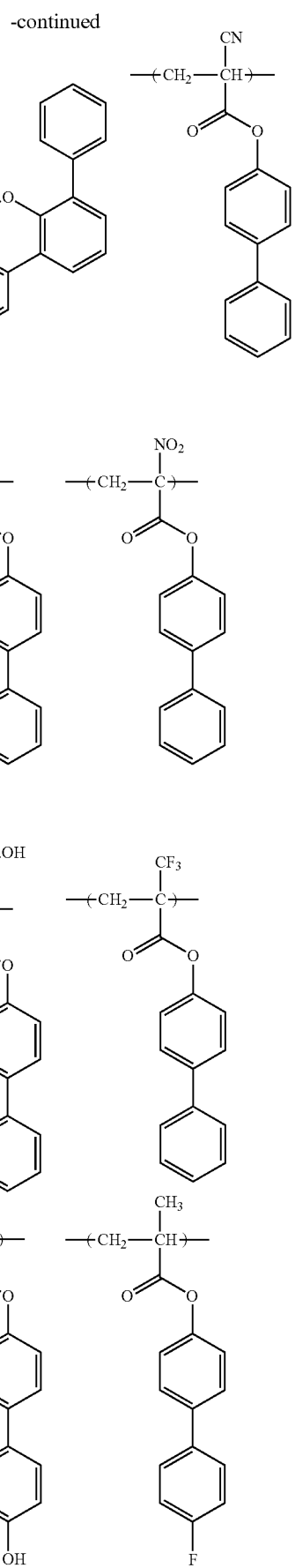

-continued

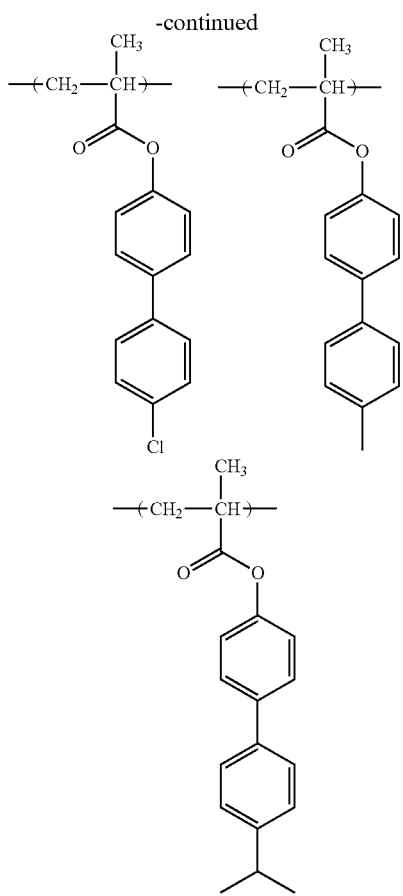

The resin (A) may or may not contains the repeating unit (c), but, if the resin contains the repeating unit (c), the content of the repeating unit (c) is preferably in a range of 1 to 30 mol %, more preferably in a range of 1 to 20 mol %, still more preferably in a range of 1 to 15 mol % based on the whole repeating units of the resin (A). The repeating unit (c) contained in the resin (A) may contain two kinds or more thereof.

The resin (A) of the present invention may appropriately have a repeating unit other than the repeating unit (b) or (c). The resin may further have a repeating unit having an alicyclic hydrocarbon structure having no polar group (for example, the acid group, the hydroxyl group and the cyano group) and not exhibiting acid decomposability as an example of such a repeating unit. Accordingly, when developing by using the developer containing an organic solvent, the solubility of the resin may be appropriately adjusted. Examples of the repeating unit may include a repeating unit represented by Formula (IV).

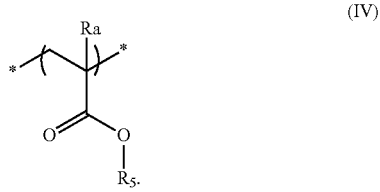

In Formula (IV), $R_5$ represents a hydrocarbon group having at least one cyclic structure and having no polar group.

Ra represents a hydrogen atom, an alkyl group or a —$CH_2$—O—$Ra_2$ group. In the formula, $Ra_2$ represents a hydrogen atom, an alkyl group or an acyl group. Ra is preferably a hydrogen atom, a methyl group, a hydroxymethyl group and a trifluoromethyl group, and particularly preferably a hydrogen atom and a methyl group.

The cyclic structure possessed by $R_5$ includes a monocyclic hydrocarbon group and a polycyclic hydrocarbon group. Examples of the monocyclic hydrocarbon group may include a cycloalkyl group having 3 to 12 carbon atoms, such as a cyclopentyl group, a cyclohexyl group, a cycloheptyl group and a cyclooctyl group, and a cycloalkenyl group having 3 to 12 carbon atoms, such as a cyclohexenyl group. The monocyclic hydrocarbon group is preferably a monocyclic hydrocarbon group having 3 to 7 carbon atoms, and more preferably a cyclopentyl group or a cyclohexyl group.

The polycyclic hydrocarbon group includes a ring-assembled hydrocarbon group and a bridged cyclic hydrocarbon group, and examples of the ring-assembled hydrocarbon group may include a bicyclohexyl group, a perhydronaphthalenyl group and the like. Examples of the bridged cyclic hydrocarbon ring may include a bicyclic hydrocarbon ring such as a pinane ring, a bornane ring, a norpinane ring, a norbornane ring and a bicyclooctane ring (a bicyclo[2.2.2]octane ring, a bicyclo[3.2.1]octane ring and the like), a tricyclic hydrocarbon ring such as a homobledane ring, an adamantine ring, a tricyclo[5.2.1.0$^{2,6}$]decane ring and a tricyclo[4.3.1.1$^{2,5}$]undecane ring, a tetracyclic hydrocarbon ring such as a tetracyclo[4.4.0.1$^{2,5}$.1$^{7,10}$]dodecane ring and a perhydro-1,4-methano-5,8-methanonaphthalene ring, and the like. Further, the bridged cyclic hydrocarbon ring also includes a condensed cyclic hydrocarbon ring, for example, a condensed ring obtained by condensing a plurality of 5- to 8-membered cycloalkane rings, such as a perhydronaphthalene (decalin) ring, a perhydroanthracene ring, a perhydrophenanthrene ring, a perhydroacenaphthene ring, a perhydrofluorene ring, a perhydroindene ring and a perhydrophenalene ring.

Preferred examples of the bridged cyclic hydrocarbon ring may include a norbornyl group, an adamantyl group, a bicyclooctanyl group, a tricyclo[5,2,1,0$^{2,6}$]decanyl group and the like. More preferred examples of the bridged cyclic hydrocarbon ring may include a norbornyl group and an adamantyl group.

The alicyclic hydrocarbon groups may have a substituent, and preferred examples of the substituent may include a halogen atom, an alkyl group, a hydroxyl group with a hydrogen atom being substituted, an amino group with a hydrogen atom being substituted and the like. Preferred examples of the halogen atom may include a bromine atom, a chlorine atom and a fluorine atom, and preferred examples of the alkyl group include a methyl group, an ethyl group, a butyl group or a t-butyl group. The alkyl group may further have a substituent, and examples of the substituent which may be further possessed by the alkyl group may include a halogen atom, an alkyl group, a hydroxyl group with a hydrogen atom being substituted, and an amino group with a hydrogen atom being substituted.

Examples of the substituent for the hydrogen atom may include an alkyl group, a cycloalkyl group, an aralkyl group, a substituted methyl group, a substituted ethyl group, an alkoxycarbonyl group and an aralkyloxycarbonyl group. Preferred examples of the alkyl group may include an alkyl group having 1 to 4 carbon atoms, preferred examples of the substituted methyl group may include a methoxymethyl group, a methoxythiomethyl group, a benzyloxymethyl group, a t-butoxymethyl group and a 2-methoxyethoxyethyl group, preferred examples of the substituted ethyl group include a 1-ethoxy ethyl group and a 1-methyl-1-methoxyethyl group, preferred examples of the acyl group may include an aliphatic acyl group having 1 to 6 carbon atoms, such as a formyl group, an acetyl group, a propionyl group, a butyryl group, an isobutyryl group, a valeryl group and a pivaloyl group, and examples of the alkoxycarbonyl group may include an alkoxycarbonyl group having 1 to 4 carbon atoms and the like.

The resin (A) may or may not contain a repeating unit having a polar group-free alicyclic hydrocarbon structure and not exhibiting acid decomposability, but in the case of containing the repeating unit, the content ratio of the repeating unit is preferably 1 mol % to 20 mol %, and more preferably 5 mol % to 15 mol %, based on the whole repeating units in the resin (A).

Specific examples of the repeating unit having a polar group-free alicyclic hydrocarbon structure and not exhibiting acid decomposability will be described below, but the present invention is not limited thereto. In the formulas, Ra represents H, $CH_3$, $CH_2OH$ or $CF_3$.

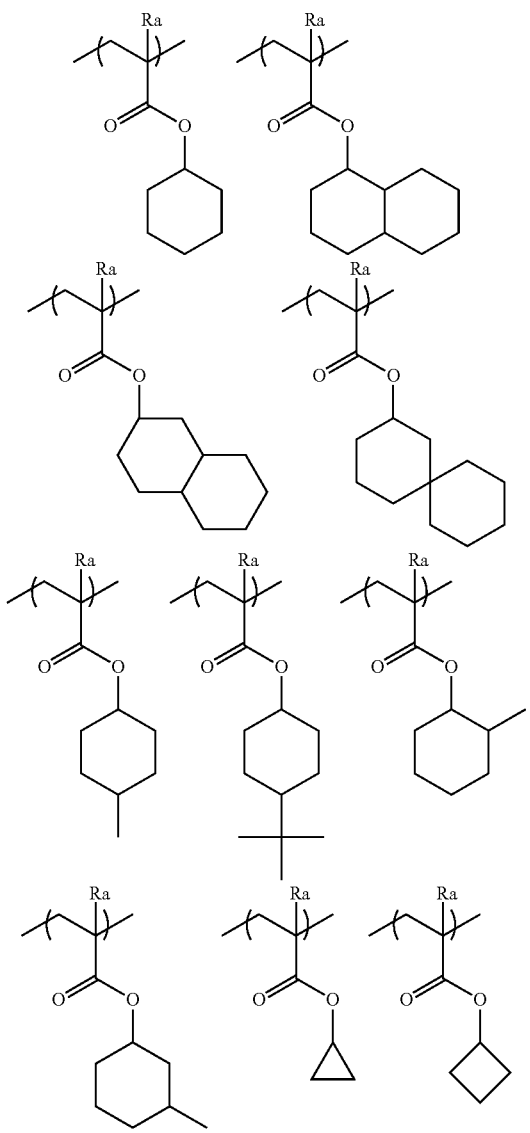

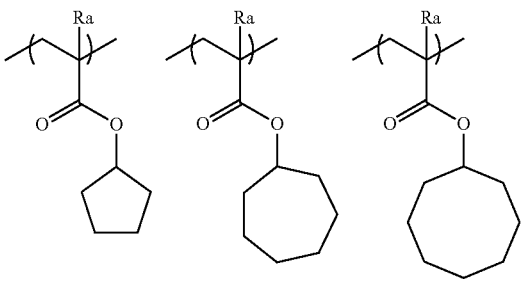

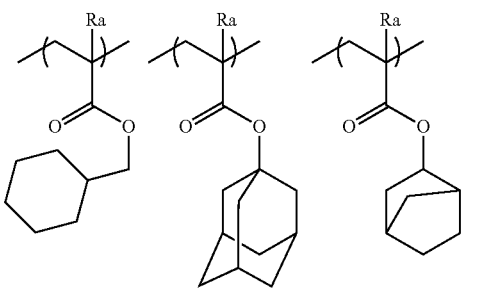

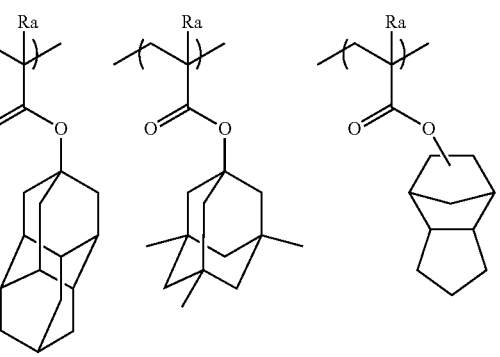

In addition, resin (A) may include the following monomer component in consideration of the effect such as improvement of Tg, improvement of the dry etching resistance, and the internal filter of the above-described out-of-band light.

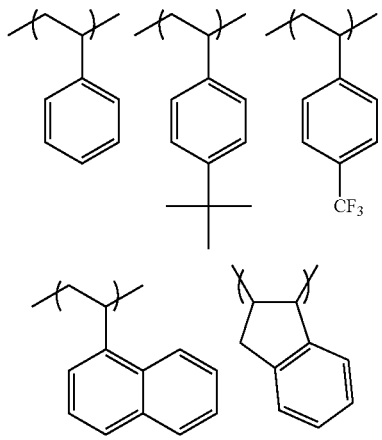

-continued

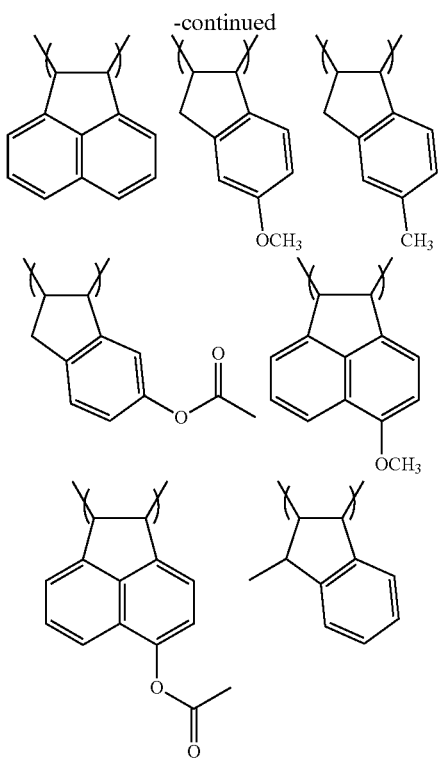

In the resin (A) used in the composition of the present invention, the molar ratio of respective repeating structural units contained is appropriately set in order to control dry etching resistance of the resist, suitability for a standard developer, adhesion to a substrate and resist profile and further resolution, heat resistance, sensitivity and the like which are performances generally required for the resist.

The form of the resin (A) in the present invention may be any form of a random type, a block type, a comb type and a star type.

The resin (A) may be synthesized, for example, by polymerization of radicals, cations, or anions of an unsaturated monomer, corresponding to each structure. In addition, it is possible to obtain a target resin by using an unsaturated monomer corresponding to a precursor of each structure to polymerize, and then performing a polymerization.

Examples of a general synthesis method include a batch polymerization method of dissolving an unsaturated monomer and a polymerization initiator in a solvent and heating the solution to perform a polymerization, a dropping polymerization method of adding dropwise a solution containing an unsaturated monomer and a polymerization initiator to a heated solvent over 1 to 10 hours, and the like, and a dropping polymerization method is preferred.

Examples of the solvent used for a polymerization include the solvent that may be used to prepare an electron beam-sensitive or extreme ultraviolet ray-sensitive resin composition, which will be described later. The polymerization is more preferably performed by using the same solvent as one used in the photosensitive composition of the present invention. Accordingly, generation of particles during storage may be suppressed.

The polymerization reaction is preferably performed under an inert gas atmosphere such as nitrogen or argon. As for the polymerization initiator, the polymerization is initiated by using a commercially available radical initiator (azo-based initiator, peroxide and the like). The radical initiator is preferably an azo-based initiator, and an azo-based initiator having an ester group, a cyano group or a carboxyl group is preferred. Preferred examples of the initiator include azobisisobutyronitrile, azobisdimethylvaleronitrile, dimethyl 2,2'-azobis(2-methylpropionate) and the like. If necessary, the polymerization may be carried out in the presence of a chain transfer agent (for example, alkyl-mercaptans, and the like).

The concentration of the reaction is 5% by mass to 70% by mass, and preferably 10% by mass to 50% by mass. The temperature of the reaction is usually 10° C. to 150° C., preferably 30° C. to 120° C., and more preferably 40° C. to 100° C.

After the completion of reaction, the reaction solution is allowed to cool to room temperature and be purified. The purification may be performed by a typical method, such as a liquid-liquid extraction method of applying water-washing or combining water-washing with an appropriate solvent to remove residual monomers or oligomer components, a purification method in a solution state, such as ultrafiltration of removing only polymers having a molecular weight not more than a specific molecular weight by virtue of extraction, a reprecipitation method of adding dropwise a resin solution in a poor solvent to solidify the resin in the poor solvent thereby removing residual monomers and the like, a purification method in a solid state, such as washing of the resin slurry separated by filtration with a poor solvent, and the like. For example, the resin is precipitated as a solid by contacting the reaction solution with a solvent (poor solvent) in which the resin is sparingly soluble or insoluble, in a volumetric amount of 10 times or less and preferably 10 to 5 times the reaction solution.

The solvent used at the time of operation of precipitation or reprecipitation from the polymer solution (precipitation or reprecipitation solvent) may be sufficient if the solvent is a poor solvent for the polymer, and the solvent may be appropriately selected from a hydrocarbon, a halogenated hydrocarbon, a nitro compound, ether, ketone, ester, carbonate, alcohol, carboxylic acid, water, and a mixed solvent including these solvents, according to the kind of the polymer, and may be used. Among these solvents, a solvent including at least alcohol (particularly, methanol or the like) or water is preferred as the precipitation or reprecipitation solvent.

The amount of the precipitation or reprecipitation solvent used may be appropriately selected by considering the efficiency, yield and the like, but in general, the amount is 100 parts by mass to 10,000 parts by mass, preferably 200 by parts by mass to 2,000 parts by mass, and more preferably 300 parts by mass to 1,000 parts by mass, based on 100 parts by mass of the polymer solution.

The temperature at the time of precipitation or reprecipitation may be appropriately selected by considering the efficiency or operability but is usually in the order from 0 to 50° C., and preferably in the vicinity of room temperature (for example, approximately from 20° C. to 35° C.). The precipitation or reprecipitation operation may be performed by a known method such as batch system and continuous system using a commonly employed mixing vessel such as a stirring tank.

The precipitated or reprecipitated polymer is usually subjected to commonly employed solid-liquid separation such as filtration and centrifugation, then dried and used. The filtration is performed by using a solvent-resistant filter element, and preferably under pressure. The drying is performed under atmospheric pressure or reduced pressure (preferably under reduced pressure) at a temperature of approximately from 30° C. to 100° C., and preferably at a temperature of approximately from 30° C. to 50° C.

Further, after the resin is once precipitated and separated, the resin may be dissolved in a solvent again and then brought into contact with a solvent in which the resin is sparingly soluble or insoluble. That is, there may be used a method including, after the completion of radical polymerization reaction, bringing the polymer into contact with a solvent in which the polymer is sparingly soluble or insoluble, to precipitate a resin (step a), separating the resin from the solution (step b), dissolving the resin in a solvent to prepare a resin solution A (step c), and then bringing the resin solution A into contact with a solvent in which the resin is sparingly soluble or insoluble and which is in a volumetric amount of less than 10 times (volumetric amount of preferably 5 times or less) the resin solution A, to precipitate a resin solid (step d), and separating the precipitated resin (step e).

The polymerization reaction is preferably performed under an inert gas atmosphere such as nitrogen or argon. As for the polymerization initiator, the polymerization is initiated by using a commercially available radical initiator (azo-based initiator, peroxide and the like). The radical initiator is preferably an azo-based initiator, and an azo-based initiator having an ester group, a cyano group or a carboxyl group is preferred. Preferred examples of the initiator include azobisisobutyronitrile, azobisdimethylvaleronitrile, dimethyl 2,2'-azobis(2-methylpropionate) and the like. If necessary, a desired polymer is recovered by a method such as a recovery of a powder or solid polymer by pouring a solvent, after the completion of reaction by adding or split-adding an initiator. The concentration of the reaction is 5% by mass to 50% by mass, and preferably 10% by mass to 30% by mass. The temperature of the reaction is usually 10° C. to 150° C., preferably 30° C. to 120° C., and more preferably 60° C. to 100° C.

The molecular weight of the resin (A) of the present invention is not specifically limited, but the weight average molecular weight thereof is preferably 1,000 to 100,000, more preferably 1,500 to 60,000, and still more preferably 2,000 to 30,000. By setting the weight average molecular weight within 1,000 to 100,000, it is possible to prevent deterioration in the heat resistance or dry etching resistance and also prevent the film-forming property from deteriorating due to impaired developability or increased viscosity. The weight average molecular weight of the resin is obtained from the GPC (carrier: THF or N-methyl-2-pyrrolidone (NMP)) in terms of polystyrene by the GPC method.

The polydispersity (Mw/Mn) is preferably is in a range of 1.00 to 5.00, more preferably in a range of 1.03 to 3.50, and still more preferably in a range of 1.05 to 2.50. The smaller the molecular weight distribution is, the better the resolution and resist shape are, and the smoother the side wall of the resist pattern is, and thus roughness is excellent.

The resin (A) of the present invention may be used either alone or in combination of two or more thereof. The content ratio of the resin (A) is preferably 20% by mass to 99% by mass, more preferably 30% by mass to 89% by mass, and still more preferably 40% by mass to 79% by mass, based on the total solid of the electron beam-sensitive or extreme ultraviolet ray-sensitive resin composition.

Specific examples of the resin (A) will be described below, but the present invention is not limited thereto. In addition, the composition ration of each repeating unit of the following polymer structure is a molar ratio.

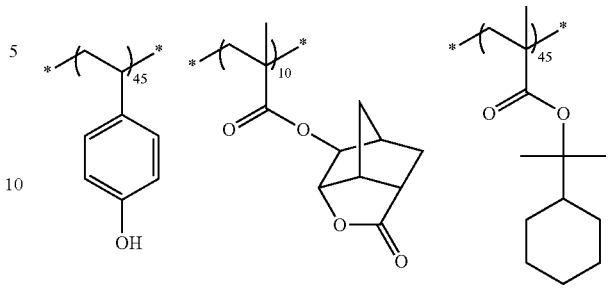

P-1

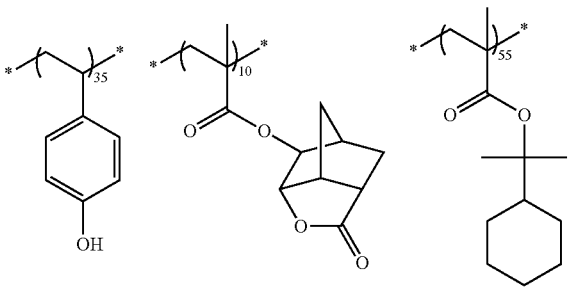

P-2

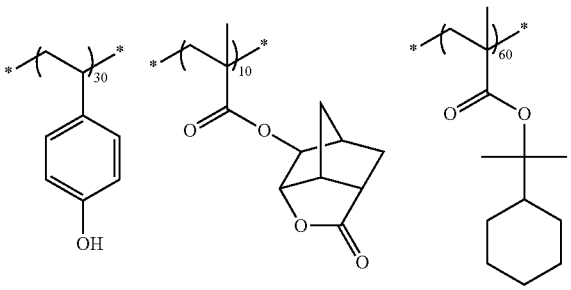

P-3

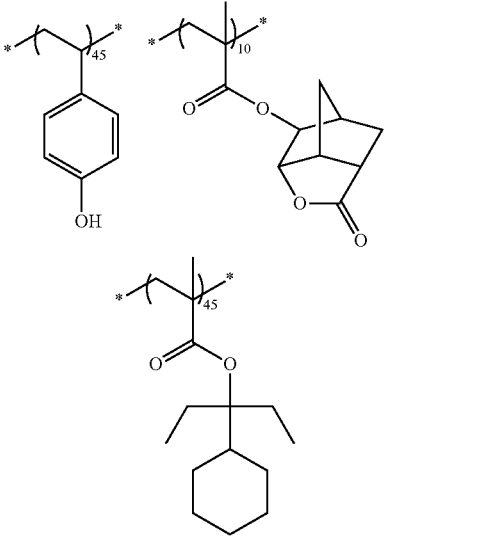

P-4

P-5
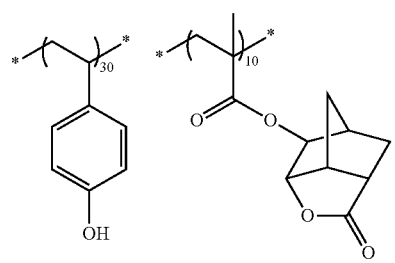
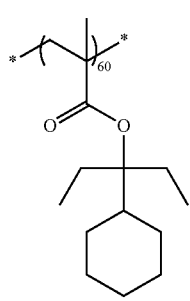
P-6
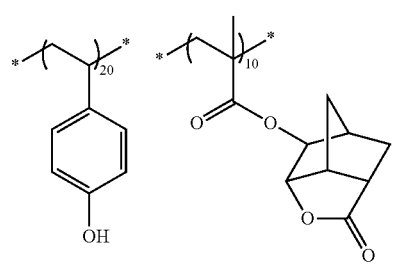
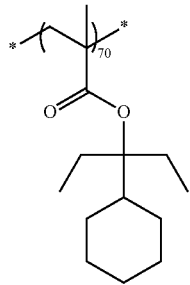
P-7
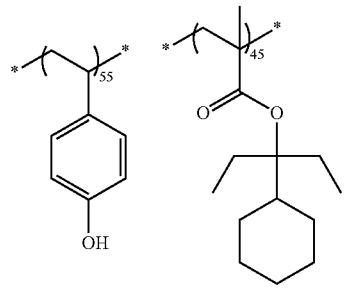
P-8
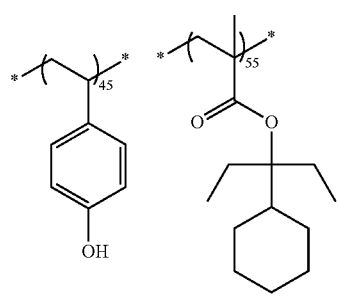
P-9
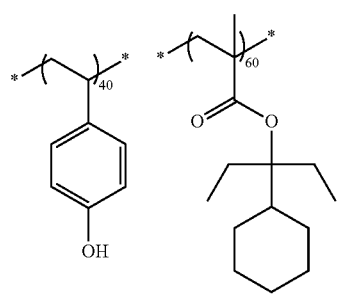
P-10
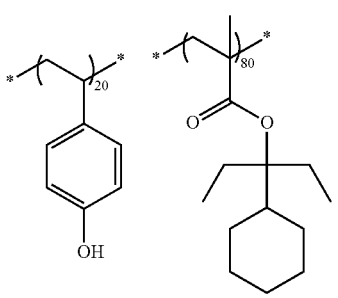
P-11
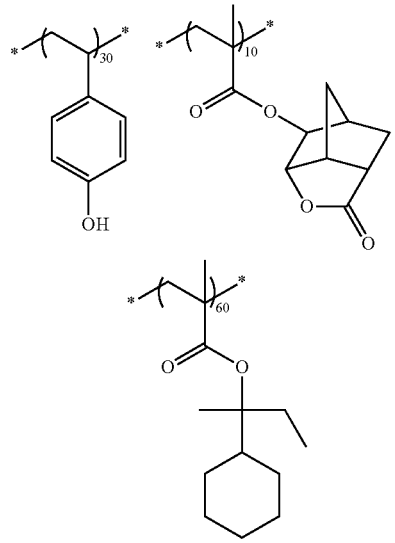

P-12
P-13
P-14
P-15
P-16
P-17
P-18
P-19
P-20

P-21
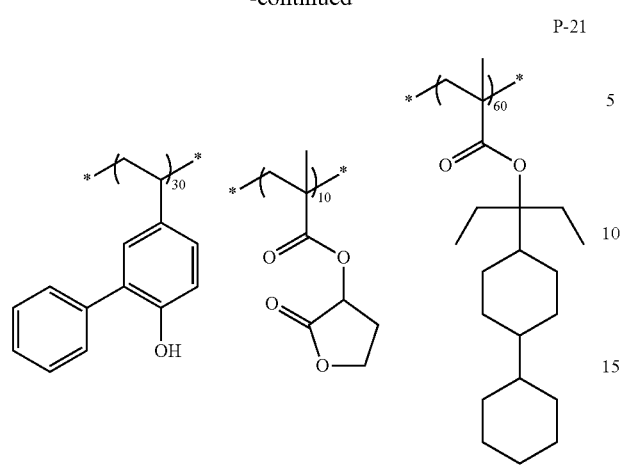
P-22
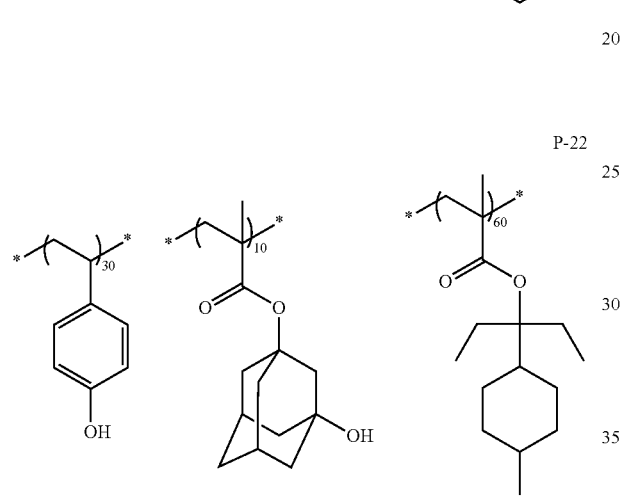
P-23
P-24
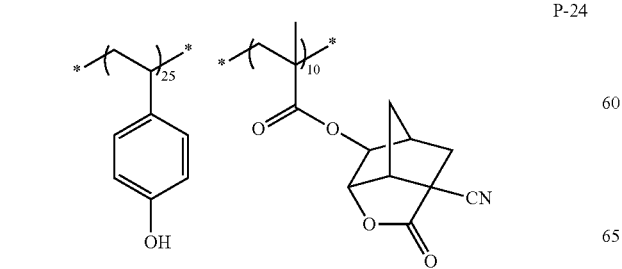
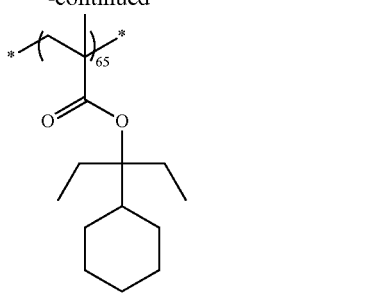
P-25
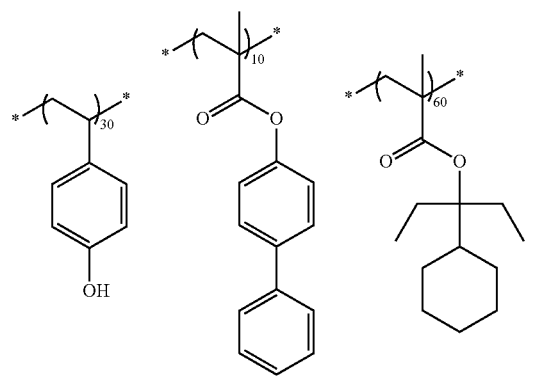
P-26
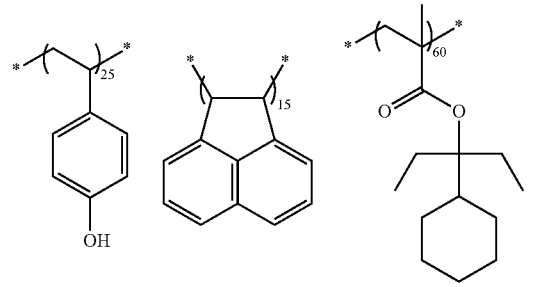
P-27
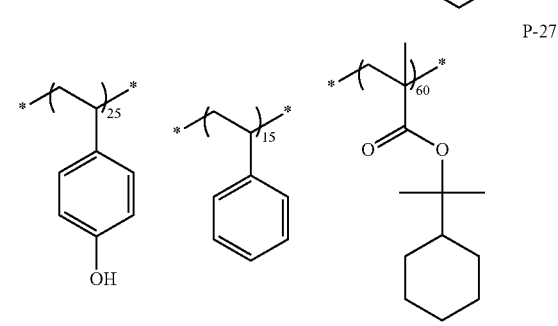
P-28

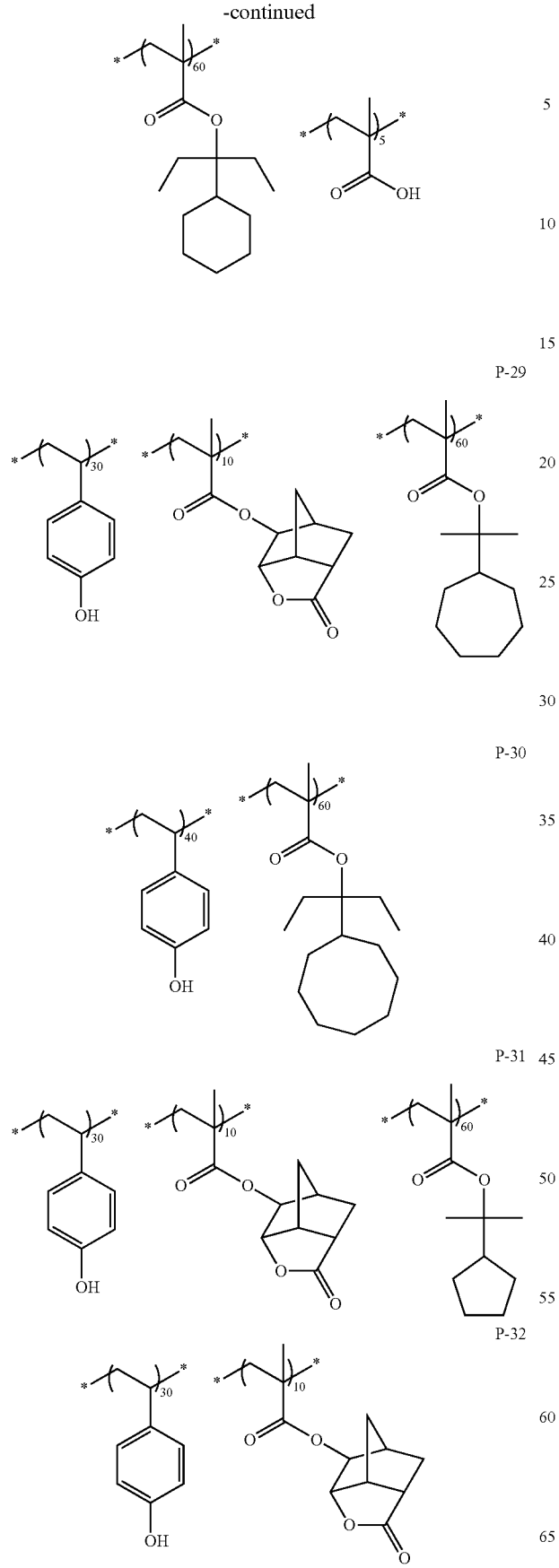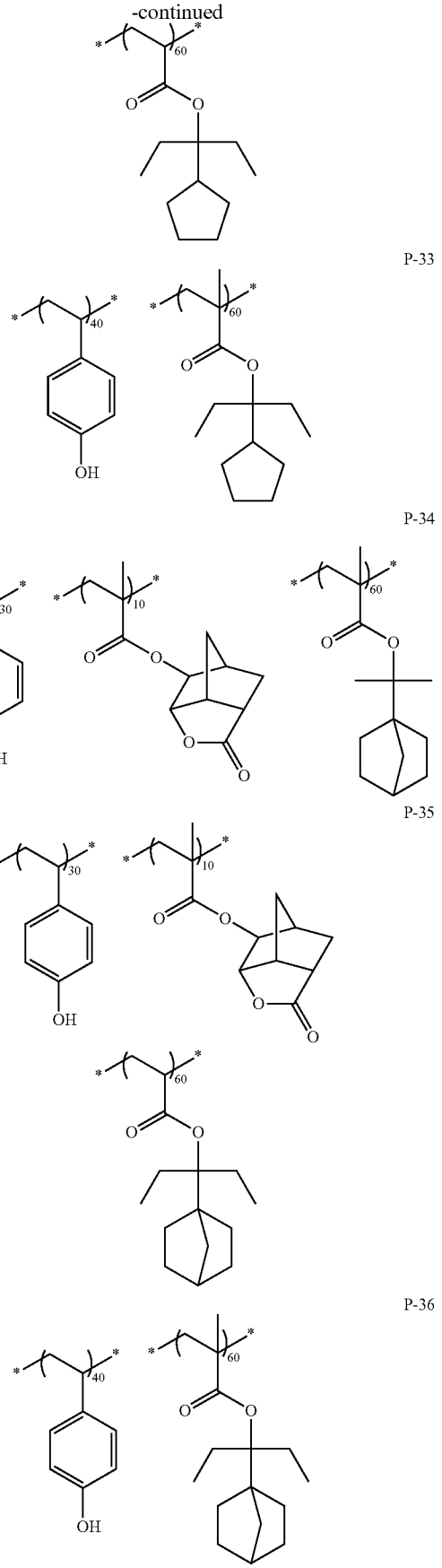

P-37
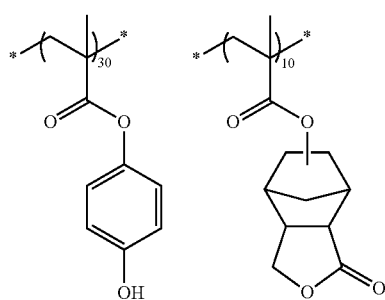
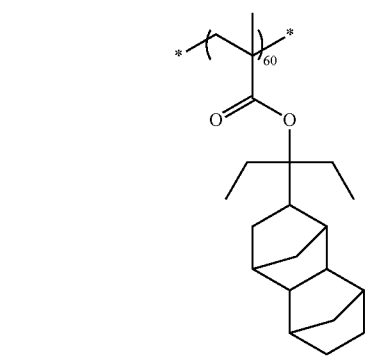
P-38
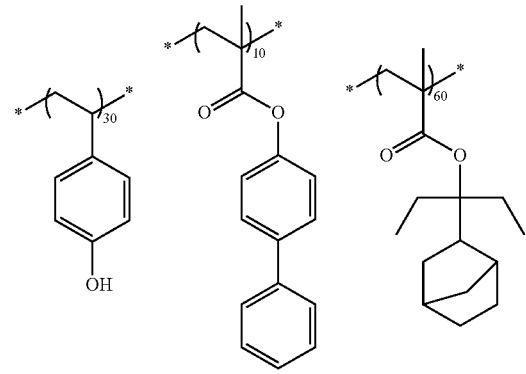
P-39
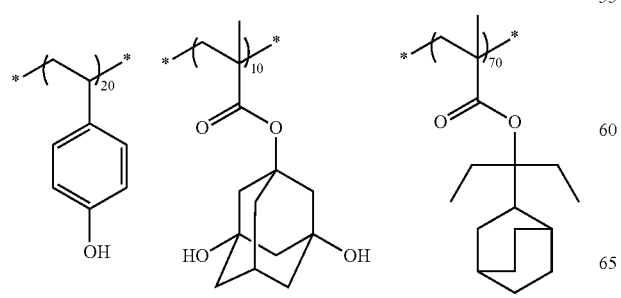
P-40
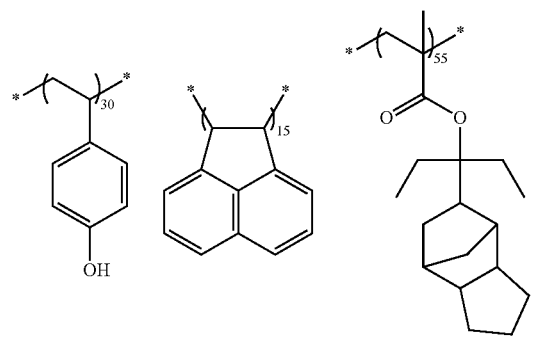
P-41
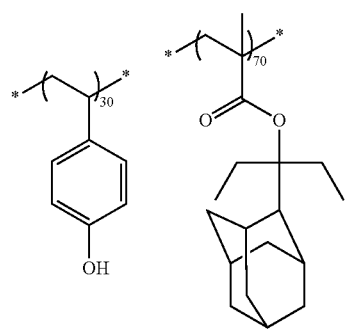
P-42
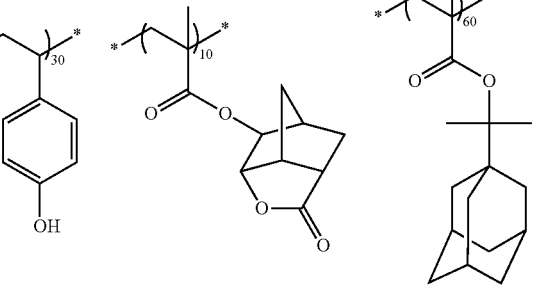
P-43
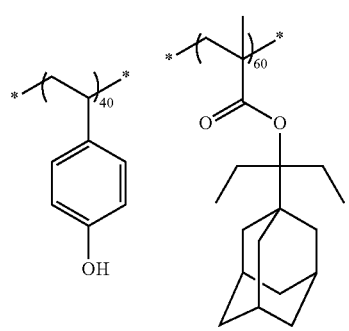
P-44
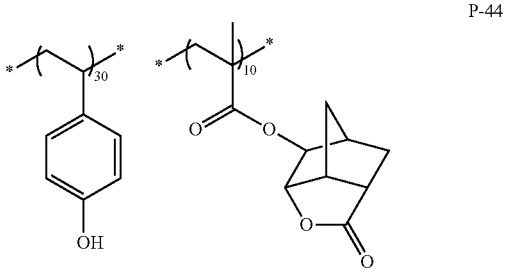

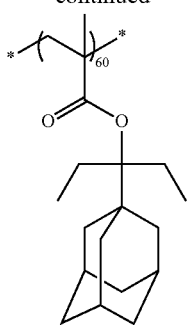
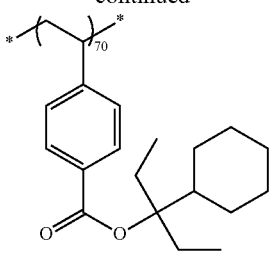
P-45
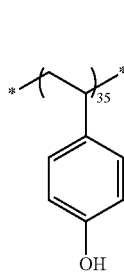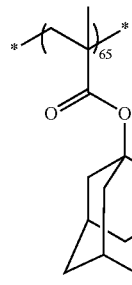
P-46
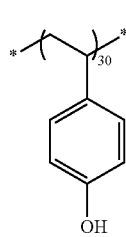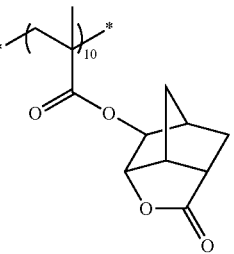
P-47
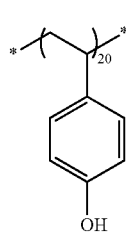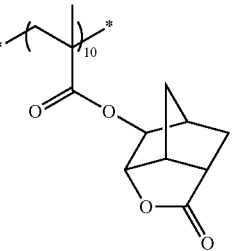
P-48
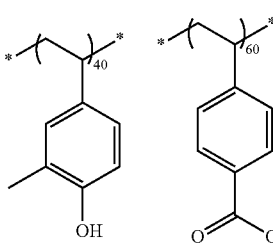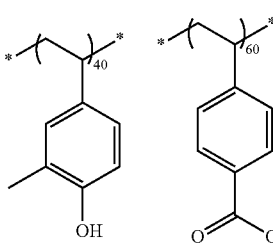
P-49
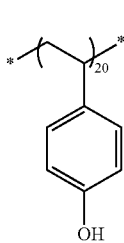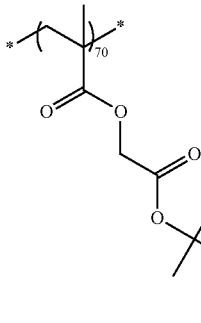
P-50
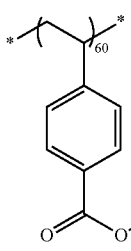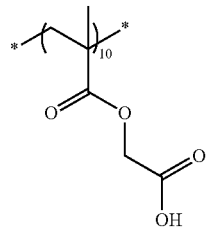
P-51
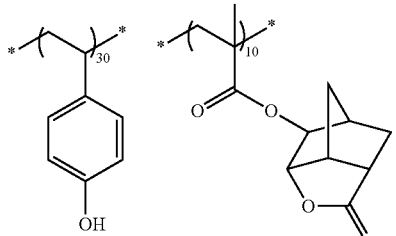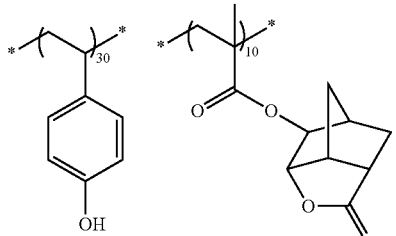

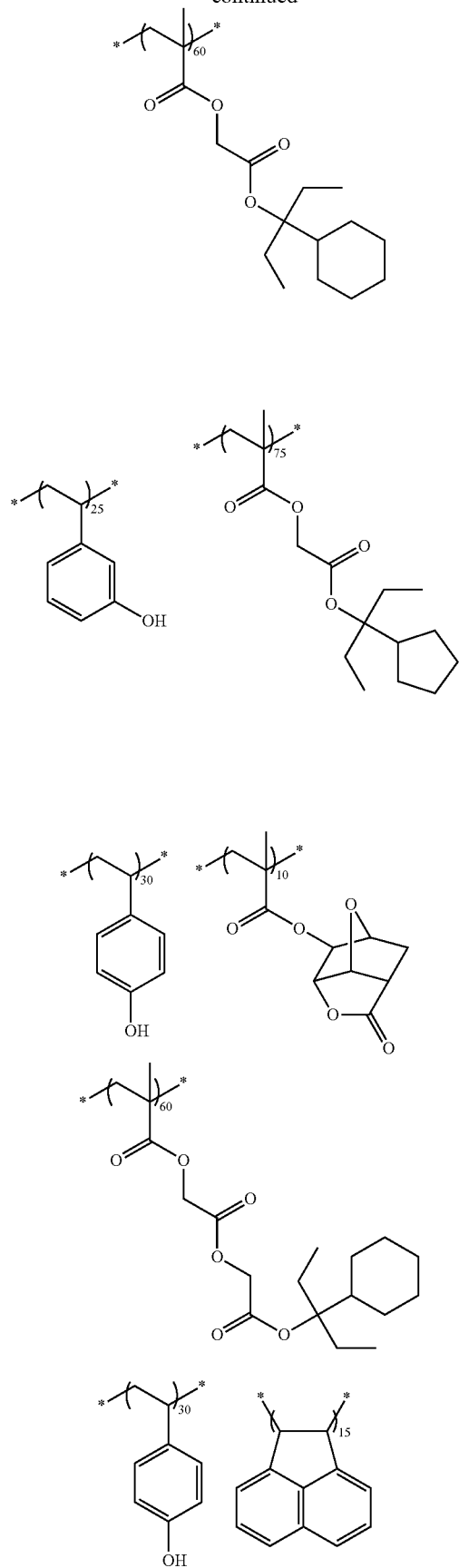
P-52
P-53
P-54
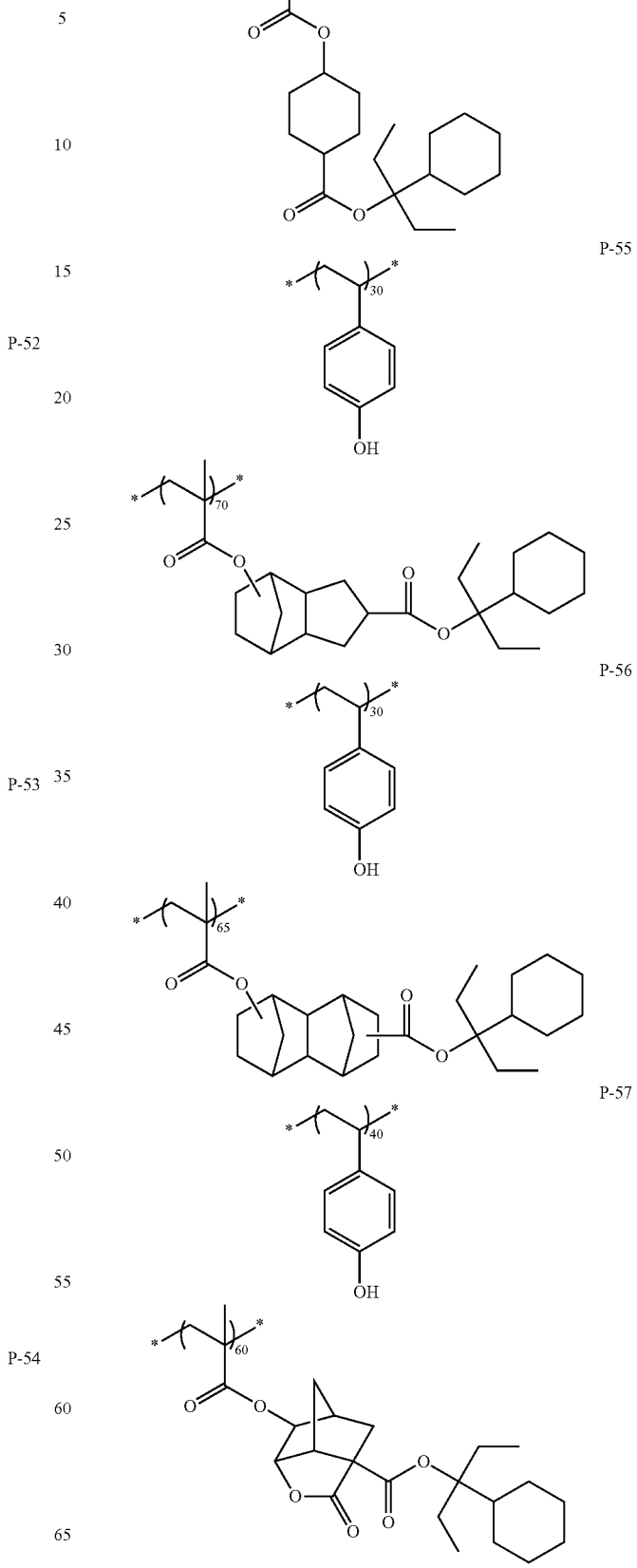
P-55
P-56
P-57

P-58
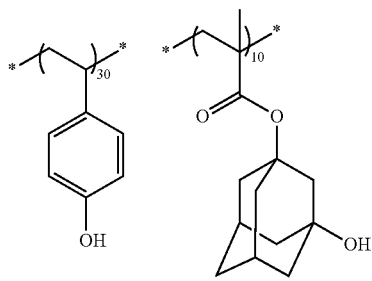
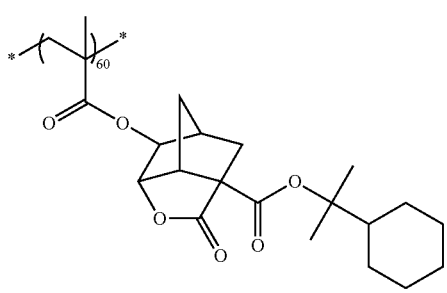
P-59
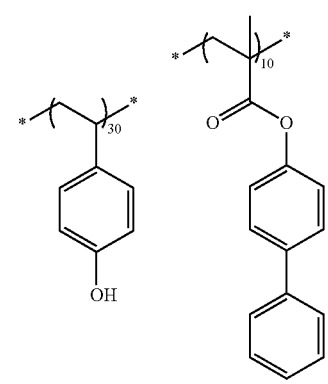
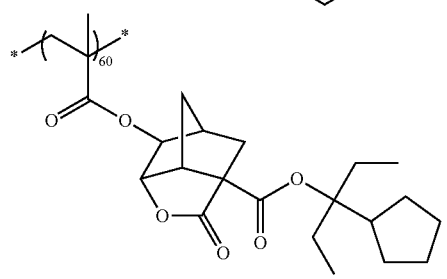
P-60
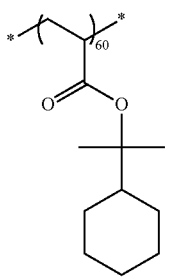
P-61
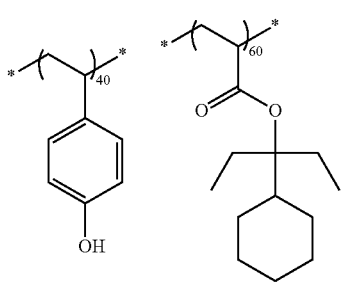
P-62
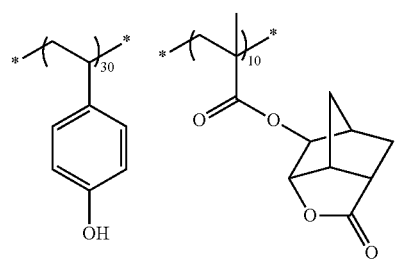
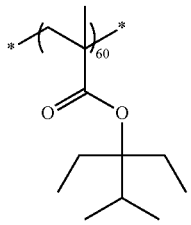
P-63
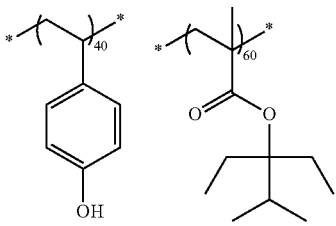
P-64
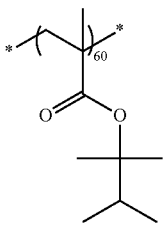
P-65
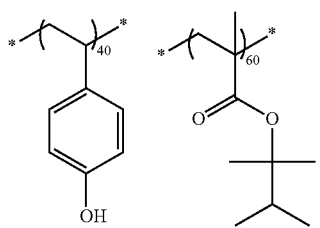

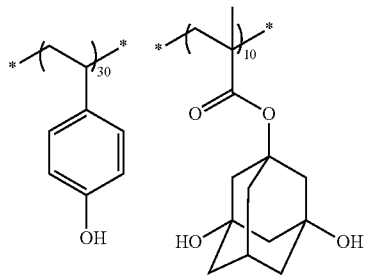
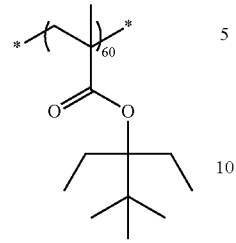
P-66
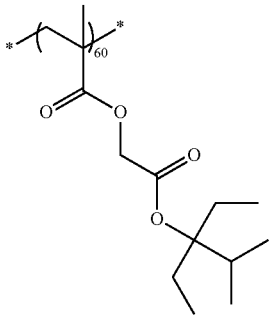
P-71
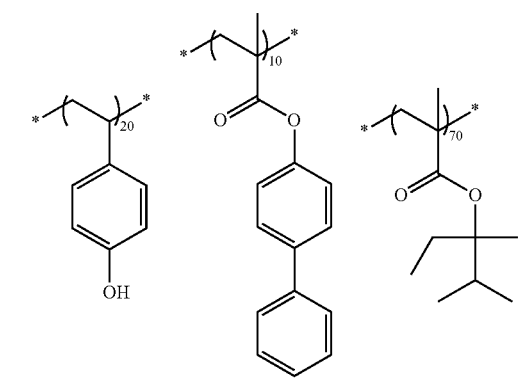
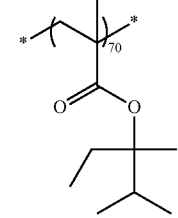
P-67
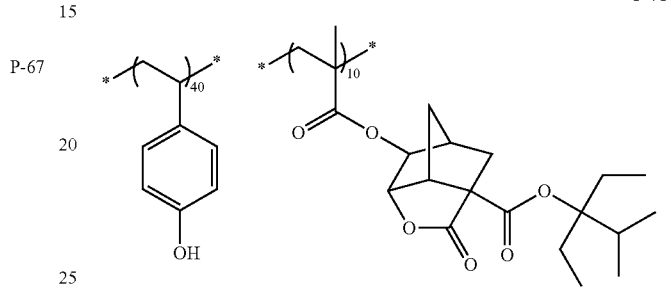
P-72
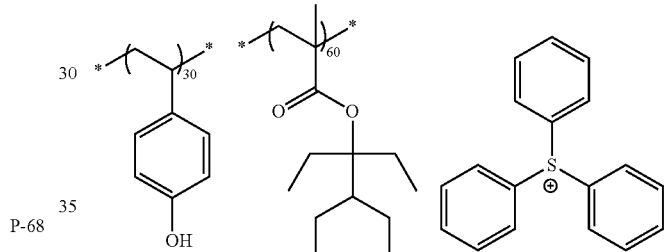
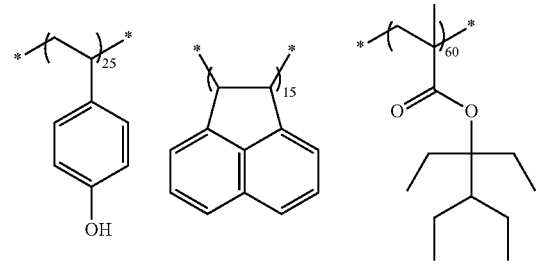
P-68
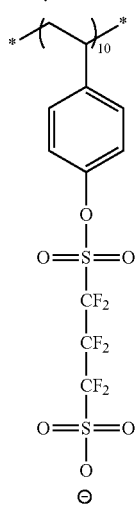
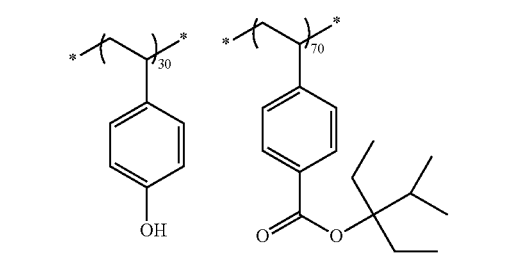
P-69
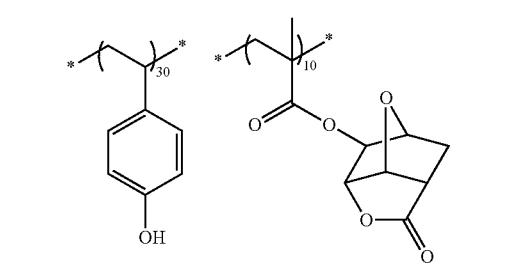
P-70
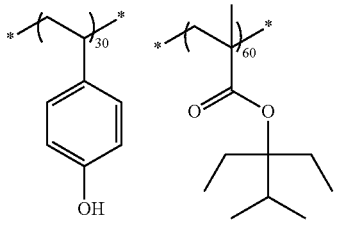
P-73

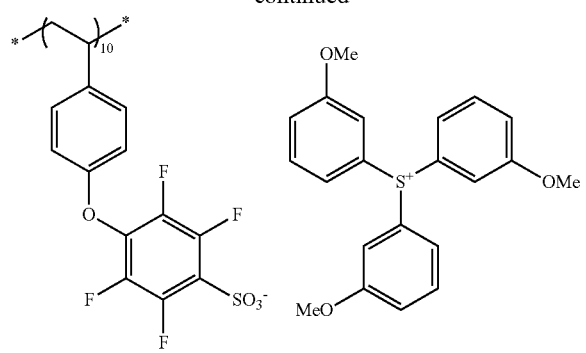
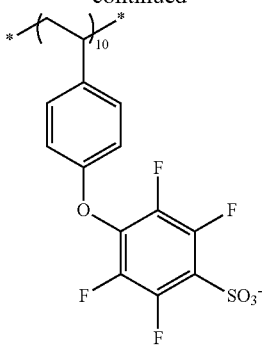
P-74
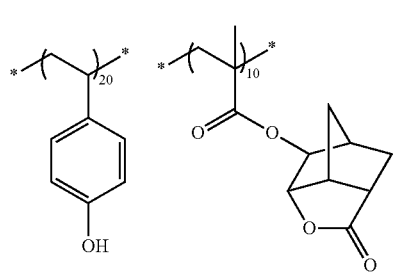
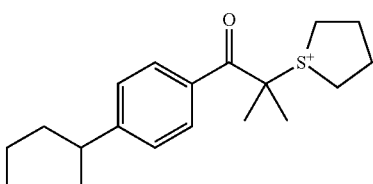
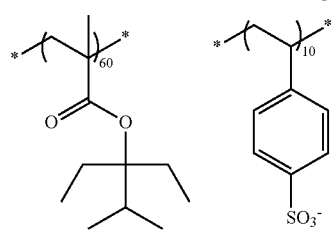
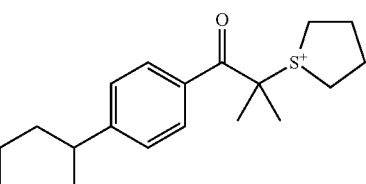
P-76
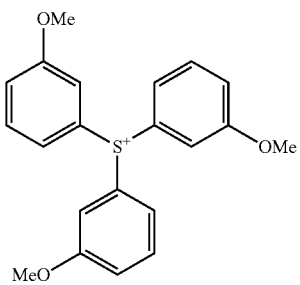
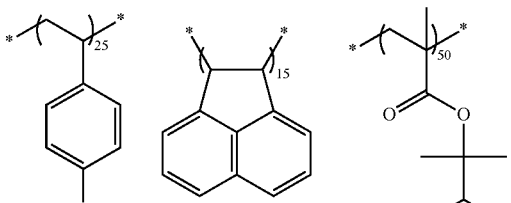
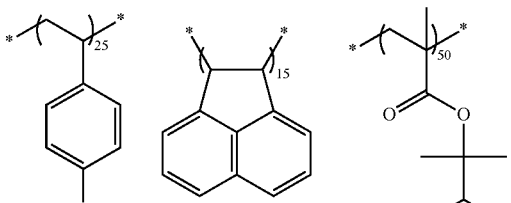
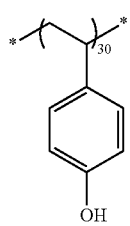
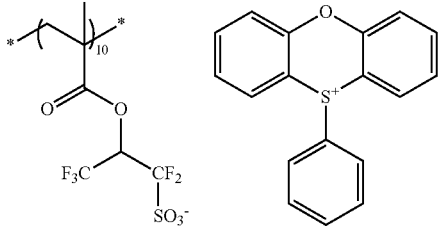
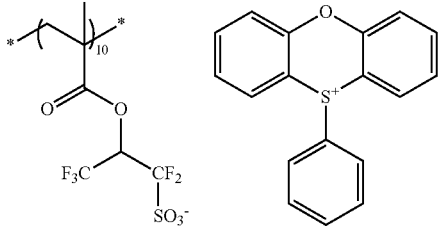
P-75
P-77
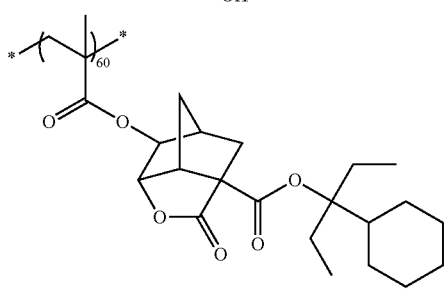
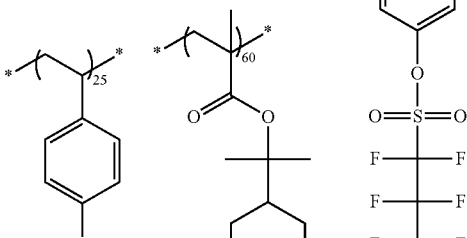
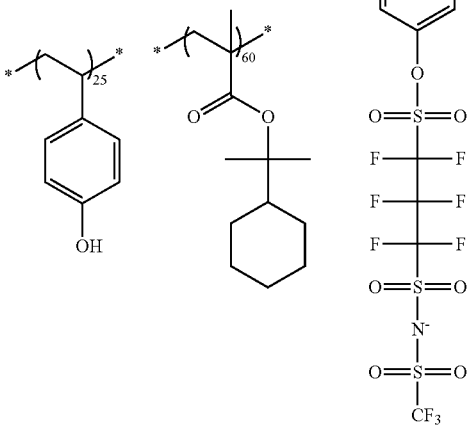

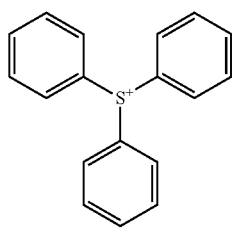
P-78
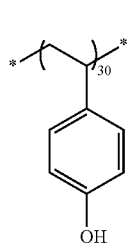 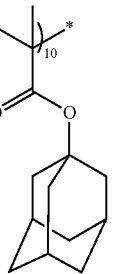 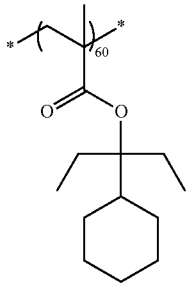
P-79
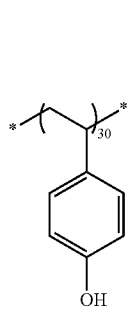 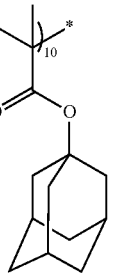 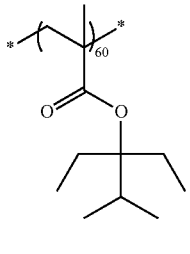
P-80
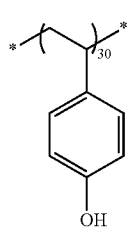 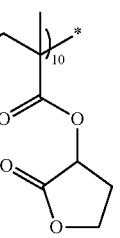 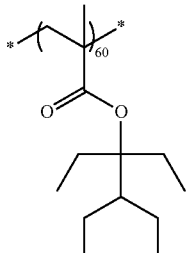
P-81
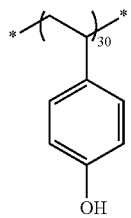 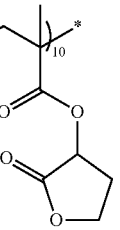 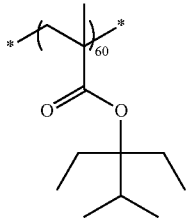
P-82
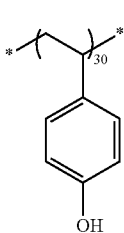 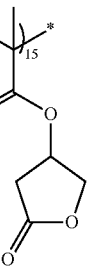 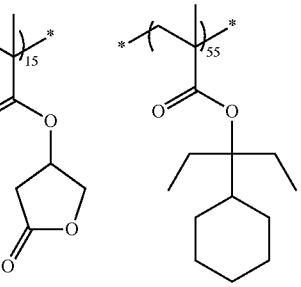
P-83
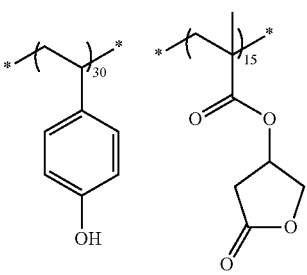 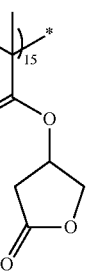 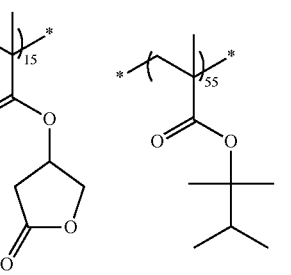
P-84
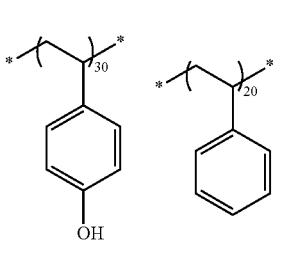 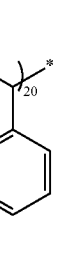 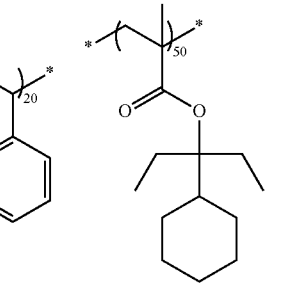
P-85
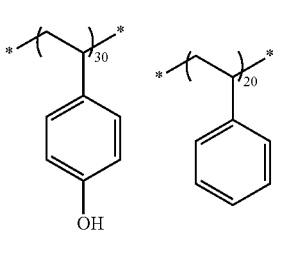 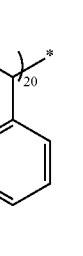 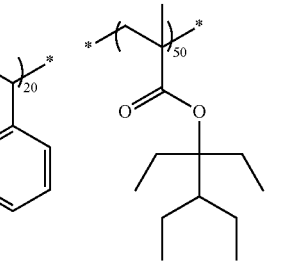
P-86
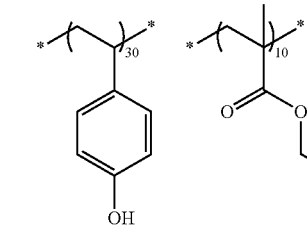 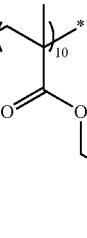 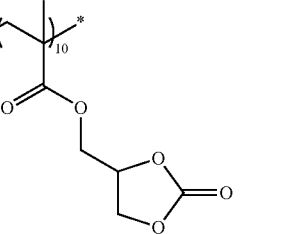

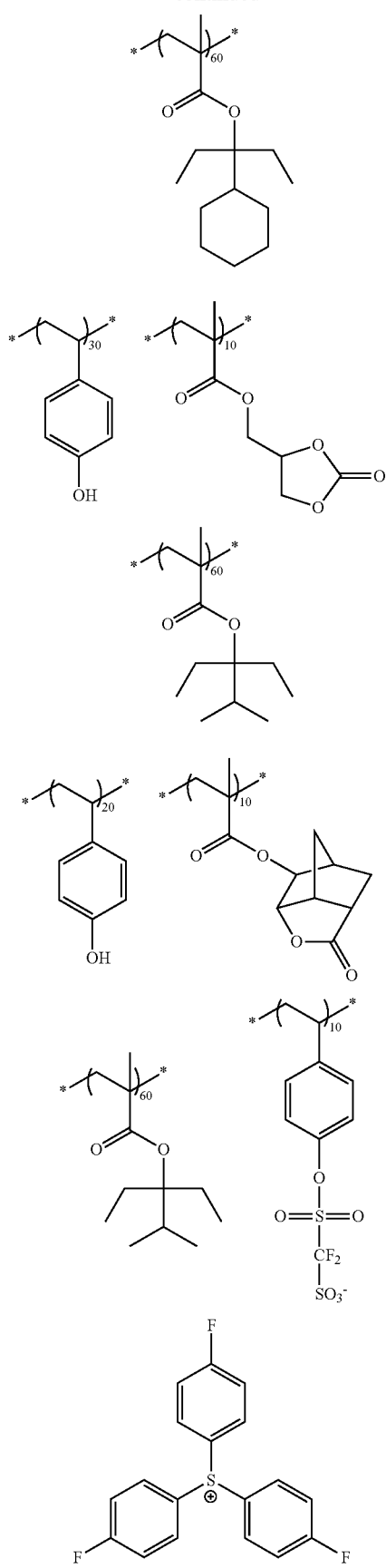
P-87
P-88
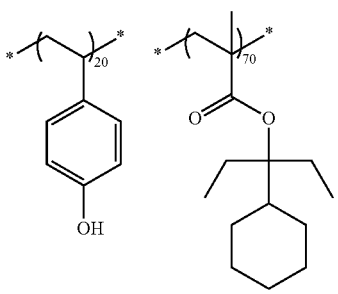
P-89
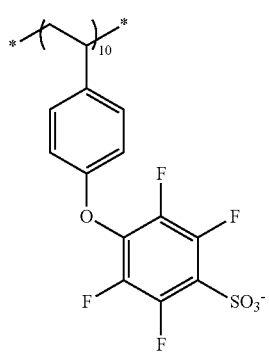
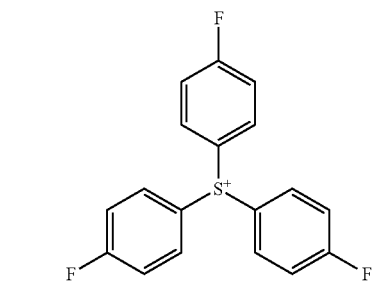
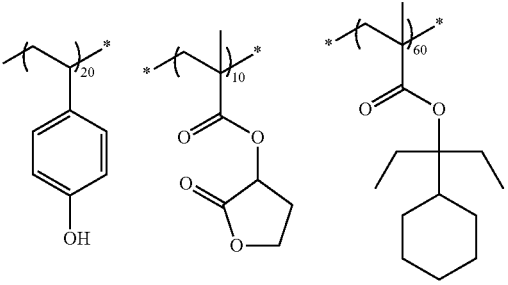
P-90
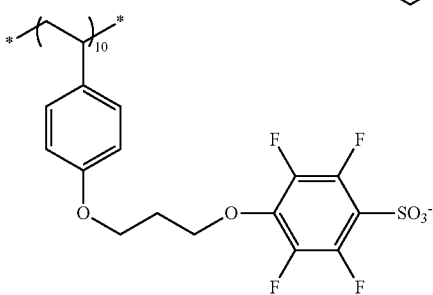

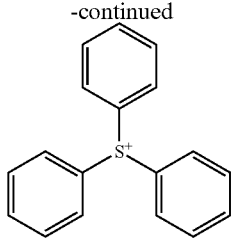
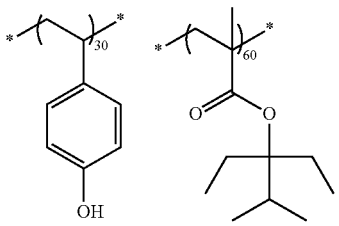
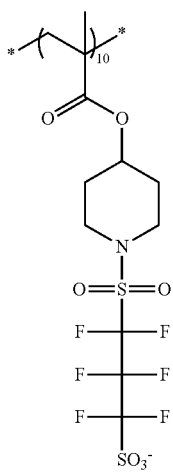

P-91

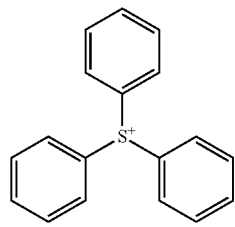 [SMILES: c1ccc([S+](c2ccccc2)c2ccccc2)cc1]

[2] Resin (A') whose solubility in a developer containing an organic solvent is decreased by the action of an acid, which is different from the resin (A)

The electron beam-sensitive or extreme ultraviolet ray-sensitive resin composition of the present invention may preferably contain a resin whose solubility in a developer containing an organic solvent is decreased by the action of an acid (hereinafter also referred to as a "resin (A')"), which is different from the resin (A).

The resin (A') is a resin whose polar group has a structure protected by a group capable of decomposing and leaving by the action of an acid (hereinafter also referred to as an "acid-decomposable group").

The resin (A') may preferably have a repeating unit having an acid-decomposable group.

Examples of a polar group may include a carboxyl group, a phenolic hydroxyl group, an alcoholic hydroxyl group, a sulfonate group, and thiol group.

Examples of the group capable of leaving by the action of an acid may include —C($R_{36}$)($R_{37}$)($R_{38}$), —C($R_{36}$)($R_{37}$)(O$R_{39}$), —C(=O)—O—C($R_{36}$)($R_{37}$)($R_{38}$), —C($R_{01}$)($R_{02}$)(O$R_{39}$), —C($R_{01}$)($R_{02}$)—C(=O)—O—C($R_{36}$)($R_{37}$)($R_{38}$) and the like.

In the Formula, $R_{36}$ to $R_{39}$ each independently represent an alkyl group, a cycloalkyl group, an aryl group, an aralkyl group or an alkenyl group. $R_{36}$ and $R_{37}$ may be bonded to each other to form a ring. $R_{01}$ and $R_{02}$ each independently represent a hydrogen atom, an alkyl group, a cycloalkyl group, an aryl group, an aralkyl group or an alkenyl group.

The resin (A') may be synthesized by a typical method (for example, radical polymerization).

The weight average molecular weight of the resin (A') in the present invention is preferably 1,000 to 200,000, more preferably 2,000 to 20,000, still more preferably 3,000 to 15,000, and particularly preferably 3,000 to 10,000, in terms of polystyrene by the GPC method. By setting the weight average molecular weight within 1,000 to 200,000, it is possible to prevent deterioration in the heat resistance or dry etching resistance and also prevent the film-forming property from deteriorating due to impaired developability or increased viscosity.

The polydispersity (molecular weight distribution) is usually in a range of 1.0 to 3.0, preferably 1.0 to 2.6, more preferably 1.0 to 2.0, and particularly preferably 1.4 to 1.7. The smaller the molecular weight distribution is, the better the resolution and resist shape are, and the smoother the side wall of the resist pattern is, and thus roughness is excellent.

The resin (A') may be used in combination of a plurality thereof.

The electron beam-sensitive or extreme ultraviolet ray-sensitive resin composition of the present invention may or may not contain the resin (A'), but in the case of containing it, the adding ratio of the resin (A') in the entire composition is usually 1% by mass to 50% by mass, preferably 1% by mass to 30% by mass, and particularly preferably 1% by mass to 15% by mass, based on the total solid of the electron beam-sensitive or extreme ultraviolet ray-sensitive resin composition.

Examples of the resin (A') may include resins described in paragraphs 0059 to 0169 of Japanese Patent Application Laid-Open No. 2010-217884 and those described in paragraphs 0214 to 0594 of Japanese Patent Application Laid-Open No. 2011-217048.

[3] (B) Compound capable of generating an acid upon irradiation with an electron beam-sensitive or extreme ultraviolet ray The composition in the present invention may preferably contain (B) a compound capable of generating an acid upon irradiation with an electron beam-sensitive or extreme ultraviolet ray (hereinafter, also referred to as an "acid generator" or a "photo-acid generator").

If the acid generator is known, it is not particularly limited. However, it may preferably be a compound capable of generating at least anyone of organic acids such as a sulphonic acid, a bis(alkylsulponyl)imid, or a tris(alkylsulphonyl)methid upon irradiation with an electron beam or extreme ultraviolet.

The compound (B) capable of generating an acid upon irradiation with an electron beam or extreme ultraviolet may have a form of the low molecular weight compound or a form of being inserted in a part of the polymer. Further, it may be used in combination of a form of the low molecular weight compound or a form of being inserted in a part of the polymer.

In the case where the compound (B) capable of generating an acid upon irradiation with an electron beam or extreme ultraviolet is a form of the low molecular weight compound, the molecular weight thereof may preferably be 3,000 or less, more preferably be 2,000 or less, and still more preferably be 1000 or less.

In the case where the compound (B) capable of generating an acid upon irradiation with an electron beam or extreme ultraviolet is a form of being inserted in a part of the polymer, it may be inserted in a part of the above-described acid-decomposable resin or the resin different from the acid-decomposable resin.

More preferred examples thereof may include compounds represented by the following Formulas (ZI), (ZII), and (ZIII).

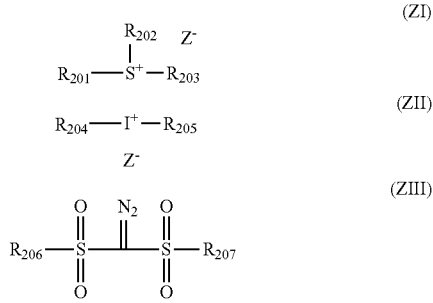

In Formula (ZI), $R_{201}$, $R_{202}$ and $R_{203}$ each independently represent an organic group.

The carbon number of the organic group as $R_{201}$, $R_{202}$ and $R_{203}$ is generally 1 to 30, and preferably 1 to 20.

Further, two of $R_{201}$ to $R_{203}$ may be bound with each other to form a ring structure, and may include an oxygen atom, a sulfur atom, an ester bond, an amide bond or a carbonyl group in the ring. Examples of the group formed by two of $R_{201}$ to $R_{203}$ being bound with each other may include an alkylene group (for example, a butylene group and a pentylene group).

$Z^-$ represents a non-nucleophilic anion (an anion having an extremely low ability of causing a nucleophilic reaction).

Examples of the non-nucleophilic anion may include sulfonate anion (an aliphatic sulfonate anion, an aromatic sulfonate anion, a camphorsulfonate anion and the like), carboxylate anion (an aliphatic carboxylate anion, an aromatic carboxylate anion, an aralkylcarboxylate anion and the like), sulfonylimide anion, bis(alkylsulfonyl)imide anion, tris(alkylsulfonyl)methyl anion and the like.

The aliphatic moiety in the aliphatic sulfonate anion and the aliphatic carboxylate anion may be an alkyl group or a cycloalkyl group, and is preferably a straight or branched alkyl group having 1 to 30 carbon atoms and a cycloalkyl group having 3 to 30 carbon atoms.

The aromatic group in the aromatic sulfonate anion and the aromatic carboxylate anion is preferably an aryl group having 6 to 14 carbon atoms, and examples thereof may include a phenyl group, a tolyl group, a naphthyl group, and the like.

The alkyl group, the cycloalkyl group and the aryl group may have a substituent. Specific examples of the substituent thereof may include a nitro group, a halogen atom such as a fluorine atom, a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), an alkylthio group (preferably having 1 to 15 carbon atoms), an alkylsulfonyl group (preferably having 1 to 15 carbon atoms), an alkyliminosulfonyl group (preferably having 2 to 15 carbon atoms), an aryloxysulfonyl group (preferably having 6 to 20 carbon atoms), an alkylaryloxysulfonyl group (preferably having 7 to 20 carbon atoms), a cycloalkylaryloxysulfonyl group (preferably having 10 to 20 carbon atoms), an alkyloxyalkyloxy group (preferably having 5 to 20 carbon atoms), a cycloalkylalkyloxyalkyloxy group (preferably having 8 to 20 carbon atoms) and the like. Examples of the aryl group and the ring structure that each group may further include an alkyl group (preferably having 1 to 15 carbon atoms) as a substituent.

The aralkyl group in the aralkylcarboxylate anion is preferably an aralkyl group having 7 to 12 carbon atoms, and examples thereof may include a benzyl group, a phenethyl group, a naphthylmethyl group, a naphthylethyl group, a naphthylbutyl group and the like.

Examples of the sulfonylimide anion include saccharin anion.

The alkyl group in the bis(alkylsulfonyl)imide anion and the tris(alkylsulfonyl) methide anion is preferably an alkyl group having 1 to 5 carbon atoms. Examples of the substituent of the alkyl group include a halogen atom, an alkyl group substituted with a halogen atom, an alkoxy group, an alkylthio group, an alkyloxysulfonyl group, an aryloxysulfonyl group, a cycloalkylaryloxysulfonyl group and the like, and a fluorine atom or an alkyl group substituted with a fluorine atom is preferred.

In addition, the alkyl groups in the bis(alkylsulfonyl) imide anion may be bound with each other to form a ring. As a result, the acid strength may be increased.

Examples of other non-nucleophilic anions may include fluorinated phosphate (for example, $PF_6^-$), fluorinated boron (for example, $BF_4^-$), fluorinated antimony (for example, $SbF_6^-$) and the like.

The non-nucleophilic anion is preferably an aliphatic sulfonate anion in which at least an a-position of sulfonic acid is substituted with a fluorine atom, an aromatic sulfonate anion substituted with a fluorine atom or a group having a fluorine atom, a bis(alkylsulfonyl)imide anion in which the alkyl group is substituted with a fluorine atom, or a tris(alkylsulfonyl)methide anion in which the alkyl group is substituted with a fluorine atom. The non-nucleophilic anion is more preferably a perfluoroaliphatic sulfonate anion (more preferably having 4 to 8 carbon atoms), a benzenesulfonate anion having a fluorine atom, and more preferably a nonafluorobutanesulfonate anion, a perfluorooctanesulfonate anion, a pentafluorobenzenesulfonate anion and a 3,5-bis(trifluoromethyl)benzenesulfonate anion.

From the viewpoint of the acid strength, a generated acid having a pKa of −1 or less is desirable in order to improve the sensitivity.

Examples of the organic group of $R_{201}$, $R_{202}$ and $R_{203}$ may include an aryl group, an alkyl group, a cycloalkyl group and the like.

It is preferred that at least one of $R_{201}$, $R_{202}$ and $R_{203}$ is an aryl group, and it is more preferred that all three is an aryl group. The aryl group may be a heteroaryl group such as indole residue, pyrrole residue and the like in addition to a phenyl group, a naphthyl group and the like. The alkyl group and the cycloalkyl group of $R_{201}$ to $R_{203}$ are preferably a straight or branched alkyl group having 1 to 10 carbon atoms, and a cycloalkyl group having 3 to 10 carbon atoms. The alkyl group is more preferably a methyl group, an ethyl group, a n-propyl group, an i-propyl group, a n-butyl group and the like. The cycloalkyl group is more preferably a cyclopropyl group, a cyclobutyl group, a cyclopentyl group, a cyclohexyl group, a cycloheptyl group and the like. These groups may further have substituents. Examples of the substituent may include a nitro group, halogen atom such as a fluorine atom, a carboxyl group, a hydroxyl group, an amino group, a cyano group, an alkoxy group (preferably having 1 to 15 carbon atoms), cycloalkyl group (preferably having 3 to 15 carbon atoms), an aryl group (preferably having 6 to 14 carbon atoms), alkoxycarbonyl group (preferably having 2 to 7 carbon atoms), an acyl group (preferably having 2 to 12 carbon atoms), alkoxycarbonyloxy group (preferably having 2 to 7 carbon atoms) and the like, but it is not limited thereto.

Further, in the case where two of $R_{201}$ to $R_{203}$ are bound to form a ring structure, the structure represented by the following Formula (A1) is preferred.

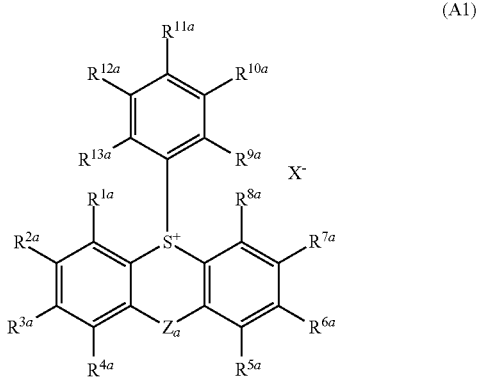

(A1)

In Formula (A1), $R^{1a}$ to $R^{13a}$ each independently represent a hydrogen atom or a substituent.

It is preferred that one to three of $R^{1a}$ to $R^{13a}$ are not a hydrogen atom and more preferred that any one of $R^{9a}$ to $R^{13a}$ is not a hydrogen atom.

Za represents a single bond or a divalent linking group.

$X^-$ is the same as $Z^-$ in Formula (ZI).

Specific examples of the case wehre $R^{1a}$ to $R^{13a}$ are not a hydrogen atom may include a halogen atom, a straight, branched or cyclic alkyl group, an alkenyl group, an alkynyl group, an aryl group, a heterocyclic group, a cyano group, a nitro group, a carboxyl group, an alkoxy group, an aryloxy group, a sillyloxy group, a heterocyclic oxy group, an acyloxy group, a carbamoyloxy group, an alkoxycarbonyloxy group, an aryloxycarbonyloxy group, an amino group (including an anylino group), an ammonio group, an acylamino group, an amino carbonyl amino group, an alkoxy- carbonyl amino group, an aryloxycarbonylamino group, a sulphamoyl amino group, an alkyl and arylsulphonyl amino group, a mercapto group, an alkylthio group, an arylthio group, a hetero cyclic thio group, a sulphamoyl group, a sulfo group, an alkyl and arylsulfinyl group, an alkyl and arylsuphonyl, an acyl group, an aryloxycarbonyl group, an alkoxycarbonyl group, a carbamoyl group, an aryl and hetero cyclic azo group, an imide group, a phosphino group, a phosphinyl group, a phosphinyl oxy group, a phosphinyl amino group, a phosphono group, a sillyl group, a hydrazine group, an ureido group, a borate group (—B(OH)$_2$), a phosphate group (—OPO(OH)$_2$), a sulphate group (—OSO$_3$H), and other known substituents.

In the case where $R^{1a}$ to $R^{13a}$ are not a hydrogen atom, a straight, branched or cyclic alkyl group substituted with a hydroxyl group is preferred.

Examples of the divalent linking group of Za may include an alkylene group, an arylene group, a carbonyl group, a sulphonyl group, a carbonyloxy group, a carbonylamino group, a sulphonyl amide group, an ether bond, a thioether bond, an amino group, a disulphide group, —(CH$_2$)$_n$— CO—, —(CH$_2$)$_n$—SO$_2$—, —CH=CH—, an amino carbonyl amino group, an amino sulphonyl amino group and the like (n is an integer of 1 to 3).

The preferred structures in the case where at least one of $R_{201}$ to $R_{203}$ is not an aryl group may include a cation structure such as compounds exemplified in paragraphs 0046, 0047 and 0048 of Japanese Patent Application Laid-Open No. 2004-233661 and paragraphs 0040 to 0046 of Japanese Patent Application Laid-Open No. 2003-35948, compounds exemplified as Formulas (I-1) to (I-70) in U.S. Patent Application Laid-Open No. 2003/0224288, and compounds exemplified as Formulas (IA-1) to (IA-54) and Formulas (IB-1) to (IB-24) of U.S. Patent Application Laid-Open No. 2003/0077540.

In Formulas (ZII) and (ZIII), $R_{204}$ to $R_{207}$ each independently represent an aryl group, an alkyl group or a cycloalkyl group.

The aryl group, the alkyl group and the cycloalkyl group of $R_{204}$ to $R_{207}$ are the same as the aryl group, the alkyl group and the cycloalkyl group of $R_{201}$ to $R_{203}$ in the compound (ZI).

The aryl group, the alkyl group and the cycloalkyl group of $R_{204}$ to $R_{207}$ may have a substituent. Examples of the substituent may also include those in which may be possessed by the aryl group, the alkyl group and the cycloalkyl group of $R_{201}$ to $R_{203}$ in the compound (ZI).

$Z^-$ represents a non-nucleophilic anion, and may include the same non-nucleophilic anion of $Z^-$ in Formula (ZI).

Further, examples of the acid generator may include the compounds represented by the following Formulas (ZIV), (ZV), and (ZVI).

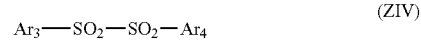

(ZIV)

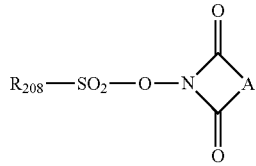

(ZV)

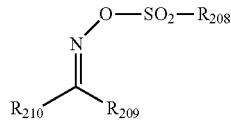

(ZVI)

In Formulas (ZIV) to (ZVI), $Ar_3$ and $Ar_4$ each independently represent an aryl group.

$R_{208}$, $R_{209}$ and $R_{210}$ each independently represent an alkyl group, a cycloalkyl group or an aryl group.

A represents an alkylene group, an alkenylene group or an arylene group.

Specific examples of the aryl group of $Ar_3$, $Ar_4$, $R_{208}$, $R_{209}$ and $R_{210}$ are the same as the specific examples of the aryl group as $R_{201}$, $R_{202}$ and $R_{203}$ in Formula (ZI).

Specific examples of the alkyl group and the cycloalkyl group of $R_{208}$, $R_{209}$ and $R_{210}$ are respectively the same as the specific examples of the alkyl group and the cycloalkyl group as $R_{201}$, $R_{202}$ and $R_{203}$ in Formula (ZI).

Examples of the alkylene group of A may include an alkylene group having 1 to 12 carbon atoms (for example, a methylene group, an ethylene group, a propylene group, an isopropylene group, a butylene group, an isobutylene group and the like), examples of the alkenylene group of A may include an alkenylene group having 2 to 12 carbon atoms (for example, an ethenylene group, a propenylene group, a butenylene group and the like), and examples of the arylene group of A may include an arylene group having 6 to 10 carbon atoms (for example, a phenylene group, a tolylene group, a naphthylene group and the like).

The compound (B) capable of generating an acid upon irradiation with an electron beam or extreme ultraviolet may preferably be a compounds represented by Formulas (3-1) or (3-2) from the viewpoint of acid decomposition efficiency of the repeating units represented by Formula (1-0) or (1-1) possessed by the resin (A).

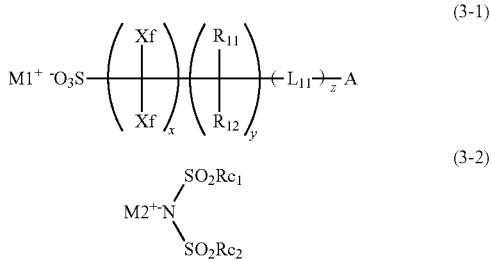

In Formula (3-1),

Xf's each independently represent a fluorine atom or an alkyl group substituted with at least one fluorine atom.

$R_{11}$ and $R_{12}$ each independently represent a hydrogen atom, a fluorine atom or an alkyl group, and when a plurality of $R_{11}$'s and $R_{12}$'s are present, $R_{11}$'s and $R_{12}$'s may be the same or different, respectively.

$L_{11}$ independently represents a divalent linking group, and when a plurality of $L_{11}$'s are present, $L_{11}$'s may be the same or different.

A represents an organic group. $M1^+$ represents a cation. x represents an integer of 1 to 20, y represents an integer of 0 to 10, and z represents an integer of 0 to 10.

In Formula (3-2), $Rc_1$ and $Rc_2$ each independently represent an organic group, and $Rc_1$ and $Rc_2$ may be bound with each other to form a ring. $M2^+$ represents a cation.

Formula (3-1) will be described in detail.

The alkyl group in the alkyl group substituted with at least one fluorine atom of Xf may preferably have 1 to 10 carbon atoms, and more preferably have 1 to 4 carbon atoms. In addition, the alkyl group substituted with a fluorine atom of Xf is preferably a perfluoroalkyl group.

Xf is preferably a fluorine atom or a perfluoroalkyl group having 1 to 4 carbon atoms. Specific examples of Xf include a fluorine atom, $CF_3$, $C_2F_5$, $C_3F_7$, $C_4F_9$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ or $CH_2CH_2C_4F_9$, and more preferably a fluorine atom or $CF_3$. In particular, it is preferred that both Xf s are a fluorine atom.

The alkyl group of $R_{11}$ and $R_{12}$ may have a substituent (preferably a fluorine atom) and may preferably have 1 to 4 carbon atoms. The alkyl group is more preferably a perfluoroalkyl group having 1 to 4 carbon atoms. Specific examples of the alkyl group having a substituent of $R_{11}$ and $R_{12}$ may include $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ and $CH_2CH_2C_4F_9$, and among them, $CF_3$ is preferred.

$R_{11}$ or $R_{12}$ is preferably a fluorine atom or $CF_3$.

x is preferably 1 to 10, and more preferably 1 to 5.

y is preferably 0 to 4, more preferably 0 or 1, and still more preferably 0.

z is preferably 0 to 5, and more preferably 0 to 3.

The divalent linking group of $L_{11}$ is not particularly limited. Examples of the divalent linking group may include —COO—, —OCO—, —CO—, —O—, —S—, —SO—, —$SO_2$—, an alkylene group, a cycloalkylene group, an alkenylene group, or a divalent linking group formed by combining a plurality of these members, and the like. The divalent linking group having 12 or less carbon atoms in total is preferred. Among them, —COO—, —OCO—, —CO— or —O— is preferred, and —COO— or —OCO— is more preferred.

The organic group of A may include an alicyclic group, an aryl group, a heterocyclic group (including a group not having aromaticity as well as a group having aromaticity), an alkyl group and the like. The organic group of A is preferably a cyclic type organic group. If it has a cyclic structure, it is not particularly limited, and may be an alicyclic group, an aryl group, a heterocyclic group (including a group not having aromaticity as well as a group having aromaticity) and the like.

The alicyclic group may be monocyclic or polycyclic, and is preferably a monocyclic cycloalkyl group such as a cyclopentyl group, a cylohexyl group and a cyclooctyl group, or a polycyclic cycloalkyl group such as a norbornyl group, a tricyclodecanyl group, a tetracyclodecanyl group, a tetracyclododecanyl group and an adamantyl group. Among them, an alicyclic group having a bulky structure with 7 or more carbon atoms, such as a norbornyl group, a tricyclodecanyl group, a tetracyclodecanyl group, a tetracyclododecanyl group and an adamantyl group, is preferred from the viewpoint of restraining diffusion in film during heating step after exposure and improving the MEEF.

Examples of the aryl group may include a benzene ring, a naphthyl ring, a phenanthryl ring and an anthracene ring.

Examples of the heterocyclic ring may include a furan ring, a thiophene ring, a benzofuran ring, a benzothiophene ring, a dibenzofuran ring, a dibenzothiophene ring and a pyridine ring. Among them, the heterocyclic ring derived from a furan ring, a thiophene ring, or a pyridine ring is preferred.

Further, the cyclic organic group may be a lactone structure, and specific examples thereof may be the lactone structure represented by Formulas (LC1-1) to (LC1-17) which may be possessed by the above-described resin (A).

The organic group of A may have a substituent. Examples of the substituent may include an alkyl group (may be straight, branched or cyclic typed, and preferably having 1 to 12 carbon atoms), a cycloalkyl group (may be monocyclic, polycyclic or spirocyclic ring, and preferably 3 to 20 carbon atoms), an aryl group (preferably having 6 to 14 carbon atoms), a hydroxyl group, an alkoxy group, an ester group, an amide group, a urethane group, a ureido group, a thioether group, a sulfonamide group and a sulfonic acid ester group. Further, the carbon constituting the cyclic organic group (the carbon contributing to ring formation) may be carbonyl carbon.

In particular, when A is an aryl group, the aryl group may preferably have 1 to 30 cycloalkyl or alkyl groups, more preferably have 1 to 30 cycloalkyl groups, and still more preferably 1 to 30 cyclohexyl groups as the substituents, Cation $M1^+$ may be the cation moiety in Formulas (ZI), (ZII) and (AI).

Hereinafter, Formula (3-2) will be described in detail.

The organic group of $Rc_1$ and $Rc_2$ may be an alkyl group, a cycloalkyl group, an aryl group and the like.

The alkyl group of $Rc_1$ and $Rc_2$ may preferably be an alkyl group having 1 to 5 carbon atoms, and examples thereof include a methyl group, an ethyl group, a propyl group, an isopropyl group, a n-butyl group, an isobutyl group, a sec-butyl group, a pentyl group, a neopentyl group and the like.

The cycloalkyl group of $Rc_1$ and $Rc_2$ may preferably be a cycloalkyl group having 3 to 5 carbon atoms, and examples thereof include a cyclopropyl group, a cyclopentyl group, a cyclohexyl group, a cycloheptyl group and the like.

The aryl group $Rc_1$ and $Rc_2$ may preferably be an aryl group having 6 to 14 carbon atoms, and examples thereof include a phenyl group, a tolyl group, a naphthyl group and the like.

The alkyl group, the cycloalkyl group and the aryl group may have substituents.

Examples of the substituent of the alkyl group and cycloalkyl group may include a halogen atom, an alkyl group, an alkoxy group, an alkylthio group, an alkyloxysuphonyl group, an aryloxysulphonyl group, a cycloalkyl aryloxysulphonyl group substituted with a halogen atom, and the like. An alkyl group substituted with a halogen atom is preferred.

$Rc_1$ and $Rc_2$ may be bound with each other to form an alkylene group and then to form a ring.

The alkylene group formed by $Rc_1$ and $Rc_2$ being bound with each other may preferably be an alkylene group having 2 to 4 carbon atoms, more preferably an alkylene group substituted with at least one fluorine atom. The alkylene group may have an oxygen atom in the alkylene chain. The alkylene group may be preferably a perfuluoro alkylene group having 2 to 4 carbon atoms, most preferably a tetrafluoro ethylene group, a hexafluoro propylene group, and octafluoro butylenes.

The compound in which $Rc_1$ and $Rc_2$ may be bound with each other to form includes specific examples described in Japanese Patent Application Laid-Open No. 2005-221721 and the like.

The cation $M2^+$ may be a cation moiety in Formulas (ZI), (ZII) and (AI).

Among the acid generator, particularly preferred examples are described below.

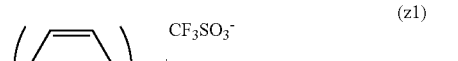
(z1)

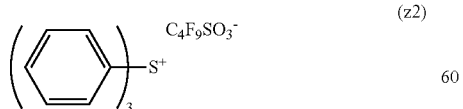
(z2)

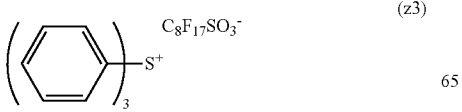
(z3)

-continued

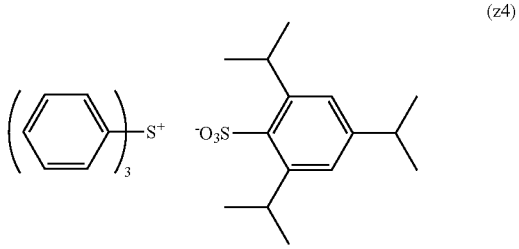
(z4)

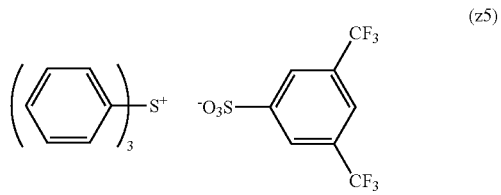
(z5)

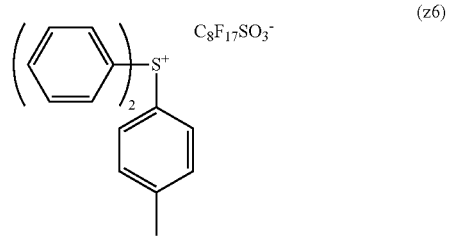
(z6)

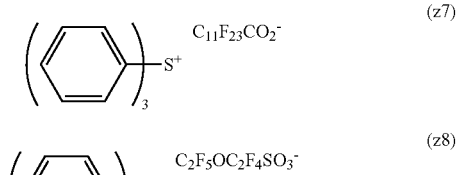
(z7)

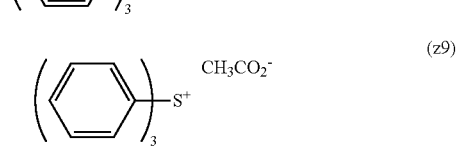
(z8)

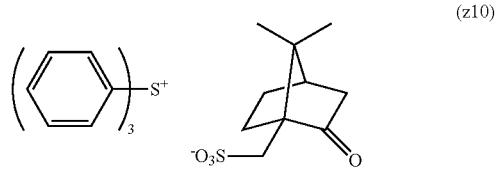
(z9)

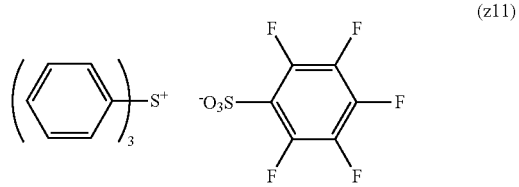
(z10)

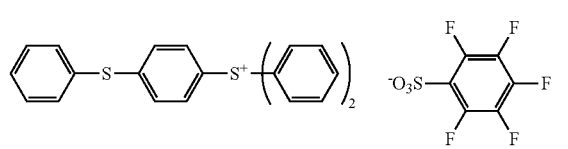
(z11)

(z12)

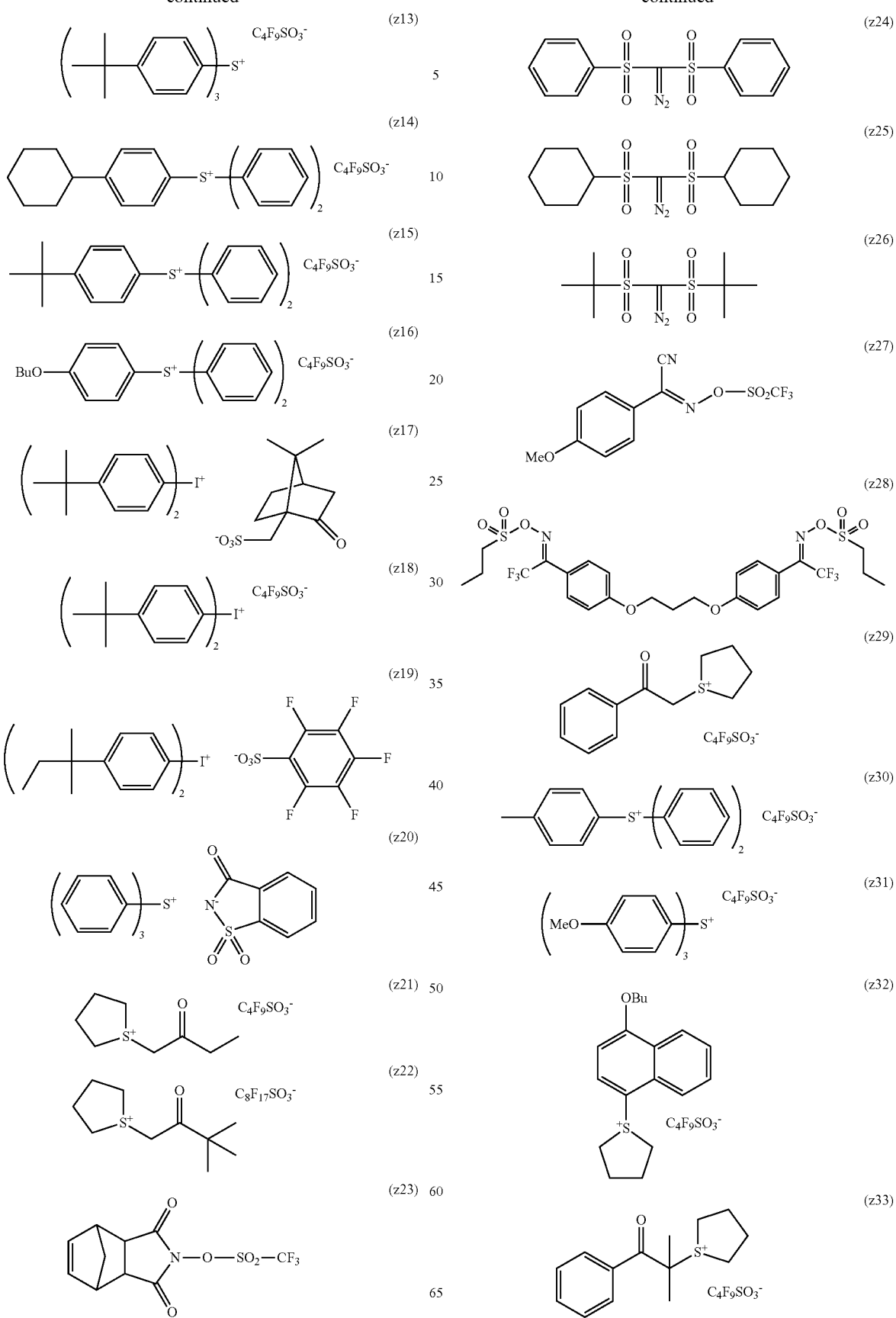

-continued
(z34) 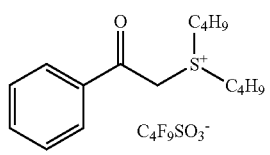
(z35) 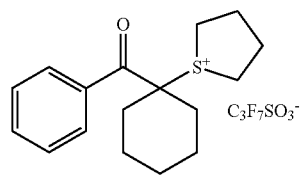
(z36) 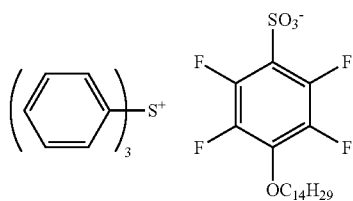
(z37) 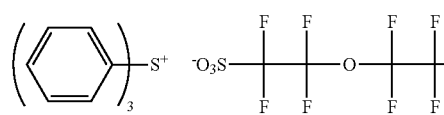
(z38) 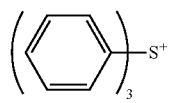
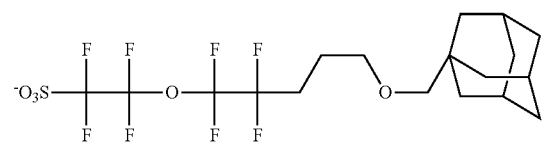
(z39) 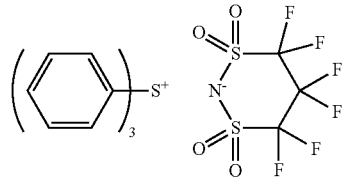
(z40) 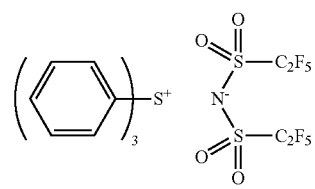
(z41) 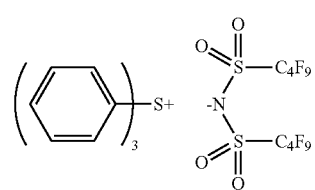
-continued
(z42) 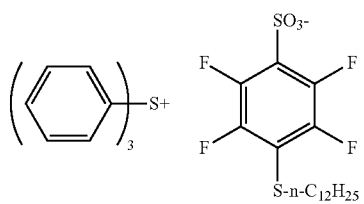
(z43) 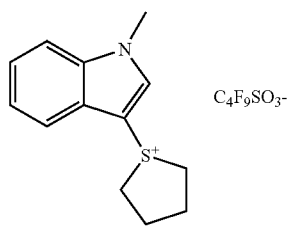
(z44) 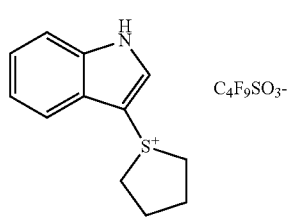
(z45) 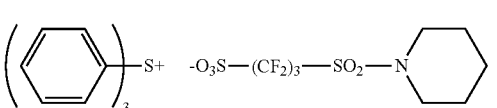
(z46) 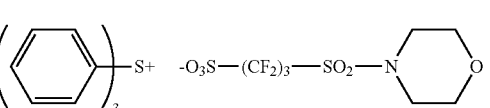
(z47) 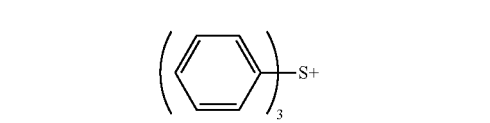
(z48) 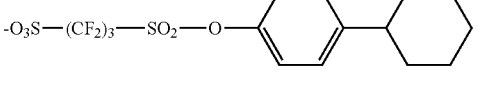
(z49) 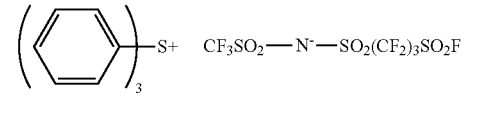
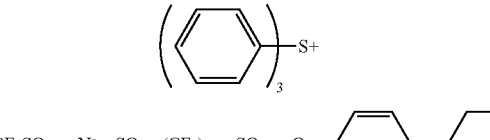
(z50) 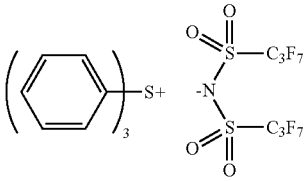

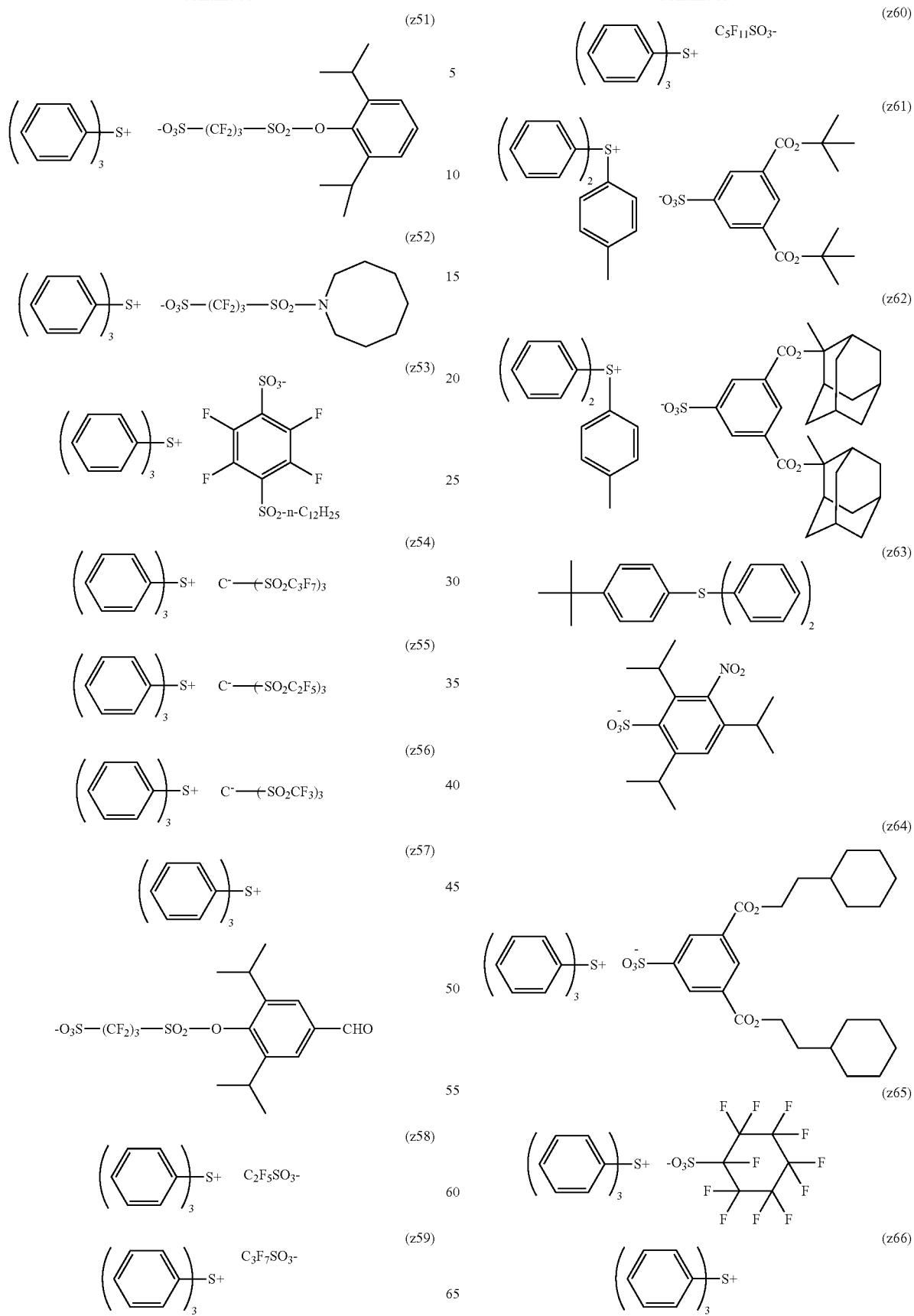

Page contains chemical structure diagrams labeled (z67) through (z79).

(z80)
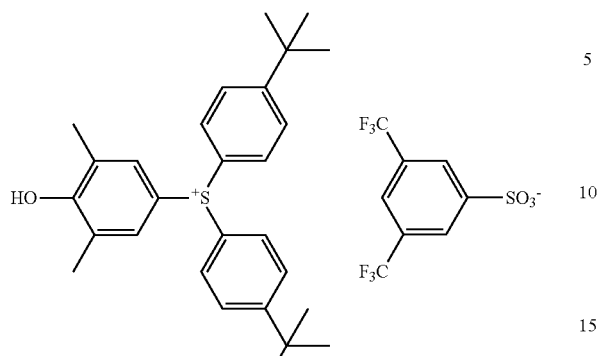
(z85)
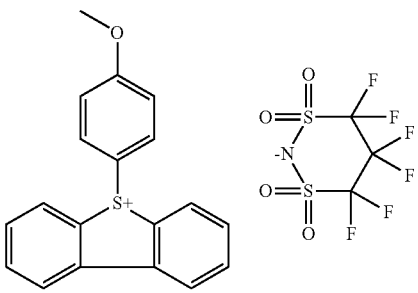
(z81)
(z86)
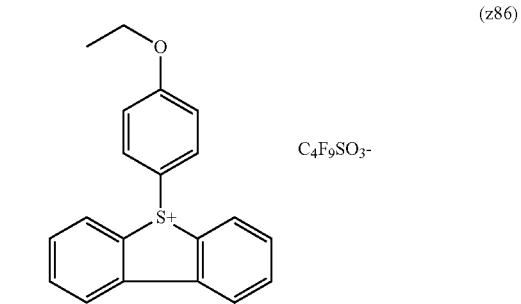
(z82)
(z87)
(z83)
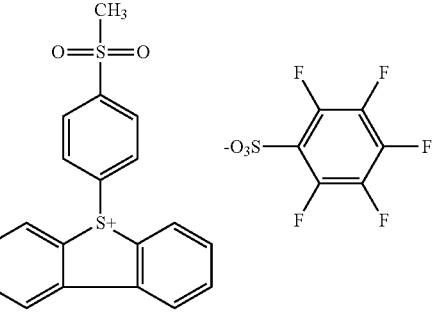
(z88)
(z84)
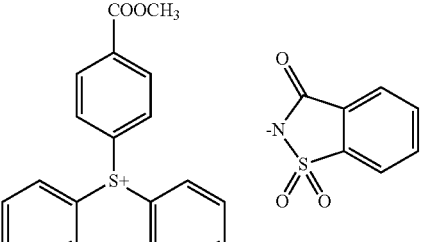
(z89)
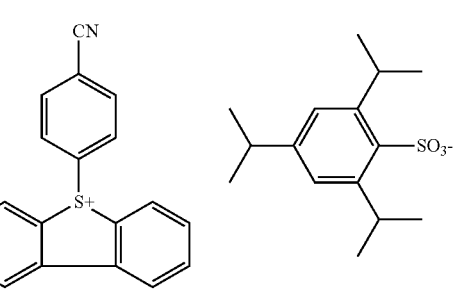

-continued
(z90)
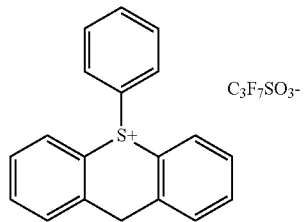
(z91)
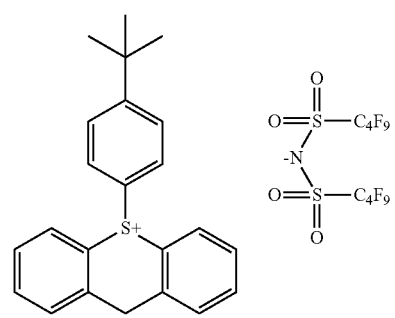
(z92)
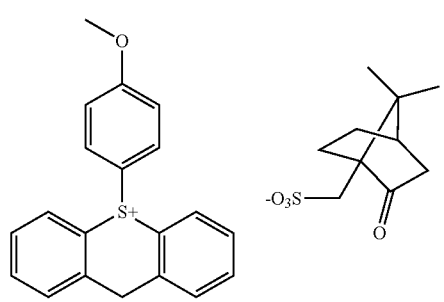
(z93)
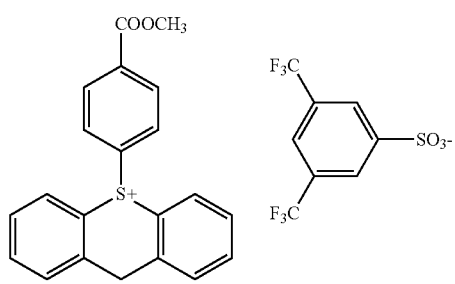
(z94)
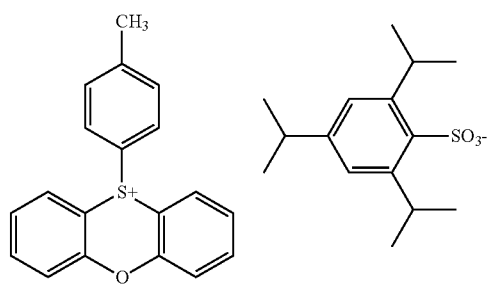
-continued
(z95)
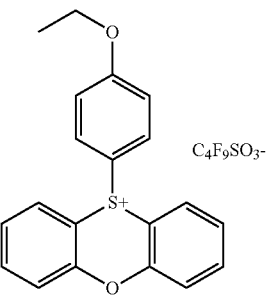
(z96)
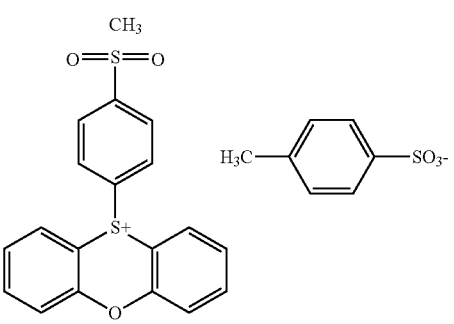
(z97)
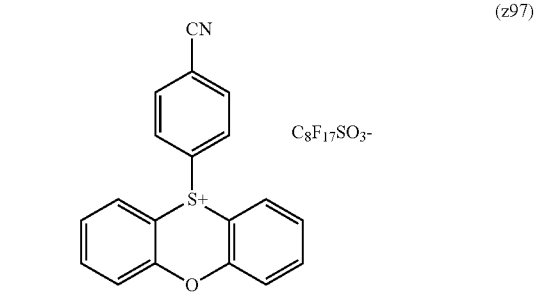
(z98)
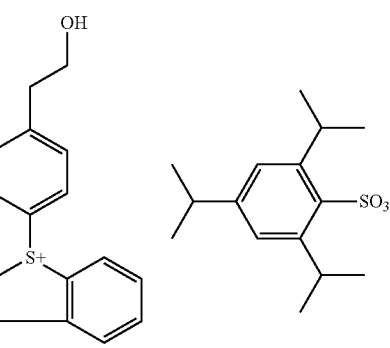
(z99)
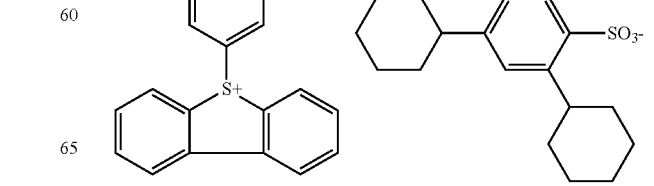

(z100)
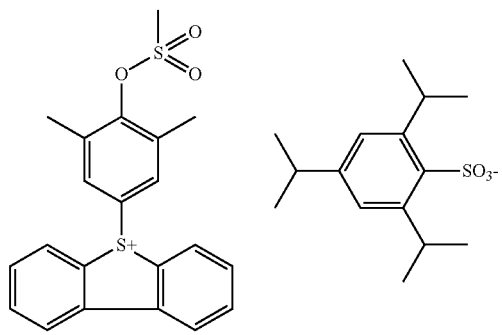
(z101)
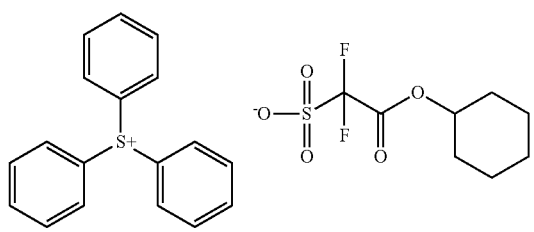
(z102)
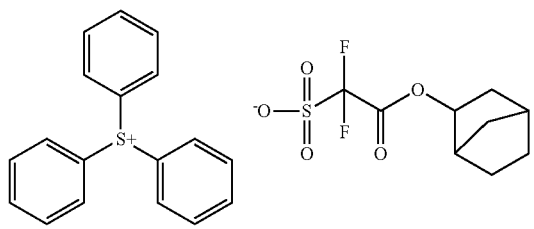
(z103)
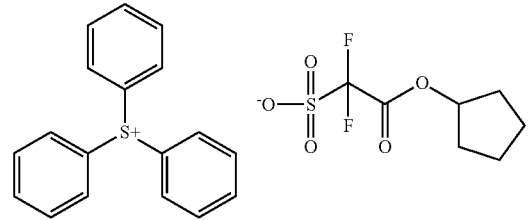
(z104)
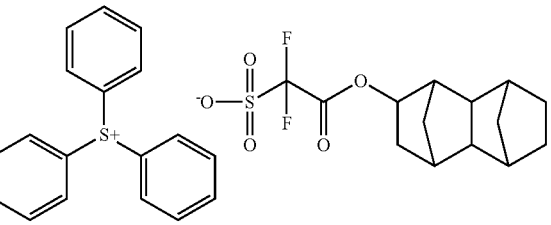
(z105)
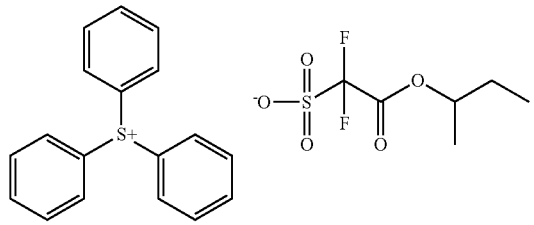
(z106)
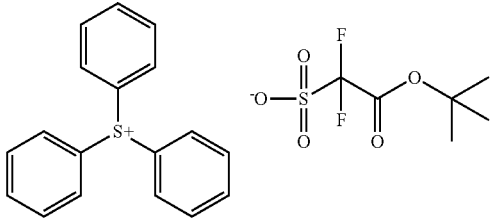
(z107)
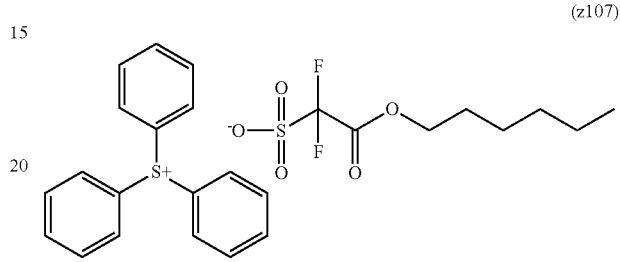
(z108)
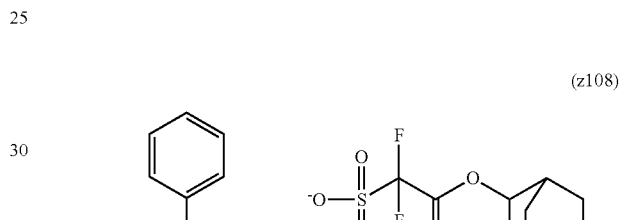
(z109)
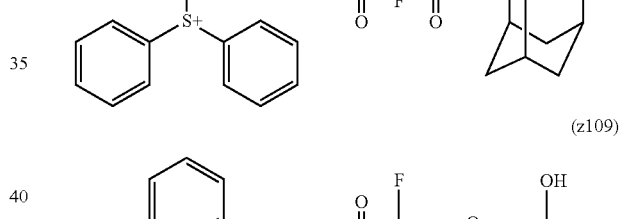
(z110)
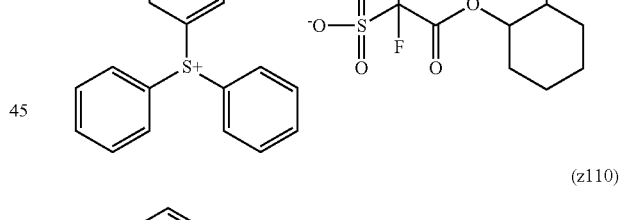
(z111)
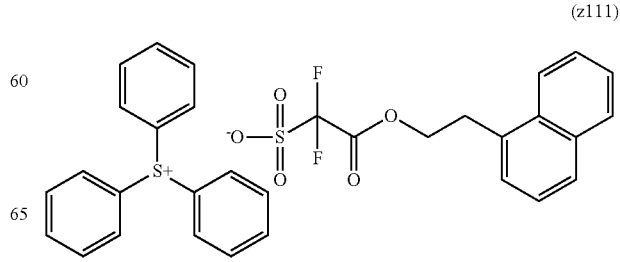

-continued
(z112)
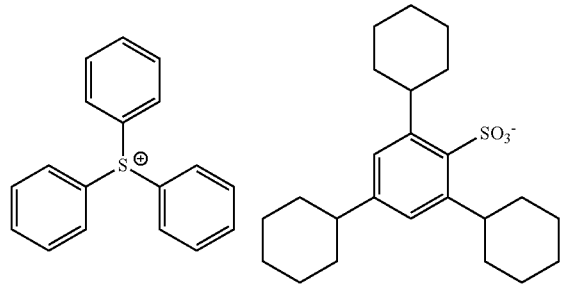
(z113)
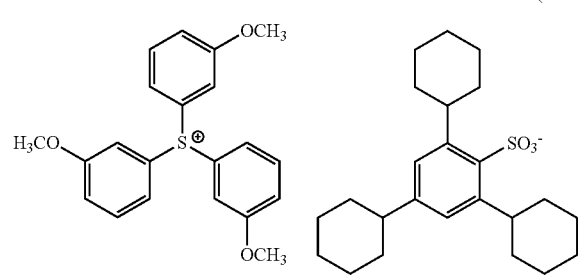
(z114)
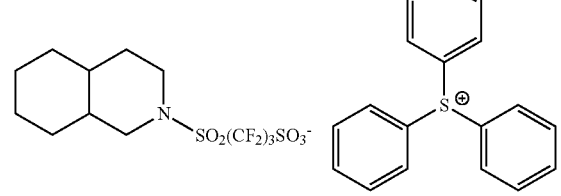
(z115)
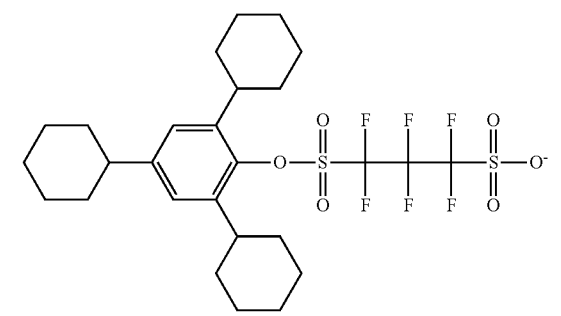
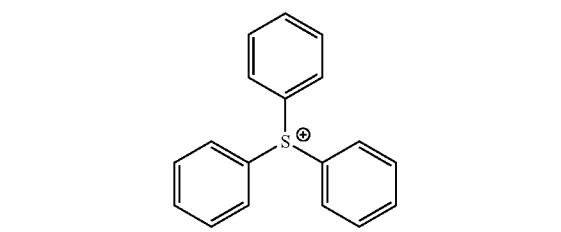
(z116)
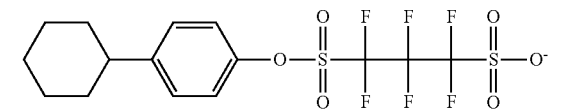
-continued
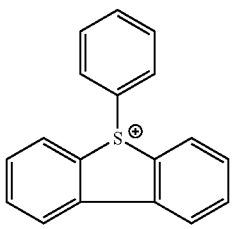
(z117)
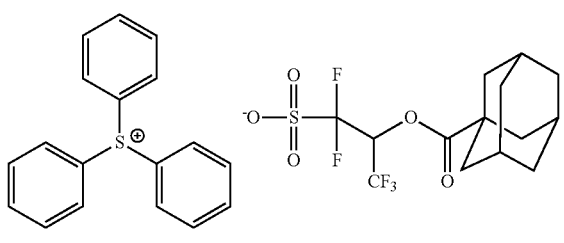
(z118)
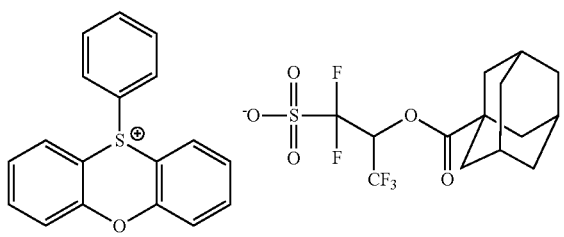
(z119)
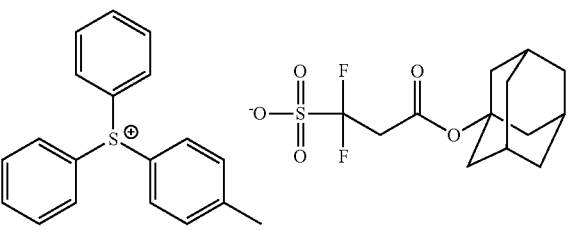
(z120)
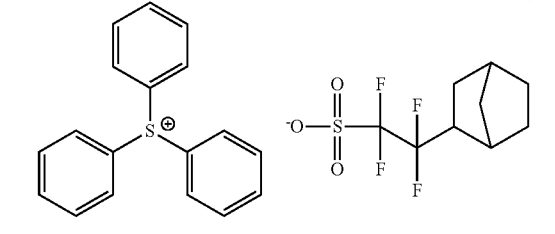
(z121)

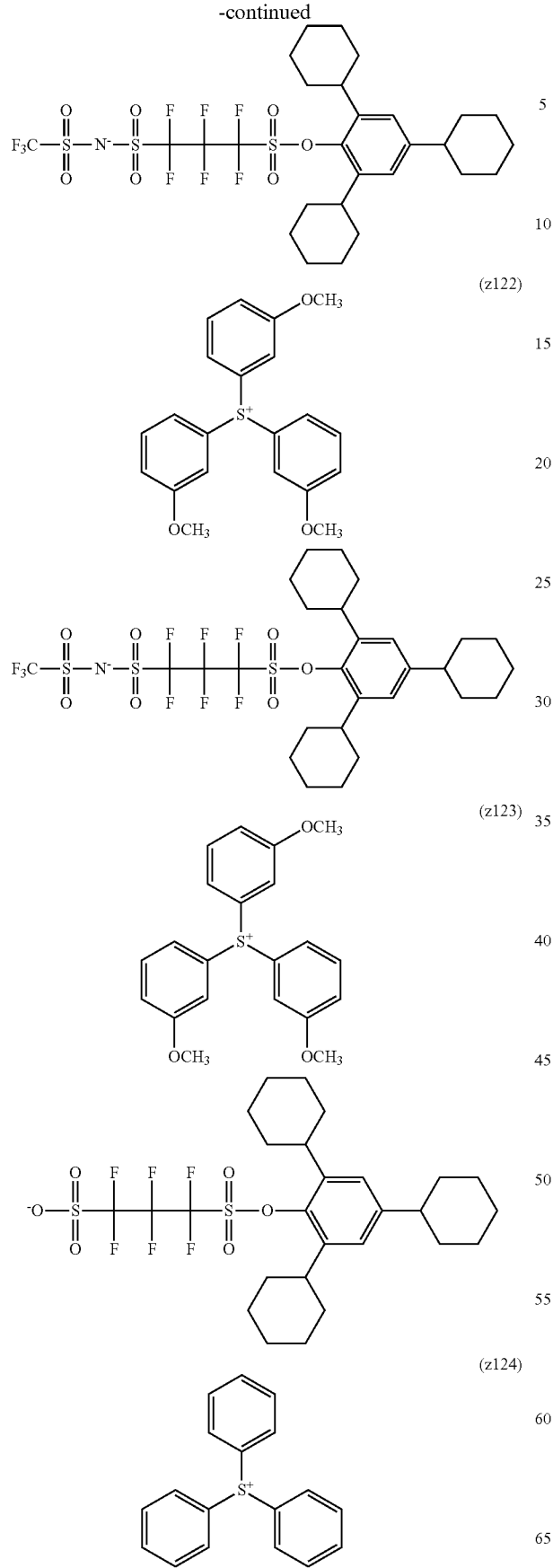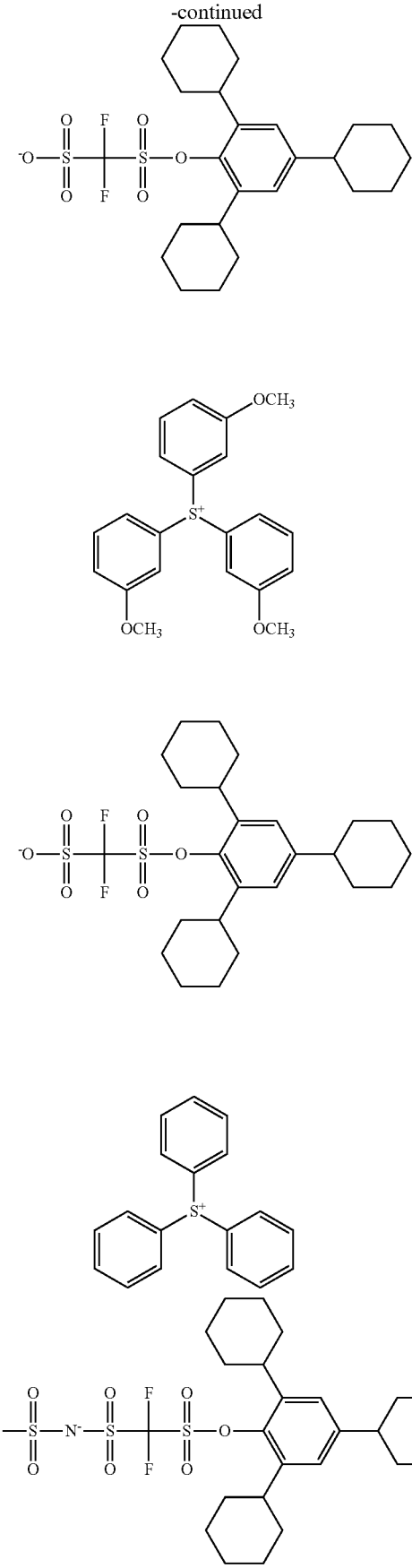

-continued
(z127)
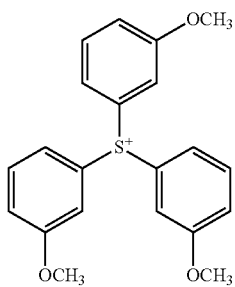
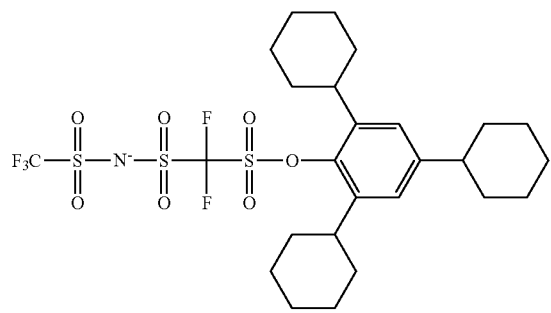
(z128)
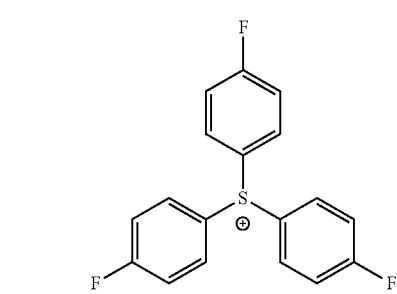
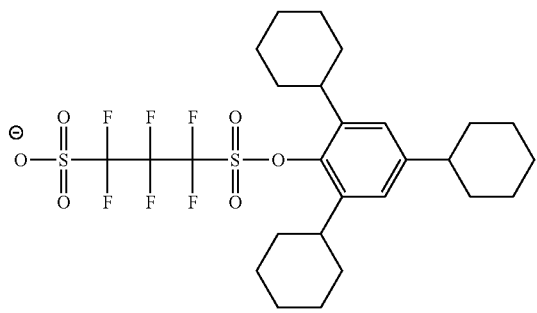
(z129)
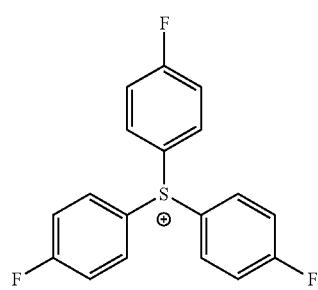
-continued
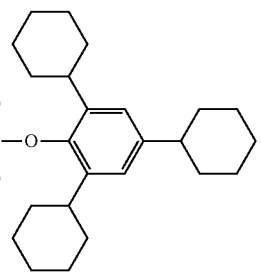
(z130)
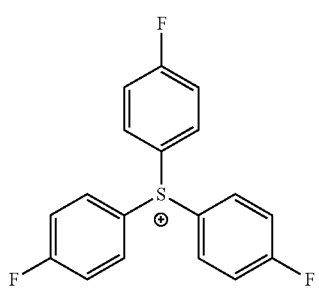
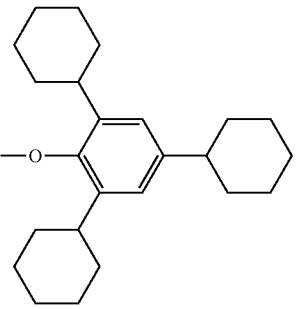
(z131)
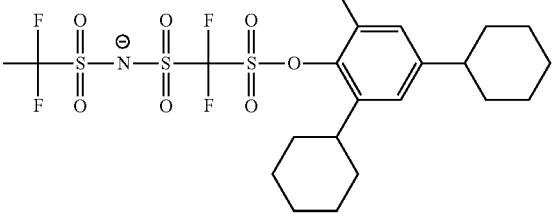

(z132) 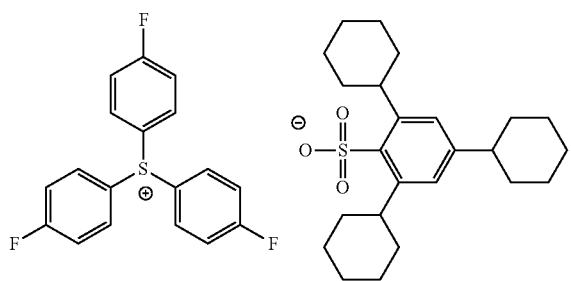
(z133) 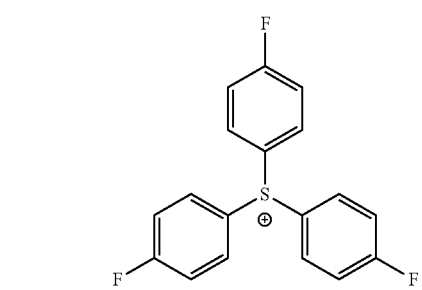
(z134) 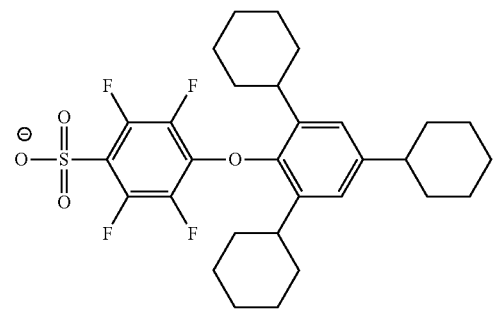
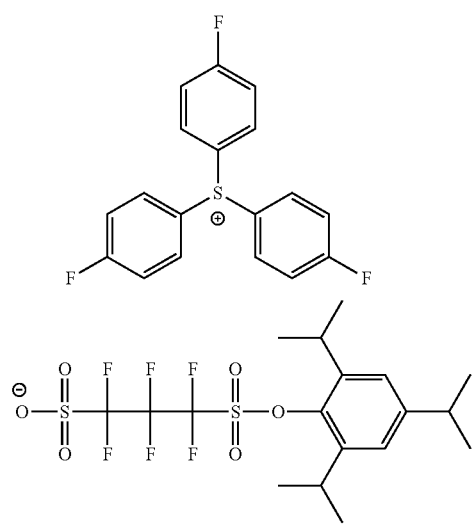
(z135) 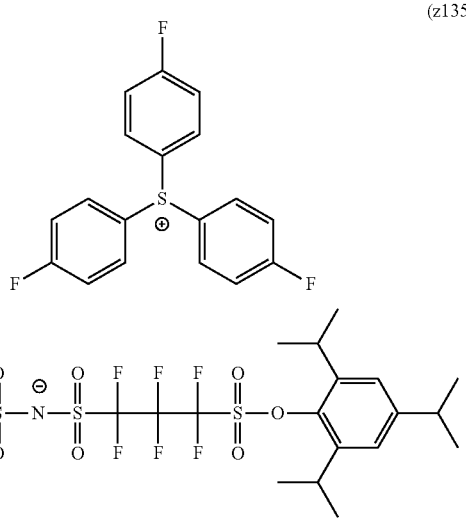
(z136) 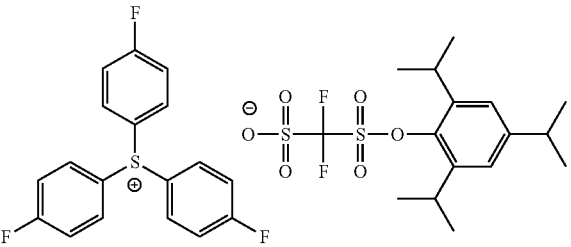
(z137) 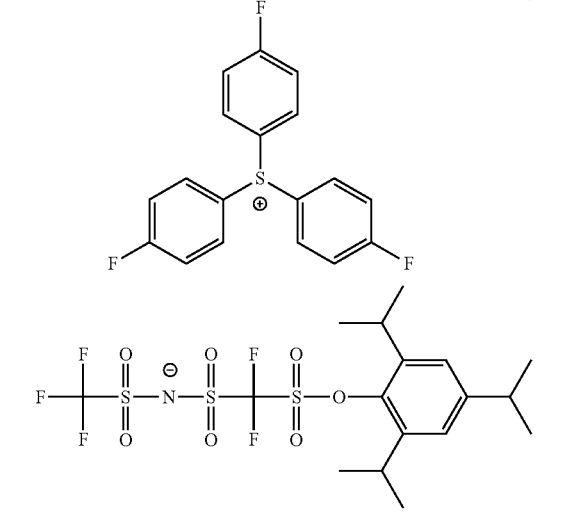
(z138)

-continued

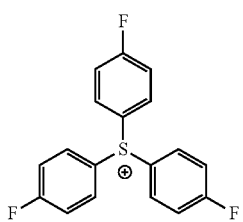 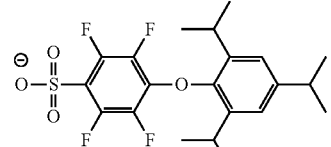

(z139)

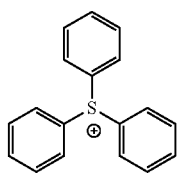 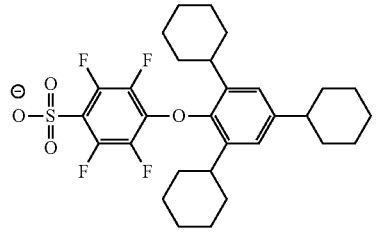

(z140)

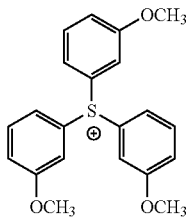 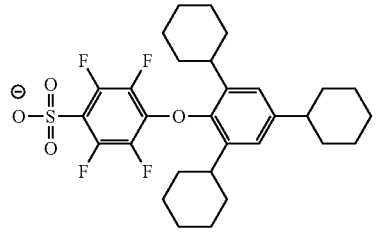

(z141)

The acid generator may be used either alone or in combination of two or more thereof.

Further, the content of the photo-acid generator is preferably 0.1 to 50% by mass, more preferably 0.5 to 45% by mass, more preferably 1 to 40% by mass, base on the total solid of the composition.

[4] The compound capable of decomposing by the action of an acid to generate an acid The electron beam-sensitive or extreme ultraviolet ray-sensitive resin composition of the present invention may further contain one or two kinds of compounds capable of decomposing by the action of an acid to generate an acid. The acid generated by the compound capable of decomposing by the action of an acid to generate an acid may preferably be a sulphonic acid, a methidic acid or an imidic acid.

Examples of the compound capable of decomposing by the action of an acid to generate an acid which may be used in the present invention are described below, but they are not limited thereto.

(PA-1)

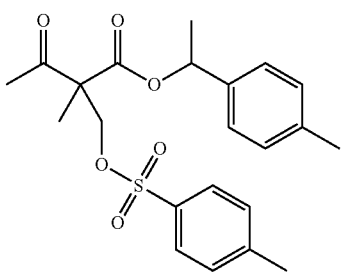

-continued (PA-2)

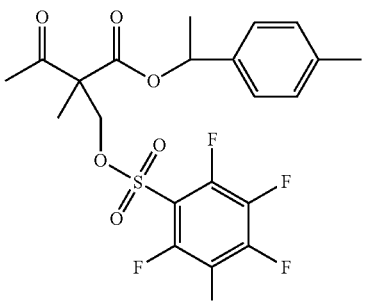

(PA-3)

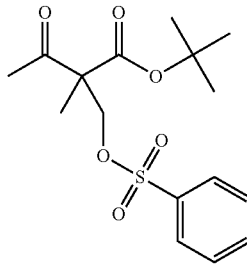

(PA-4)

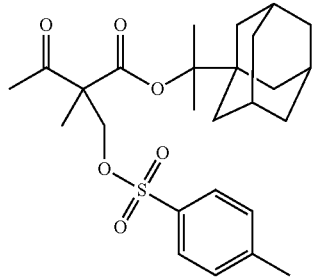

(PA-5)

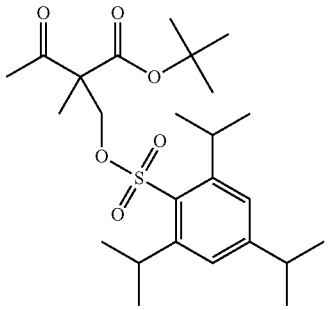

(PA-6)

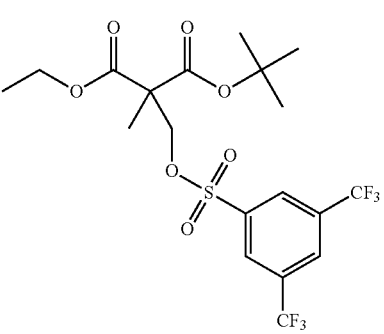

(PA-7)

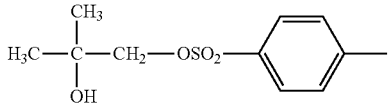

-continued (PA-8)
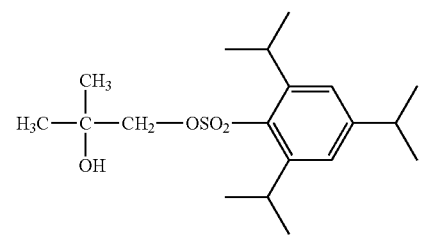

(PA-9)
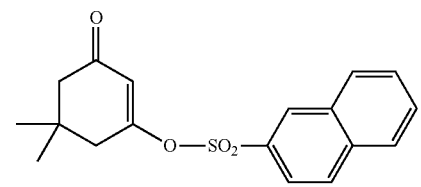

(PA-10)
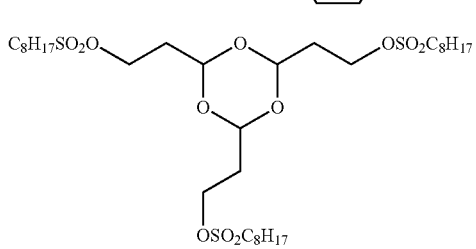

(PA-11)
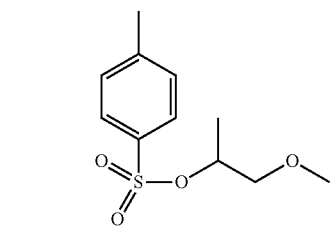

(PA-12)
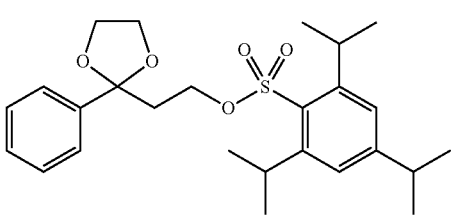

(PA-13)
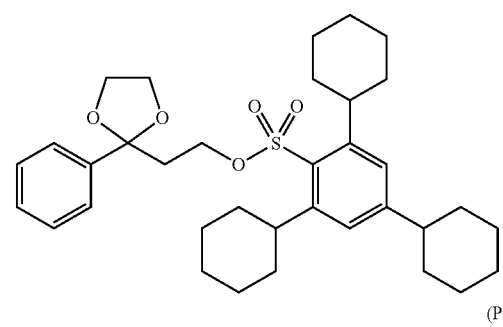

(PA-14)
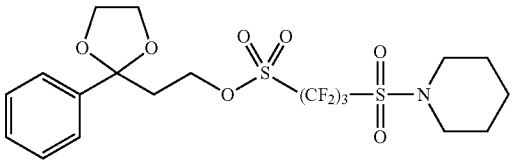

-continued (PA-15)
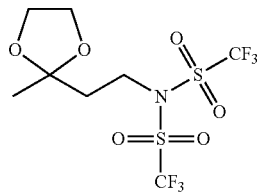

(PA-16)
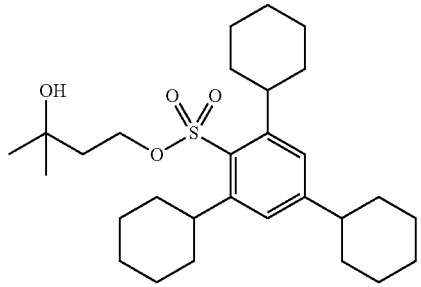

(PA-17)
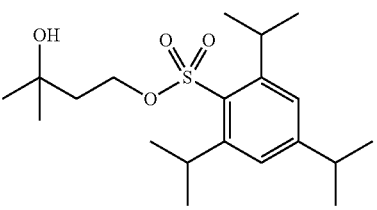

(PA-18)
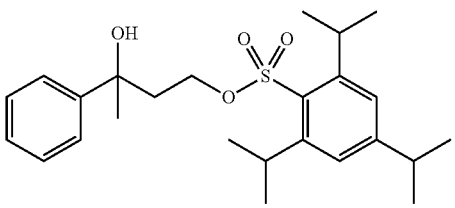

The compound capable of decomposing by the action of an acid to generate an acid may be used either alone or in combination of two or more thereof.

The content of the compound capable of decomposing by the action of an acid to generate an acid is preferably 0.1 to 40% by mass, more preferably 0.5 to 30% by mass, and still more preferably 1.0 to 20% by mass based on the total solid of the electron beam-sensitive or extreme ultraviolet ray-sensitive resin composition.

[5] (C) Solvent (Coating Solvent)

The composition of the invention may preferably have a solvent (C).

The solvent which may be used to prepare a composition is not particularly limited as long as the solvent dissolves each component, but examples thereof may include alkylene glycol monoalkyl ether carboxylate (propylene glycol monomethyl ether acetate (PGMEA; alias, 1-methoxy-2-acetoxy propane), and the like), alkylene glycol monoalkyl ether (propylene glycol monomethyl ether (PGME; alias, 1-methoxy-2-propanol), and the like), alkylester lactate (ethyl lactate, methyl lactate, and the like), cyclic lactone (γ-butyro lactone, and the like, preferably having 4 to 10 carbon atoms), chained or cyclic ketone (2-heptanone, cyclohexanone, and the like, preferably having 4 to 10 carbon atoms), alkylenecarbonate (ethylenecarbonate, propylenecarbonate, and the like), alkyl carboxylate (preferably, alkyl acetate such as butyl acetate), alkyl alkoxy acetate (ethyl aethoxy propionate) and the like. Examples of other available solvent may include those described after [0244] of U.S. Patent Application Publication No. 2008/0248425 A1.

In the above compounds, alkylene glycol monoalkyl ether carboxylate and alkylene glycol monoalkyl ether are preferred.

These solvent may be used either alone or in combination of two or more thereof. In the case of mixing two or more solvents, it is preferred that the solvent having a hydroxyl group is mixed with the solvent not having a hydroxyl group. The mixing ratio (by mass) of the solvent having a hydroxyl group to the solvent not having a hydroxyl group is 1/99 to 99/1, preferably 10/90 to 90/10, more preferably 20/80 to 60/40.

The solvent having a hydroxyl group is preferably alkylene glycol monoalkyl ether, and the solvent not having a hydroxyl group is preferably alkylene glycol monoalkyl ether carboxylate.

[6] Basic compound

The electron beam-sensitive or extreme ultraviolet ray-sensitive resin composition according to the present invention may further contain a basic compound. The basic compound is preferably a stronger basic compound as compared with phenol. Further, the basic compound is preferably an organic basic compound, and more preferably a nitrogen-containing basic compound.

A nitrogen-containing basic compound which may be used is not particularly limited, but for example, compounds classified into the following (1) to (7) may be used.

(1) Compound represented by Formula (BS-1)

In Formula (BS-1),

R's each independently represent a hydrogen atom or an organic group. However, at least one of three R's is an organic group. The organic group is a straight or branched alkyl group, a monocyclic or polycyclic cycloalkyl group, an aryl group or an aralkyl group.

The carbon number of the alkyl group as R is not particularly limited, but usually 1 to 20, and preferably 1 to 12.

The carbon number of the cycloalkyl group as R is not particularly limited, but usually 3 to 20, and preferably 5 to 15.

The carbon number of the aryl group as R is not particularly limited, but usually 6 to 20, and preferably 6 to 10. Specific examples thereof may include a phenyl group, a naphthyl group and the like.

The carbon number of the aralkyl group as R is not particularly limited, but usually 7 to 20, and preferably 7 to 11. Specific examples thereof may include a benzyl group and the like.

The alkyl group, the cycloalkyl group, the aryl group and the aralkyl group as R may have a substituent by which a hydrogen atom is substituted. Examples of the substituent may include an alkyl group, a cycloalkyl group, an aryl group, an aralkyl group, a hydroxyl group, a carboxyl group, an alkoxy group, an aryloxy group, an alkylcarbonyloxy group, an alkyloxycarbonyl group and the like.

Meanwhile, in the compound represented by Formula (BS-1), it is preferred that at least two of R's are organic groups.

Specific examples of the compound represented by Formula (BS-1) may include tri-n-butylamine, tri-n-pentylamine, tri-n-octylamine, tri-n-decylamine, triisodecylamine, dicyclohexylmethylamine, tetradecylamine, pentadecylamine, hexadecylamine, octadecylamine, didecylamine, methyloctadecylamine, dimethylundecylamine, N,N-dimethyldodecylamine, methyldioctadecylamine, N,N-dibutylaniline, N,N-dihexylaniline, 2,6-diisopropylaniline and 2,4,6-tri(t-butyl)aniline.

Further, a preferred basic compound represented by Formula (BS-1) may be exemplified by a compound in which at least one R is an alkyl group substituted with a hydroxyl group. Specific examples thereof may include triethanolamine and N,N-dihydroxyethylaniline.

Meanwhile, the alkyl group as R may have an oxygen atom in the alkyl chain. That is, an oxyalkylene chain may be formed. The oxyalkylene chain is preferably —$CH_2CH_2O$—. Specific examples thereof may include tris(methoxyethoxyethyl)amine and compounds exemplified after the 60th line in column 3 of U.S. Pat. No. 6,040,112.

Among the basic compounds represented by Formula (BS-1), examples of the compound having a hydroxyl group or an oxygen atom may include the followings.

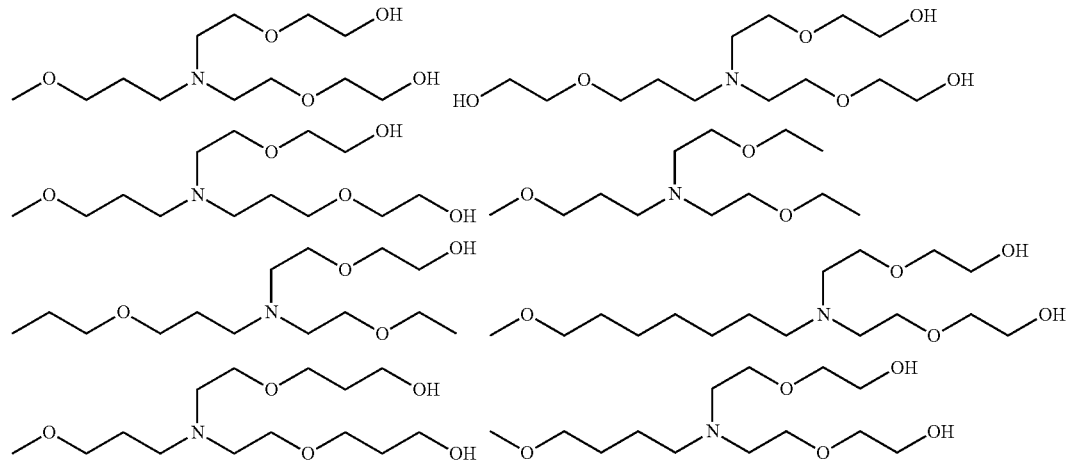

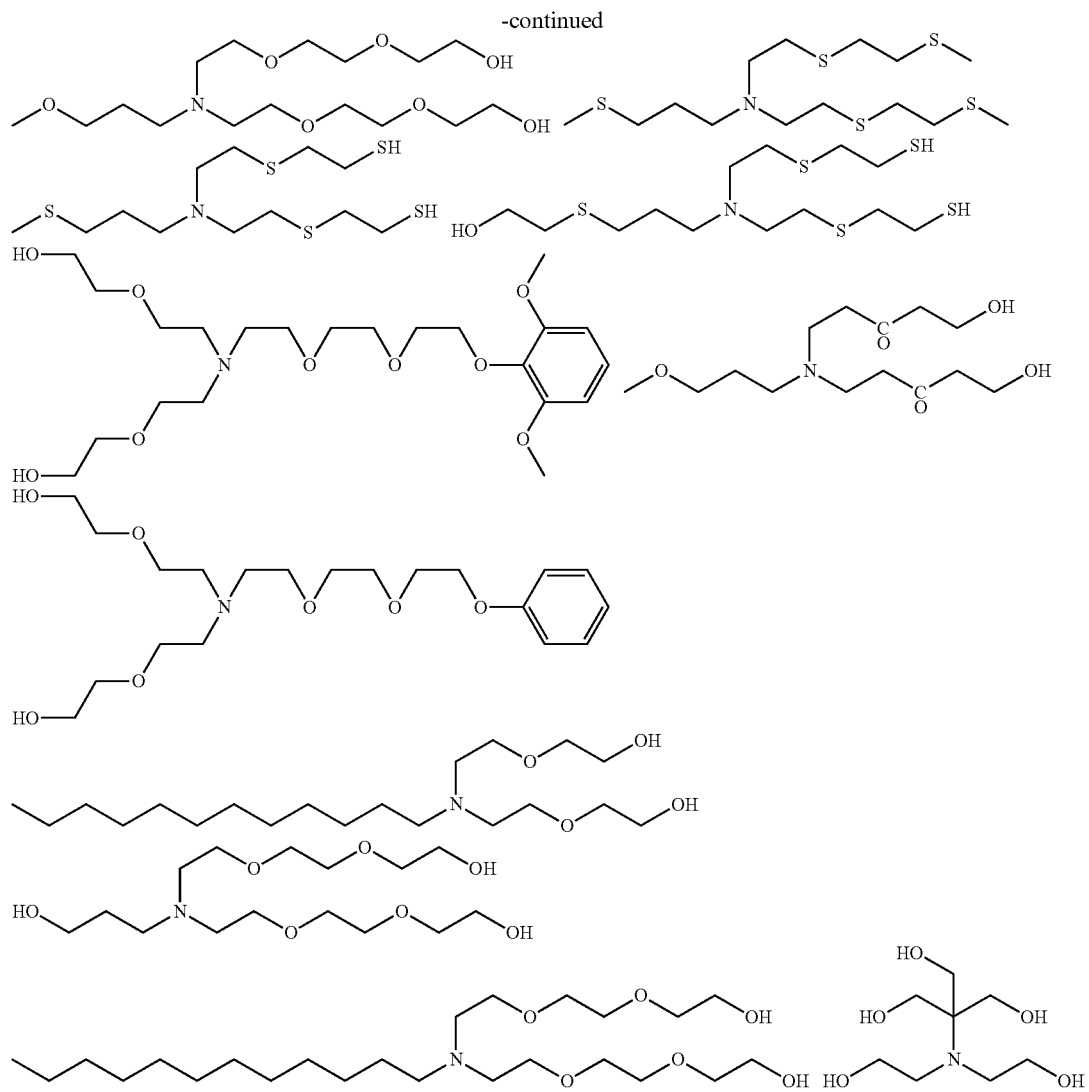

(2) Compound having a nitrogen-containing heterocyclic structure

The nitrogen-containing heterocycle may or may not have aromaticity. Further, the nitrogen-containing heterocycle may have a plurality of nitrogen atoms. Furthermore, the nitrogen-containing heterocycle may have a heteroatom other than a nitrogen atom. Specific examples thereof may include a compound having an imidazole structure (2-phenylbenzimidazole, 2,4,5-triphenylimidazole and the like), a compound having a piperidine structure [N-hydroxyethylpiperidine and bis(1,2,2,6,6-pentamethyl-4-piperidyl)sebacate and the like], a compound having a pyridine structure (4-dimethylaminopyridine and the like) and a compound having an antipyrine structure (antipyrine, hydroxyantipyrine and the like).

Examples of the preferred compound having a nitrogen-containing heterocyclic structure may include guanidine, aminopyridine, aminoalkylpyridine, aminopyrrolidine, indazole, imidazole, pyrazole, pyrazine, pirimidine, purine, imidazoline, pyrazoline, piperazine, aminomorpholine and aminoalkylmorpholine. They may further have a substituent. Examples of the preferred substituens may include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group and a cyano group.

Examples of the particularly preferred basic compound may include imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5methylpyrazine, pyrimidine, 2,4-diaminopyrimidine, 4,6-dihydroxypyrimidine, 2-pyrazoline, 3-pyrazoline, N-aminomorpholine and N-(2-aminoethyl)morpholine.

Further, a compound having two or more ring structure is also suitably used. Specific examples thereof may include 1,5-diazabicyclo[4.3.0]nona-5-ene and 1,8-diazabicyclo[5.4.0]-undeca-7-ene.

(3) Amine Compound Having a Phenoxy Group

An amine compound having a phenoxy group refers to a compound having a phenoxy group at the end of the N atom opposite to the alkyl group contained in an amine compound. The phenoxy group may have a substituent such as an alkyl group, an alkoxy group, a halogen atom, a cyano group, a nitro group, a carboxyl group, a carboxylic acid ester group, a sulfonic acid ester group, an aryl group, an aralkyl group, an acyloxy group, an aryloxy group and the like.

More preferably, the compound has at least one oxyalkylene chain between the phenoxy group and the nitrogen atom. The number of the oxyalkylene chain is preferably 3 to 9, and more preferably 4 to 6 per molecule. Among oxyalkylene chains, —$CH_2CH_2O$— is particularly preferred.

Specific examples thereof may include 2-[2-{2-(2,2-dimethoxy-phenoxyethoxy)ethyl}-bis-(2-methoxyethyl)]-amine and compounds (C1-1) to (C3-3) exemplified in paragraph [0066] of U.S. 2007/0224539A1.

The amine compound having a phenoxy group is obtained, for example, by reacting primary or secondary amine having a phenoxy group and haloalkyl ether with heating, adding an aqueous solution of a strong base such as sodium hydroxide, potassium hydroxide and tetraalkyl ammonium, and then extracting with an organic solvent such as ethyl acetate and chloroform. Further, the amine compound having a phenoxy group may be obtained by reacting primary or secondary amine and haloalkyl ether having a phenoxy group at the end with heating, adding an aqueous solution of a strong base such as sodium hydroxide, potassium hydroxide and tetraalkyl ammonium, and then extracting with an organic solvent such as ethyl acetate and chloroform.

(4) Ammonium Salt

As a basic compound, an ammonium salt may be also appropriately used.

The cation of the ammonium salt is preferably a tetraalkyl ammonium cation in which an alkyl group having 1 to 18 carbon atoms is substituted, more preferably a tetramethyl ammonium cation, a tetraethyl ammonium cation, a tetra(n-butyl) ammonium cation, a tetra(n-heptyl) ammonium cation, a tetra(n-octyl) ammonium cation, a dimethyl hexadecyl ammonium cation, a benzyl trimethyl cation, most preferably a tetra(n-butyl) ammonium cation.

Examples of the cation of ammonium salts include a hydroxide, a carboxylate, a halide, a sulfonate, a borate and a phosphonate. Among them, a hydroxide or a carboxylate is particularly preferred.

The halide is particularly preferably chloride, bromide and iodide.

The sulfonate is particularly preferably an organic sulfonate having 1 to 20 carbon atoms. Examples of the organic sulfonate may include an alkylsulfonate and an arylsulfonate having 1 to 20 carbon atoms.

The alkyl group contained in the alkylsulfonate may have a substituent. Examples of the substituent may include a fluorine atom, a chlorine atom, a bromine atom, an alkoxy group, an acyl group and an aryl group. Specific examples of the alkylsulfonate may include methanesulfonate, ethanesulfonate, butanesulfonate, hexanesulfonate, octanesulfonate, benzylsulfonate, trifluoromethanesulfonate, pentafluoroethanesulfonate and nonafluorobutanesulfonate.

Examples of the aryl group contained in the arylsulfonate may include a phenyl group, a naphthyl group and an anthryl group. The aryl group may have a substituent. The substituent is preferably, for example, a straight or branched alkyl group having 1 to 6 carbon atoms and a cycloalkyl group having 3 to 6 carbon atoms. Specific examples thereof may preferably include a methyl group, an ethyl group, a n-propyl group, an isopropyl group, a n-butyl group, an i-butyl group, a t-butyl group, a n-hexyl group and a cyclohexyl group. Examples of other substituents may include an alkoxy group having 1 to 6 carbon atoms, a halogen atom, a cyano group, a nitro group, an acyl group and an acyloxy group.

The carboxylate may be aliphatic carboxylate or an aromatic carboxylate, and examples thereof include acetate, lactate, pyruvate, trifluoroacetate, adamantanecarboxylate, a hydroxyadamantanecarboxylate, benzoate, naphthoate, salisylate, phthalate, phenolate and the like, preferably benzoate, naphthoate, phenolate and the like, and most preferably benzoate.

In this case, the ammonium salt is preferably tetra(n-butyl) ammonium benzoate, tetra(n-butyl) ammonium phenolate and the like.

In the case of the hydroxide, the ammonium salt is particularly preferably tetraalkylammonium hydroxide of 1 to 8 carbon atoms (tetraalkylammonium hydroxide such as a tetramethylammonium hydroxide and tetraethylammonium hydroxide, tetra-(n-butyl)ammonium hydroxide and the like).

(5) Compound (PA) having a proton acceptor functional group and capable of decomposing upon irradiation with an electron beam or extreme ultraviolet ray to generate a compound which is reduced in or deprived of the proton acceptor property, or is changed from the proton acceptor property to acidity The composition according to the present invention is a basic compound, and may further contains a compound having a proton acceptor functional group and capable of decomposing upon irradiation with an electron beam or extreme ultraviolet ray to generate a compound which is reduced in or deprived of the proton acceptor property, or is changed from the proton acceptor property to acidity [hereinafter, also referred to as a compound (PA)].

The proton acceptor functional group refers to a functional group having a group or an electron capable of electrostatically interacting with protons, for example, a functional group having a macrocyclic structure such as a cyclic polyether or a functional group having a nitrogen atom having an unshared electron pair which does not contribute to π-conjugation. The nitrogen atom having an unshared electron pair which does not contribute to π-conjugation means a nitrogen atom having, for example, a partial structure represented by the following formula.

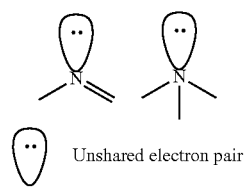

Unshared electron pair

Examples of the preferred partial structure of the proton acceptor functional group may include crown ether, azacrown ether, primary to tertiary amine, pyridine, imidazole, pyrazine structure and the like.

The compound (PA) decomposes upon irradiation with an electron beam or extreme ultraviolet ray to generate a compound which is reduced in or deprived of the proton acceptor property, or is changed from the proton acceptor property to acidity. Herein, "being reduced in or deprived of the proton acceptor property, or being changed from the proton acceptor property to acidity" means that the proton acceptor property is changed due to the addition of a proton to the proton acceptor functional group, and specifically, that the equilibrium constant in the chemical equilibrium decreases, when a proton adduct is produced from the compound (PA) having a proton acceptor functional group and a proton.

Specific examples of the compound (PA) are shown below, but not limited thereto.

(PA-1)
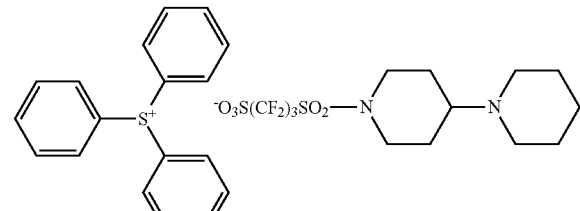

(PA-2)
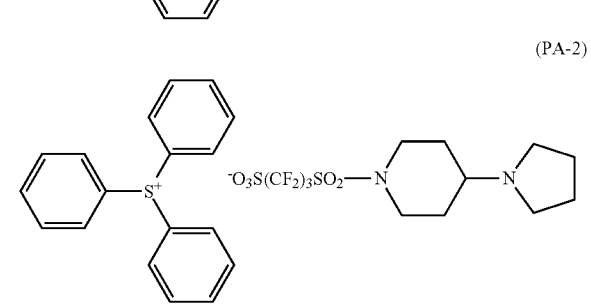

(PA-3)
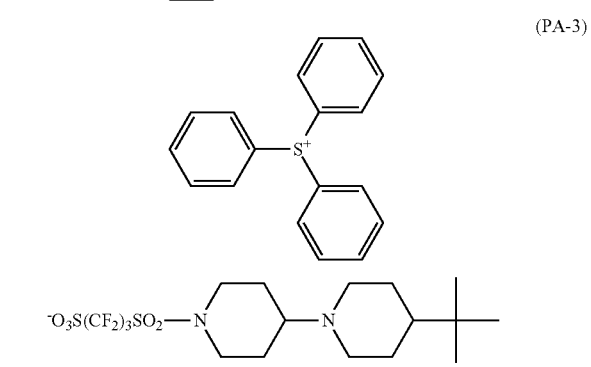

(PA-4)
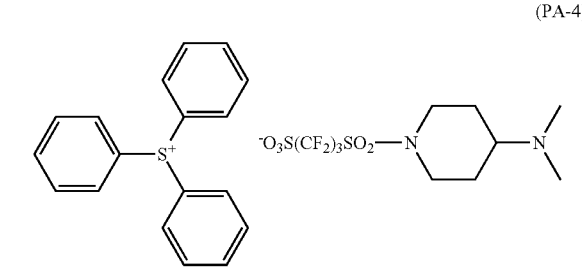

(PA-5)
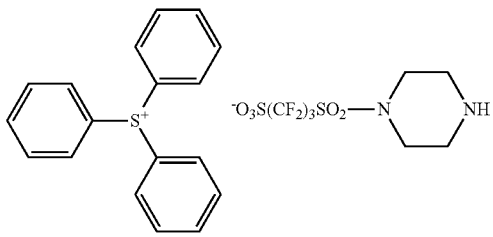

(PA-6)
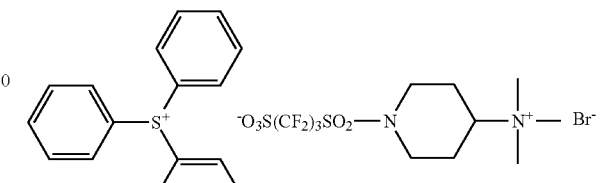

(PA-7)
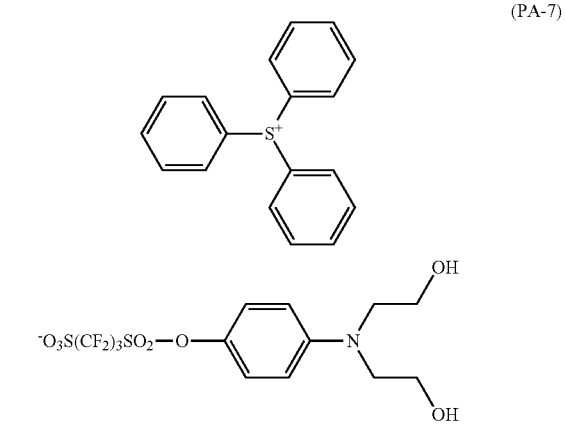

(PA-8)
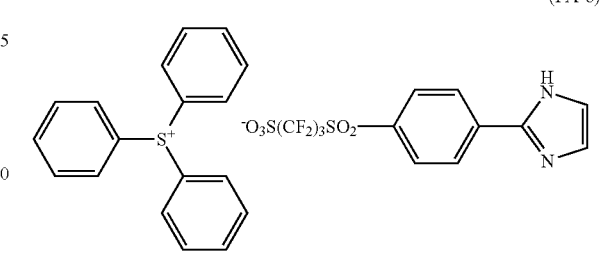

(PA-9)
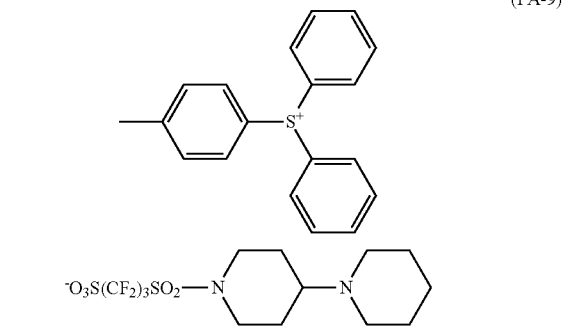

(PA-10)
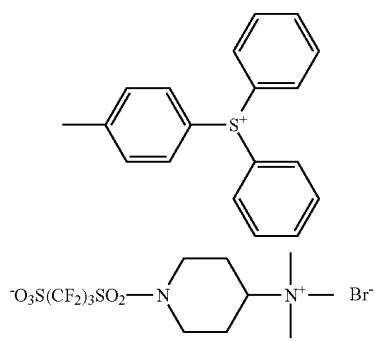
(PA-11)
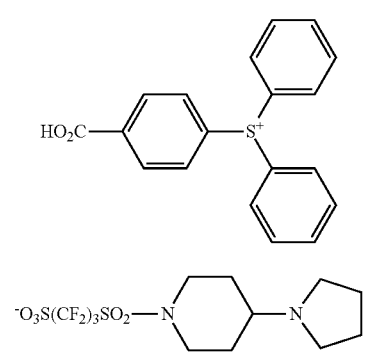
(PA-12)
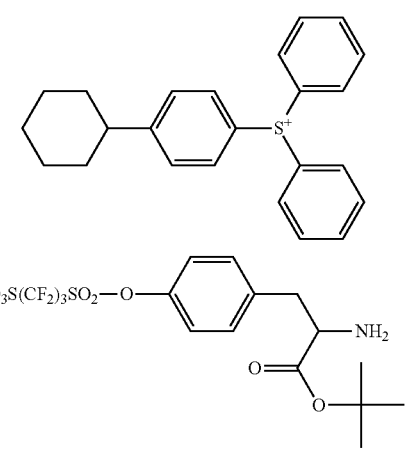
(PA-13)
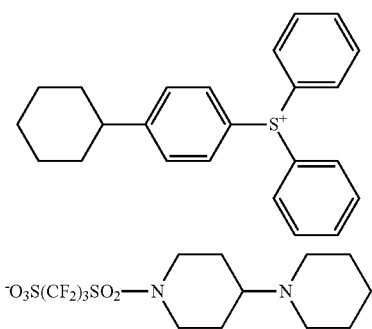
(PA-14)
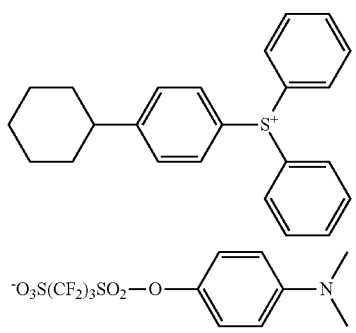
(PA-15)
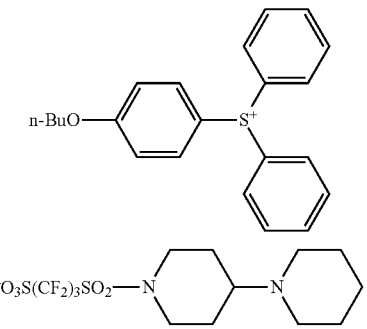
(PA-16)
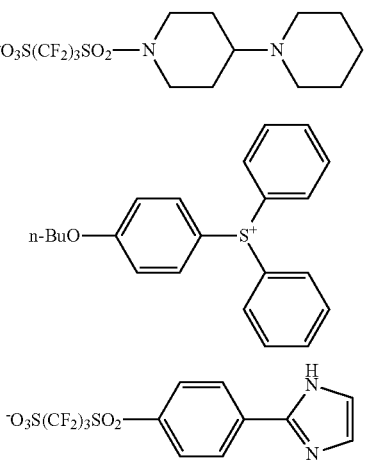
(PA-17)
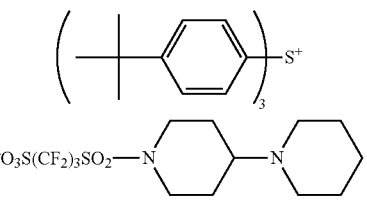
(PA-18)
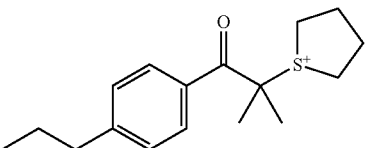
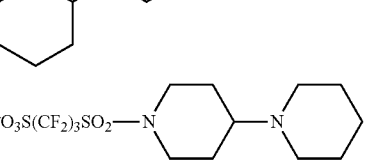

-continued
(PA-19)
(PA-20)
(PA-21)
(PA-22)
(PA-23)
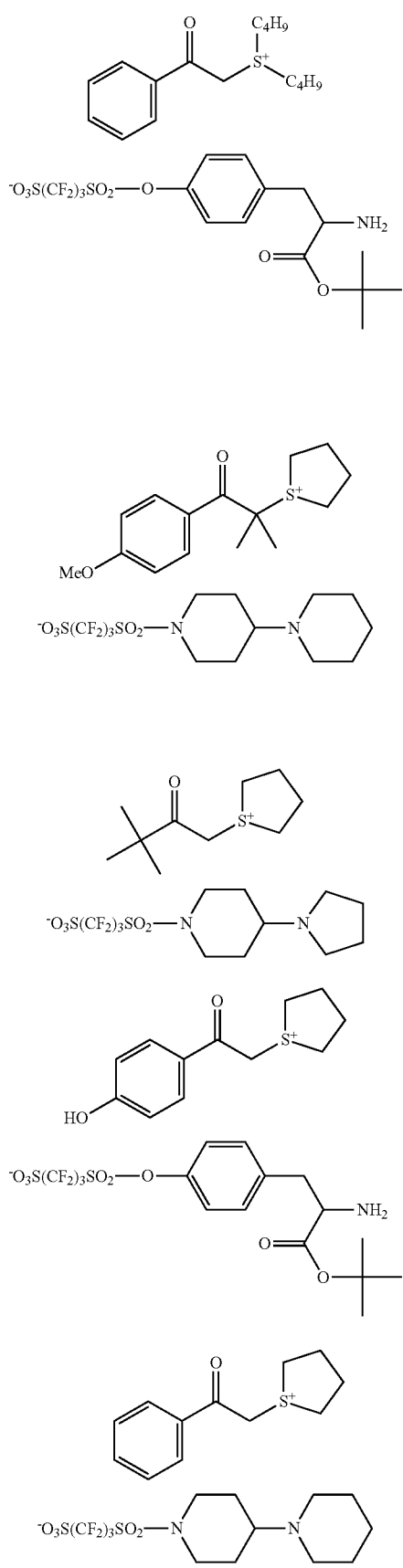
-continued
(PA-24)
(PA-25)
(PA-26)
(PA-27)
(PA-28)
(PA-29)
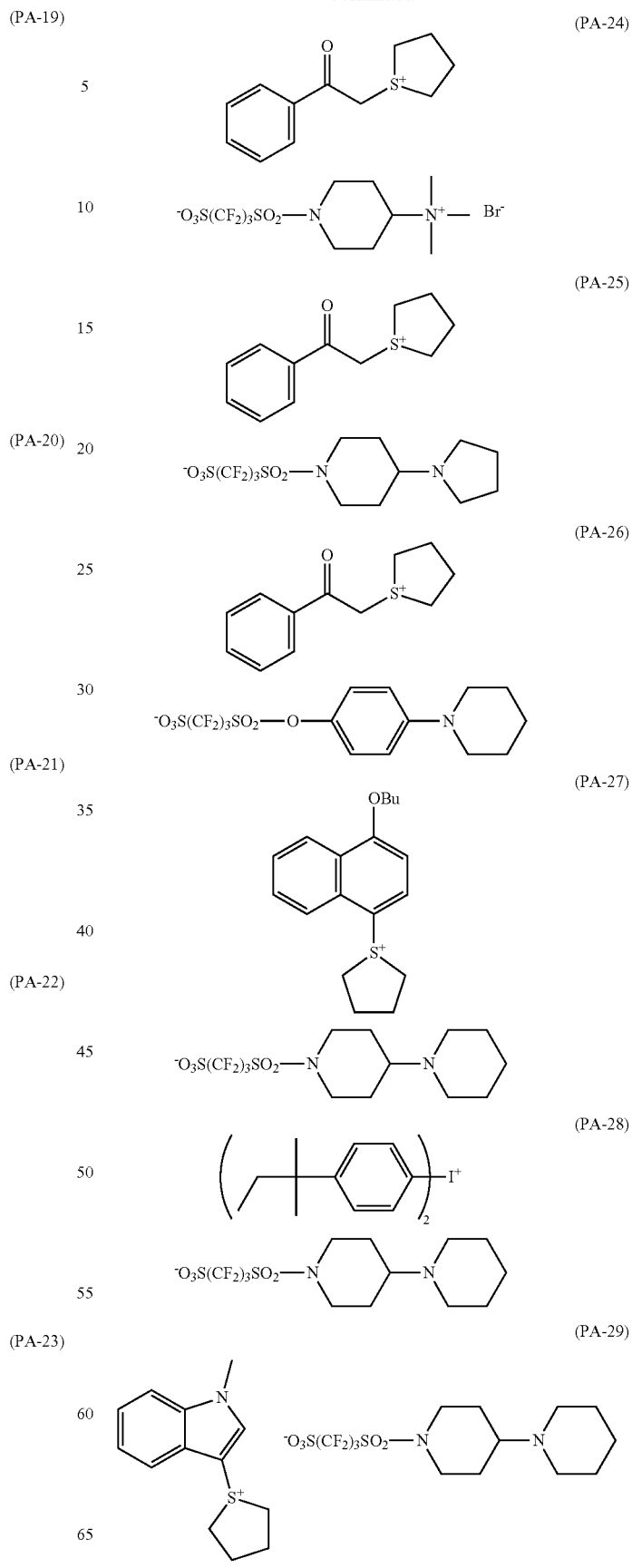

-continued
(PA-30)
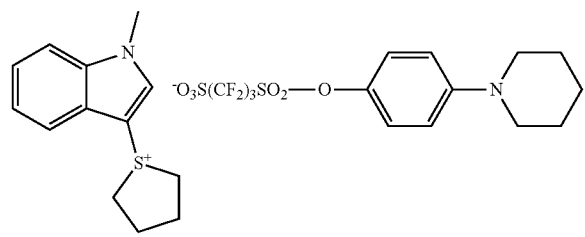
(PA-31)
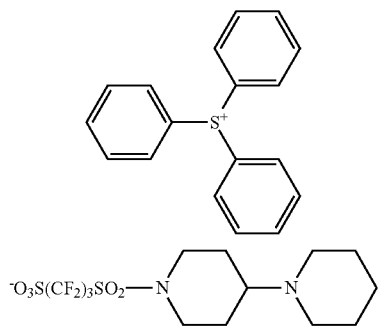
(PA-32)
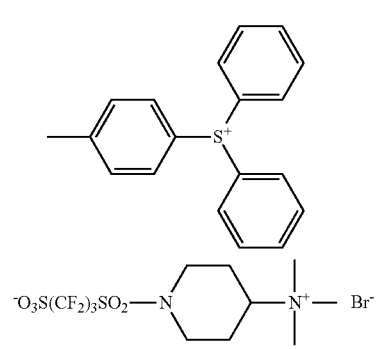
(PA-33)
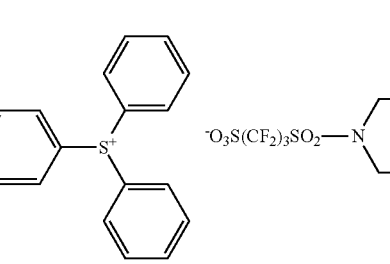
(PA-34)
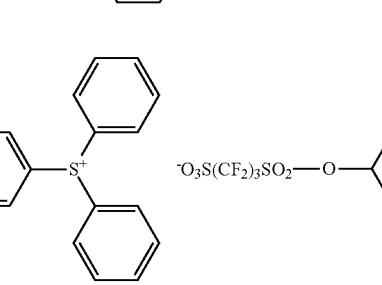
(PA-35)
-continued
(PA-36)
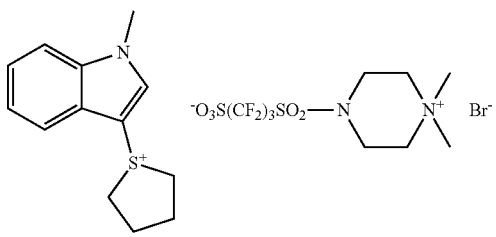
(PA-37)
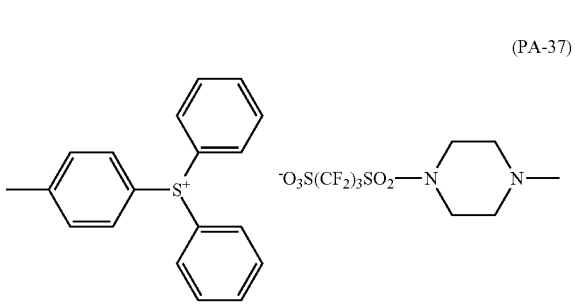
(PA-38)
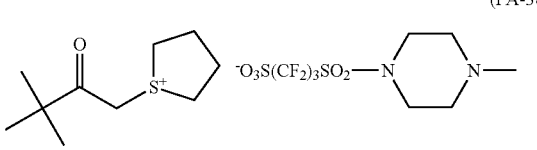
(PA-39)
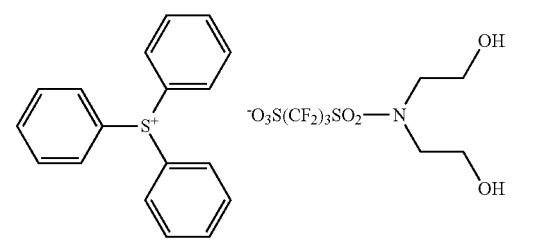
(PA-40)
(PA-41)
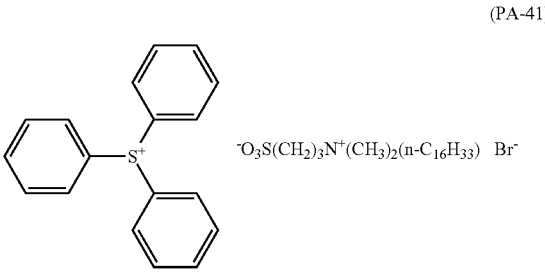

-continued
(PA-42)
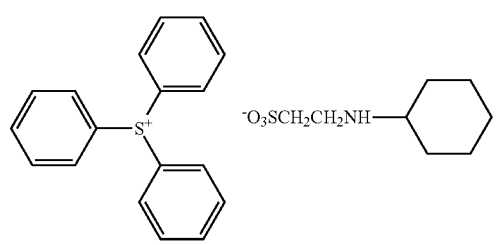
(PA-43)
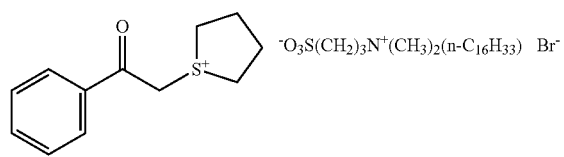
(PA-44)
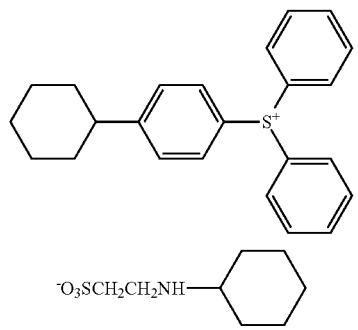
(PA-45)
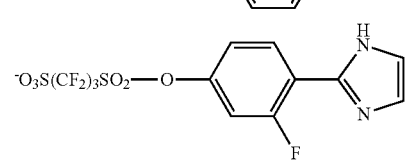
(PA-46)
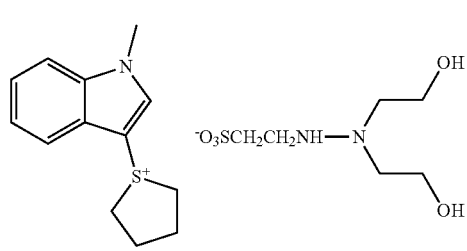
-continued
(PA-47)
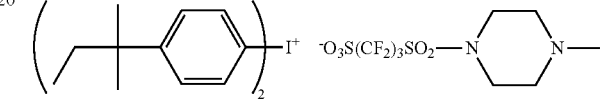
(PA-48)
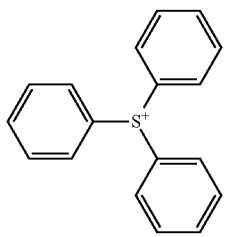
(PA-49)
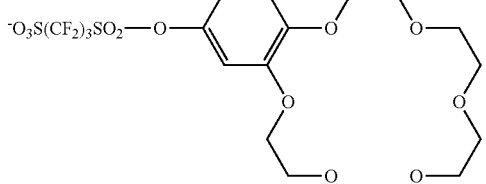
(PA-50)
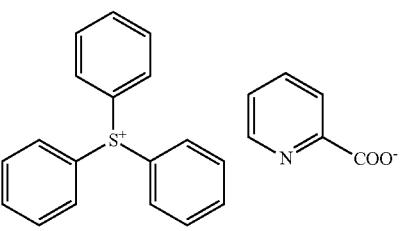
(PA-51)
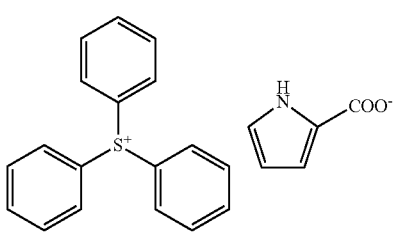

(PA-52) 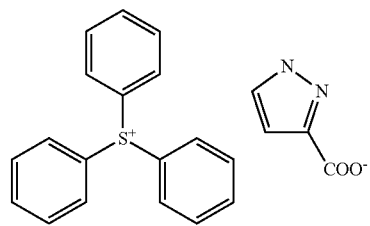
(PA-53) 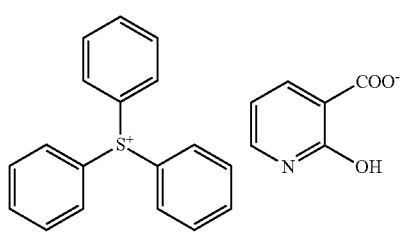
(PA-54) 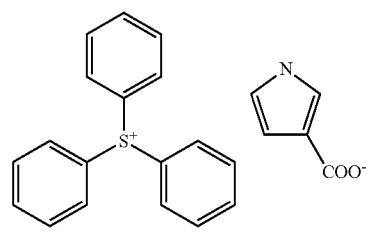
(PA-55) 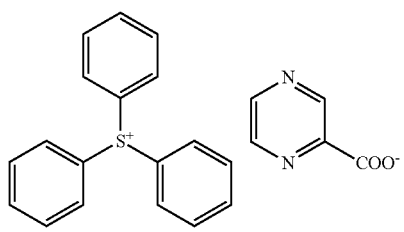
(PA-56) 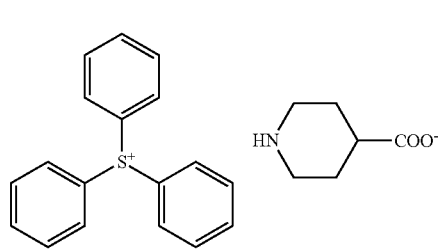
(PA-57) 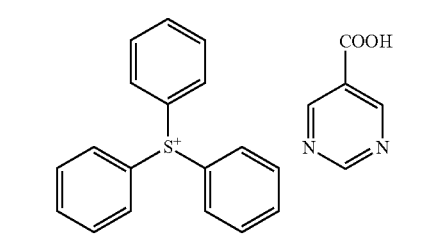
(PA-58) 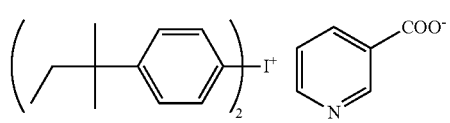
(PA-59) 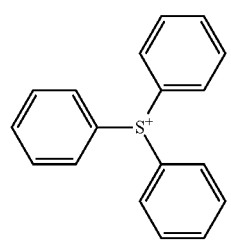
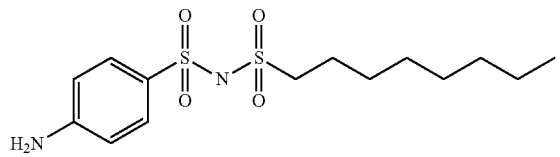
(PA-60) 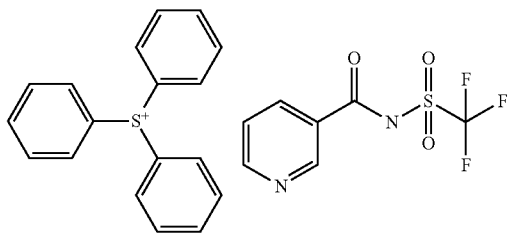
(PA-61) 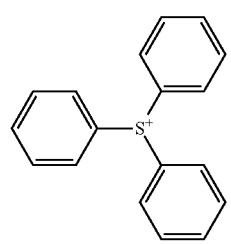
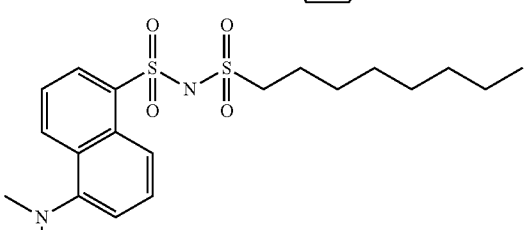
(PA-62) 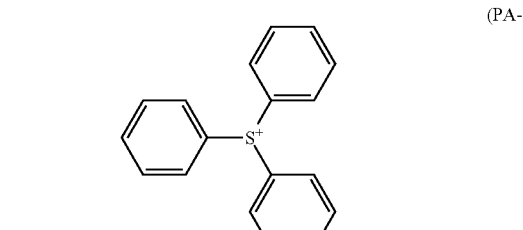
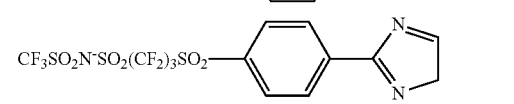

(PA-63)
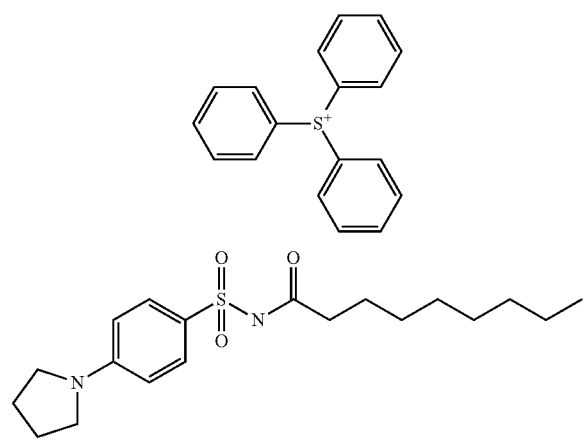
(PA-64)
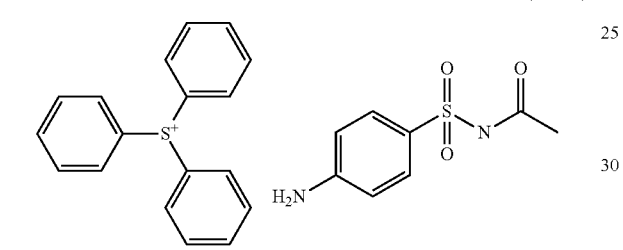
(PA-65)
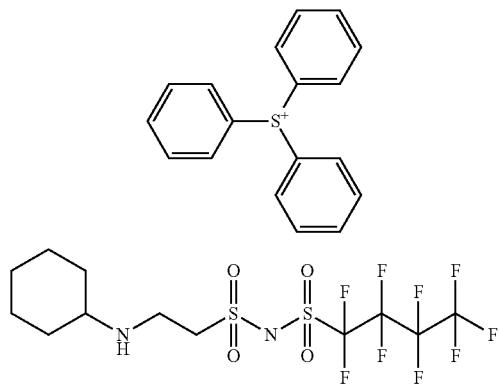
(PA-66)
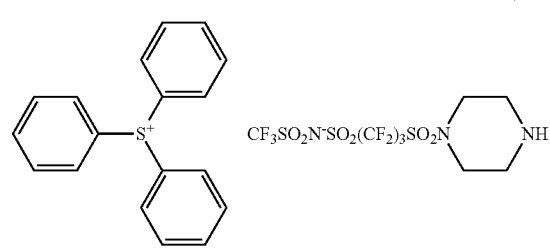
(PA-67)
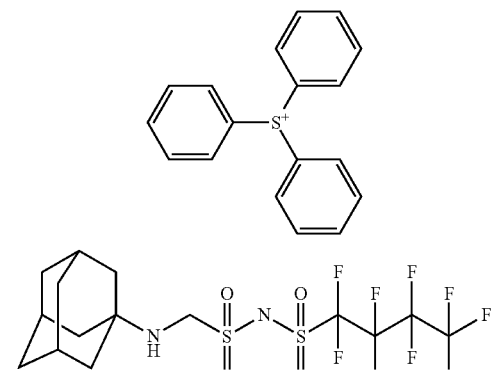
(PA-68)
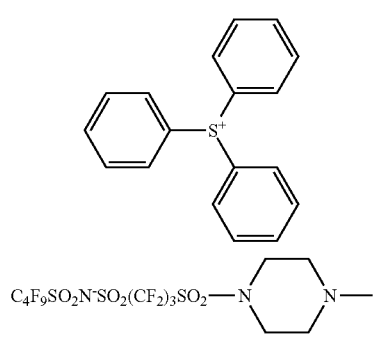
(PA-69)
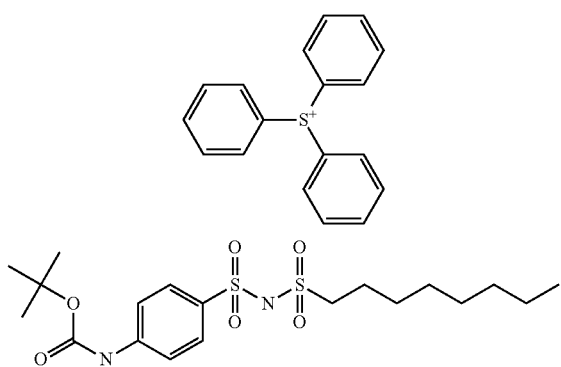
(PA-70)
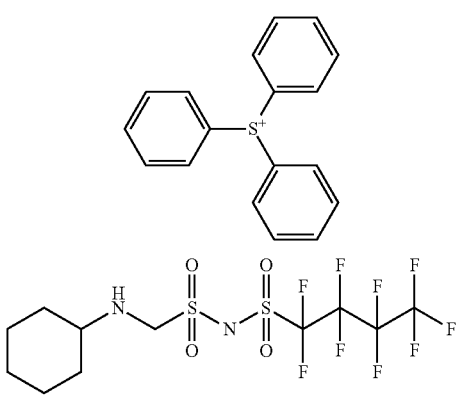

(PA-71)
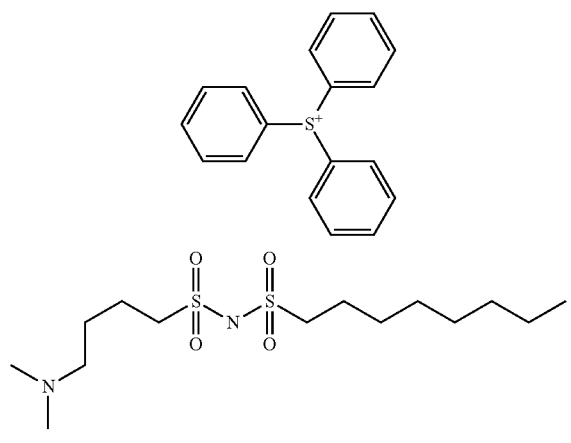
(PA-75)
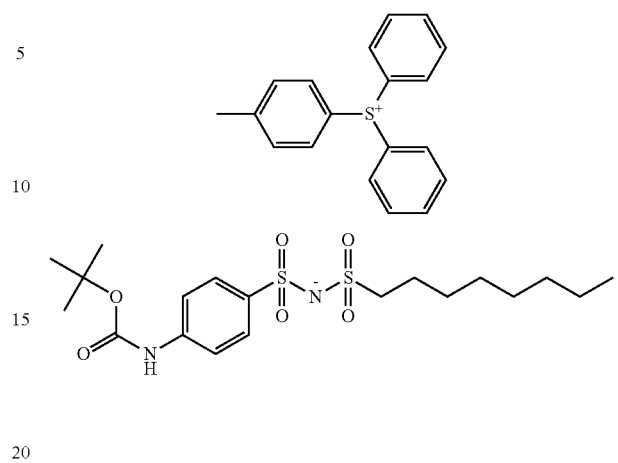
(PA-72)
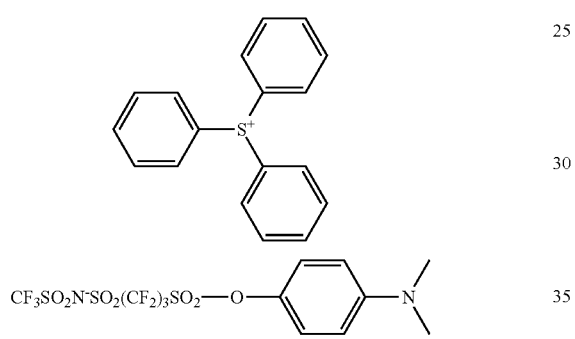
(PA-76)
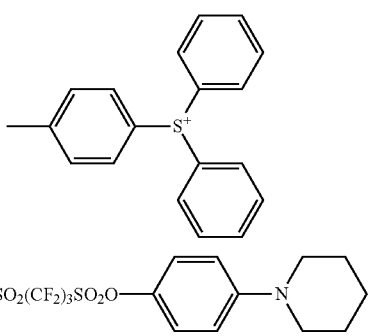
CF$_3$SO$_2$N$^-$ SO$_2$(CF$_2$)$_3$SO$_2$O 
(PA-73)
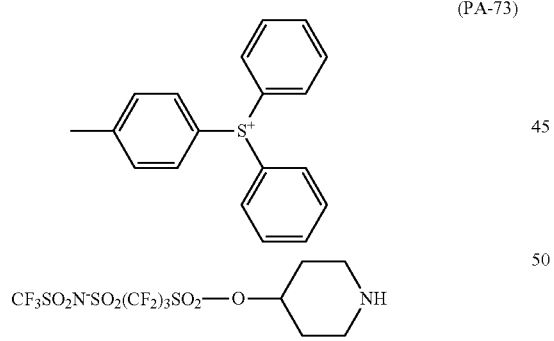
(PA-77)
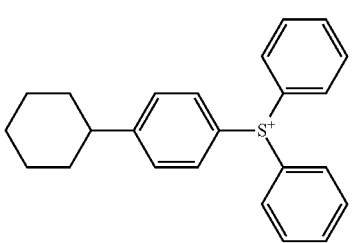
CF$_3$SO$_2$N$^-$ SO$_2$(CF$_2$)$_3$SO$_2$O 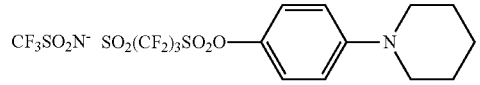
(PA-74)
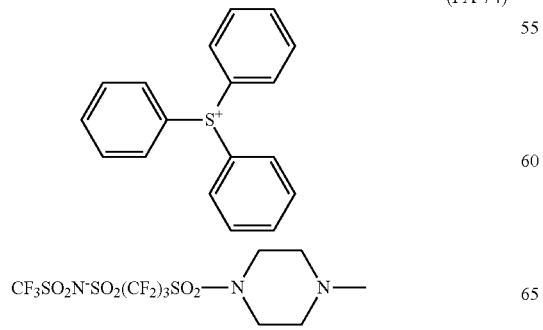
(PA-78)
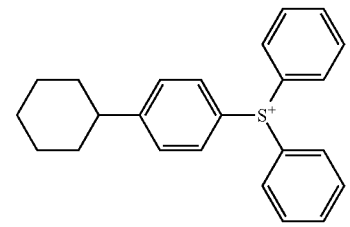
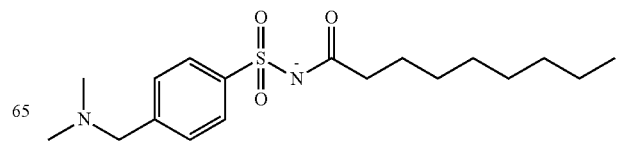

(PA-79)
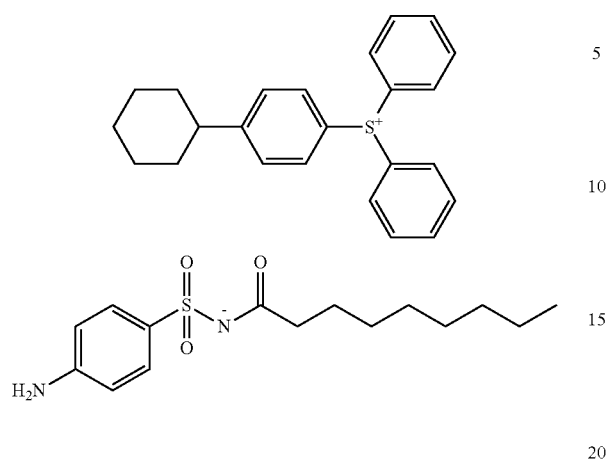
(PA-83)
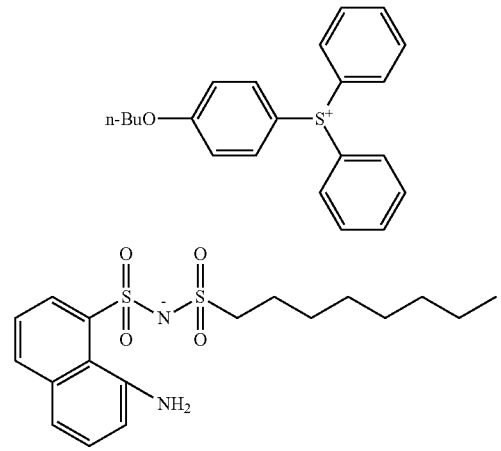
(PA-80)
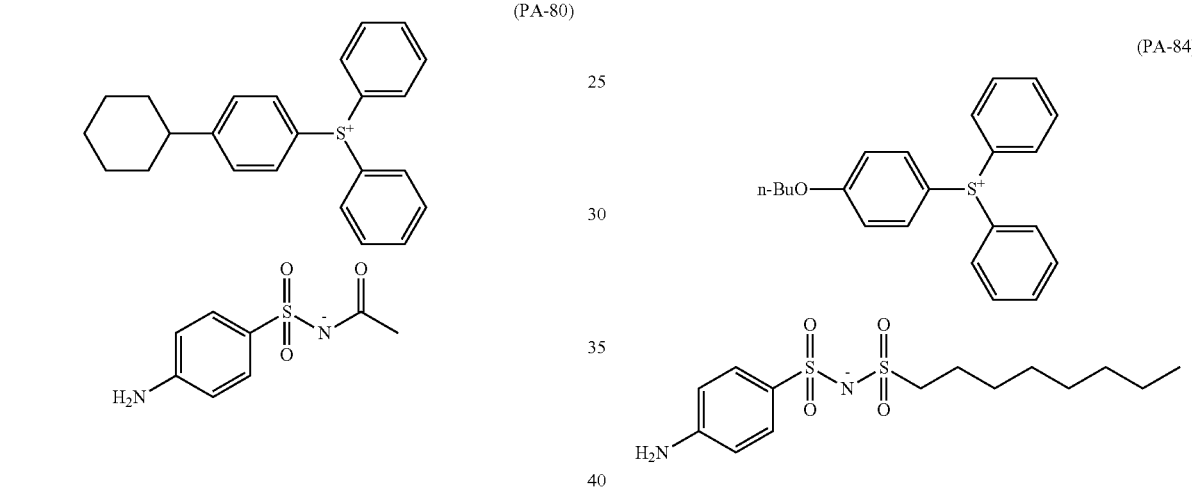
(PA-84)
(PA-81)
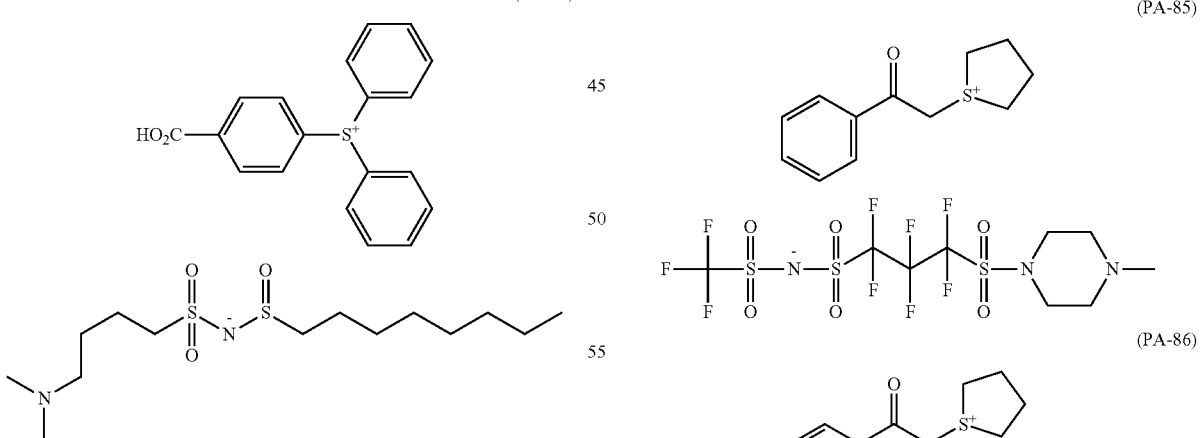
(PA-85)
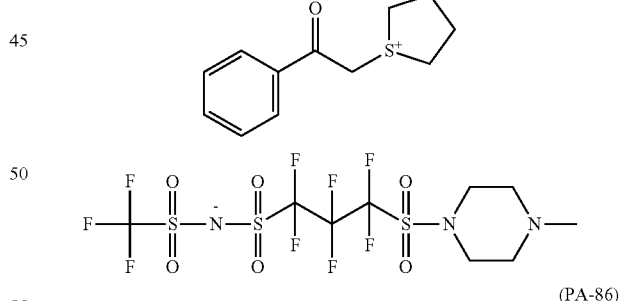
(PA-86)
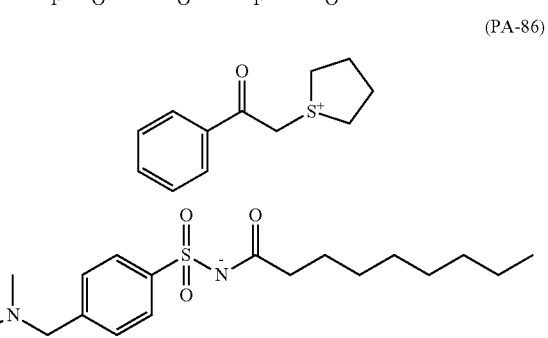
(PA-82)
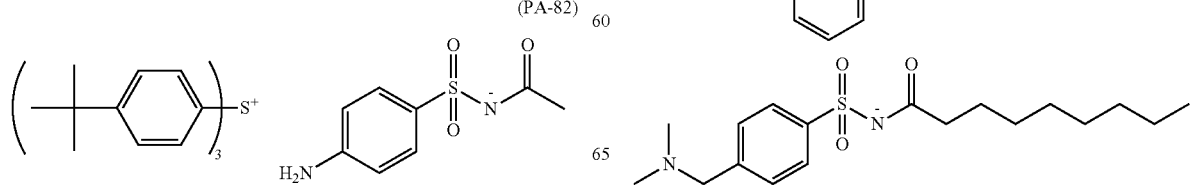

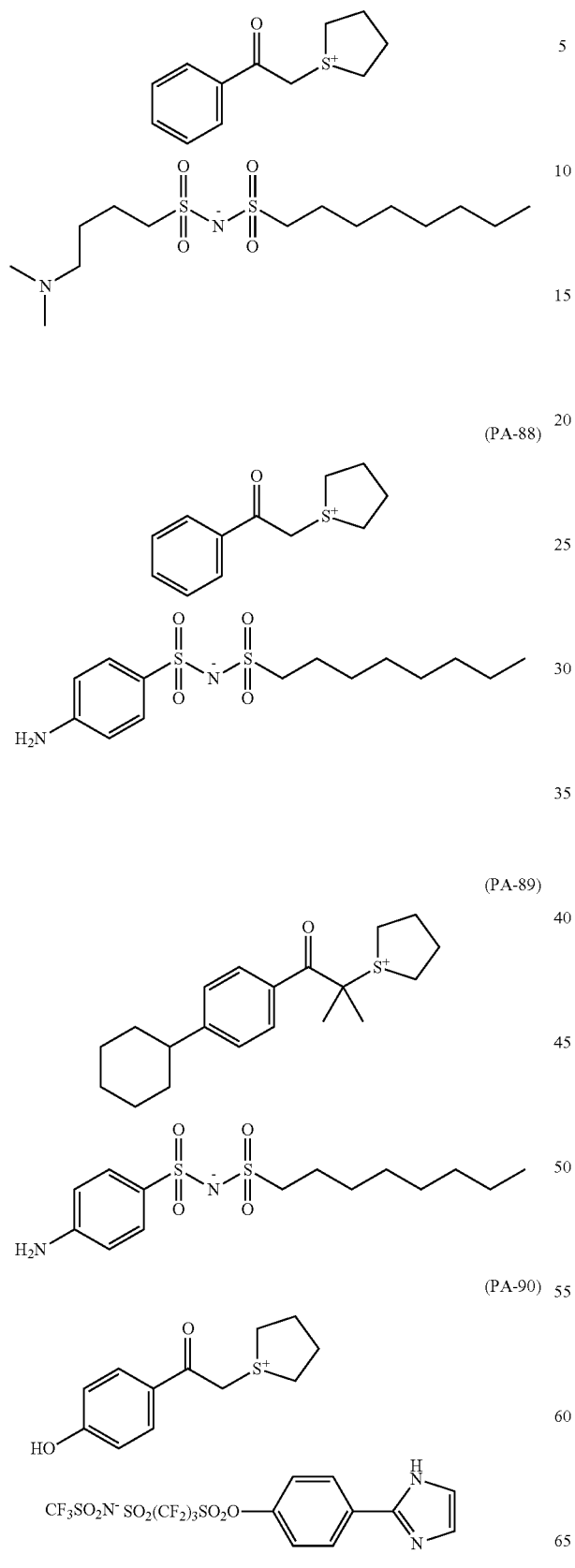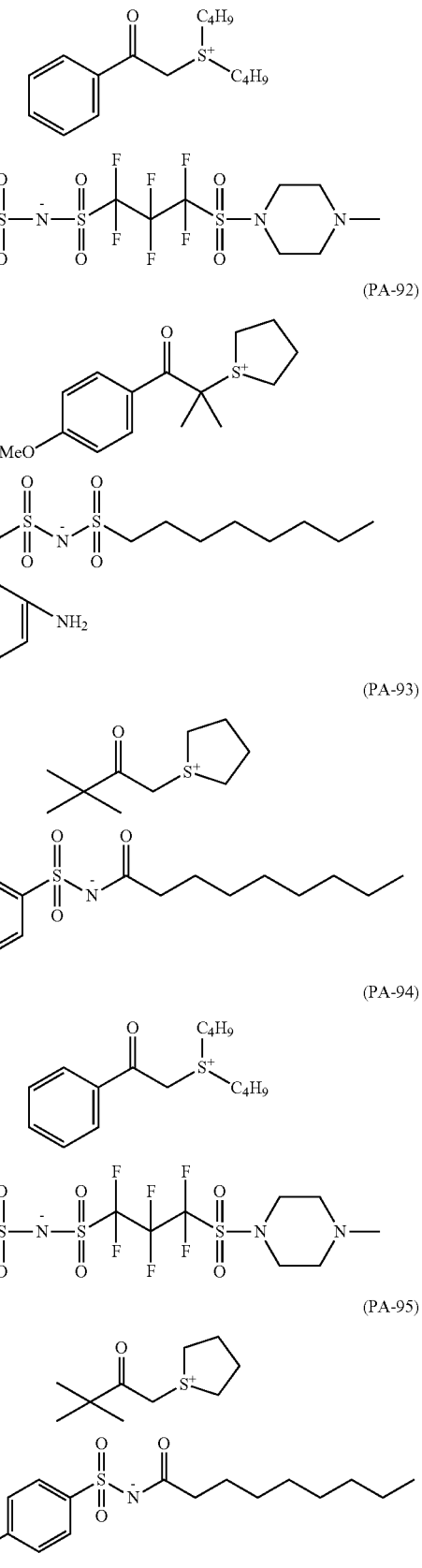

-continued (PA-96)

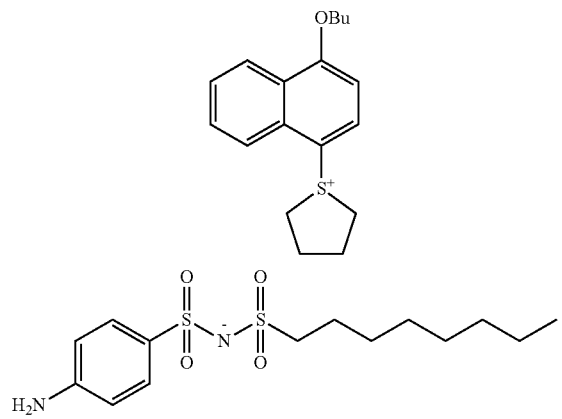

(PA-97)

(PA-98)

(PA-99)

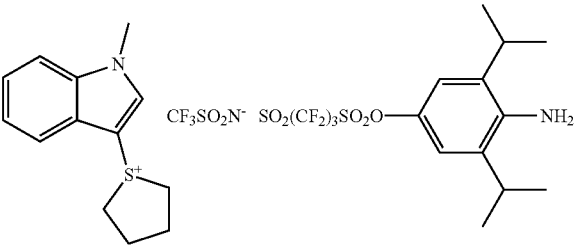

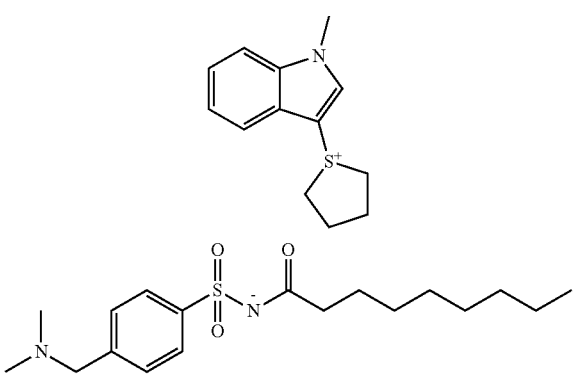

-continued (PA-100)

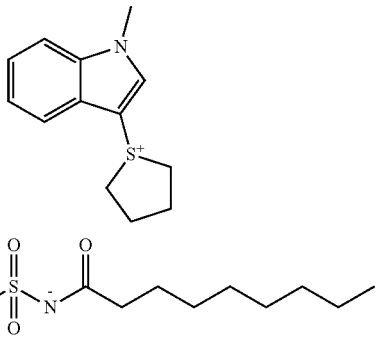

(PA-101)

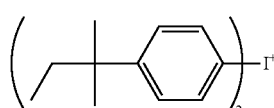

(PA-102)

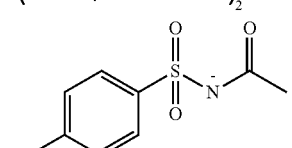

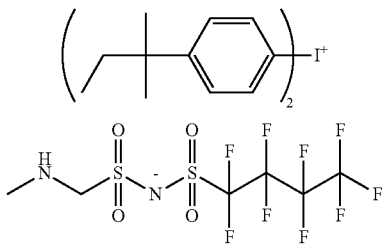

Further, in the present invention, the compound (PA) may be appropriately selected other than the compound generating the compound represented by Formula (PA-1). For example, the compound being an ionic compound and having a proton acceptor moiety in the cation moiety may be used. More specifically, the compound represented by Formula (7) may be used.

$$(R)_{m}-A^{+}-(R_N)_n \quad X^-  \quad (7)$$

In Formula, A represents a sulfur atom or an iodine atom.

M represents 1 or 2, and n represents 1 or 2. But, when A is a sulfur atom, m+n=3, and when A is an iodine atom, m+n=2.

R represents an aryl group.

$R_N$ represents an aryl group substituted with a proton acceptor functional group.

$X^-$ represents a counter anion.

Specific examples of $X^-$ may be the same as those of $ZX^-$ in Formula (ZI).

The specific examples of the aryl group in R and $R_N$ may preferably include a phenyl group.

Specific examples of the proton acceptor functional group of $R_N$ are the same as the proton acceptor functional group described in the above-mentioned Formula (PA-1).

In the composition of the present invention, the blending ratio of the compound (PA) in the whole composition is preferably 0.1% by mass to 10% by mass, and more preferably 1% by mass to 8% by mass based on the total solid.

(6) Guanidine Compound

The composition of the present invention may further contain a guanidine compound having a structure represented by the following formula.

The guanidine compound shows strong basicity because the positive charge of the conjugate acid is dispersion-stabilized by three nitrogens.

As for the basicity of the guanidine compound (A) of the present invention, it is preferred that pKa of the conjugate acid is 6.0 or more. The value of 7.0 to 20.0 is preferred in that the neutralization reactivity with an acid is high and the roughness characteristic is excellent, and the value of 8.0 to 16.0 is more preferred.

Due to the strong basicity, diffusion of an acid is suppressed, thereby contributing to the formation of an excellent pattern shape.

Meanwhile, "pKa" as used herein denotes pKa in an aqueous solution, and indicates that the lower the value is, the stronger the acid strength is, as described in, for example, Chemical Handbook (II) (4th revised edition, 1993, The Chemical Society of Japan edited, Maruzen Company, Limited). Specifically, pKa in an aqueous solution may be practically measured by measuring an acid dissociation constant at 25° C. using an infinitely dilute aqueous solution, and may also be obtained by calculating a value based on Hammett substituent constants and the database of the known literature values using the following software package 1. All the pKa values described in the present specification denote values obtained by calculation using the software package.

Software package 1: Advanced Chemistry Development (ACD/Labs) Software V 8.14 for Solaris (1994-2007 ACD/Labs).

In the present invention, log P refers to a logarithm value of the partition coefficient (P) of n-octanol/water, and is an effective parameter which may characterize the hydrophilicity/hydrophobicity for various compounds. The partition coefficient is generally obtained by calculation regardless of experiments, and in the present invention, it indicates the value calculated by CS Chem Draw Ultra Ver. 8.0 software package Crippen's fragmentation method.

Further, log P of the guanidine compound (A) is preferably 10 or less. By setting log P to the value or less, the compound may be contained uniformly in a resist film.

Log P of the guanidine compound (A) is preferably in a range of 2 to 10, more preferably in a range of 3 to 8, and still more preferably in a range of 4 to 8.

Further, it is preferred that the guanidine compound (A) in the present invention does not have a nitrogen atom other than the guanidine structure.

Specific examples of the guanidine compound are shown below, but not limited thereto.

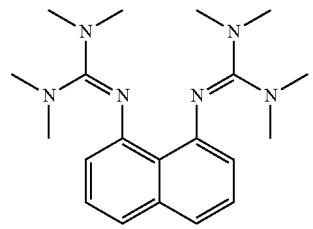

Log P: 4.29

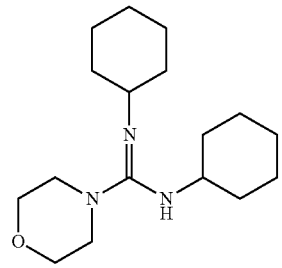

Log P: 3.32

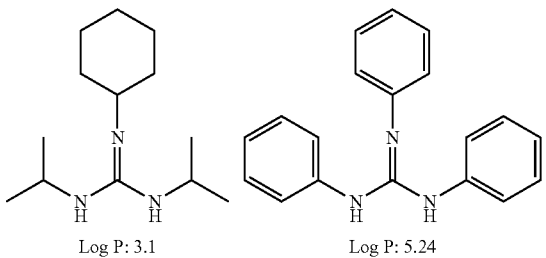

Log P: 3.1       Log P: 5.24

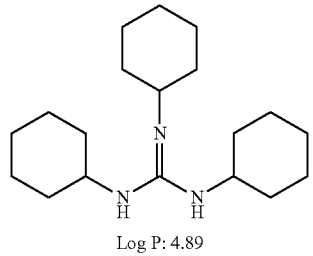

Log P: 4.89

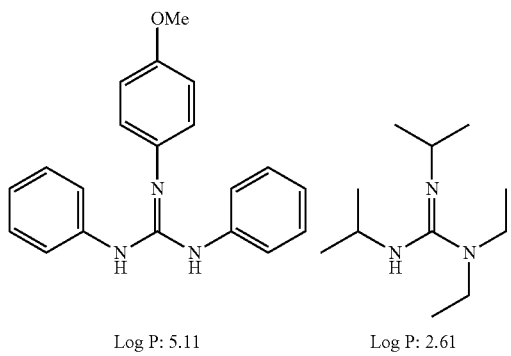

Log P: 5.11       Log P: 2.61

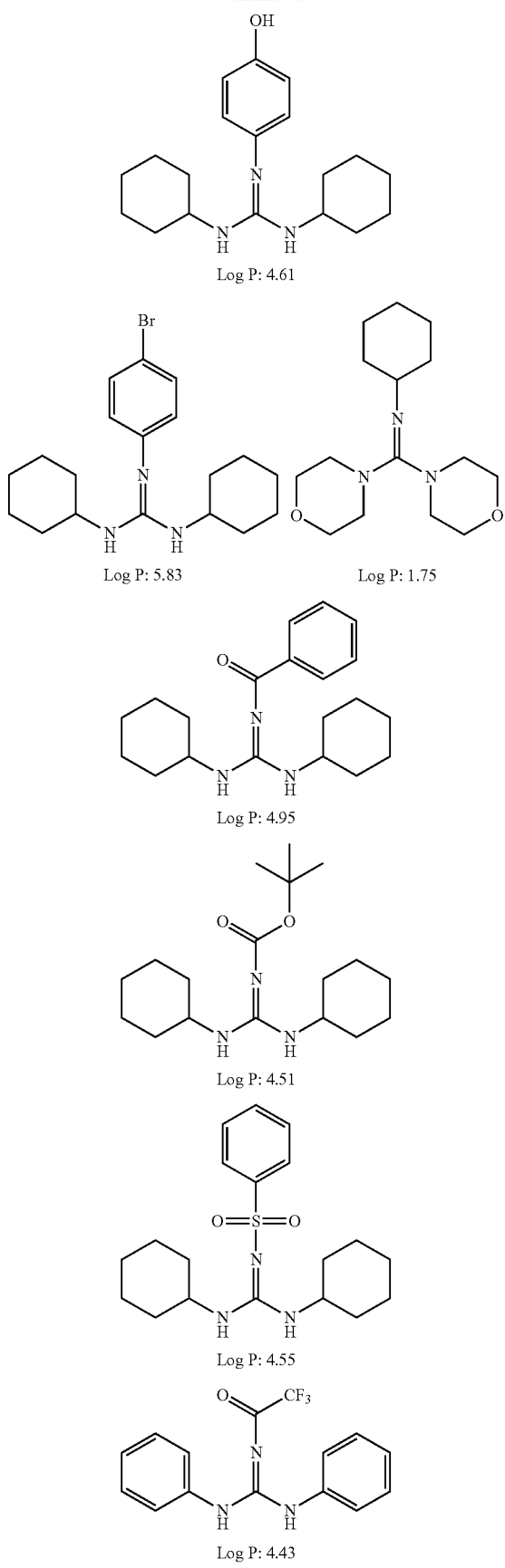

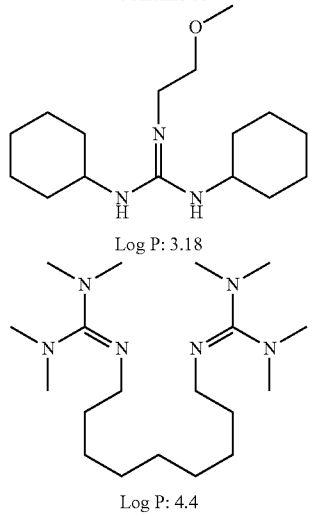

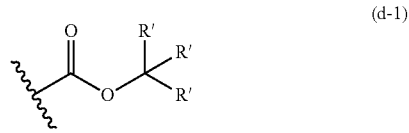

(7) Low molecular weight compound containing a nitrogen atom and having a group capable of leaving by the action of an acid The composition of the present invention may contain a low molecular weight compound containing a nitrogen atom and having a group capable of leaving by the action of an acid (hereinafter, also referred to as "a low molecular weight compound (D)" or "compound (D)"). The low molecular weight compound (D) has preferably basicity after the group capable of leaving by the action of an acid is left.

The group capable of leaving by the action of an acid is not particularly limited to, but preferably an acetal group, a carbonate group, a carbamate group, a tertiary ester group, a tertiary hydroxyl group or a hemiaminal ether group, and particularly preferably a carbamate group or a hemiaminal ether group.

The molecular weight of the low molecular weight compound (D) having a group capable of leaving by the action of an acid is preferably 100 to 1,000, more preferably 100 to 700, and particularly preferably 100 to 500.

The compound (D) is preferably an amine derivative having a group capable of leaving by the action of an acid on its nitrogen atom.

The compound (D) may have a carbamate group having a protecting group on its nitrogen atom. The protecting group constituting the carbamate group may be represented by the following Formula (d-1).

(d-1)

In Formula (d-1),

Each of R' independently represents a hydrogen atom, a straight or branched alkyl group, a cycloalkyl group, an aryl group, an aralkyl group or an alkoxyalkyl group. R' may be bound with each other to form a ring.

R' is preferably a straight or branched alkyl group, a cycloalkyl group or an aryl group, and more preferably a straight or branched alkyl group or a cycloalkyl group.

Particular structures of the group are shown below.
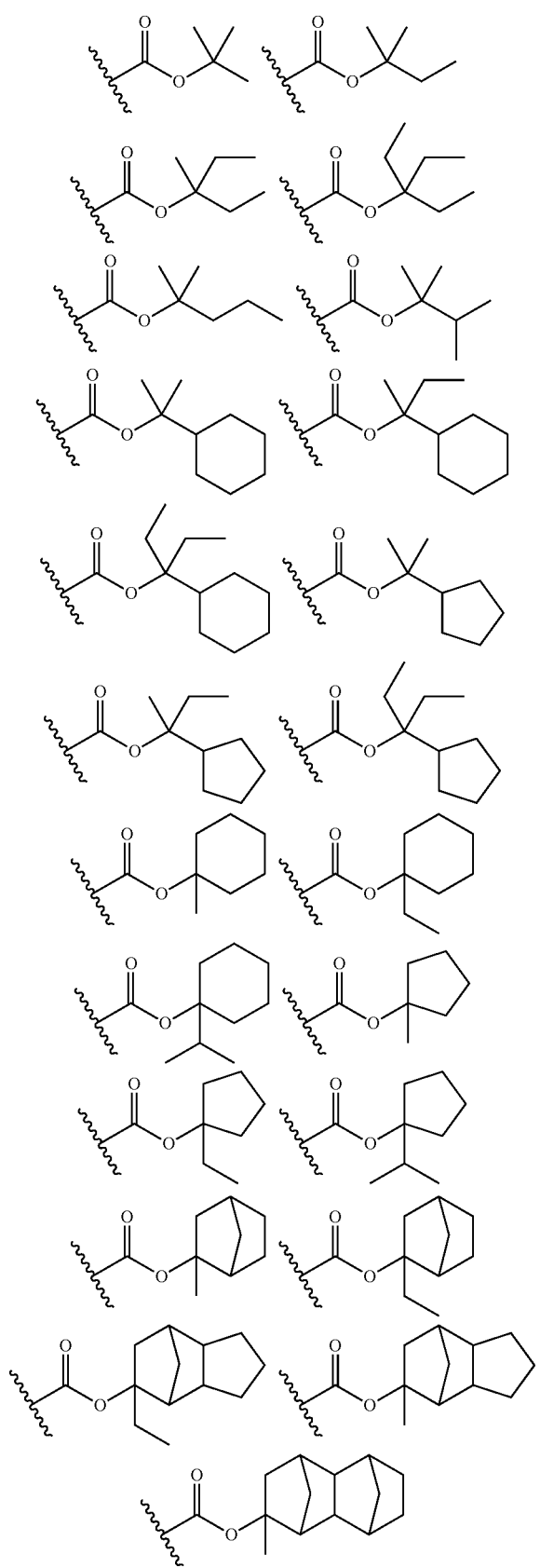
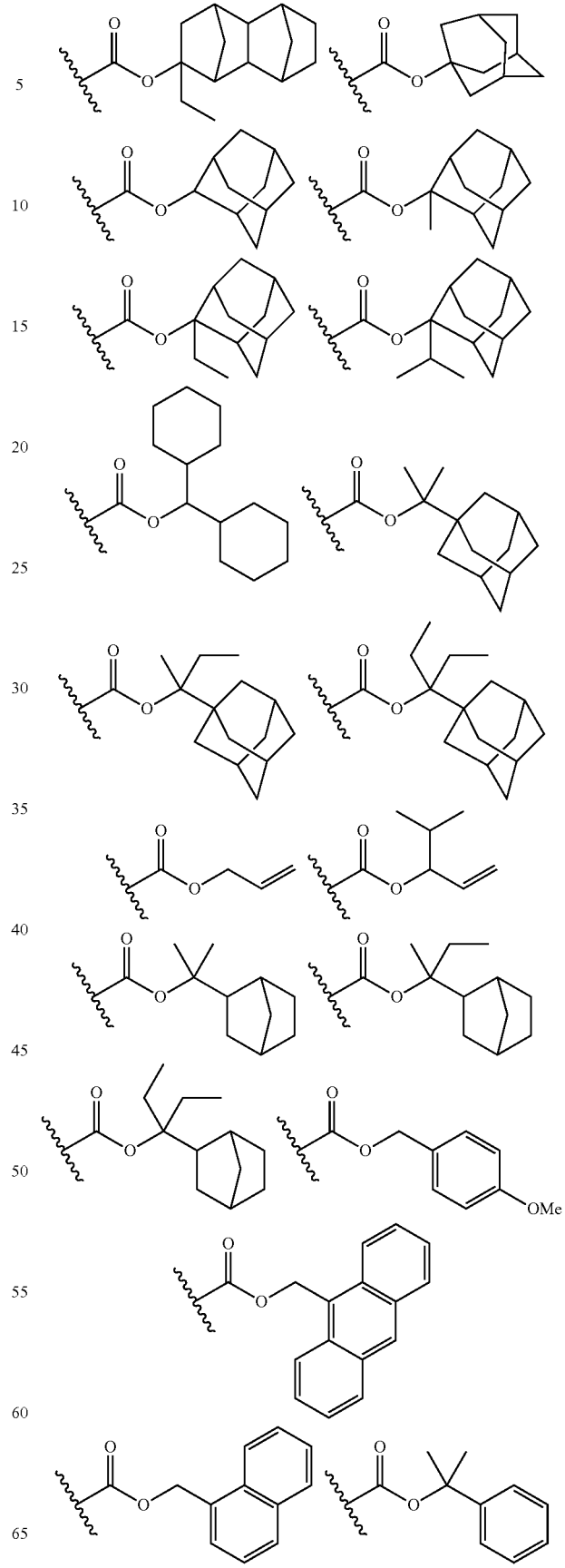

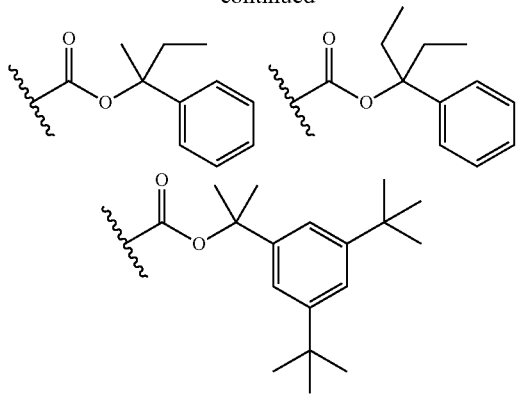

The compound (D) may be constituted by arbitrarily combining the basic compound as described below and the structure represented by Formula (d-1).

The compound (D) particularly preferably has a structure represented by the following Formula (A).

Meanwhile, the compound (D) may correspond to the above-mentioned basic compound as long as the compound is a low molecular compound having a group capable of leaving by the action of an acid.

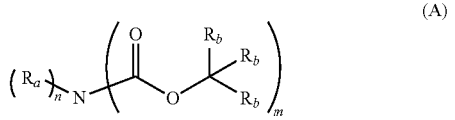

In Formula (A), Ra represents a hydrogen atom, an alkyl group, a cycloalkyl group, an aryl group or an aralkyl group. Further, when n=2, two of Ra's may be the same as or different, or two of Ra may be bound with each other to form a divalent heterocyclic hydrocarbon group (preferably having 20 or less carbon atoms) or a derivative thereof.

Each Rb independently represents a hydrogen atom, an alkyl group, a cycloalkyl group, an aryl group, an aralkyl group or an alkoxyalkyl group. However, in —C(Rb)(Rb)(Rb), when one or more of Rb's are a hydrogen atom, at least one of the rest of Rb's is a cyclopropyl group, a 1-alkoxyalkyl group or an aryl group.

At least two of Rb's may be bound to form an alicyclic hydrocarbon group, an aromatic hydrocarbon group, a heterocyclic hydrocarbon group or a derivative thereof.

n represents an integer of 0 to 2, m represents an integer of 1 to 3, and n+m=3.

In Formula (A), the alkyl group, the cycloalkyl group, the aryl group and the aralkyl group represented by Ra and Rb may be substituted with a functional group such as a hydroxyl group, a cyano group, an amino group, a pyrrolidino group, a piperidino group, a morpholino group and an oxo group, an alkoxy group or a halogen atom. The same is applied to the alkoxyalkyl group represented by Rb.

Examples of the alkyl group, the cycloalkyl group, the aryl group and the aralkyl group of Ra and/or Rb (the alkyl group, the cycloalkyl group, the aryl group and the aralkyl group may be substituted with the above-mentioned functional group, an alkoxy group or a halogen atom) may include:

a group derived from a straight or branched alkane such as methane, ethane, propane, butane, pentane, hexane, heptane, octane, nonane, decane, undecane and dodecane, and a group in which the group derived from an alkane is substituted with one or more kinds of or one or more of cycloalkyl groups such as a cyclobutyl group, a cyclopentyl group and a cyclohexyl group, a group derived from a cycloalkane such as a cyclobutane, a cyclopentane, a cyclohexane, cycloheptane, cyclooctane, a norbornane, an adamantane and a noradamantane, and a group in which the group derived from an cycloalkane is substituted with one or more kinds of or one or more of straight or branched alkyl groups such as a methyl group, an ethyl group, a n-propyl group, an i-propyl group, a n-butyl group, a 2-methylpropyl group, a 1-methylpropyl group and a t-butyl group, a group derived from an aromatic compound such as benzene, naphthalene and anthracene, and a group in which the group derived from an aromatic compound is substituted with one or more kinds of or one or more of straight or branched alkyl groups such as a methyl group, an ethyl group, a n-propyl group, an i-propyl group, a n-butyl group, a 2-methylpropyl group, a 1-methylpropyl group and a t-butyl group, a group derived from a heterocyclic compound such as pyrrolidine, piperidine, morpholine, tetrahydrofuran, tetrahydropyran, indole, indoline, quinoline, perhydroquinoline, indazole and benzimidazole, and a group in which the group derived from a heterocyclic compound is substituted with one or more kinds of or one or more of groups derived from a straight or branched alkyl group or an aromatic compound, a group in which the group derived from a straight or branched alkane the group derived from a cycloalkane are substituted with one or more kinds of or one or more of the group derived from an aromatic compound such as a phenyl group, a naphthyl group and an anthracenyl group, or a group in which the above-mentioned substituent is substituted with a functional group such as a hydroxyl group, a cyano group, an amino group, a pyrrolidino group, a piperidino group, a morpholino group and an oxo group.

Further, examples of the divalent heterocyclic hydrocarbon group (preferably having 1 to 20 carbon atoms) formed by Ra's being bound with each other, or a derivative thereof may include a group derived from a heterocyclic compound such as pyrrolidine, piperidine, morpholine, 1,4,5,6-tetrahydropyrimidine, 1,2,3,4-tetrahydroquinoline, 1,2,3,6-tetrahydropyridine, homopiperazine, 4-azabenzimidazole, benzotriazole, 5-azabenzotriazole, 1H-1,2,3-triazole, 1,4,7-triazacyclononane, tetrazole, 7-azaindole, indazole, benzimidazole, imidazo[1,2-a]pyridine, (1 S,4S)-(+)-2,5-diazabicyclo[2.2.1]heptane, 1,5,7-triazabicyclo[4.4.0]dec-5-ene, indole, indoline, 1,2,3,4-tetrahydroquinoxaline, perhydroquinoline and 1,5,9-triazacyclododecane, and a group in which the group derived from a heterocyclic compound is substituted with one or more kinds of or one or more of the groups derived from a straight or branched alkane, the groups derived from a cycloalkane, the groups derived from an aromatic compounds, the groups derived from a heterocyclic compounds, or one or more kinds of or one or more of the functional groups such as a hydroxyl group, a cyano group, an amino group, pyrrolidino group, a piperidino group, a morpholino group and an oxo group.

Specific examples of the particularly preferred compounds (D) in the present inventions are shown, but the present invention is not limited thereto.

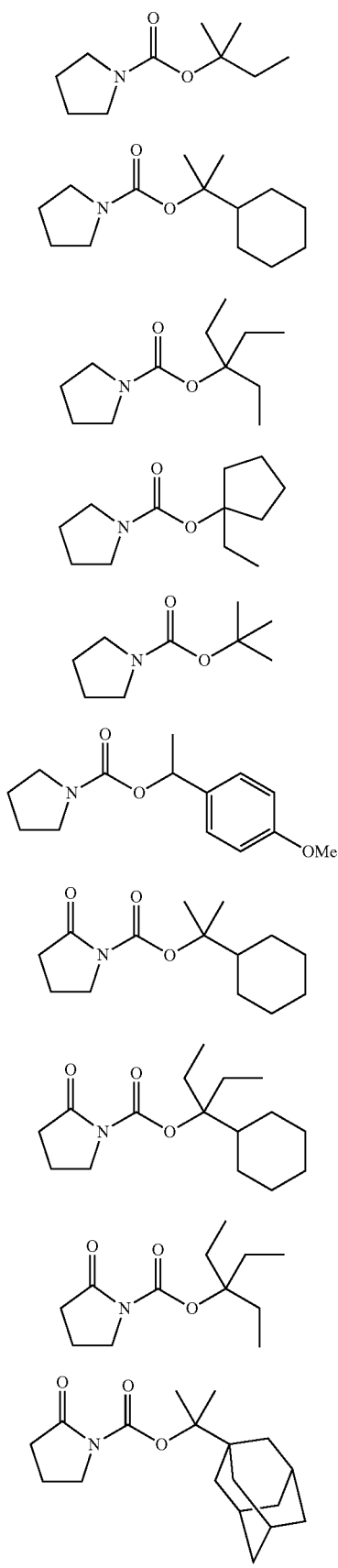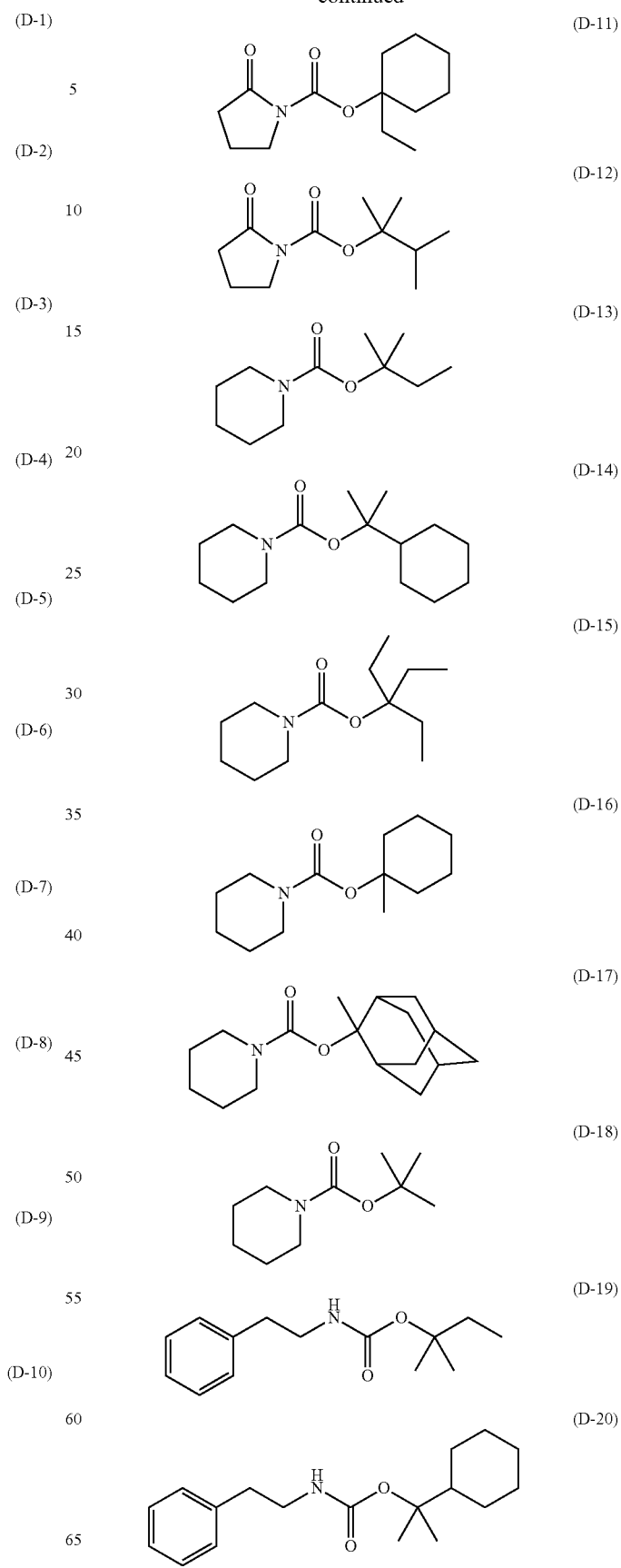

-continued
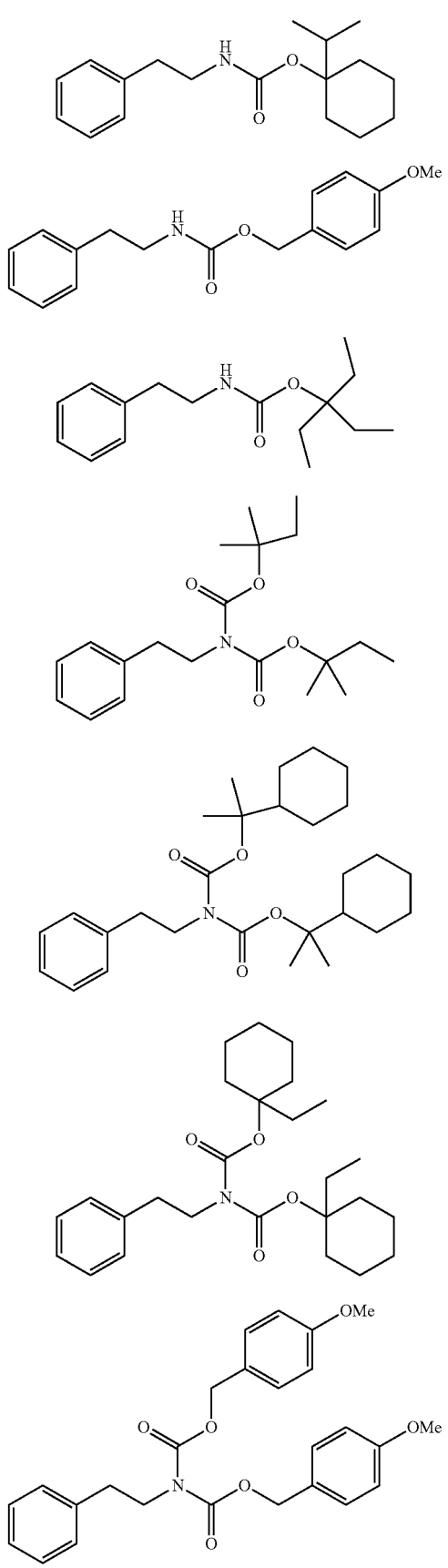
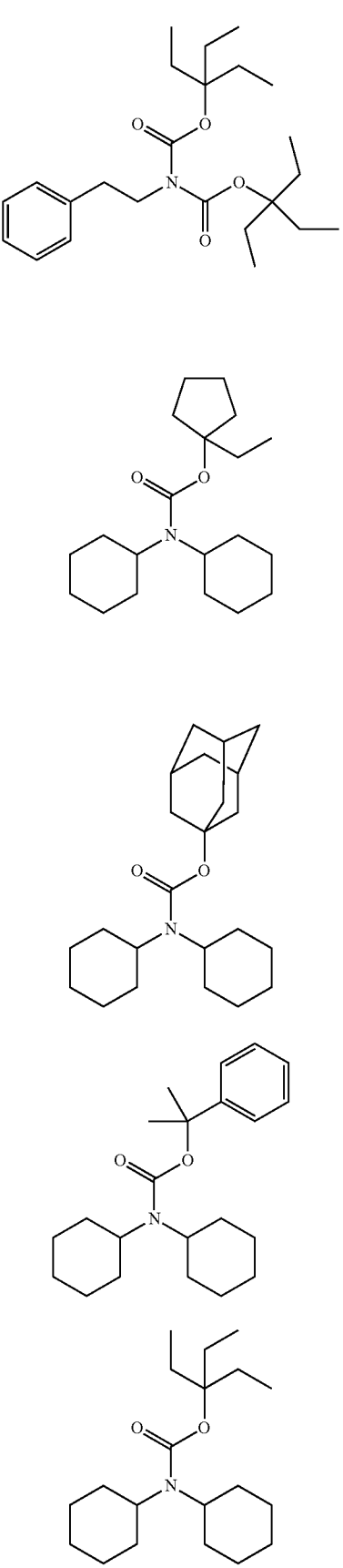

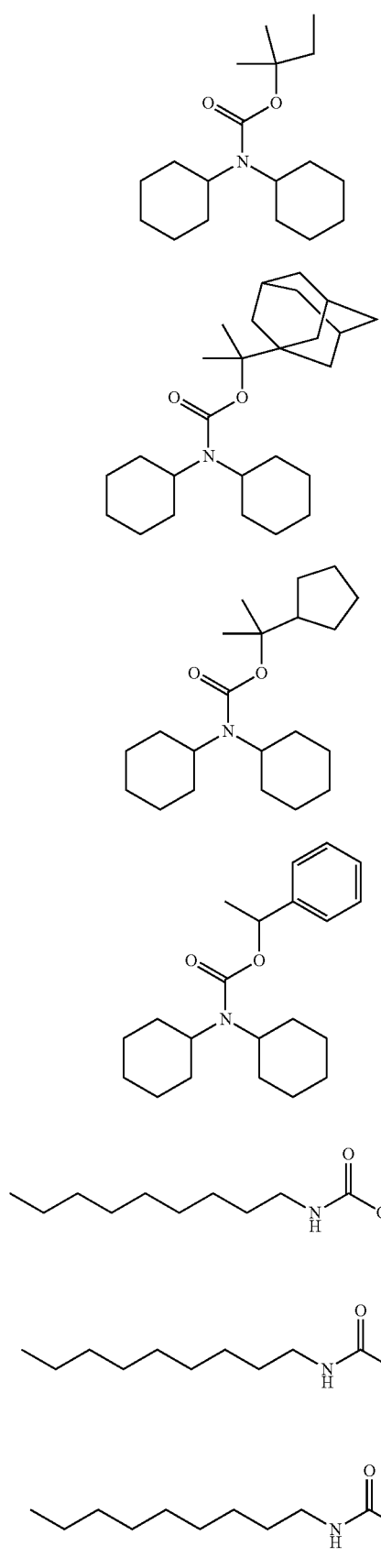
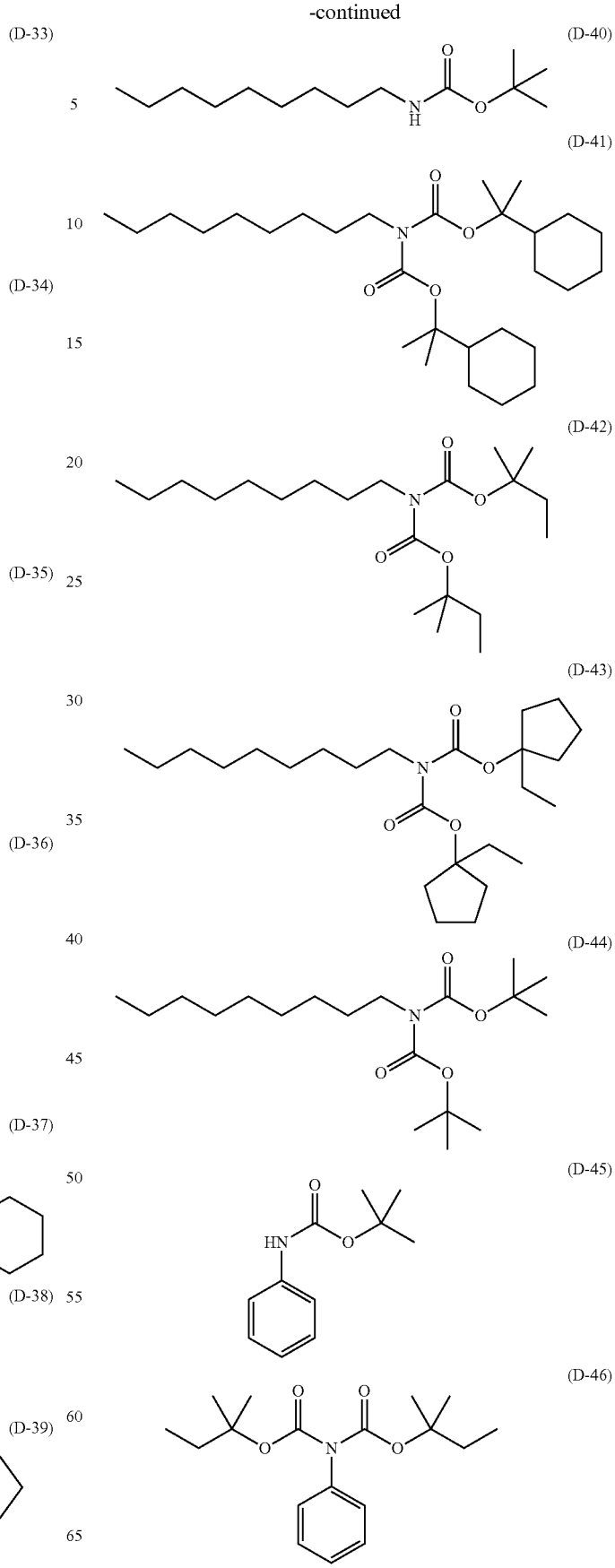

(D-47)
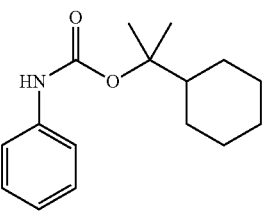
(D-48)
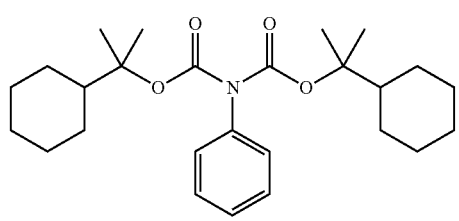
(D-49)
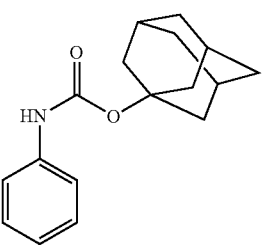
(D-50)
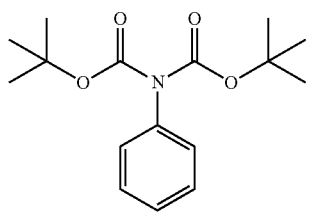
(D-51)
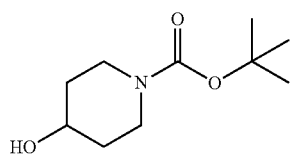
(D-52)
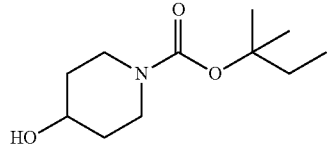
(D-53)
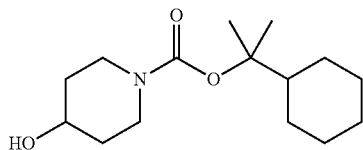
(D-54)
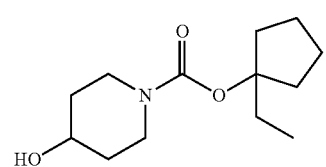
(D-55)
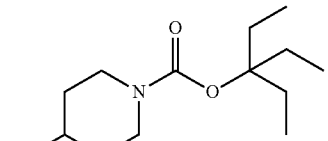
(D-56)
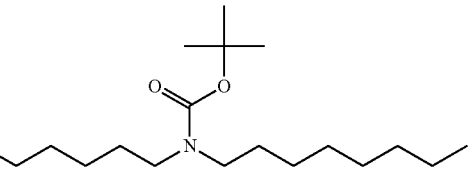
(D-57)
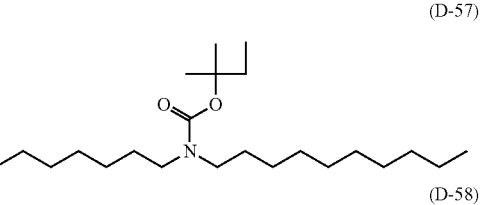
(D-58)
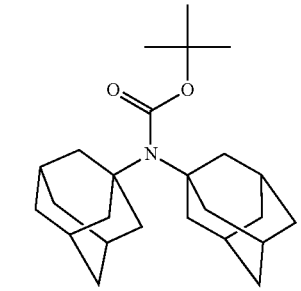
(D-59)
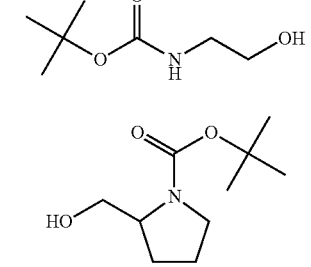
(D-60)
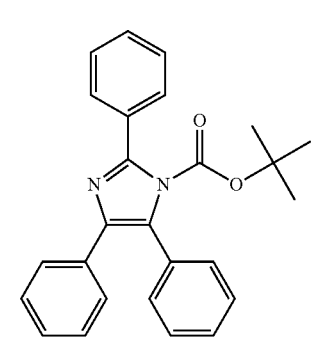
(D-61)

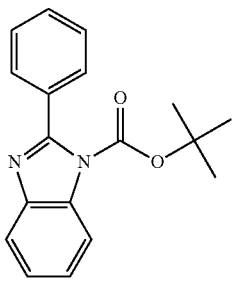
(D-62)

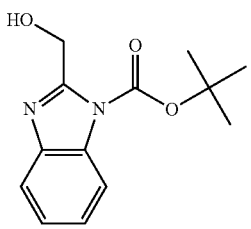
(D-63)

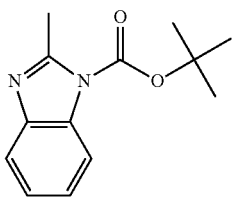
(D-64)

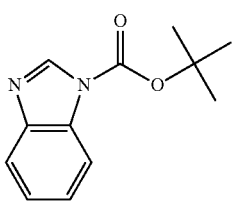
(D-65)

The compound represented by Formula (A) may be synthesized based on Japanese Patent Application Laid-Open No. 2007-298569, Japanese Patent Application Laid-Open No. 2009-199021 and the like.

In the present invention, the low molecular weight compound (D) may be used either alone or in combination of two or more thereof.

Although the composition of the present invention may or may not contain the low molecular compound (D), when containing, the content of the compound (D) is usually 0.001% by mass to 20% by mass, preferably 0.001% by mass to 10% by mass, and more preferably 0.01% by mass to 5% by mass based on the total solid of the composition adding up the above-mentioned basic compound.

Further, in the case where the composition of the present invention contains an acid generator, the ratio of the acid generator and the compound (D) used in the composition is preferably Acid generator/[Compound (D)+The following basic compound] (molar ratio)=2.5 to 300. That is, the molar ratio is preferably 2.5 or more from the viewpoint of the sensitivity and the resolution, and is preferably 300 or less from the viewpoint of suppressing the reduction in resolution caused by growing of the resist pattern over time after exposure until heat treatment. Acid generator/[Compound (D)+The following basic compound] (molar ratio) is more preferably 5.0 to 200, and still more preferably 7.0 to 150.

Besides, the compounds which may be used in the composition according to the present invention may include compounds synthesized in Examples of Japanese Patent Application Laid-Open No. 2002-363146 and compounds described in paragraph 0108 of Japanese Patent Application Laid-Open No. 2007-298569.

As the basic compound, a photosensitive basic compound may be used. As the photosensitive basic compound, compounds described in, for example, Japanese Patent Publication No. 2003-524799, J. Photopolym. Sci & Tech. Vol. 8, P. 543-553(1995) and the like may be used.

The molecular weight of the basic compound is usually 100 to 1,500, preferably 150 to 1,300, and more preferably 200 to 1,000.

The basic compound may be used either alone or in combination of two or more thereof.

In the case where the composition according to the present invention contains a basic compound, the content is preferably 0.01% by mass to 8.0% by mass, more preferably 0.1 to 5.0% by mass, and particularly preferably 0.2% by mass to 4.0% by mass based on the total solid of the composition.

The molar ratio of the basic compound to the photo-acid generator is preferably set to 0.01 to 10, more preferably 0.05 to 5, and still more preferably 0.1 to 3. If the molar ratio is set to be excessively high, the sensitivity and/or the resolution may be reduced in some cases. If the molar ratio is set to be excessively low, thinning of patterns is possibly caused between exposure and heating (post-bake). The molar ratio is more preferably 0.05 to 5, and still more preferably 0.1 to 3. Meanwhile, the above-described molar ratio of the photo-acid generator is based on the summed amount of the repeating unit (B) of the resin and the photo-acid generator which may be further contained in the resin.

[7] Hydrophobic Resin (HR)

The electron beam-sensitive or extreme ultraviolet ray-sensitive resin composition of the present invention may have a hydrophobic resin (HR) other than the resin (P).

The hydrophobic resin (HR) may preferably contain a group having a fluorine atom, a group having a silicon atom, or a hydrocarbon grop having 5 or carbon atoms to localize on the surface of the film. These groups may be included in the main chain of the resin, and may be included in the side chain thereof. Specific examples of the hydrophobic resin (HR) are shown below.

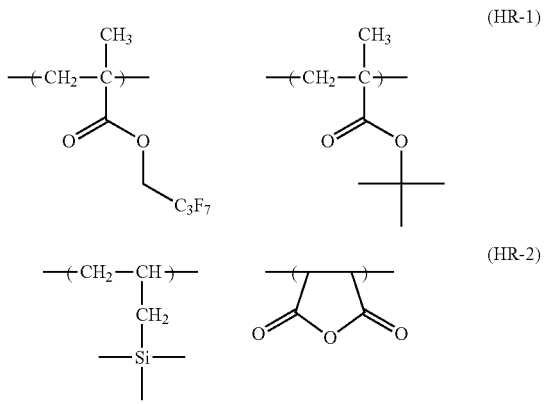

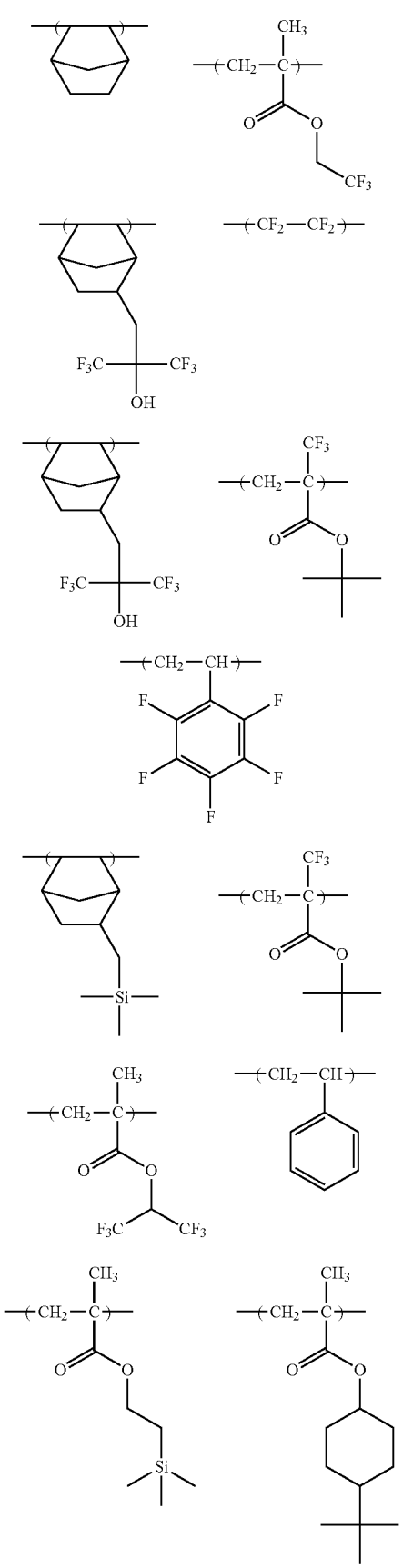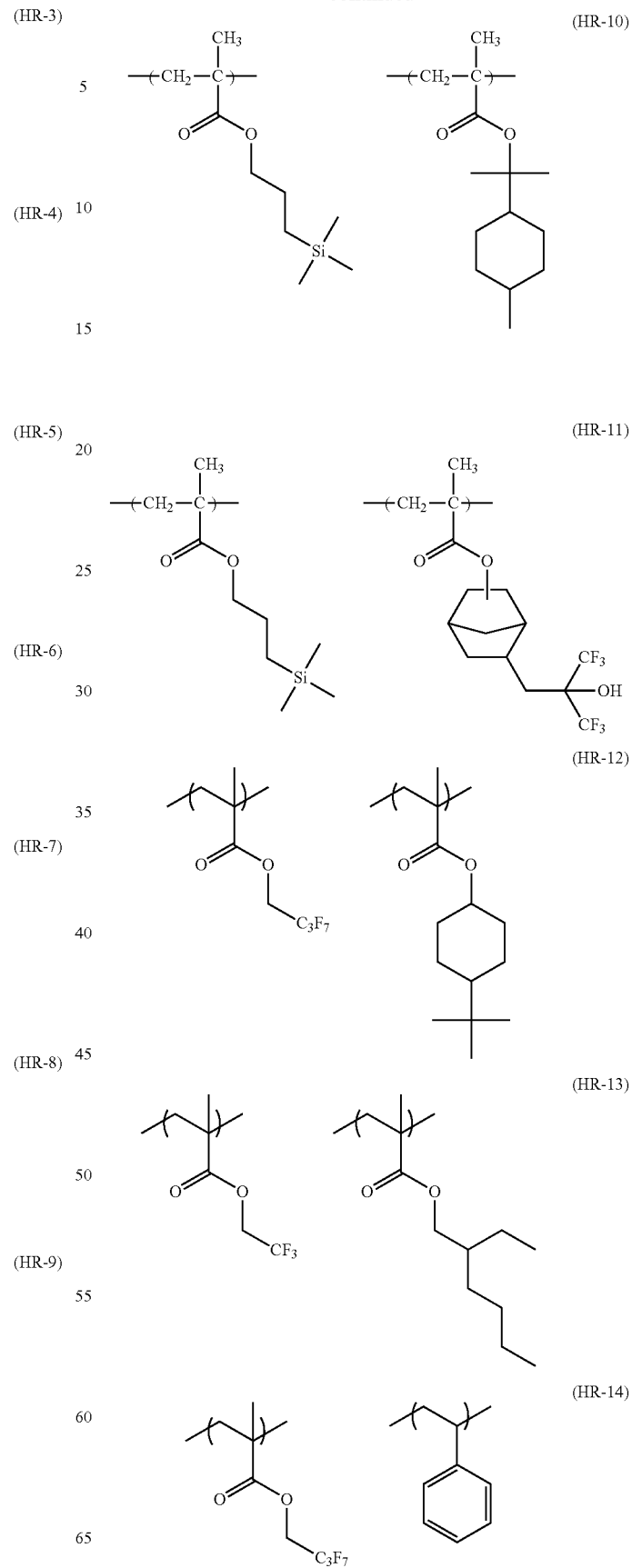

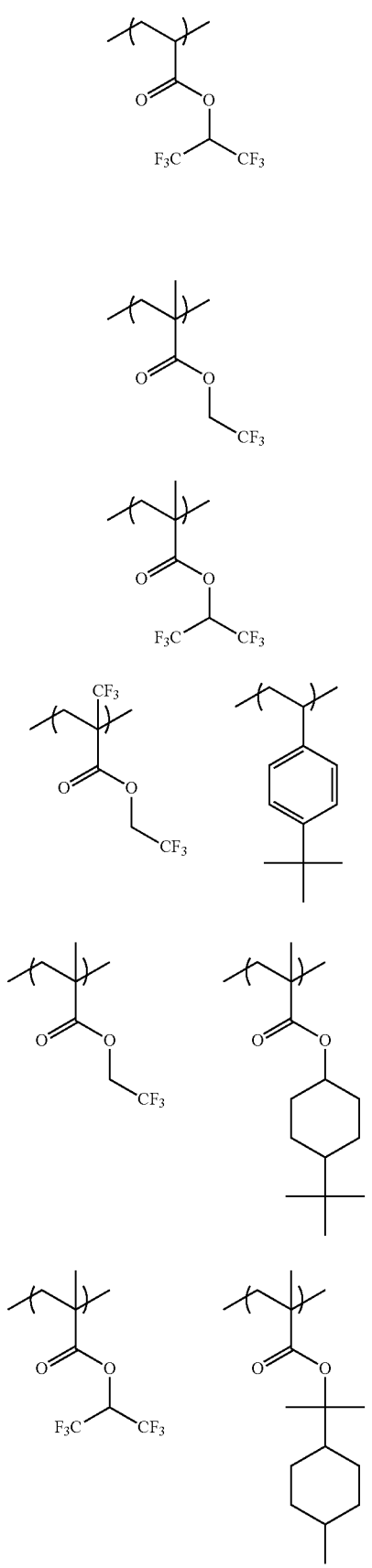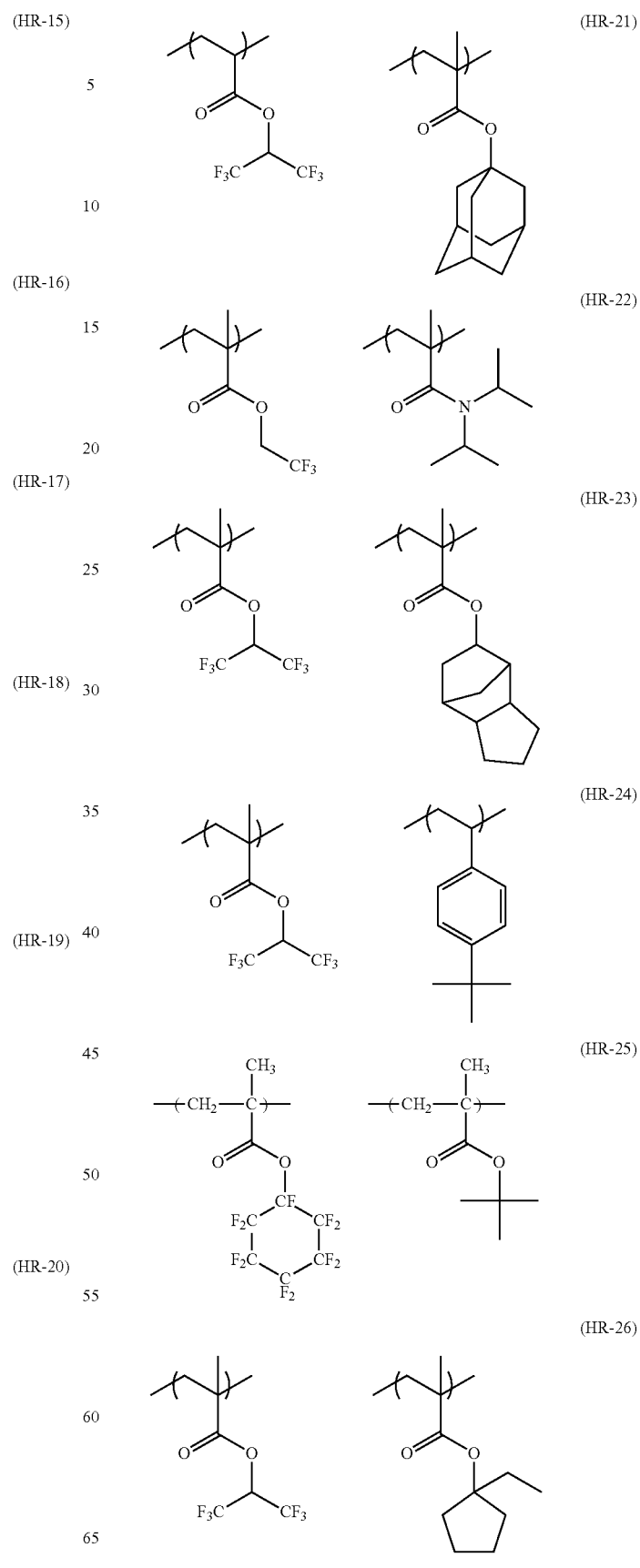

(HR-27)
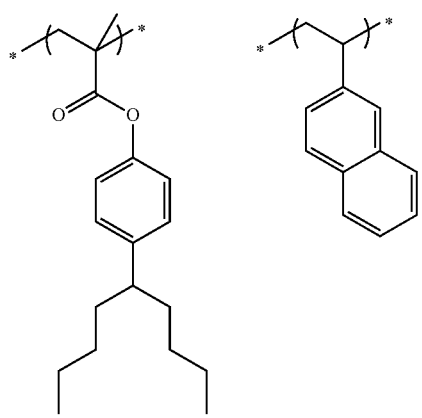 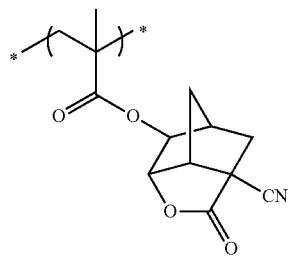
(HR-28)
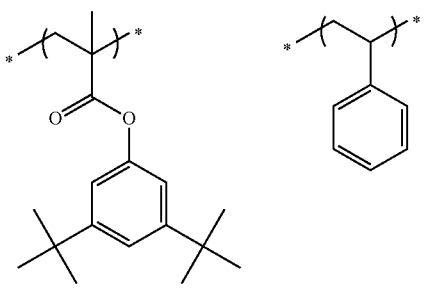
(HR-31)
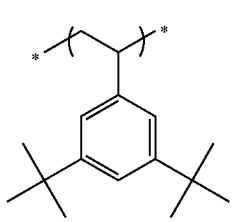
(HR-29)
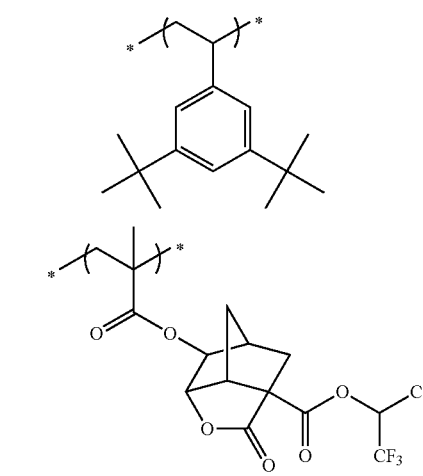
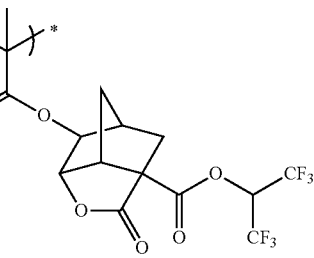 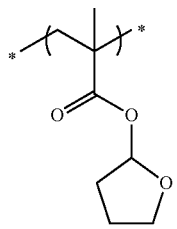
(HR-32)
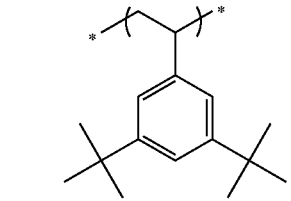
(HR-30)
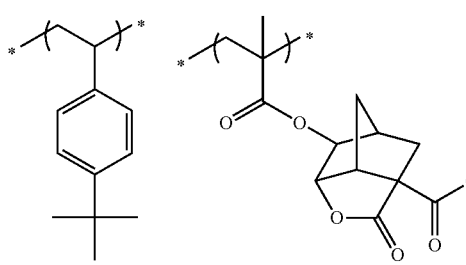
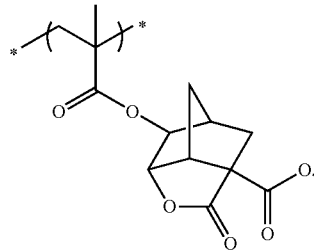
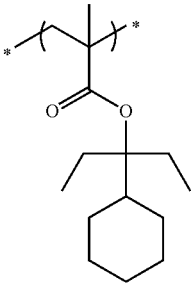

-continued

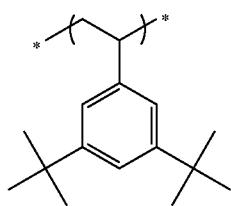
(HR-33)

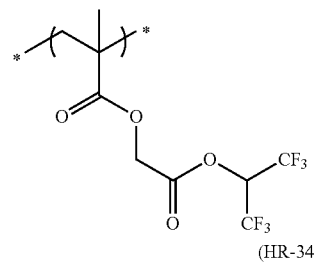

(HR-34)

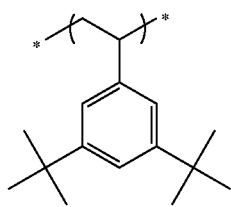

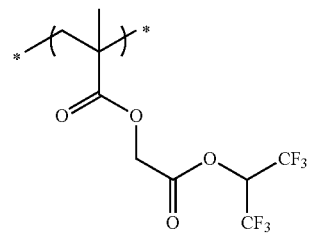

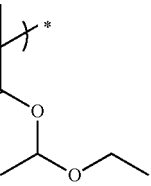

In addition, as a hydrophobic resin, the resins described in Japanese Patent Application Laid-Open No. 2011-248019, Japanese Patent Application Laid-Open No. 2010-175859, Japanese Patent Application Laid-Open No. 2012-032544 may be preferably used.

[8] Surfactant

The composition according to the present invention may further contain a surfactant. By containing surfactants, it is possible to form a resist pattern with less adhesion and reduced development defects due to good sensitivity and resolution when using an exposure light source with a wavelength of 250 nm or less, particularly 220 nm or less.

The surfactant is particularly preferably a fluorine-based and/or silicon-based surfactant.

Examples of the fluorine-based and/or silicon-based surfactants may include surfactants described in paragraph [0276] of U.S. Patent Application Publication No. 2008/0248425, such as Eftop EF301 and EF303 (manufactured by Shin-Akita Chemical Co., Ltd.), Fluorad FC430, 431 and 4430 (manufactured by Sumitomo 3M Limited), Megafac F171, F173, F176, F189, F113, F110, F177, F120 and R08 (manufactured by DIC Corporation), Surflon S-382, SC101, 102, 103, 104, 105 and 106 (manufactured by Asahi Glass Co., Ltd.), Troysol S-366 (manufactured by Troy Chemical Industries, Inc.), GF-300 and GF-150 (manufactured by Toagosei Chemical Industry Co., Ltd.), Surflon S-393 (manufactured by Seimi Chemical Co., Ltd.), Eftop EF121, EF122A, EF122B, RF122C, EF125M, EF135M, EF351, EF352, EF801, EF802 and EF601 (manufactured by JEMCO Co., Ltd.), PF636, PF656, PF6320 and PF6520 (manufactured by OMNOVA Solutions. Inc.), and FTX-204G, 208G, 218G, 230G, 204D, 208D, 212D, 218D and 222D (manufactured by NEOS Co., Ltd.). In addition, polysiloxane polymer KP-341 (manufactured by Shin-Etsu Chemical Co., Ltd.) may also be used as the silicon-based surfactant.

Further, the surfactants may be synthesized by using a fluoro-aliphatic compound which is prepared by a telomerization method (also referred to as a telomer method) or an oligomerization method (also referred to as an oligomer method), other than those known surfactants described above. Specifically, the polymer having a fluoro-aliphatic group derived from a fluoro-aliphatic compound may use as a surfactant. The fluoro-aliphatic compound may be synthesized by the method described in Japanese Patent Application Laid-Open No. 2002-90991.

The polymer having a fluoro-aliphatic group may preferably be a copolymer of a monomer having a fluoro-aliphatic group with (poly(oxyalkylene))acrylate or methacrylate and/or (poly(oxyalkylene))methacrylate, may be irregularly distributed, and may preferably be a block copolymer.

Examples of the poly(oxyalkylene) group may include a poly(oxyethylene) group, a poly(oxypropylene) group and a poly(oxybutylene) group. In addition, it may preferably be an alkylene unit with different chain length in the same chain such as a block connector of poly(oxyethylene, oxypropylene and oxyethylene), and a block connector of poly(oxyethylene and oxypropylene).

Further, the copolymer of a monomer having a fluoro-aliphatic group and a (poly(oxyalkylene))acrylate or methacrylate may preferably be a ternary or more copolymer consisting of copolymerizing a monomer having different two or more fluoro-aliphatic groups and different two or more (poly(oxyalkylene))acrylate or methacrylate, and the like at the same time.

Examples of the commercially available surfactants may include Megafac F178, F-470, F-473, F-475, F-476 and F-472 (manufactured by DIC Corporation), a copolymer of acrylate or methacrylate having a $C_6F_{13}$ group with (poly(oxyalkylene))acrylate or methacrylate, a copolymer of acrylate or methacrylate having a $C_6F_{13}$ group with (poly(oxyethylene))acrylate or methacrylate, a copolymer of acrylate or methacrylate having a $C_6F_{13}$ group with (poly(oxypropylene))acrylate or methacrylate, a copolymer of acrylate or methacrylate having a $C_8F_{17}$ group with (poly(oxyalkylene))acrylate or methacrylate, a copolymer of acrylate or methacrylate having a $C_8F_{17}$ group with (poly(oxyethylene))acrylate or methacrylate, a copolymer of acrylate or methacrylate having a $C_8F_{17}$ group with (poly(oxypropylene))acrylate or methacrylate, and the like.

Further, in the present invention, it is also possible to use a surfactant other than the fluorine-based and/or silicon-based surfactant, described in paragraph [0280] of U.S. Patent Application Publication No. 2008/0248425.

These surfactants may be used either alone or in combination of two or more thereof.

In the case where the composition according to the present invention contains a surfactant, the content of the surfactant is preferably 0% by mass to 2% by mass, more preferably 0.0001% by mass to 2% by mass, and still more preferably 0.0005% by mole to 1% by mole, based on the total solid of the composition.

[9] Other Additives

The composition of the present invention may contain a carboxylic acid, a carboxylic acid onium salt, the compound having a molecular weight of 3000 or less capable of suppressing dissolution described in Proceeding of SPIE, 2724, 355(1996), dyes, plasticizers, light sensitizer, light absorbent, antioxidants, and the like in addition to the above-mentioned components.

In particular, the carboxylic acid may be properly used to improve the performance. An aromatic carboxylic acid such as a benzoic acid, a naphthoic acid and the like may be preferably used as a carboxylic acid.

The content of carboxylic acid is preferably 0.01 to 10% by mass, more preferably 0.01 to 5% by mass, still more preferably 0.01 to 3% by mass based on the total solid of the composition.

From the viewpoint of improving the resolution, the electron beam-sensitive or extreme ultraviolet ray-sensitive resin composition in the present invention is preferably used in a film thickness of 10 nm to 250 nm, more preferably in a film thickness of 20 nm to 200 nm, and still more preferably in a film thickness of 30 nm to 100 nm. Such a film thickness may be achieved by setting a solid concentration in the composition to an adequate range to have an appropriate viscosity, thereby improving coatability and film-formation property.

The solid concentration of the electron beam-sensitive or extreme ultraviolet ray-sensitive resin composition in the present invention is usually 1.0% by mass to 10% by mass, preferably 2.0% by mass to 5.7% by mass, and more preferably 2.0% by mass to 5.3% by mass. By setting the solid concentration to the above-described range, the resist solution may be uniformly applied on a substrate and a resist pattern having excellent line width roughness may be formed. The reason is not clear, but it is thought that by setting the solid concentration to 10% by mass or less and preferably 5.7% by mass or less, aggregation of materials, particularly, a photo-acid generator, in the resist solution is suppressed, and as a result, a uniform resist film may be formed.

The solid concentration is a weight percentage of the weight of other resist components excluding the solvent, based on the total weight of the electron beam-sensitive or extreme ultraviolet ray-sensitive resin composition.

The electron beam-sensitive or extreme ultraviolet ray-sensitive resin composition in the present invention is used by dissolving the above-described components in a predetermined an organic solvent, preferably in the mixed solvent, filtering the solution through a filter, and then applying the filtered solution on a predetermined support (substrate). The filter used for filtration is preferably a polytetrafluoroethylene-, polyethylene- or nylon-made filter having a pore size of 0.1 μm or less, more preferably 0.05 μm or less, and still more preferably 0.03 μm or less. In the filtration through a filter, as described in, for example, Japanese Patent Application Laid-Open No. 2002-62667, circulating filtration may be performed, or the filtration may be performed by connecting a plurality of kinds of filters in series or in parallel. In addition, the composition may be filtered a plurality of times. Further, a deaeration treatment or the like may be applied to the composition before or after filtration.

[Use]

The pattern forming method of the present invention may be appropriately used to manufacture semiconductor microcircuits such as a manufacture of super LSI or high capacity of microchips. In addition, when manufacturing semiconductor microcircuits, the patterned resist film is provided in the process of forming circuits or etching, and the remaining resist film portion is finally removed by the solvent and the like. Accordingly, the resist film derived from the electron beam-sensitive or extreme ultraviolet ray-sensitive resin composition described in the present invention is not residual in the finally product such as a microchip, unlike the so-called permanent resist used for the printed circuit board.

Further, the present invention also relates to a method for manufacturing an electronic device, including the above-described pattern forming method of the present invention, and the electronic device manufactured by this manufacturing method.

The electronic device of the present invention is suitably mounted on the electric electronic devices (such as home appliances, OA media-related devices, optical devices and communication devices).

Example

Hereinafter, the present invention will be described in detail with reference to Examples, but the scope of the present invention is not limited thereby.

Synthesis Example 1

Synthesis of Resin P-5

The resin was synthesized according to the following scheme

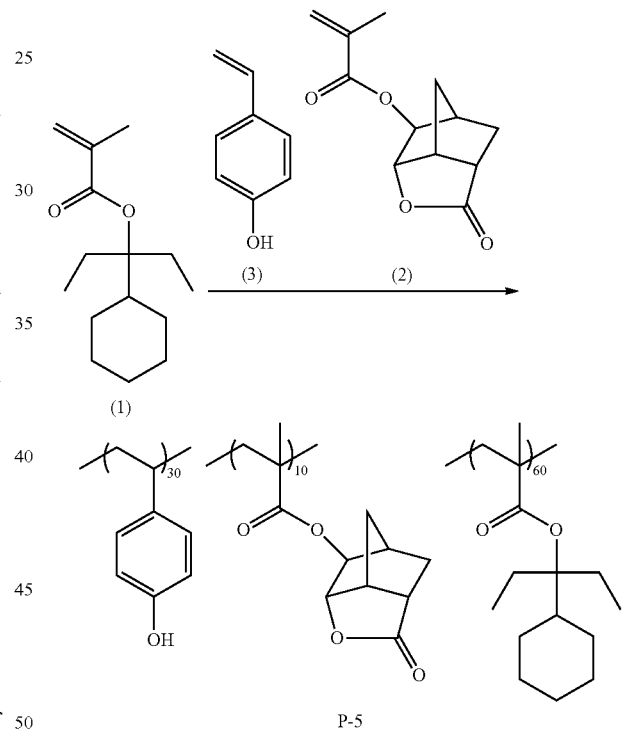

A cyclohexanone solution (50.00% by mass) of 2.52 g of the compound (3), 0.78 g of the compound (2), 5.33 g of the compound (1), and 0.32 g of the polymerization initiator V-601 (manufactured by Wako Pure Chemical Industries, Ltd.) were dissolved in 27.01 g of a cyclohexanone. 15.22 g of cyclohexanone was put in the reaction vessel, the reaction solution was added dropwise thereto under nitrogen atmosphere at 85° C. over 4 hours. The reaction solution was heated with stirring over 2 hours, and then it was allowed to cool to the room temperature.

The reaction solution was added dropwise to 400 g of heptanes to precipitate a polymer, and then filter it. The filtered solid was washed by pouring 200 g of heptanes thereto. After that, the solid after washing was dried under reduced pressure to obtain 2.98 g of resin (P-5).

The resins (P-1) to (P-4), (P-6) to (P-14), (P-16), (P-22), (P-24) to (P-26), (P-28) to (P-38), (P-42) to (P-44), (P-47), (P-51), (P-53), (P-57), (P-61) to (P-64), (P-66), (P-71) to (P-73), (P-77), (P-78) to (P-91) were synthesized in the same manner as in resin (P-5). The synthesized polymer structure is described previously as specific examples.

In addition, the weight average molecular weight (Mw) and the polydispersity (Mw/Mn) of each resin, which was synthesized as described above and will be used in the Examples being described later, are shown in the following table.

TABLE 1

| | Weight average mloecular weight | Polydispersity |
|---|---|---|
| P-1 | 12500 | 1.55 |
| P-2 | 12000 | 1.51 |
| P-3 | 11500 | 1.50 |
| P-4 | 13000 | 1.58 |
| P-5 | 12000 | 1.52 |
| P-6 | 11000 | 1.48 |
| P-7 | 12500 | 1.44 |
| P-8 | 12000 | 1.38 |
| P-9 | 11500 | 1.36 |
| P-10 | 12000 | 1.45 |
| P-11 | 18000 | 1.67 |
| P-12 | 7000 | 1.49 |
| P-13 | 16500 | 1.62 |
| P-14 | 14500 | 1.78 |
| P-16 | 20000 | 1.75 |
| P-22 | 7500 | 1.56 |
| P-24 | 12000 | 1.48 |
| P-25 | 17500 | 1.68 |
| P-26 | 15500 | 1.57 |
| P-28 | 14000 | 1.60 |
| P-29 | 17000 | 1.60 |
| P-30 | 17500 | 1.63 |
| P-31 | 19000 | 1.67 |
| P-32 | 10000 | 1.44 |
| P-33 | 10500 | 1.53 |
| P-34 | 5000 | 1.44 |
| P-35 | 18000 | 1.45 |
| P-36 | 14000 | 1.66 |
| P-37 | 28000 | 1.76 |
| P-38 | 25000 | 1.89 |
| P-42 | 11500 | 1.44 |
| P-43 | 12000 | 1.49 |
| P-44 | 9500 | 1.51 |
| P-47 | 8000 | 1.46 |
| P-51 | 16500 | 1.60 |
| P-53 | 15000 | 1.85 |
| P-57 | 13000 | 1.52 |
| P-61 | 10000 | 1.54 |
| P-62 | 11000 | 1.46 |
| P-63 | 10500 | 1.47 |
| P-64 | 13000 | 1.50 |
| P-71 | 12000 | 1.51 |
| P-72 | 13000 | 1.55 |
| P-73 | 14000 | 1.58 |
| P-77 | 15000 | 1.60 |

TABLE 2

| | Weight average mloecular weight | Polydispersity |
|---|---|---|
| P-66 | 13000 | 1.57 |
| P-78 | 14000 | 1.61 |
| P-79 | 13500 | 1.60 |
| P-80 | 15000 | 1.54 |
| P-81 | 14500 | 1.52 |
| P-82 | 16000 | 1.58 |
| P-83 | 15000 | 1.55 |
| P-84 | 20000 | 1.75 |
| P-85 | 19000 | 1.72 |

TABLE 2-continued

| | Weight average mloecular weight | Polydispersity |
|---|---|---|
| P-86 | 22000 | 1.82 |
| P-87 | 21000 | 1.80 |
| P-88 | 15000 | 1.50 |
| P-89 | 13000 | 1.44 |
| P-90 | 14000 | 1.46 |
| P-91 | 16000 | 1.58 |

As for the Comparative Examples, the following resin C-1 was synthesized according to the above-described method and used in the Examples as described below. The polymer structure, the weight average molecular weight (Mw) and the polydispersity (Mw/Mn) of resin C-1 are shown below. Further, the composition ratio of each repeating unit of the polymer structure is shown in the molar ratio.

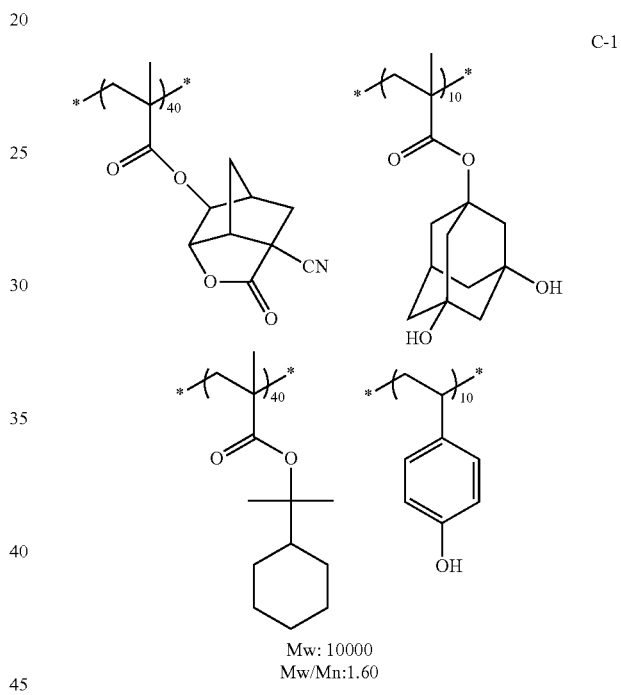

Mw: 10000
Mw/Mn: 1.60

[Hydrophobic Resin]

The hydrophobic resin was appropriately selected from the above-examplified hydrophobic resins HR-1 to HR-34 and then used.

Hereinafter, the composition ratio (molar ratio) of the hydrophobic resin, the weight average molecular weight (Mw) and the polydispersity (Mw/Mn) will be described.

TABLE 3

| Added polymer | Composition Ratio % (From left) | | Weight average molecular weight | poly-dispersity |
|---|---|---|---|---|
| HR-1 | 90 | 10 | 8000 | 1.5 |
| HR-24 | 50 | 50 | 20000 | 1.6 |
| HR-28 | 80 | 30 | 5000 | 1.45 |
| HR-29 | 10 | 90 | 12000 | 1.47 |

[Photo-Acid Generator]

The photo-acid generator was appropriately selected from the above-examplified acid generators z1 to z141, and then used.

[Basic Compound]

As a basic compound, anything of the following compounds (N-1) to (N-11) was used.

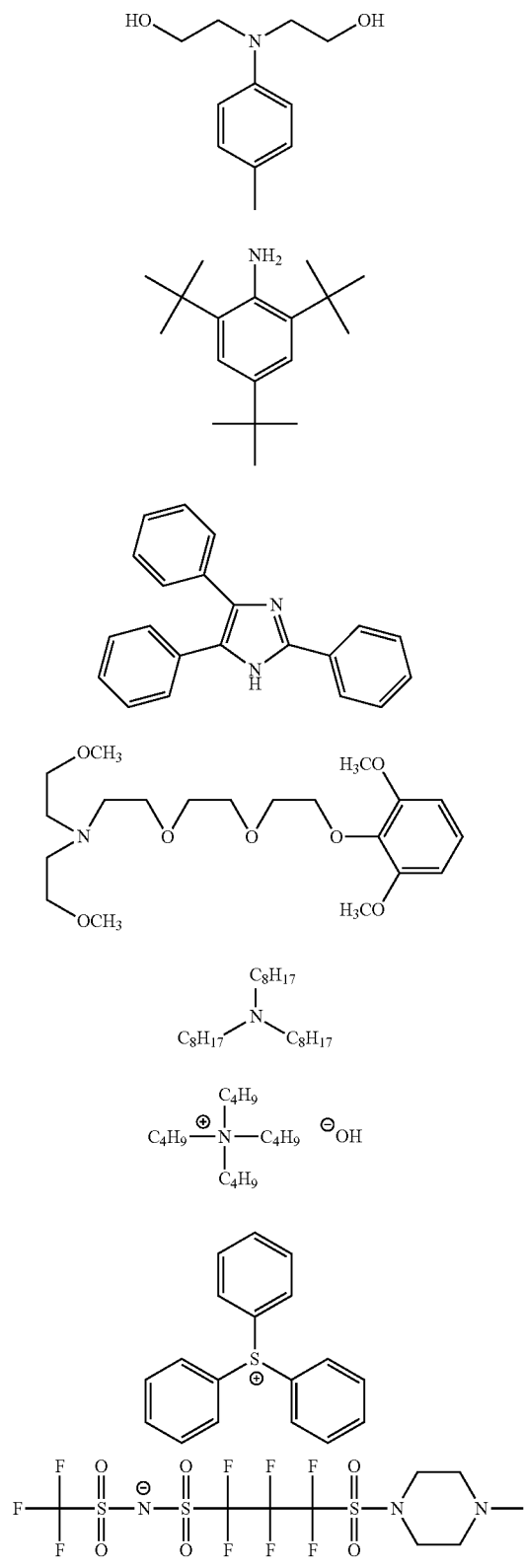

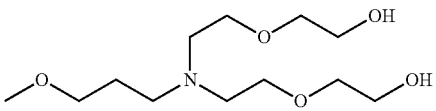

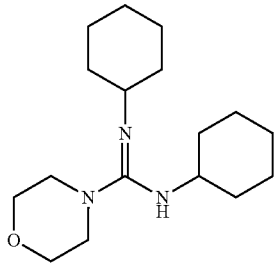

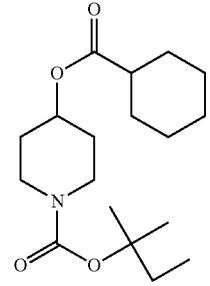

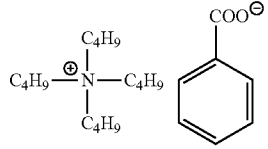

In addition, the compound (N-7) corresponds to the compound (PA), and was synthesized based on the description of [0354] in Japanese Patent Application Laid-Open No. 2006-330098.

[Surfactants]

The followings W-1 to W-4 are used as the surfactant.

W-1: Megaface F176 (manufactured by DIC Corporation; fluorine-based)

W-2: Megaface R08 (manufactured by DIC Corporation; fluorine and silicon-based)

W-3: Polysiloxane Polymer KP-341 (manufactured by Shin-Etsu Chemical Co., Ltd.; silicon-based)

W-4: PF6320 (manufactured by OMNOVA Solutions Inc.; fluorine-based)

<Coating Solvent>

The followings are used as the applying solvent.

S1: Propylene glycol monomethyl ether acetate (PGMEA)

S2: Propylene glycol monomethyl ether (PGME)

S3: Ethyl lactate

S4: Cyclohexanone

<Developer>

The followings are used as the developer.

SG-1: 2-nonanone

SG-2: Methyl amyl ketone (2-Heptanone)

SG-3: Butyl acetate

TMAH: 2.38% by mass of Tetramethyl ammonium hydroxyde aqueous solution

<Rinse Liquid>
The followings are used as the rinse liquid.
SR-1: 4-methyl-2-pentanol
SR-2: 1-hexanol
SR-3: Methyl isobutyl carbinol
[Electron Beam (EB) Exposure, an Organic Solvent Development, Isolated Space Evaluation]
(1) Preparation and Coating of an Electron Beam-Sensitive or Extreme Ultraviolet Ray-Sensitive Resin Composition The coating solution composition having a solid of 3% by mass, which has the composition shown in the following Table, was microfilted through the membrane filter having a pore size of 0.1 μm to obtain an electron beam-sensitive or extreme ultraviolet ray-sensitive resin composition (resist composition) solution.

The electron beam-sensitive or extreme ultraviolet ray-sensitive resin composition was applied on 6-inch Si wafer treated with hexamethyl disilazane (HMDS) previously by using the spin coater Mark8 manufactured by Tokyo Electron, and dried on a hot plate at 100° C. over 60 seconds to obtain a resist film having a film thickness of 50 nm.
(2) EB Exposure and Development Example 1-1 to 1-60, Comparative Example 1-1

The wafer coated with the resist film obtained in the above step (1) was subjected to pattern irradiation by using an electron beam drawing apparatus (HL750 manufactured by Hitachi, Ltd., acceleration voltage of 50 KeV). At this time, the drawing was performed to form an isolated space of line/space=100:1. After the electron beam drawing, the film was heated on a hot plate at 110° C. over 60 seconds, developed for 30 seconds by paddling in the organic developer described in the following table, rinsed with the rinse liquid described in the following table. The wafer was rotated at a rotational speed of 4,000 rpm for 30 seconds, and heated at 90° C. for 60 seconds to obtain a resist pattern having an isolated space of line/space=100:1.

Comparative Example 1-2, 1-3

The preparation of an electron beam-sensitive or extreme ultraviolet ray-sensitive resin composition and the pattern formation were conducted in the same manner as in Examples 1-1 to 1-60 and Comparative Example 1-1, except that the composition was changed as shown in the following table, the drawing area was inverted upon the irradiation of an electron beam, and subjected to a development by the alkali aqueous solution (TMAH; 2.38% by mass tetramethylammoniumhydroxide aqueous solution) instead of organic developer, and water was used as the rinse liquid.
(3) Evaluation of a Resist Pattern The resist pattern obtained was evaluated with respect to the sensitivity, the resolution in the isolated space, and the space width roughness by using a scanning electron microscope (S-9220 manufactured by Hitachi, Ltd.)
(3-1) Sensitivity The irradiation energy when resolving the pattern (line/space=1:1) having a line width of 100 nm was designated as a sensitivity (Eop). The smaller the value is, the better the sensitivity performance indicates.
(3-2) Resolution in the Isolated Space The limiting resolution (the minimum space width at which the line and the space are separately resolved) of the isolated space (line/space=100:1) in the Eop was obtained, and it was designated as a "resolution (nm)," The smaller the value is, the better the resolution performance indicates.
(3-3) Space Width Roughness For the space width roughness in the above Eop, the space width was calculated concerning arbitrary 50 points in 0.5 μm in the longitudinal direction of the resist pattern of the isolated space of line/space=100:1, and the standard deviation was obtained to calculate 36. The smaller the value is, the better the roughness performance indicates.

TABLE 4

| Ex | Resin (mass %) | Photo-acid generator (mass %) | Basic compound (mass %) | Solvent (mass %) | Surfactant (mass %) | Developer | Rinse liquid | Sensitivity (μC/cm$^2$) | Isolated space resolution (nm) | Space width roughness (nm) |
|---|---|---|---|---|---|---|---|---|---|---|
| Ex. 1-1 | P-1 77.99 | z122 20 | N-6 2 | S1/S2 80/20 | W-4 0.01 | SG-3 | — | 23.9 | 75.0 | 6.0 |
| Ex. 1-2 | P-2 77.99 | z122 20 | N-6 2 | S1/S2 80/20 | W-4 0.01 | SG-3 | — | 19.5 | 62.5 | 5.3 |
| Ex. 1-3 | P-3 77.99 | z122 20 | N-6 2 | S1/S2 80/20 | W-4 0.01 | SG-3 | — | 16.6 | 50.0 | 4.9 |
| Ex. 1-4 | P-4 77.99 | z121 20 | N-6 2 | S1/S2 80/20 | W-4 0.01 | SG-3 | — | 19.5 | 62.5 | 4.9 |
| Ex. 1-5 | P-5 77.99 | z121 20 | N-6 2 | S1/S2 80/20 | W-4 0.01 | SG-3 | — | 14.0 | 37.5 | 4.5 |
| Ex. 1-6 | P-6 77.99 | z121 20 | N-6 2 | S1/S2 80/20 | W-4 0.01 | SG-3 | — | 16.3 | 50.0 | 5.0 |
| Ex. 1-7 | P-7 77.99 | z126 20 | N-6 2 | S1/S2 80/20 | W-4 0.01 | SG-3 | — | 19.9 | 62.5 | 5.1 |
| Ex. 1-8 | P-8 77.99 | z126 20 | N-6 2 | S1/S2 80/20 | W-4 0.01 | SG-3 | — | 15.4 | 50.0 | 4.7 |
| Ex. 1-9 | P-9 77.99 | z126 20 | N-6 2 | S1/S2 80/20 | W-4 0.01 | SG-3 | — | 14.2 | 37.5 | 4.6 |
| Ex. 1-10 | P-10 77.99 | z126 20 | N-6 2 | S1/S2 80/20 | W-4 0.01 | SG-3 | — | 17.1 | 50 | 4.9 |
| Ex. 1-11 | P-11 76.00 | z2 20 | N-5 4 | S1/S2 60/40 | None | SG-2 | — | 16.3 | 62.5 | 5.3 |
| Ex. 1-12 | P-12 77.99 | z69 20 | N-3 2 | S1/S2 80/20 | W-1 0.01 | SG-3 | — | 16.5 | 50.0 | 4.9 |
| Ex. 1-13 | P-13 69.99 | z130 25 | N-7 5 | S1/S2 80/20 | W-2 0.01 | SG-3 | — | 14.2 | 37.5 | 4.8 |

TABLE 4-continued

| Ex | Resin (mass %) | Photo-acid generator (mass %) | Basic compound (mass %) | Solvent (mass %) | Surfactant (mass %) | Developer | Rinse liquid | Sensitivity ($\mu C/cm^2$) | Isolated space resolution (nm) | Space width roughness (nm) |
|---|---|---|---|---|---|---|---|---|---|---|
| Ex. 1-14 | P-14 83.99 | z18 15 | N-1 1 | S4 100 | W-4 0.01 | SG-3 | SR-1 | 22.1 | 62.5 | 5.6 |
| Ex. 1-15 | P-16 86.99 | z112 10 | N-10 3 | S1/S2 50/50 | W-4 0.01 | SG-3 | SR-2 | 25.5 | 75.0 | 5.9 |
| Ex. 1-16 | P-22 77.99 | z118 20 | N-8 2 | S1/S2 80/20 | W-4 0.01 | SG-2 | — | 17.3 | 50.0 | 5.2 |
| Ex. 1-17 | P-24 77.99 | z115 20 | N-8 2 | S1/S2 80/20 | W-4 0.01 | SG-3 | — | 14.3 | 37.5 | 4.5 |
| Ex. 1-18 | P-25/P-5 = 1/1 (mass ratio) 82.99 | z116 15 | N-6 2 | S1/S2 80/20 | W-4 0.01 | SG-1 | — | 15.8 | 50.0 | 4.9 |
| Ex. 1-19 | P-26 77.99 | z45/z69 = 1/1 (mass ratio) 20 | N-2 2 | S1/S2 50/50 | W-4 0.01 | SG-3 | — | 20.3 | 62.5 | 5.3 |
| Ex. 1-20 | P-28 77.99 | z121 20 | N-8 2 | S1/S2 80/20 | W-4 0.01 | SG-3 | — | 14.0 | 37.5 | 4.6 |
| Ex. 1-21 | P-29 75.99 | z114 20 | N-4 4 | S1/S2 80/20 | W-3 0.01 | SG-3 | SR-2 | 22.1 | 62.5 | 5.4 |
| Ex. 1-22 | P-30 77.99 | z117 20 | N-1 2 | S1/S2 50/50 | W-4 0.01 | SG-2 | — | 21.9 | 62.5 | 5.4 |
| Ex. 1-23 | P-31 77.99 | z124 20 | N-6 2 | S3 100 | W-4 0.01 | SG-3 | — | 19.0 | 62.5 | 5.4 |
| Ex. 1-24 | P-32 77.99 | z124 20 | N-6 2 | S1/S2 80/20 | W-4 0.01 | SG-3 | — | 15.7 | 50.0 | 4.9 |
| Ex. 1-25 | P-33 67.99 | z125 30 | N-8 2 | S1/S2 80/20 | W-4 0.01 | SG-3 | — | 16.0 | 50.0 | 5.0 |
| Ex. 1-26 | P-34 78.00 | z108 20 | N-8 2 | S1/S2 80/20 | None | SG-3 | — | 19.8 | 62.5 | 5.3 |
| Ex. 1-27 | P-35 77.99 | z108 20 | N-8 2 | S1/S2 80/20 | W-4 0.01 | SG-3 | — | 15.5 | 50.0 | 4.9 |
| Ex. 1-28 | P-38 77.99 | z108 20 | N-8 2 | S1/S2 80/20 | W-4 0.01 | SG-3 | — | 15.9 | 50.0 | 5.0 |
| Ex. 1-29 | P-37 77.99 | z4/z10 = 1/1 (mass ratio) 20 | N-5 2 | S1/S2 50/50 | W-2 0.01 | SG-3 | SR-3 | 26.1 | 75.0 | 6.1 |
| Ex. 1-30 | P-38 75.99 | z99 20 | N-10 4 | S1/S2 80/20 | W-4 0.01 | SG-2 | SR-1 | 19.7 | 62.5 | 5.5 |
| Ex. 1-31 | P-42 77.99 | z119 20 | N-8 2 | S1/S2 50/50 | W-1 0.01 | SG-1 | — | 20.3 | 62.5 | 5.5 |
| Ex. 1-32 | P-43 77.99 | z127 20 | N-9 2 | S1/S2 80/20 | W-4 0.01 | SG-3 | — | 16.7 | 50.0 | 5.2 |
| Ex. 1-33 | P-44 77.99 | z127 20 | N-9 2 | S1/S2 80/20 | W-4 0.01 | SG-3 | — | 17.4 | 50.0 | 5.0 |

TABLE 5

| Ex | Resin (mass %) | Photo-acid generator (mass %) | Basic compound (mass %) | Solvent (mass %) | Surfactant (mass %) | Developer | Rinse liquid | Sensitivity ($\mu C/cm^2$) | Isolated space resolution (nm) | Space width roughness (nm) |
|---|---|---|---|---|---|---|---|---|---|---|
| Ex. 1-34 | P-47 77.99 | z11 20 | N-4 2 | S1/S2 60/40 | W-4 0.01 | SG-2 | — | 23.0 | 62.5 | 5.7 |
| Ex. 1-35 | P-51 76.99 | z120 20 | N-7 3 | S1/S2 80/20 | W-4 0.01 | SG-3 | — | 16.8 | 50.0 | 4.9 |
| Ex. 1-36 | P-53 77.99 | z19 20 | N-6 2 | S1/S2 80/20 | W-3 0.01 | SG-3 | SR-3 | 20.5 | 62.5 | 5.5 |
| Ex. 1-37 | P-57 77.99 | z123 20 | N-6 2 | S1/S2 80/20 | W-4 0.01 | SG-3 | — | 17.6 | 50.0 | 5.0 |
| Ex. 1-38 | P-61 77.99 | z112 20 | N-6 2 | S1/S4 80/20 | W-4 0.01 | SG-3 | — | 27.6 | 87.5 | 6.4 |
| Ex. 1-39 | P-62 77.99 | z123 20 | N-6 2 | S1/S2 80/20 | W-4 0.01 | SG-3 | — | 14.5 | 37.5 | 4.7 |
| Ex. 1-40 | P-63 77.99 | z125 20 | N-6 2 | S1/S2 80/20 | W-4 0.01 | SG-3 | — | 14.8 | 37.5 | 4.8 |
| Ex. 1-41 | P-64 77.99 | z122 20 | N-6 2 | S1/S2 60/40 | W-4 0.01 | SG-3 | — | 17.1 | 50.0 | 5.2 |
| Ex. 1-42 | P-71 76.99 | z120 20 | N-7 2 | S1/S2 80/20 | W-4 0.01 | SG-2 | — | 16.9 | 50.0 | 5.1 |
| Ex. 1-43 | P-72 97.99 | | N-8 2 | S1/S2 80/20 | W-4 0.01 | SG-3 | — | 15.5 | 50.0 | 4.7 |

TABLE 5-continued

| Ex | Resin (mass %) | Photo-acid generator (mass %) | Basic compound (mass %) | Solvent (mass %) | Surfactant (mass %) | Developer | Rinse liquid | Sensitivity ($\mu C/cm^2$) | Isolated space resolution (nm) | Space width roughness (nm) |
|---|---|---|---|---|---|---|---|---|---|---|
| Ex. 1-44 | P-73 97.99 | | N-3 4 | S1/S2 80/20 | W-1 0.01 | SG-3 | — | 16.5 | 50.0 | 4.9 |
| Ex. 1-45 | P-77 97.99 | | N-9 2 | S1/S2 80/20 | W-4 0.01 | SG-3 | — | 18.9 | 62.5 | 5.4 |
| Ex. 1-46 | P-66 66.99 | z132 30 | N-11 3 | S1/S2 80/20 | W-1 0.01 | SG-3 | — | 14.2 | 37.5 | 4.5 |
| Ex. 1-47 | P-78 68.99 | z132 30 | N-11 3 | S1/S2 80/20 | W-4 0.01 | SG-3 | — | 14.3 | 37.5 | 4.6 |
| Ex. 1-48 | P-79 72.99 | z133 25 | N-6 3 | S1/S2 80/20 | W-4 0.01 | SG-3 | — | 14.4 | 37.5 | 4.6 |
| Ex. 1-49 | P-80 77.99 | z108 20 | N-3 2 | S1/S2 60/40 | W-4 0.01 | SG-3 | — | 15.8 | 50.0 | 5.2 |
| Ex. 1-50 | P-81 66.99 | z133 30 | N-4 3 | S1/S2 80/20 | W-4 0.01 | SG-3 | SR-1 | 15.7 | 50.0 | 5.1 |
| Ex. 1-51 | P-82 67.99 | z132 30 | N-11 2 | S1/S2 80/20 | W-3 0.01 | SG-3 | SR-3 | 15.8 | 50.0 | 5.1 |
| Ex. 1-52 | P-83 72.99 | z130 25 | N-8 2 | S1/S2 80/20 | W-4 0.01 | SG-3 | — | 16.0 | 50.0 | 5.2 |
| Ex. 1-53 | P-84 76.99 | z128 20 | N-6 3 | S1/S4 80/20 | W-4 0.01 | SG-1 | — | 18.0 | 50.0 | 5.3 |
| Ex. 1-54 | P-85 76.99 | z112 20 | N-11 3 | S1/S2 80/20 | W-4 0.01 | SG-3 | — | 18.2 | 50.0 | 5.4 |
| Ex. 1-55 | P-86 77.99 | z117 20 | N-10 2 | S1/S2 80/20 | W-4 0.01 | SG-2 | — | 20.3 | 62.5 | 5.6 |
| Ex. 1-56 | P-87 77.99 | z124 20 | N-5 2 | S1/S2 60/40 | W-4 0.01 | SG-3 | SR-2 | 20.5 | 62.5 | 5.6 |
| Ex. 1-57 | P-88 97.99 | | N-6 2 | S1/S2 80/20 | W-4 0.01 | SG-3 | — | 15.5 | 50.0 | 5.0 |
| Ex. 1-58 | P-89 96.99 | | N-11 3 | S1/S2 50/50 | W-4 0.01 | SG-3 | — | 14.0 | 37.5 | 4.6 |
| Ex. 1-59 | P-90 97.99 | | N-11 2 | S1/S2 80/20 | W-1 0.01 | SG-3 | — | 15.7 | 50.0 | 5.0 |
| Ex. 1-60 | P-91 97.99 | | N-3 2 | S1/S2 80/20 | W-4 0.01 | SG-3 | — | 19.2 | 62.5 | 5.5 |
| C. Ex. 1-1 | C-1 77.99 | z121 20 | N-6 2 | S1/S2 80/20 | W-4 0.01 | SG-3 | — | 33.1 | 100.0 | 7.8 |
| C. Ex. 1-2 | P-1 77.99 | z122 20 | N-6 2 | S1/S2 80/20 | W-4 0.01 | TMAH (Positive) | water | 32.9 | 100.0 | 8.1 |
| C. Ex. 1-3 | P-4 77.99 | z121 20 | N-6 2 | S1/S2 80/20 | W-4 0.01 | TMAH (Positive) | water | 28.8 | 87.5 | 8.0 |

As apparent from the results shown in the Table, it may be known that in Comparative Examples 1-2 and 1-3 which were subjected to an alkali aqueous solution development, the sensitivity and the isolated space resolution were deteriorated and the space width roughness was large.

On the one hand, it may be known that in Examples 1-1 to 1-60 of the present invnetion which were subjected to an organic solvent development, the sensitivity and the isolated space resolution were excellent and the space width roughness was small. It is thought that the swelling and the surface tension of the resin (A) may be reduced by using an organic solvent development, and thus, it becomes advantageous to the isolated space resolution or the space width roughness.

Further, it may be known that in Comparative Example 1-1 which used resin C-1 (corresponding to resin (A1-1) described in Patent Document 2 (Japanese Patent Application Laid-Open No. 2010-217884)), the sensitivity and the isolated space resolution were deteriorated, and the space width roughness was large.

On the other hand, it may be known that in Examples 1-1 to 1-60 of the present invention, among an organic solvent developments, the sensitivity and the isolated space resolution were excellent and the space width roughness was small. It is thought that the resin (A) of the present invention has less activation energy (Ea) of the acid decomposition reaction compared to resin C-1, and contains 45 mol % or more of the repeating unit represented by the above Formula (1-0), and thus it has a high sensitivity and a high contrast. As a result, it is thought that the isolated space resolution is excellent, and space width roughness becomes small.

In particular, it may be known that this effect these effects tend to be more significant when using the compounded represented by Formula (3-1) or (3-2) as an acid generator.

[Extreme Ultraviolet(EUV) Exposure, an Organic Solvent Development, Isolated Space Evaluation]

(4) Preparation and Coating of an Electron Beam-Sensitive or Extreme Ultraviolet Ray-Sensitive Resin Composition The coating solution composition having a solid of 2.5% by mass, which has the composition shown in the following Table, was microfilted through the membrane filter having a pore size of 0.05 µm to obtain an electron beam-sensitive or extreme ultraviolet ray-sensitive resin composition (resist composition) solution.

The electron beam-sensitive or extreme ultraviolet ray-sensitive resin composition was applied on 6 inch Si wafer treated with hexamethyl disilazane (HMDS) previously by using the spin coater Mark8 manufactured by Tokyo Electron, and dried on a hot plate at 100° C. over 60 seconds to obtain a resist film having a film thickness of 50 nm.

(5) EUV Exposure and Development

Examples 2-1 to 2-64 and Comparative Examples 2-1

The wafer coated with the resist film obtained in the above step (4) was subjected to pattern exposure by using an EUV exposure apparatus (Micro Exposure Tool, NA 0.3, X-dipole, outer sigma 0.68, inner sigma 0.36, manufactured by Exitech Corporation) and a exposure mask (line/space=5/1). After the irradiation, the film was heated on a hot plate at 110° C. over 60 seconds, developed for 30 seconds by paddling in the organic developer described in the following table, rinsed with the rinse liquid described in the following table. The wafer was rotated at a rotational speed of 4,000 rpm for 30 seconds, and baked at 90° C. for 60 seconds to obtain a resist pattern having an isolated space of line/space=5:1.

Comparative Examples 2-2 and 2-3

The preparation of an electron beam-sensitive or extreme ultraviolet ray-sensitive resin composition and the pattern formation were conducted in the same manner as in Examples 2-1 to 2-64 and Comparative Example 2-1, except that the composition was changed as shown in the following table, the pattern exposure was conducted by using an exposure mask to invert the pattern of exposure mask, and the development was performed by the alkali aqueous solution (TMAH; 2.38% by mass tetramethylammoniumhydroxide aqueous solution) instead of organic developer, and water was used as the rinse liquid.

(6) Evaluation of a Resist Pattern

The resist pattern obtained was evaluated about the sensitivity, the resolution, and LWR by using a scanning electron microscope (S-9380II manufactured by Hitachi, Ltd.)

(6-1) Sensitivity

The irradiation energy when resolving the pattern (line/space=1:1) having a line width of 50 nm was designated as a sensitivity (Eop). The smaller the value is, the better the sensitivity performance indicates.

(6-2) Resolution in the Isolated Space

The limiting resolution (the minimum line width at which the line and the space are separately resolved) of the isolated space (line/space=5:1) in the above Eop was obtained, and it was designated as a "resolution (nm)," The smaller the value is, the better the resolution performance indicates.

(6-3) Space Width Roughness

About the space width roughness in the above Eop, the line width was calculated concerning arbitrary 50 points in 0.5 μm in the longitudinal direction of the resist pattern of the isolated space of line/space=5:1, and the standard deviation was obtained to calculate 3σ. The smaller the value is, the better the roughness performance indicates.

TABLE 6

| Ex | Resin (mass %) | Photo-acid generator (mass %) | Basic compound (mass %) | Hydrophobic resin | Solvent (mass %) | Surfactant (mass %) | Developer | Rinse solution | Sensitivity (μC/cm$^2$) | Isolated space resolution (nm) | Space width roughness (nm) |
|---|---|---|---|---|---|---|---|---|---|---|---|
| Ex. 2-1 | P-1 77.99 | z122 20 | N-6 2 | — | S1/S2 80/20 | W-4 0.01 | SG-3 | — | 21.9 | 36.0 | 5.0 |
| Ex. 2-2 | P-2 77.99 | z122 20 | N-6 2 | — | S1/S2 80/20 | W-4 0.01 | SG-3 | — | 18.0 | 32.0 | 4.5 |
| Ex. 2-3 | P-3 77.99 | z122 20 | N-6 2 | — | S1/S2 80/20 | W-4 0.01 | SG-3 | — | 13.6 | 29.0 | 4.1 |
| Ex. 2-4 | P-4 77.99 | z121 20 | N-6 2 | — | S1/S2 80/20 | W-4 0.01 | SG-3 | — | 18.5 | 33.0 | 4.7 |
| Ex. 2-5 | P-5 77.99 | z121 20 | N-6 2 | — | S1/S2 80/20 | W-4 0.01 | SG-3 | — | 11.0 | 26.0 | 3.5 |
| Ex. 2-6 | P-6 77.99 | z121 20 | N-6 2 | — | S1/S2 80/20 | W-4 0.01 | SG-3 | — | 13.2 | 28.0 | 3.9 |
| Ex. 2-7 | P-7 77.99 | z126 20 | N-6 2 | — | S1/S2 80/20 | W-4 0.01 | SG-3 | — | 18.8 | 33.0 | 4.7 |
| Ex. 2-8 | P-8 77.99 | z126 20 | N-6 2 | — | S1/S2 80/20 | W-4 0.01 | SG-3 | — | 13.2 | 27.0 | 3.9 |
| Ex. 2-9 | P-9 77.99 | z126 20 | N-6 2 | — | S1/S2 80/20 | W-4 0.01 | SG-3 | — | 11.3 | 26.0 | 3.6 |
| Ex. 2-10 | P-10 77.99 | z126 20 | N-6 2 | — | S1/S2 80/20 | W-4 0.01 | SG-3 | — | 15.2 | 29.0 | 4.0 |
| Ex. 2-11 | P-11 76.00 | z2 20 | N-5 4 | — | S1/S2 60/40 | None | SG-2 | — | 19.5 | 31.0 | 4.4 |
| Ex. 2-12 | P-12 77.99 | z69 20 | N-3 2 | — | S1/S2 80/20 | W-1 0.01 | SG-3 | — | 16.2 | 28.0 | 4.1 |
| Ex. 2-13 | P-13 69.99 | z130 25 | N-7 5 | — | S1/S2 80/20 | W-2 0.01 | SG-3 | — | 11.2 | 26.0 | 3.6 |
| Ex. 2-14 | P-14 83.99 | z18 15 | N-1 1 | — | S4 100 | W-4 0.01 | SG-3 | SR-1 | 20.8 | 33.0 | 4.7 |
| Ex. 2-15 | P-16 86.99 | z112 20 | N-10 3 | — | S1/S2 50/50 | W-4 0.01 | SG-3 | SR-2 | 23.5 | 35.0 | 5.1 |
| Ex. 2-16 | P-22 77.99 | z118 20 | N-8 2 | — | S1/S2 80/20 | W-4 0.01 | SG-3 | — | 14.8 | 29.0 | 4.2 |
| Ex. 2-17 | P-24 77.99 | z115 20 | N-8 2 | — | S1/S2 80/20 | W-4 0.01 | SG-3 | — | 11.2 | 26.0 | 3.6 |
| Ex. 2-18 | P-25/P-5 = 1/1 (mass ratio) 82.99 | z116 15 | N-6 2 | — | S1/S2 80/20 | W-4 0.01 | SG-1 | — | 13.6 | 28.0 | 3.9 |
| Ex. 2-19 | P-26 77.99 | z45/z69 = 1/1 (mass ratio) 20 | N-2 2 | — | S1/S2 50/50 | W-4 0.01 | SG-3 | — | 17.5 | 31.0 | 4.3 |

TABLE 6-continued

| Ex | Resin (mass %) | Photo-acid generator (mass %) | Basic compound (mass %) | Hydro-phobic resin | Solvent (mass %) | Surfactant (mass %) | Developer | Rinse solution | Sensitivity ($\mu C/cm^2$) | Isolated space resolution (nm) | Space width roughness (nm) |
|---|---|---|---|---|---|---|---|---|---|---|---|
| Ex. 2-20 | P-28 77.99 | z121 20 | N-8 2 | | S1/S2 80/20 | W-4 0.01 | SG-3 | — | 11.4 | 26.0 | 3.5 |
| Ex. 2-21 | P-29 75.99 | z114 20 | N-4 4 | | S1/S2 80/20 | W-3 0.01 | SG-3 | SR-2 | 18.6 | 31.0 | 4.4 |
| Ex. 2-22 | P-30 77.99 | z117 20 | N-1 2 | | S1/S2 50/50 | W-4 0.01 | SG-2 | — | 18.9 | 31.0 | 4.4 |
| Ex. 2-23 | P-31 77.99 | z124 20 | N-6 2 | | S3 100 | W-4 0.01 | SG-3 | — | 17.2 | 31.0 | 4.4 |
| Ex. 2-24 | P-32 77.99 | z124 20 | N-6 2 | | S1/S2 80/20 | W-4 0.01 | SG-3 | — | 13.0 | 28.0 | 3.9 |
| Ex. 2-25 | P-33 67.99 | z125 30 | N-8 2 | | S1/S2 80/20 | W-4 0.01 | SG-3 | — | 13.4 | 29.0 | 4.0 |
| Ex. 2-26 | P-34 78.00 | z108 20 | N-8 2 | | S1/S2 80/20 | None | SG-3 | — | 18.2 | 31.0 | 4.3 |
| Ex. 2-27 | P-35 77.99 | z108 20 | N-8 2 | | S1/S2 80/20 | W-4 0.01 | SG-3 | — | 12.8 | 28.0 | 3.9 |
| Ex. 2-28 | P-36 77.99 | z108 20 | N-8 2 | | S1/S2 80/20 | W-4 0.01 | SG-3 | — | 13.2 | 29.0 | 4.0 |
| Ex. 2-29 | P-37 77.99 | z4/z10 = 1/1 (mass ratio) 20 | N-5 2 | | S1/S2 50/50 | W-2 0.01 | SG-3 | SR-3 | 23.6 | 35.0 | 5.2 |
| Ex. 2-30 | P-38 75.99 | z94 20 | N-10 4 | | S1/S2 80/20 | W-4 0.01 | SG-2 | SR-1 | 17.8 | 30.0 | 4.5 |
| Ex. 2-31 | P-42 77.99 | z119 20 | N-8 2 | | S1/S2 50/50 | W-1 0.01 | SG-1 | — | 17.7 | 32.0 | 4.5 |
| Ex. 2-32 | P-43 77.99 | z127 20 | N-9 2 | | S1/S2 80/20 | W-4 0.01 | SG-3 | — | 13.8 | 30.0 | 4.2 |
| Ex. 2-33 | P-44 77.99 | z127 20 | N-9 2 | | S1/S2 80/20 | W-4 0.01 | SG-3 | — | 13.5 | 29.0 | 4.0 |

TABLE 7

| Ex | Resin (mass %) | Photo-acid generator (mass %) | Basic compound (mass %) | Hydro-phobic resin | Solvent (mass %) | Surfactant (mass %) | Developer | Rinse liquid | Sensitivity ($\mu C/cm^2$) | Isolated space resolution (nm) | Space width roughness (nm) |
|---|---|---|---|---|---|---|---|---|---|---|---|
| Ex. 2-34 | P-47 77.99 | z11 20 | N-4 2 | | S1/S2 60/40 | W-4 0.01 | SG-2 | — | 20.5 | 33.0 | 4.7 |
| Ex. 2-35 | P-51 76.99 | z120 20 | N-7 3 | | S1/S2 80/20 | W-4 0.01 | SG-3 | — | 14.0 | 29.0 | 3.9 |
| Ex. 2-36 | P-53 77.99 | z19 20 | N-6 2 | | S1/S2 80/20 | W-3 0.01 | SG-3 | SR-3 | 18.2 | 32.0 | 4.5 |
| Ex. 2-37 | P-57 77.99 | z123 20 | N-6 2 | | S1/S2 80/20 | W-4 0.01 | SG-3 | — | 15.0 | 29.0 | 4.0 |
| Ex. 2-38 | P-61 77.99 | z112 20 | N-6 2 | | S1/S4 80/20 | W-4 0.01 | SG-3 | — | 24.1 | 38.0 | 6.1 |
| Ex. 2-39 | P-62 77.99 | z123 20 | N-6 2 | | S1/S2 80/20 | W-4 0.01 | SG-3 | — | 12.2 | 27.0 | 3.7 |
| Ex. 2-40 | P-63 77.99 | z125 20 | N-6 2 | | S1/S2 80/20 | W-4 0.01 | SG-3 | — | 12.5 | 27.0 | 3.7 |
| Ex. 2-41 | P-64 77.99 | z122 20 | N-6 2 | | S1/S2 60/40 | W-4 0.01 | SG-3 | — | 15.4 | 29.0 | 4.2 |
| Ex. 2-42 | P-71 76.99 | z120 20 | N-7 3 | | S1/S2 80/20 | W-4 0.01 | SG-2 | — | 15.1 | 29.0 | 4.2 |
| Ex. 2-43 | P-72 97.99 | | N-8 2 | | S1/S2 80/20 | W-4 0.01 | SG-3 | — | 12.8 | 28.0 | 3.9 |
| Ex. 2-44 | P-73 97.99 | | N-3 2 | | S1/S2 80/20 | W-1 0.01 | SG-3 | — | 12.7 | 28.0 | 3.9 |
| Ex. 2-45 | P-77 97.99 | | N-9 2 | | S1/S2 80/20 | W-4 0.01 | SG-3 | — | 17.5 | 31.0 | 4.3 |
| Ex. 2-46 | P-66 66.99 | z132 30 | N-11 3 | | S1/S2 80/20 | W-1 0.01 | SG-3 | — | 11.0 | 26.0 | 3.5 |
| Ex. 2-47 | P-78 66.99 | z132 30 | N-11 3 | | S1/S2 80/20 | W-4 0.01 | SG-3 | — | 11.3 | 26.0 | 3.6 |
| Ex. 2-48 | P-79 72.99 | z133 25 | N-6 2 | | S1/S2 80/20 | W-4 0.01 | SG-3 | — | 11.3 | 26.0 | 3.6 |
| Ex. 2-49 | P-80 77.99 | z108 20 | N-3 2 | | S1/S2 60/40 | W-4 0.01 | SG-3 | — | 14.2 | 29.0 | 4.2 |
| Ex. 2-50 | P-81 66.99 | z133 30 | N-4 3 | | S1/S2 80/20 | W-4 0.01 | SG-3 | SR-1 | 14.1 | 29.0 | 4.1 |

TABLE 7-continued

| Ex | Resin (mass %) | Photo-acid generator (mass %) | Basic compound (mass %) | Hydro-phobic resin (mass %) | Solvent (mass %) | Surfactant (mass %) | Developer | Rinse liquid | Sensitivity ($\mu C/cm^2$) | Isolated space resolution (nm) | Space width roughness (nm) |
|---|---|---|---|---|---|---|---|---|---|---|---|
| Ex. 2-51 | P-82 67.99 | z132 30 | N-11 2 | | S1/S2 80/20 | W-3 0.01 | SG-3 | SR-3 | 13.6 | 28.0 | 4.0 |
| Ex. 2-52 | P-83 72.99 | z130 25 | N-8 2 | | S1/S2 80/20 | W-4 0.01 | SG-3 | — | 13.5 | 28.0 | 4.0 |
| Ex. 2-53 | P-84 76.99 | z128 20 | N-6 3 | | S1/S4 80/20 | W-4 0.01 | SG-1 | — | 15.8 | 32.0 | 4.4 |
| Ex. 2-54 | P-85 76.99 | z112 20 | N-11 3 | | S1/S2 80/20 | W-4 0.01 | SG-3 | — | 16.0 | 32.0 | 4.3 |
| Ex. 2-55 | P-86 77.99 | z117 20 | N-10 2 | | S1/S2 80/20 | W-4 0.01 | SG-2 | — | 18.4 | 31.0 | 4.7 |
| Ex. 2-56 | P-87 77.99 | z124 20 | N-5 2 | | S1/S2 60/40 | W-4 0.01 | SG-3 | SR-2 | 18.2 | 31.0 | 4.6 |
| Ex. 2-57 | P-88 97.99 | | N-6 2 | | S1/S2 80/20 | W-4 0.01 | SG-3 | — | 13.4 | 28.0 | 4.5 |
| Ex. 2-58 | P-89 96.99 | | N-11 3 | | S1/S2 50/50 | W-4 0.01 | SG-3 | — | 11.0 | 26.0 | 3.6 |
| Ex. 2-59 | P-90 97.99 | | N-11 3 | | S1/S2 80/20 | W-1 0.01 | SG-3 | — | 13.3 | 28.0 | 4.4 |
| Ex. 2-60 | P-91 97.99 | | N-3 2 | | S1/S2 80/20 | W-4 0.01 | SG-3 | — | 17.1 | 26.0 | 4.8 |
| Ex. 2-61 | P-5 67.99 | z121 20 | N-6 2 | | S1/S2 80/20 | W-4 0.01 | SG-3 | — | 10.9 | 24.0 | 3.3 |
| Ex. 2-62 | P-13 64.99 | z130 25 | N-7 5 | | S1/S2 50/50 | W-2 0.01 | SG-3 | — | 11.1 | 24.0 | 3.4 |
| Ex. 2-63 | P-62 68.99 | z123 20 | N-6 2 | | S1/S2 80/20 | W-4 0.01 | SG-3 | — | 12.3 | 24.0 | 3.5 |
| Ex. 2-64 | P-89 88.99 | | N-11 3 | | S1/S2 50/50 | W-4 0.01 | SG-3 | — | 10.8 | 24.0 | 3.4 |
| C, Ex. 2-1 | C-1 77.99 | z121 20 | N-6 2 | | S1/S2 80/20 | W-4 0.01 | SG-3 | — | 30.0 | 44.0 | 7.0 |
| C, Ex 2-2 | P-1 77.99 | z122 20 | N-6 2 | | S1/S2 80/20 | W-4 0.01 | TMAH (positive) | water | 28.9 | 48.0 | 7.2 |
| C, Ex. 2-3 | P-4 77.99 | z121 20 | N-6 2 | | S1/S2 80/20 | W-4 0.01 | TMAH (positive) | water | 25.5 | 46.0 | 7.3 |

As apparent from the results shown in the Table, it may be known that in Comparative Examples 2-2 and 2-3 where an alkali aqueous solution development was conducted, the sensitivity and the isolated space resolution were deteriorated and the space width roughness was large.

On the one hand, it may be known that in Examples 2-1 to 2-64 of the present invention where an organic solvent development was conducted, the sensitivity and the isolated space resolution were excellent and the space width roughness was small. It is thought that the swelling and the surface tension of the resin (A) may be reduced by using an organic solvent development, and thus it becomes advantageous to the isolated space resolution or the space width roughness.

Further, it may be known that in Comparative Example 2-1 where resin C-1 (corresponding to resin (A1-1) described in Patent Document 2) was used, the sensitivity and the isolated space resolution were deteriorated, and the space width roughness was large.

On the other hand, it may be known that in Examples 2-1 to 2-64 of the present invention, among an organic solvent developments, the sensitivity and the isolated space resolution were excellent and the space width roughness was small. It is thought that the resin (A) of the present invention has less activation energy (Ea) of the acid decomposition reaction compared to resin C-1, and contains 45 mol % or more of the repeating unit represented by the above Formula (1-0), and thus it has a high sensitivity and a high contrast. As a result, it is thought that the isolated space resolution is excellent, and space width roughness becomes small.

In particular, it may be known that this effect these effects tend to be more significant when using the compound represented by Formula (3-1) or (3-2) as an acid generator.

Further, it may be known that in Examples 2-61 to 2-64 which use the electron beam-sensitive or extreme ultraviolet ray-sensitive resin composition containing the hydrophobic resin, compared to Examples 2-5, 2-13, 2-39, and 2-58 which use the electron beam-sensitive or extreme ultraviolet ray-sensitive resin composition containing the same components except that it does not contain the hydrophobic resin, each isolated space resolution was especially excellent and the space width roughness was especially small. It is thought that the occurrence of excess carboxylic acid in accordance of the over-processing of deprotection of the polymer on the surface of the resist film causes the reverse taper shaping of the formed pattern, and the hydrophobic resin was suppressed by ubiquitously covering the surface of the resis film.

In particular, it may be known that in the case where the pattern formation is conducted by the EUV exposure using the hydrophobic resin having an aromatic ring, the hydrophobic resin absorbs the out-of-band light, which prevents the reverse taper shaping or the surface roughness based on the occurrence of excess of the carboxylic acid on the surface, and thus the improvement of the isolated space resolution may be compatible with a higher level of the reduction of the space width roughness.

[Extreme Ultraviolet(EUV) Exposure, an Organic Solvent Development, Contact Hole Evaluation]

(7) Preparation and Coating of an Electron Beam-Sensitive or Extreme Ultraviolet Ray-Sensitive Resin Composition The coating solution composition having a solid of 2.5% by mass, which has the composition shown in the following Table, was microfilted through the membrane filter having a pore size of 0.05 μm to obtain an electron beam-sensitive or extreme ultraviolet ray-sensitive resin composition (resist composition) solution.

The electron beam-sensitive or extreme ultraviolet ray-sensitive resin composition was applied on 6-inch Si wafer treated with hexamethyl disilazane (HMDS) previously by using the spin coater Mark8 manufactured by Tokyo Electron, and dried on a hot plate at 100° C. over 60 seconds to obtain a resist film having a film thickness of 50 nm.

(8) EUV Exposure and Development

Examples 3-1 to 3-60 and Comparative Example 3-1

The wafer coated with the resist film obtained in the above step (7) was subjected to pattern exposure by using an EUV exposure apparatus (Micro Exposure Tool, NA 0.3, Quadrupole, outer sigma 0.68, inner sigma 0.36, manufactured by Exitech Corporation) through a halftone mask having a square arrangement in which a hole portion is 36 nm and a pitch between holes is 72 nm (here, a portion corresponding to the hole is light-shielded in order to form a negative image). After the irradiation, the film was heated on a hot plate at 110° C. over 60 seconds, developed for 30 seconds by paddling in the organic developer described in the following table, rinsed with the rinse liquid described in the following table. The wafer was rotated at a rotational speed of 4,000 rpm for 30 seconds, and baked at 90° C. for 60 seconds to obtain a contact hole pattern having a pore diameter of 36 nm. The used exposure amount was designated to an optimal exposure amount.

Comparative Examples 3-2 and 3-3

The preparation of an electron beam-sensitive or extreme ultraviolet ray-sensitive resin composition and the pattern formation were conducted in the same manner as in Examples 3-1 to 3-60 and Comparative Example 3-1, except that the composition was changed as shown in the following table, the pattern exposure was conducted by using a halftone mask to invert the pattern of a halftone mask, and the development was performed by the alkali aqueous solution (TMAH; 2.38% by mass tetramethylammoniumhydroxide aqueous solution) instead of organic developer, and water was used as the rinse liquid.

(8-1) Exposure Latitude (EL, %)

A hole size is observed by a Critical Dimension scanning electron microscope (SEM) (S-9380II manufactured by Hitachi, Ltd.), and an optimal exposure amount at the time of resolving a contact hole pattern having an average hole portion of 36 nm was designated to the sensitivity ($E_{opt}$) (mJ/cm$^2$). An exposure amount was obtained when the obtained optimal exposure amount ($E_{opt}$) was used as a reference and subsequently, the hole size becomes 36 nm±10% (that is, 39.6 nm and 32.4 nm) which was a target value. Further, the exposure latitude (EL, %) defined as the following equation was calculated. The larger EL value was, the smaller the change in performance caused by a change in exposure amount was and the better the EL was.

$[EL(\%)]=[$(an exposure amount when the hole portion is 32.4 nm)−(an exposure amount when the hole portion is 39.6 nm)$]/E_{opt}×100$ (8-2) Uniformity of Local Pattern Dimension (Local CDU, nm)

Within one shot exposed as the optimal exposure amount in the exposure latitude evaluation, in twenty regions having an interval of 1 μm therebetween, hole sizes at arbitrary 25 points in each region (that is, 500 points in total) were measured and a standard deviation thereof was obtained to calculate 3σ. The smaller the value is, the smaller the variation in dimension is and the better the performance is.

(8-3) Minimun Dimention Evaluation (a Contact Hole Pattern Resolution Evaluation) (unit: nm)

The resist film obtained using the electron beam-sensitive or extreme ultraviolet ray-sensitive resin composition Example and Comparative Example was subjected to an exposure by changing the exposure amount. A hole diameter of the obtained isolated hole pattern was observed and measured in dimension by a scanning electron microscope (SEM) (S-9380II manufactured by Hitachi, Ltd.), and the minimal pattern dimension which the isolated hole pattern was subjected to resolution was obtained. The smaller the measured value is, the better the pattern resolution indicates.

TABLE 8

| Ex | Resin (mass %) | Photo-acid generator (mass %) | Basic compound (mass %) | Solvent (mass %) | Surfactant (mass %) | Developer | Rinse liquid | Contact hole resolution (nm) | Contact hole EL (%) | Local-CDU |
|---|---|---|---|---|---|---|---|---|---|---|
| Ex. 3-1 | P-1 77.99 | z122 20 | N-6 2 | S1/S2 80/20 | W-4 0.01 | SG-3 | — | 30 | 16.6 | 5.7 |
| Ex. 3-2 | P-2 77.99 | z122 20 | N-6 2 | S1/S2 80/20 | W-4 0.01 | SG-3 | — | 28 | 17.2 | 5.1 |
| Ex. 3-3 | P-3 77.99 | z122 20 | N-6 2 | S1/S2 80/20 | W-4 0.01 | SG-3 | — | 26 | 17.7 | 4.7 |
| Ex. 3-4 | P-4 77.99 | z121 20 | N-6 2 | S1/S2 80/20 | W-4 0.01 | SG-3 | — | 28 | 17.2 | 5.1 |
| Ex. 3-5 | P-5 77.99 | z121 20 | N-6 2 | S1/S2 80/20 | W-4 0.01 | SG-3 | — | 24 | 18.0 | 4.4 |
| Ex. 3-6 | P-6 77.99 | z121 20 | N-6 2 | S1/S2 80/20 | W-4 0.01 | SG-3 | — | 26 | 17.5 | 4.7 |
| Ex. 3-7 | P-7 77.99 | z126 20 | N-6 2 | S1/S2 80/20 | W-4 0.01 | SG-3 | — | 28 | 17.0 | 5.2 |
| Ex. 3-8 | P-8 77.99 | z126 20 | N-6 2 | S1/S2 80/20 | W-4 0.01 | SG-3 | — | 26 | 17.6 | 4.7 |
| Ex. 3-9 | P-9 77.99 | z126 20 | N-6 2 | S1/S2 80/20 | W-4 0.01 | SG-3 | — | 24 | 17.9 | 4.5 |
| Ex. 3-10 | P-10 77.99 | z126 20 | N-6 2 | S1/S2 80/20 | W-4 0.01 | SG-3 | — | 26 | 17.3 | 5.0 |
| Ex. 3-11 | P-11 76.00 | z2 20 | N-5 4 | S1/S2 60/40 | None | SG-2 | — | 28 | 16.8 | 5.3 |

TABLE 8-continued

| Ex | Resin (mass %) | Photo-acid generator (mass %) | Basic compound (mass %) | Solvent (mass %) | Surfactant (mass %) | Developer | Rinse liquid | Contact hole resolution (nm) | Contact hole EL (%) | Local-CDU |
|---|---|---|---|---|---|---|---|---|---|---|
| Ex. 3-12 | P-12 77.99 | z69 20 | N-3 2 | S1/S2 80/20 | W-1 0.01 | SG-3 | — | 26 | 17.3 | 4.7 |
| Ex. 3-13 | P-13 69.99 | z130 25 | N-7 5 | S1/S2 80/20 | W-2 0.01 | SG-3 | — | 26 | 16.7 | 4.9 |
| Ex. 3-14 | P-14 83.99 | z18 15 | N-1 1 | S4 100 | W-4 0.01 | SG-3 | SR-1 | 28 | 16.8 | 5.5 |
| Ex. 3-15 | P-16 86.99 | z112 10 | N-10 3 | S1/S2 50/50 | W-4 0.01 | SG-3 | SR-2 | 30 | 16.4 | 5.8 |
| Ex. 3-16 | P-22 77.99 | z118 20 | N-8 2 | S1/S2 80/20 | W-4 0.01 | SG-3 | — | 26 | 17.4 | 4.7 |
| Ex. 3-17 | P-24 77.99 | z115 20 | N-8 2 | S1/S2 80/20 | W-4 0.01 | SG-3 | — | 24 | 17.9 | 4.5 |
| Ex. 3-18 | P-25/P-5 = 1/1 (mass ratio) 82.99 | z116 15 | N-6 2 | S1/S2 80/20 | W-4 0.01 | SG-1 | — | 26 | 17.6 | 4.8 |
| Ex. 3-19 | P-26 77.99 | z45/z69 = 1/1 (mass ratio) 20 | N-2 2 | S1/S2 50/50 | W-4 0.01 | SG-3 | — | 28 | 17.2 | 5.1 |
| Ex. 3-20 | P-28 77.99 | z121 20 | N-8 2 | S1/S2 80/20 | W-4 0.01 | SG-3 | — | 24 | 18.0 | 4.5 |
| Ex. 3-21 | P-29 75.99 | z114 20 | N-4 4 | S1/S2 80/20 | W-3 0.01 | SG-3 | SR-2 | 28 | 16.7 | 5.3 |
| Ex. 3-22 | P-30 77.99 | z117 20 | N-1 2 | S1/S2 50/50 | W-4 0.01 | SG-2 | — | 28 | 16.9 | 5.2 |
| Ex. 3-23 | P-31 77.99 | z124 20 | N-6 2 | S3 100 | W-4 0.01 | SG-3 | — | 28 | 17.2 | 5.1 |
| Ex. 3-24 | P-32 77.99 | z124 20 | N-6 2 | S1/S2 80/20 | W-4 0.01 | SG-3 | — | 26 | 17.6 | 4.7 |
| Ex. 3-25 | P-33 67.99 | z125 30 | N-8 2 | S1/S2 80/20 | W-4 0.01 | SG-3 | — | 26 | 17.5 | 4.8 |
| Ex. 3-26 | P-34 78.00 | z108 20 | N-8 2 | S1/S2 80/20 | None | SG-3 | — | 28 | 17.3 | 5.0 |
| Ex. 3-27 | P-35 77.99 | z108 20 | N-8 2 | S1/S2 80/20 | W-4 0.01 | SG-3 | — | 26 | 17.6 | 4.6 |
| Ex. 3-28 | P-36 77.99 | z108 20 | N-8 2 | S1/S2 80/20 | W-4 0.01 | SG-3 | — | 26 | 17.6 | 4.7 |
| Ex. 3-29 | P-37 77.99 | z4/z10 = 1/1 (mass ratio) 20 | N-5 2 | S1/S2 50/50 | W-2 0.01 | SG-3 | SR-3 | 30 | 16.5 | 5.8 |
| Ex. 3-30 | P-38 75.99 | z94 20 | N-10 4 | S1/S2 80/20 | W-4 0.01 | SG-2 | SR-1 | 28 | 17.0 | 5.3 |
| Ex. 3-31 | P-42 77.99 | z119 20 | N-8 2 | S1/S2 50/50 | W-1 0.01 | SG-1 | — | 28 | 17.1 | 5.1 |
| Ex. 3-32 | P-43 77.99 | z127 20 | N-9 2 | S1/S2 80/20 | W-4 0.01 | SG-3 | — | 26 | 17.5 | 4.9 |
| Ex. 3-33 | P-44 77.99 | z127 20 | N-9 2 | S1/S2 80/20 | W-4 0.01 | SG-3 | — | 26 | 17.6 | 4.8 |

TABLE 9

| Ex | Resin (mass %) | Photo-acid generator (mass %) | Basic compound (mass %) | Solvent (mass %) | Surfactant (mass %) | Developer | Rinse liquid | Contact hole resolution (nm) | Contact hole EL (%) | Local-CDU |
|---|---|---|---|---|---|---|---|---|---|---|
| Ex. 3-34 | P-47 77.99 | z11 20 | N-4 2 | S1/S2 60/40 | W-4 0.01 | SG-2 | — | 28 | 16.8 | 5.3 |
| Ex. 3-35 | P-51 76.99 | z120 20 | N-7 3 | S1/S2 80/20 | W-4 0.01 | SG-3 | — | 26 | 17.5 | 4.7 |
| Ex. 3-36 | P-53 77.99 | z19 20 | N-6 2 | S1/S2 80/20 | W-3 0.01 | SG-3 | SR-3 | 28 | 17.1 | 5.1 |
| Ex. 3-37 | P-57 77.99 | z123 20 | N-6 2 | S1/S2 80/20 | W-4 0.01 | SG-3 | — | 26 | 17.5 | 4.8 |
| Ex. 3-38 | P-61 77.99 | z112 20 | N-6 2 | S1/S2 80/20 | W-4 0.01 | SG-3 | — | 32 | 16.0 | 6.2 |
| Ex. 3-39 | P-62 77.99 | z123 20 | N-6 2 | S1/S2 80/20 | W-4 0.01 | SG-3 | — | 24 | 17.7 | 4.5 |
| Ex. 3-40 | P-63 77.99 | z125 20 | N-6 2 | S1/S2 80/20 | W-4 0.01 | SG-3 | — | 24 | 17.8 | 4.5 |
| Ex. 3-41 | P-64 77.99 | z122 20 | N-6 2 | S1/S2 60/40 | W-4 0.01 | SG-3 | — | 26 | 17.4 | 4.9 |
| Ex. 3-42 | P-71 76.99 | z120 20 | N-7 3 | S1/S2 80/20 | W-4 0.01 | SG-2 | — | 26 | 17.3 | 4.9 |

TABLE 9-continued

| Ex | Resin (mass %) | Photo-acid generator (mass %) | Basic compound (mass %) | Solvent (mass %) | Surfactant (mass %) | Developer | Rinse liquid | Contact hole resolution (nm) | Contact hole EL (%) | Local-CDU |
|---|---|---|---|---|---|---|---|---|---|---|
| Ex. 3-43 | P-72 97.99 | | N-8 2 | S1/S2 80/20 | W-4 0.01 | SG-3 | — | 26 | 17.6 | 4.6 |
| Ex. 3-44 | P-73 97.99 | | N-3 2 | S1/S2 80/20 | W-1 0.01 | SG-3 | — | 26 | 17.6 | 4.7 |
| Ex. 3-45 | P-77 97.99 | | N-9 2 | S1/S2 80/20 | W-4 0.01 | SG-3 | — | 28 | 17.1 | 5.1 |
| Ex. 3-46 | P-66 66.99 | z132 30 | N-11 3 | S1/S2 80/20 | W-1 0.01 | SG-3 | — | 24 | 18.0 | 4.5 |
| Ex. 3-47 | P-78 66.99 | z132 30 | N-11 3 | S1/S2 80/20 | W-4 0.01 | SG-3 | — | 24 | 17.9 | 4.6 |
| Ex. 3-48 | P-79 72.99 | z133 25 | N-6 2 | S1/S2 80/20 | W-4 0.01 | SG-3 | — | 24 | 17.8 | 4.6 |
| Ex. 3-49 | P-80 77.99 | z108 20 | N-3 2 | S1/S2 60/40 | W-4 0.01 | SG-3 | — | 26 | 17.4 | 4.8 |
| Ex. 3-50 | P-81 66.99 | z133 30 | N-4 3 | S1/S2 80/20 | W-4 0.01 | SG-3 | SR-1 | 26 | 17.3 | 4.9 |
| Ex. 3-51 | P-82 67.99 | z132 30 | N-11 2 | S1/S2 80/20 | W-3 0.01 | SG-3 | SR-3 | 26 | 17.5 | 4.9 |
| Ex. 3-52 | P-83 72.99 | z130 25 | N-8 2 | S1/S2 80/20 | W-4 0.01 | SG-3 | — | 26 | 17.4 | 4.8 |
| Ex. 3-53 | P-84 76.99 | z128 20 | N-6 3 | S1/S2 80/20 | W-4 0.01 | SG-1 | — | 27 | 17.2 | 5.1 |
| Ex. 3-54 | P-85 76.99 | z112 20 | N-11 3 | S1/S2 80/20 | W-4 0.01 | SG-3 | — | 27 | 17.2 | 5.1 |
| Ex. 3-55 | P-86 77.99 | z117 20 | N-10 2 | S1/S2 80/20 | W-4 0.01 | SG-2 | — | 28 | 17.0 | 5.3 |
| Ex. 3-56 | P-87 77.99 | z124 20 | N-5 2 | S1/S2 60/40 | W-4 0.01 | SG-3 | SR-2 | 28 | 16.8 | 5.2 |
| Ex. 3-57 | P-88 97.99 | | N-6 2 | S1/S2 80/20 | W-4 0.01 | SG-3 | — | 26 | 17.4 | 4.8 |
| Ex. 3-58 | P-89 96.99 | | N-11 3 | S1/S2 50/50 | W-4 0.01 | SG-3 | — | 24 | 17.9 | 4.6 |
| Ex. 3-59 | P-90 97.99 | | N-11 2 | S1/S2 80/20 | W-1 0.01 | SG-3 | — | 26 | 17.5 | 4.9 |
| Ex. 3-60 | P-91 97.99 | | N-3 2 | S1/S2 80/20 | W-4 0.01 | SG-3 | — | 28 | 17.1 | 5.2 |
| C. Ex. 3-1 | C-1 77.99 | z121 20 | N-6 2 | S1/S2 80/20 | W-4 0.01 | SG-3 | — | 36 | 13.3 | 8.0 |
| C. Ex. 3-2 | P-1 77.99 | z122 20 | N-6 2 | S1/S2 80/20 | W-4 0.01 | TMAH (Positive) | water | 36 | 14.6 | 8.2 |
| C. Ex. 3-3 | P-4 77.99 | z121 20 | N-6 2 | S1/S2 80/20 | W-4 0.01 | TMAH (Positive) | water | 34 | 15.2 | 8.1 |

As apparent from the results shown in the Table, it may be known that in Comparative Examples 3-2 and 3-3 which conducted an alkali aqueous solution development, the resolution about the contact hole, exposure latitude (EL), and the uniformity of local pattern dimension (Local-CDU) were deteriorated.

On the one hand, it may be known that in Examples 3-1 to 3-60 of the present invnetion which conducted an organic solvent development, the resolution about the contact hole, EL, and Local-CDU were excellent. It is thought that the swelling and the surface tension of the resin (A) may be reduced by using an organic solvent development, and thus it becomes advantageous to the resolution about the contact hole, EL, and Local-CDU.

Further, it may be known that in Comparative Example 3-1 which used resin C-1 (corresponding to resin (A1-1) described in Patent Document 2), the resolution about the contact hole, EL, and Local-CDU were deteriorated.

On the other hand, it may be known that in Examples 3-1 to 3-60 of the present invention, among an organic solvent developments, the resolution about the contact hole, EL, and Local-CDU were excellent. It is thought that the resin (A) of the present invention has less activation energy (Ea) of the acid decomposition reaction compared to resin C-1, and contains 45 mol % or more of the repeating unit represented by the above Formula (1-0), and thus the effective diffusion length of the generated acid is short and the contrast is high. As a result, it is thought that the resolution about the contact hole, EL, and Local-CDU becomes improved.

In particular, it may be known that this effect these effects tend to be more significant when using the compouned represented by Formulas (3-1) or (3-2) as an acid generator.

INDUSTRIAL APPLICABILITY

According to the present invention, it is possible to provide a pattern forming method, an electron beam-sensitive or an extreme ultraviolet ray-sensitive resin composition, and a resist film, and a method for manufacturing an electronic device, and an electronic device using the same, in which the pattern forming method provides an excellent sensitivity, resolution, and space width roughness performance in the formation of fine isolated space patterns having a space width of 100 nm or less, and also provides a high resolution, a good exposure latitude (EL), and an excellent uniformity of local pattern dimension (Local-CDU) in the case of forming a hole pattern having fine pore diameter (for example, 50 nm or less).

This application is based on Japanese patent application Nos. 2012-181892 and 2013-054401, filed on Aug. 20, 2012 and Mar. 15, 2013, respectively, the entire content of which is hereby incorporated by reference, the same as if set forth at length.

The invention claimed is:
1. A pattern forming method, comprising:
(a) forming a film by using an electron beam-sensitive or extreme ultraviolet ray-sensitive resin composition containing a resin (A) having a repeating unit represented by Formula (1-0) and a repeating unit represented by Formula (1-2), a compound (B) capable of generating an acid upon irradiation with an electron beam-sensitive or extreme ultraviolet ray, and a solvent (C);
(b) exposing the film by using an electron beam or extreme ultraviolet ray; and
(c) developing the exposed film by using a developer containing an organic solvent to form a negative pattern,
wherein a content of the repeating unit represented by Formula (1-0) is 45 mol % or more based on a whole repeating units in the resin (A):

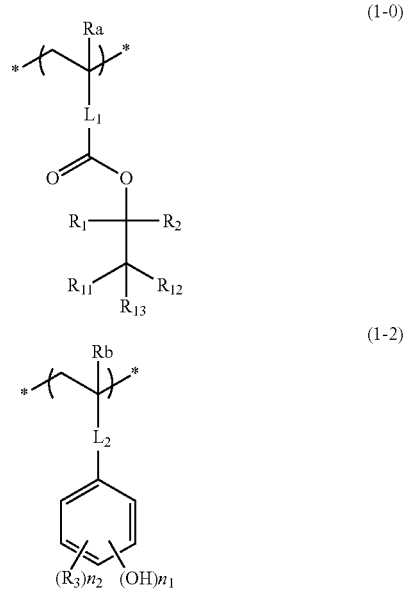

wherein in Formula (1-0),
$R_1$ and $R_2$ each independently represent an alkyl group,
$R_{11}$ and $R_{12}$ each independently represent an alkyl group,
$R_{13}$ represents a hydrogen atom or an alkyl group,
$R_{11}$ and $R_{12}$ may be bound with each other to form a ring, and $R_{11}$ and $R_{13}$ may be bound with each other to form a ring,
Ra represents a hydrogen atom, an alkyl group, a cyano group or a halogen atom, and $L_1$ represents a single bond or a divalent linking group,
in Formula (1-2),
Rb represents a hydrogen atom, an alkyl group, a cyano group or a halogen atom,
$R_3$ represents a substituent,
$n_1$ represents an integer of 1 or 2, $n_2$ represents an integer of 0 to 4,
when $n_2$ represents an integer of 2 to 4, $R_3$'s may be bound with each other to form a ring, and
$L_2$ represents a single bond, —COO— or —CONR$_4$—, and $R_4$ represents a hydrogen atom or an alkyl group.
2. The pattern forming method according to claim 1, wherein the repeating unit represented by Formula (1-0) is a repeating unit represented by Formula (1-1):

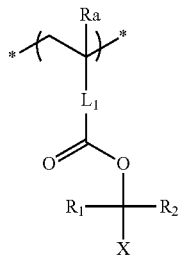

wherein in Formula (1-1),
X represents an alicyclic group,
$R_1$ and $R_2$ each independently represent an alkyl group,
Ra represents a hydrogen atom, an alkyl group, a cyano group or a halogen atom, and
$L_1$ represents a single bond or a divalent linking group.
3. The pattern forming method according to claim 2, wherein X in Formula (1-1) is a cyclohexyl group or a cyclopentyl group.
4. The pattern forming method according to claim 1, wherein the content of the repeating unit represented by Formula (1-0) is 55 mol % or more based on the whole repeating units in the resin (A).
5. The pattern forming method according to claim 1, wherein a content of the repeating unit represented by Formula (1-2) is 15 mol % or more based on the whole repeating units in the resin (A).
6. The pattern forming method according to claim 1, wherein both of $R_1$ and $R_2$ in Formula (1-0) are an alkyl group having 2 to 10 carbon atoms.
7. The pattern forming method according to claim 6, wherein both of $R_1$ and $R_2$ in Formula (1-0) are an ethyl group.
8. The pattern forming method according to claim 1, wherein the resin (A) further contains a repeating unit represented by Formula (2),
the content of the repeating unit represented by Formula (1-0) is 45 to 85 mol % based on the whole repeating units in the resin (A),
a content of the repeating unit represented by Formula (1-2) is 15 to 45 mol % based on the whole repeating units in the resin (A), and
a content of the repeating unit represented by Formula (2) is 1 to 40 mol % based on the whole repeating units in the resin (A):

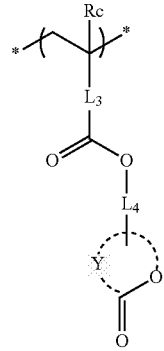

wherein in Formula (2),

L₃ and L₄ each independently represent a single bond or a divalent linking group, Y represents an atomic group capable of forming a lactone structure, and Rc represents a hydrogen atom, an alkyl group, a cyano group or a halogen atom.

9. The pattern forming method according to claim 1, wherein the compound (B) is a compound represented by Formula (3-1) or (3-2):

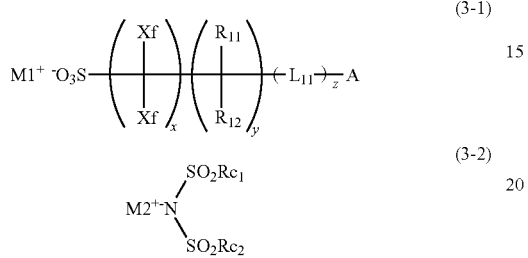

wherein in Formula (3-1),

Xf's each independently represents a fluorine atom or an alkyl group substituted with at least one fluorine atom, $R_{11}$ and $R_{12}$ each independently represent a hydrogen atom, a fluorine atom or an alkyl group, and when a plurality of $R_{11}$ and $R_{12}$ is present, $R_{11}$'s may be the same or different and $R_{12}$'s may be the same or different, $L_{11}$ represents a divalent linking group, and when a plurality of $L_{11}$ is present, $L_{11}$'s may be the same or different, A represents an organic group, $M1^+$ represents a cation, x represents an integer of 1 to 20, y represents an integer of 0 to 10, z represents an integer of 0 to 10, in Formula (3-2), $Rc_1$ and $Rc_2$ each independently represent an organic group, and $Rc_1$ and $Rc_2$ may be bound with each other to form a ring, and $M2^+$ represents a cation.

10. The pattern forming method according to claim 1, for use in fabricating semiconductor microcircuits.

11. An electron beam-sensitive or extreme ultraviolet ray-sensitive resin composition, comprising a resin (A) having a repeating unit represented by Formula (1-0) and a repeating unit represented by Formula (1-2), a compound (B) capable of generating an acid upon irradiation with an electron beam-sensitive or extreme ultraviolet ray, and a solvent (C), wherein a content of the repeating unit represented by Formula (1-0) is 45 mol % or more based on a whole repeating units in the resin (A):

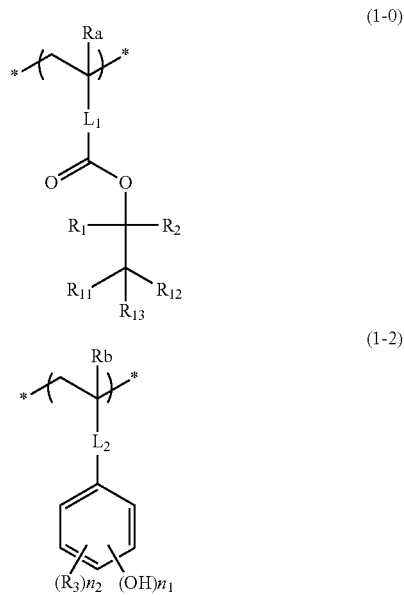

wherein in Formula (1-0), $R_1$ and $R_2$ each independently represent an alkyl group, $R_{11}$ and $R_{12}$ each independently represent an alkyl group, $R_{13}$ represents a hydrogen atom or an alkyl group, $R_{11}$ and $R_{12}$ may be bound with each other to form a ring, and $R_{11}$ and $R_{13}$ may be bound with each other to form a ring, Ra represents a hydrogen atom, an alkyl group, a cyano group or a halogen atom, and $L_1$ represents a single bond or a divalent linking group, in Formula (1-2), Rb represents a hydrogen atom, an alkyl group, a cyano group or a halogen atom, $R_3$ represents a substituent, $n_1$ represents an integer of 1 or 2, $n_2$ represents an integer of 0 to 4, when $n_2$ represents an integer of 2 to 4, $R_3$'s may be bound with each other to form a ring, and $L_2$ represents a single bond, —COO— or —CONR₄—, and $R_4$ represents a hydrogen atom or an alkyl group.

12. A resist film formed by using the electron beam-sensitive or extreme ultraviolet ray-sensitive resin composition according to claim 11.

13. A method for manufacturing an electronic device comprising:

(i) providing a substrate for a semiconductor or a circuit board; and (ii) performing the pattern forming method according on claim 1 to the substrate.

14. The pattern forming method according to claim 1, wherein the content of the repeating unit represented by Formula (1-0) is 60 mol % or more based on the whole repeating units in the resin (A).

* * * * *